United States Patent
Yamazaki et al.

(10) Patent No.: US 12,540,397 B2
(45) Date of Patent: Feb. 3, 2026

(54) METHOD FOR FORMING METAL OXIDE

(71) Applicant: Semiconductor Energy Laboratory Co., Ltd., Atsugi (JP)

(72) Inventors: Shunpei Yamazaki, Setagaya (JP); Tetsuya Kakehata, Isehara (JP); Sachiko Kawakami, Atsugi (JP); Fumito Isaka, Zama (JP); Yuji Egi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 393 days.

(21) Appl. No.: 18/218,148

(22) Filed: Jul. 5, 2023

(65) Prior Publication Data

US 2024/0026537 A1 Jan. 25, 2024

(30) Foreign Application Priority Data

Jul. 15, 2022 (JP) ................. 2022-114230

(51) Int. Cl.
*C23C 16/455* (2006.01)
*C23C 16/40* (2006.01)
(Continued)

(52) U.S. Cl.
CPC ........ *C23C 16/45553* (2013.01); *C23C 16/40* (2013.01); *H01L 21/02565* (2013.01);
(Continued)

(58) Field of Classification Search
CPC . C23C 16/45553; C23C 16/40; C23C 16/405; C23C 16/407; C23C 16/45527;
(Continued)

(56) References Cited

U.S. PATENT DOCUMENTS

2014/0110705 A1* 4/2014 Koezuka ................ H10D 99/00
257/43
2016/0079089 A1* 3/2016 Koezuka ........... H01L 21/02172
438/104

(Continued)

FOREIGN PATENT DOCUMENTS

WO   WO-2021/171136   9/2021

OTHER PUBLICATIONS

European Search Report (Application No. 23183801.2) Dated Dec. 19, 2023.

(Continued)

*Primary Examiner* — Omar F Mojaddedi
(74) *Attorney, Agent, or Firm* — Eric J. Robinson; Robinson Intellectual Property Law Office, P.C.

(57) ABSTRACT

A novel method for forming a metal oxide is provided. The metal oxide is formed using a precursor with a high decomposition temperature while a substrate is heated to higher than or equal to 300° C. and lower than or equal to 500° C. In the formation, plasma treatment, microwave treatment, or heat treatment is preferably performed as impurity removal treatment in an atmosphere containing oxygen. The impurity removal treatment may be performed while irradiation with ultraviolet light is performed. The metal oxide is formed by alternate repetition of precursor introduction and oxidizer introduction. For example, the impurity removal treatment is preferably performed every time the precursor introduction is performed more than or equal to 5 times and less than or equal to 10 times.

20 Claims, 28 Drawing Sheets

(51) Int. Cl.
*H01L 21/02* (2006.01)
*H10B 12/00* (2023.01)
*H10D 30/67* (2025.01)
*H10D 62/40* (2025.01)

(52) U.S. Cl.
CPC .... *H01L 21/0262* (2013.01); *H01L 21/02664* (2013.01); *H10B 12/33* (2023.02); *H10D 30/6728* (2025.01); *H10D 30/6755* (2025.01); *H10D 62/405* (2025.01)

(58) Field of Classification Search
CPC . C23C 16/403; C23C 16/45534; C23C 16/44; C23C 16/50; C23C 14/08; C23C 14/34; H01L 21/02565; H01L 21/0262; H01L 21/02664; H01L 21/02554; H01L 21/02172; H01L 21/02266; H01L 21/0228; H10B 12/33; H10B 12/00; H10B 12/05; H10D 30/6728; H10D 30/6755; H10D 30/6757
See application file for complete search history.

(56) References Cited

U.S. PATENT DOCUMENTS

| | | | |
|---|---|---|---|
| 2016/0284859 A1* | 9/2016 | Asami | H10D 30/673 |
| 2018/0374841 A1 | 12/2018 | Anderson et al. | |
| 2020/0006554 A1 | 1/2020 | Cheng et al. | |
| 2020/0279858 A1 | 9/2020 | Xie et al. | |
| 2020/0292998 A1 | 9/2020 | Yoshizumi et al. | |
| 2021/0020785 A1 | 1/2021 | Sato et al. | |
| 2021/0091207 A1 | 3/2021 | Yu et al. | |
| 2021/0167194 A1 | 6/2021 | Yamazaki et al. | |
| 2021/0225710 A1* | 7/2021 | Yim | H01L 21/02532 |
| 2021/0233769 A1 | 7/2021 | Yamazaki et al. | |
| 2021/0320212 A1 | 10/2021 | Yamazaki et al. | |
| 2021/0376126 A1 | 12/2021 | Sohn et al. | |
| 2022/0045167 A1 | 2/2022 | Do et al. | |
| 2022/0123131 A1* | 4/2022 | Madia | H01L 21/02502 |
| 2022/0123143 A1 | 4/2022 | Song et al. | |
| 2022/0165623 A1 | 5/2022 | Jun et al. | |
| 2022/0190125 A1 | 6/2022 | Wu et al. | |
| 2022/0328694 A1 | 10/2022 | Hanaoka et al. | |
| 2022/0403516 A1* | 12/2022 | Ma | H01L 21/67213 |
| 2023/0029551 A1 | 2/2023 | Hsieh | |
| 2023/0050036 A1 | 2/2023 | Yamazaki et al. | |
| 2023/0072305 A1 | 3/2023 | Cheng et al. | |
| 2023/0079244 A1 | 3/2023 | Yamazaki et al. | |
| 2023/0103070 A1 | 3/2023 | Jun et al. | |
| 2023/0110947 A1 | 4/2023 | Yamazaki et al. | |
| 2023/0126578 A1 | 4/2023 | Reznicek et al. | |
| 2023/0178558 A1 | 6/2023 | Do | |
| 2023/0187493 A1 | 6/2023 | Hong et al. | |
| 2023/0209926 A1* | 6/2023 | Yang | H01L 24/05 257/72 |
| 2023/0274949 A1* | 8/2023 | Routzahn | H01L 21/67103 438/689 |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10, The Japan Society of Applied Physics.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

FIG. 13A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 13B
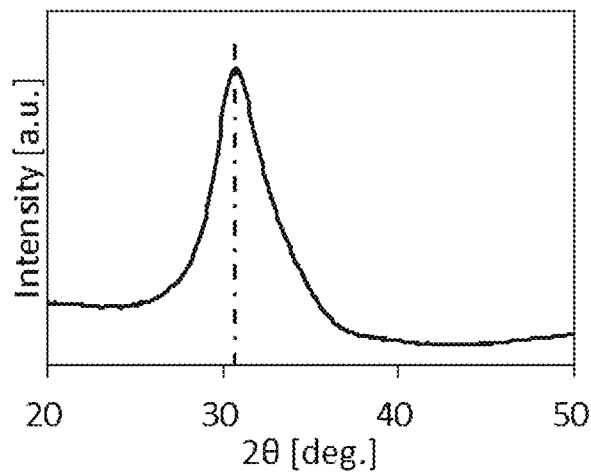
FIG. 13C
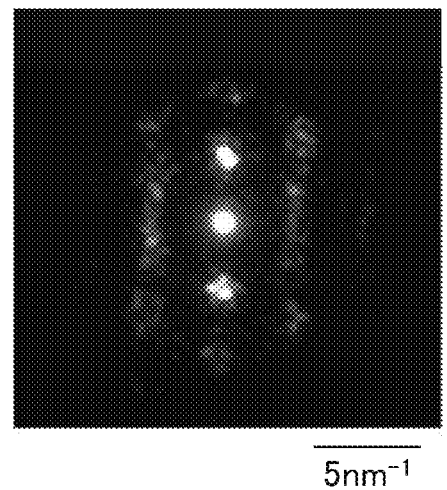

600A

METHOD FOR FORMING METAL OXIDE

BACKGROUND OF THE INVENTION

1. Field of the Invention

One embodiment of the present invention relates to a method for forming a metal oxide. One embodiment of the present invention relates to a semiconductor device including the metal oxide and a method for manufacturing the semiconductor device. One embodiment of the present invention relates to a transistor including the metal oxide and a method for manufacturing the transistor.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a method for driving any of them, and a method for manufacturing any of them.

In this specification and the like, a semiconductor device means a device that utilizes semiconductor characteristics, and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. In some cases, a memory device, a display device, a light-emitting device, a lighting device, and an electronic device themselves are semiconductor devices and also include a semiconductor device.

2. Description of the Related Art

A technique by which a transistor is formed using a semiconductor thin film formed over a substrate having an insulating surface has been attracting attention. The transistor is used in a wide range of electronic devices such as an integrated circuit (IC) or a display device. As semiconductor materials applicable to the transistor, silicon-based semiconductor materials have been widely used, but oxide semiconductors have been attracting attention as alternative materials.

For oxide semiconductors, a c-axis-aligned crystalline (CAAC) structure and a nanocrystalline (nc) structure, which are neither a single crystal structure nor an amorphous structure, have been discovered (see Non-Patent Documents 1 and 2).

Non-Patent Documents 1 and 2 disclose a technique for forming a transistor with the use of an oxide semiconductor having the CAAC structure.

REFERENCES

Non-Patent Documents

[Non-Patent Document 1] S. Yamazaki et al., *SID Symposium Digest of Technical Papers*, 2012, Volume 43, Issue 1, pp. 183-186.

[Non-Patent Document 2] S. Yamazaki et al., *Japanese Journal of Applied Physics*, 2014, Volume 53, Number 4S, pp. 04ED18-1-04ED18-10.

SUMMARY OF THE INVENTION

An object of one embodiment of the present invention is to provide a novel metal oxide and a formation method thereof. Another object of one embodiment of the present invention is to provide a miniaturized transistor. Another object of one embodiment of the present invention is to provide a transistor with a high on-state current. Another object of one embodiment of the present invention is to provide a transistor with favorable electrical characteristics. Another object of one embodiment of the present invention is to provide a highly reliable transistor or semiconductor device. Another object of one embodiment of the present invention is to provide a semiconductor device that can be miniaturized or highly integrated. Another object of one embodiment of the present invention is to provide a method for manufacturing the semiconductor device.

Note that the description of these objects does not preclude the existence of other objects. One embodiment of the present invention does not need to achieve all of these objects. Other objects can be derived from the description of the specification, the drawings, and the claims.

One embodiment of the present invention is a method for forming a metal oxide, including a first step of supplying a first compound to a chamber and then supplying an oxidizer to the chamber, and a second step of supplying a second compound to the chamber and then supplying the oxidizer to the chamber. The first compound is represented by any one of General Formulae (G1) to (G3). The second compound is represented by another one of General Formulae (G1) to (G3). In each of the first and second steps, a substrate in the chamber is heated to higher than or equal to 300° C. and lower than or equal to 500° C.

[Chemical Formula 1]

$$\text{In}\!-\!\!\left(\text{R}^1\right)_m \quad (G1)$$

$$\text{M}\!-\!\!\left(\text{R}^2\right)_n \quad (G2)$$

$$\text{Zn}\!-\!\!\left(\text{R}^3\right)_k \quad (G3)$$

In General Formulae (G1) to (G3), M represents Ga, Al, or Sn; each of $R^1$ to $R^3$ independently represents hydrogen (including deuterium), fluorine, chlorine, bromine, iodine, oxygen, phosphorus, sulfur, a hydroxy group, a thiol group, a boryl group, a substituted or unsubstituted phosphanyl group, a substituted or unsubstituted alkyl group having 1 to 8 carbon atoms, a substituted or unsubstituted alkenyl group having 2 to 8 carbon atoms, a substituted or unsubstituted alkynyl group having 2 to 8 carbon atoms, a substituted or unsubstituted cycloalkyl group having 3 to 10 carbon atoms, a substituted or unsubstituted cycloalkenyl group having 3 to 10 carbon atoms, a substituted or unsubstituted cycloalkynyl group having 3 to 10 carbon atoms, a substituted or unsubstituted alkoxy group having 1 to 6 carbon atoms, a substituted or unsubstituted alkylsulfanyl group having 1 to 6 carbon atoms, a substituted or unsubstituted 1,3-propanedialdehyde group, a substituted or unsubstituted aryl group having 6 to 30 carbon atoms, or a substituted or unsubstituted heteroaryl group having 2 to 30 carbon atoms in which a ring is formed by a plurality of elements selected from carbon, sulfur, oxygen, boron, and phosphorus; m represents an integer of 1 to 3; n represents an integer of 1 to 3 when M is Ga or Al and represents an integer of 1 to 4 when M is Sn; and k represents 1 or 2. When m is 2 or more, a plurality of $R^1$s may be the same or different, and may be bonded to each other to form a ring. When n is 2 or more, a plurality of $R^2$s may be the same or different, and may be bonded to each other to form a ring. When k is 2, a plurality of $R^3$s may be the same or different and may be bonded to each other to form a ring. A bond between In and $R^1$, a bond between M and $R^2$, a bond between Zn and $R^3$, a bond between the plurality of $R^1$s, a bond between the plurality of $R^2$s, and a bond between the plurality of $R^3$s are each any of a single bond, a double bond, and a triple bond.

In General Formulae (G1) to (G3), at least one of m, n, and k is preferably 2 or more. When m is 2, two $R^1$s are preferably different from each other. When m is 3, at least one of $R^1$s is preferably different from the other $R^1$s. When n is 2, two $R^2$s are preferably different from each other. When n is 3 or more, at least one of $R^2$s is preferably different from the other $R^2$s. When k is 2, two $R^3$s are preferably different from each other.

In General Formulae (G1) to (G3), it is preferable that each of $R^1$ to $R^3$ independently represent hydrogen (including deuterium), fluorine, chlorine, bromine, iodine, oxygen, phosphorus, sulfur, a hydroxy group, a thiol group, a boryl group, a substituted or unsubstituted phosphanyl group, a substituted or unsubstituted alkyl group having 1 to 8 carbon atoms, a substituted or unsubstituted alkenyl group having 2 to 8 carbon atoms, a substituted or unsubstituted alkynyl group having 2 to 8 carbon atoms, a substituted or unsubstituted cycloalkyl group having 3 to 10 carbon atoms, a substituted or unsubstituted cycloalkenyl group having 3 to 10 carbon atoms, a substituted or unsubstituted cycloalkynyl group having 3 to 10 carbon atoms, a substituted or unsubstituted alkoxy group having 1 to 6 carbon atoms, a substituted or unsubstituted alkylsulfanyl group having 1 to 6 carbon atoms, a substituted or unsubstituted 1,3-propanedialdehyde group, a substituted or unsubstituted phenyl group, a substituted or unsubstituted furanyl group, or a substituted or unsubstituted thienyl group.

The first compound and the second compound are each preferably a liquid at 25° C. and 1 atm.

In each of the first and second steps, the substrate is preferably heated to higher than or equal to 400° C. and lower than or equal to 450° C.

Performing each of the first and second steps one or more times and performing impurity removal treatment in an atmosphere containing oxygen are regarded as a first cycle, and the first cycle is preferably repeated a plurality of times. For example, in the first cycle, the first step or the second step that is less frequent or both of the first and second steps are preferably performed more than or equal to 5 times and less than or equal to 10 times.

The method for forming a metal oxide which is one embodiment of the present invention may further include a third step of supplying a third compound to the chamber and then supplying the oxidizer to the chamber. The third compound is represented by the other one of General Formulae (G1) to (G3). In the third step, the substrate is heated to higher than or equal to 300° C. and lower than or equal to 500° C. The third compound is preferably a liquid at 25° C. and 1 atm. In the third step, the substrate is preferably heated to higher than or equal to 400° C. and lower than or equal to 450° C. Performing each of the first, second, and third steps one or more times and then performing impurity removal treatment in an atmosphere containing oxygen are regarded as a first cycle, and the first cycle is preferably repeated a plurality of times.

One embodiment of the present invention is a method for forming a metal oxide, including a first step of supplying a first compound to a chamber and then supplying an oxidizer to the chamber, and a second step of supplying a second compound to the chamber and then supplying the oxidizer to the chamber. The first compound is represented by any one of General Formulae (G1) to (G3). The second compound is represented by another one of General Formulae (G1) to (G3). Performing each of the first and second steps one or more times and then performing impurity removal treatment in an atmosphere containing oxygen are regarded as a first cycle, and the first cycle is repeated a plurality of times.

In the first cycle, the first step or the second step that is less frequent or both of the first and second steps are preferably performed more than or equal to 5 times and less than or equal to 10 times.

The method for forming a metal oxide which is one embodiment of the present invention may further include a third step of supplying a third compound to the chamber and then supplying the oxidizer to the chamber. The third compound is represented by the other one of General Formulae (G1) to (G3). In the first cycle, the third step is performed one or more times before the impurity removal treatment.

One embodiment of the present invention is a method for forming a metal oxide, including a first step of supplying a first compound to a chamber and then supplying an oxidizer to the chamber, and a second step of supplying a second compound to the chamber and then supplying the oxidizer to the chamber. The first compound is represented by any one of General Formulae (G1) to (G3). The second compound is represented by another one of General Formulae (G1) to (G3). Performing each of the first and second steps one or more times and then performing impurity removal treatment in an atmosphere containing oxygen are regarded as a first cycle, and performing each of the first and second steps one or more times in the order different from that of the first cycle and then performing the impurity removal treatment in an atmosphere containing oxygen are regarded as a second cycle. The first cycle and the second cycle are alternately performed a plurality of times.

In the first cycle, the first step or the second step that is less frequent or both of the first and second steps are preferably performed more than or equal to 5 times and less than or equal to 10 times. In the second cycle, the first step or the second step that is less frequent or both of the first and second steps are preferably performed more than or equal to 5 times and less than or equal to 10 times.

The method for forming a metal oxide which is one embodiment of the present invention may further include a third step of supplying a third compound to the chamber and then supplying the oxidizer to the chamber. The third compound is represented by the other one of General Formulae (G1) to (G3). In each of the first and second cycles, the third step is performed one or more times before the impurity removal treatment.

Plasma treatment is preferably performed as the impurity removal treatment. Alternatively, microwave treatment is preferably performed as the impurity removal treatment. Alternatively, heat treatment at higher than or equal to 300° C. and lower than or equal to 500° C. is preferably performed as the impurity removal treatment. The impurity removal treatment is performed while irradiation with ultraviolet light is performed.

According to one embodiment of the present invention, a novel metal oxide and a formation method thereof can be provided. According to another embodiment of the present invention, a miniaturized transistor can be provided. According to another embodiment of the present invention, a transistor with a high on-state current can be provided. According to another embodiment of the present invention, a transistor with high electrical characteristics can be provided. According to another embodiment of the present invention, a highly reliable transistor or semiconductor device can be provided. According to another embodiment of the present invention, a semiconductor device that can be miniaturized or highly integrated can be provided. According to another embodiment of the present invention, a method for manufacturing the semiconductor device can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

In the accompanying drawings:

FIG. 13A shows classification of crystal structures of IGZO, FIG. 13B shows an XRD spectrum of a CAAC-IGZO film, and FIG. 13C shows a nanobeam electron diffraction pattern of a CAAC-IGZO film;

DETAILED DESCRIPTION OF THE INVENTION

Figure 1A:
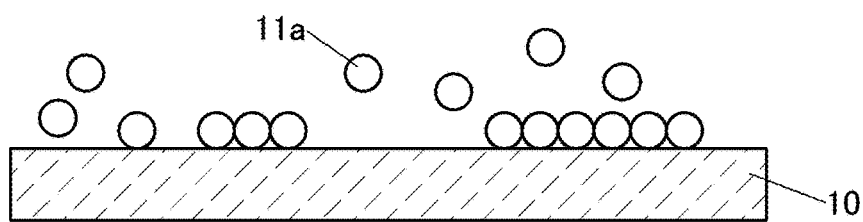
FIGS. 1A to 1E are cross-sectional views illustrating an example of a method for forming a metal oxide.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings. For example, in the actual manufacturing process, a layer, a resist mask, or the like might be unintentionally reduced in size by treatment such as etching, which is not illustrated in some cases for easy understanding.

Note that in this specification and the like, ordinal numbers such as "first" and "second" are used for convenience and do not limit the number of components or the order of components (e.g., the order of steps or the stacking order of layers). Furthermore, an ordinal number used for a component in a certain part in this specification is not the same as an ordinal number used for the component in another part in this specification or claims in some cases.

Note that the terms "film" and "layer" can be used interchangeably depending on the case or the circumstances. For example, the term "conductive layer" can be replaced with the term "conductive film". As another example, the term "insulating film" can be replaced with the term "insulating layer".

A transistor is a kind of semiconductor element and enables amplification of current or voltage, switching operation for controlling conduction or non-conduction, and the like. A transistor in this specification includes, in its category, an insulated-gate field effect transistor (IGFET) and a thin film transistor (TFT).

In this specification and the like, a transistor is an element having at least three terminals of a gate, a drain, and a source. The transistor includes a region where a channel is formed (also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

The functions of a "source" and a "drain" are sometimes replaced with each other when a transistor of opposite polarity is used or when the direction of current flow is changed in circuit operation, for example. Thus, the terms "source" and "drain" can be used interchangeably in this specification.

Note that impurities in a semiconductor refer to, for example, elements other than the main components of the semiconductor. For example, an element with a concentration of lower than 0.1 atomic % is an impurity. When a semiconductor contains an impurity, an increase in density of defect states or a reduction in crystallinity of the semiconductor may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen, lithium, sodium, silicon, boron, phosphorus, carbon, and nitrogen. Specific examples include hydrogen, lithium, sodium, silicon, boron, phosphorus, carbon, and nitrogen. Note that water also serves as an impurity in some cases. Entry of an impurity may cause oxygen vacancies (also referred to as $V_O$) in an oxide semiconductor, for example.

Note that in this specification and the like, oxynitride refers to a material that contains more oxygen than nitrogen. Nitride oxide refers to a material that contains more nitrogen than oxygen.

The contents of elements such as hydrogen, oxygen, carbon, and nitrogen in a film can be analyzed by secondary ion mass spectrometry (SIMS) or X-ray photoelectron spectroscopy (XPS), for example. Note that XPS is suitable when the content of a target element is high (e.g., 0.5 atomic % or more, or 1 atomic % or more).

In contrast, SIMS is suitable when the content of a target element is low (e.g., 0.5 atomic % or less, or 1 atomic % or less). To compare the contents of elements, analysis with a combination of SIMS and XPS is preferably used.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. The term "perpendicular" indicates that the angle formed between two straight lines is greater than or equal to 800 and less than or equal to 100°. Thus, the case where the angle is greater than or equal to 850 and less than or equal to 950 is also included. In addition, the term "substantially perpendicular" indicates that the angle formed between two straight lines is greater than or equal to 600 and less than or equal to 120°.

In this specification and the like, the term "electrically connected" includes the case where components are connected to each other through an object having any electric action. There is no particular limitation on an "object having any electric function" as long as electric signals can be transmitted and received between components that are connected through the object. Examples of the "object having any electric function" are a switching element such as a transistor, a resistor, a coil, a capacitor, and an element with a variety of functions as well as an electrode and a wiring.

Unless otherwise specified, off-state current in this specification and the like refers to leakage current between a source and a drain of a transistor in an off state (also referred to as a non-conduction state or a cutoff state). Unless otherwise specified, the off state of an n-channel transistor means that a gate-source voltage $V_{gs}$ is lower than a threshold voltage $V_{th}$, and the off state of a p-channel transistor means that $V_{gs}$ is higher than $V_{th}$.

In this specification and the like, a top surface shape refers to a shape in a plan view, i.e., a shape seen from above.

Note that in this specification and the like, a tapered shape refers to a shape such that at least part of a side surface of a component is inclined with respect to a substrate surface or a formation surface of the component. For example, a tapered shape preferably includes a region where the angle between the inclined side surface and the substrate surface or the formation surface of the component (such an angle is also referred to as a taper angle) is less than 90°. Note that the side surface of the component, the substrate surface, and the formation surface are not necessarily completely flat and may be substantially flat with a slight curvature or with slight unevenness.

In this specification and the like, the expression "A is in contact with B" means that at least part of A is in contact with B. In other words, A includes a region in contact with B, for example.

In this specification and the like, the expression "A is positioned over B" means that at least part of A is positioned over B. In other words, A includes a region positioned over B, for example.

In this specification and the like, the expression "A covers B" means that at least part of A covers B. In other words, A includes a region covering B, for example.

In this specification and the like, the expression "A overlaps with B" means that at least part of A overlaps with B. In other words, A includes a region overlapping with B, for example.

Embodiment 1

In this embodiment, a metal oxide of one embodiment of the present invention and a formation method thereof will be described with reference to FIGS. 1A to 1E, FIGS. 2A to 2D, FIGS. 3A to 3D, FIGS. 4A to 4C, FIGS. 5A to 5D, FIGS. 6A to 6C, FIG. 7, FIGS. 8A and 8B, FIGS. 9A to 9C, FIGS. 10A and 10B, FIGS. 11A and 11B, FIG. 12, FIGS. 13A to 13C, FIGS. 14A to 14D, FIGS. 15A to 15F, FIGS. 16A and 16B, and FIGS. 17A to 17D.

A metal oxide of one embodiment of the present invention can be used as any of a semiconductor material, an insulating material, and a conductive material depending on the kind, combination, composition, and the like of elements constituting the metal oxide. The metal oxide of one embodiment of the present invention can be used for a semiconductor layer of a transistor, for example. The metal oxide is referred to as an oxide semiconductor or an oxide in some cases.

A formation method of a metal oxide which is one embodiment of the present invention employs an atomic layer deposition (ALD) method, and thus enables formation of a film with a uniform and extremely small thickness. Therefore, the formation method is suitable for forming a metal oxide included in a miniaturized transistor.

In the formation method of a metal oxide which is one embodiment of the present invention, an organic precursor is preferably used. Using an organic precursor enables deposition at a lower temperature than the case of using an inorganic precursor. Note that an organic precursor is a precursor containing carbon as its constituent element, and an inorganic precursor is a precursor not containing carbon as its constituent element.

Meanwhile, a metal oxide film formed using an organic precursor might have a high impurity concentration (e.g., at least one of a hydrogen concentration, a carbon concentration, and a nitrogen concentration). Furthermore, impurities in the formed metal oxide film are difficult to remove sufficiently even when heat treatment is performed after the film formation.

In view of this, in the formation method of a metal oxide which is one embodiment of the present invention, a precursor with a high decomposition temperature is used and deposition is performed while a substrate is heated at high temperature. The use of the precursor with a high decomposition temperature allows deposition to be performed at a high substrate temperature, thereby forming a film with few impurities. This can inhibit entry of hydrogen contained in a raw material such as a precursor into the metal oxide. This can also inhibit entry of carbon, nitrogen, and the like contained in a raw material such as a precursor into the metal oxide. Accordingly, the impurity concentration in the metal oxide can be reduced. In addition, a metal oxide with high crystallinity can be formed. Meanwhile, the formation method does not include high-temperature treatment (for example, treatment at higher than 700° C.) that increases the maximum temperature in the manufacturing process of a transistor or a semiconductor device, and thus can form a metal oxide with few impurities without decreasing productivity.

In the formation method of a metal oxide which is one embodiment of the present invention, impurity removal treatment is intermittently performed during deposition in an atmosphere containing oxygen. By performing the impurity removal treatment during deposition, impurities can be removed more certainly than the case of performing the impurity removal treatment after deposition. This can inhibit hydrogen contained in a raw material such as a precursor from remaining in the metal oxide. This can also inhibit carbon, nitrogen, and the like contained in a raw material such as a precursor from remaining in the metal oxide. Accordingly, the impurity concentration in the metal oxide can be reduced. In addition, the crystallinity of the metal oxide can be increased.

As described above, by the formation method of a metal oxide which is one embodiment of the present invention, a metal oxide with few impurities which is used for a semiconductor layer of a miniaturized transistor can be formed. In addition, by the formation method of a metal oxide which is one embodiment of the present invention, a metal oxide with high crystallinity which is used for a semiconductor layer of a miniaturized transistor can be formed. Accordingly, a miniaturized transistor with favorable electrical characteristics can be achieved. Furthermore, a miniaturized transistor with favorable reliability can be achieved. In particular, a metal oxide having a CAAC structure is preferably formed.

Note that an inorganic precursor may be used in the formation method of a metal oxide which is one embodiment of the present invention. For example, both an organic precursor and an inorganic precursor may be used. In the formation method of a metal oxide which is one embodiment of the present invention, one or both of deposition while a substrate is heated and the impurity removal treatment can inhibit an impurity originating from a raw material from remaining in the metal oxide, even when an inorganic precursor is used.

Specifically, one embodiment of the present invention is a formation method of a metal oxide including a first step where a first compound is supplied to a chamber and then an oxidizer is supplied to the chamber, and a second step where a second compound is supplied to the chamber and then the oxidizer is supplied to the chamber. The formation method may further include a third step where a third compound is supplied to the chamber and then the oxidizer is supplied to the chamber.

In the formation method of a metal oxide which is one embodiment of the present invention, in each of the first, second, and third steps, a substrate placed in the chamber is preferably heated to higher than or equal to 300° C. and lower than or equal to 500° C., further preferably higher than or equal to 400° C. and lower than or equal to 450° C. In addition, the substrate heating temperature is preferably lower than the decomposition temperatures of the first and second compounds. In the case where the third compound is used, the substrate heating temperature is preferably lower than the decomposition temperature of the third compound.

In the formation method of a metal oxide which is one embodiment of the present invention, it is preferable that each of the first and second steps be performed one or more times, and then impurity removal treatment be performed in an atmosphere containing oxygen. The impurity removal treatment releases impurities from the metal oxide film. The impurity removal treatment preferably releases hydrogen, carbon, nitrogen, and the like from the metal oxide film. In addition, oxygen is preferably supplied to the metal oxide by the impurity removal treatment. In this case, the amount of oxygen vacancies ($V_O$) and impurities in the metal oxide can be reduced. The use of a metal oxide with a reduced amount of oxygen vacancies ($V_O$) and impurities can improve the electrical characteristics and reliability of a transistor.

Examples of the impurity removal treatment include plasma treatment, microwave treatment, and heat treatment.

When plasma treatment or microwave treatment is performed, the substrate temperature is preferably higher than or equal to room temperature (e.g., 25° C.), higher than or equal to 100° C., higher than or equal to 200° C., higher than or equal to 300° C., or higher than or equal to 400° C., and lower than or equal to 500° C. or lower than or equal to 450° C. The heat treatment temperature is preferably higher than or equal to 100° C., higher than or equal to 200° C., higher than or equal to 300° C., or higher than or equal to 400° C., and lower than or equal to 500° C. or lower than or equal to 450° C.

The temperature of the impurity removal treatment is particularly preferably set lower than or equal to the maximum temperature in the manufacturing process of a transistor or a semiconductor device, in which case the impurity content in the metal oxide can be reduced without decrease in productivity. For example, when the maximum temperature in manufacturing a transistor or a semiconductor device including the metal oxide of one embodiment of the present invention is lower than or equal to 500° C., preferably lower than or equal to 450° C., the productivity of the transistor or the semiconductor device can be improved.

In addition, the impurity removal treatment is preferably performed at a temperature lower than the decomposition temperatures of the first and second compounds. In the case where the third compound is used, the impurity removal treatment is preferably performed at a temperature lower than the decomposition temperature of the third compound. In addition, the impurity removal treatment may be performed at higher than 500° C. (e.g., higher than 500° C. and lower than or equal to 700° C.).

The impurity removal treatment may be performed while irradiation with light (e.g., ultraviolet light) is performed. This can promote release of impurities. Examples of a light source include a laser and a mercury lamp. For example, an oxygen radical is generated by photoexcitation to react with hydrogen, carbon, nitrogen, or the like, so that impurities in a film can be reduced and crystallization can be promoted. In some cases, impurities are removed even at a low heating temperature more easily in the case where light irradiation is performed than in the case where light irradiation is not performed.

In addition, light irradiation may be performed during deposition. For example, while the first compound is supplied to the chamber and/or while the oxidizer is supplied to the chamber in the first step, the formation surface of the metal oxide may be irradiated with light. The same applies to the second and third steps.

Performing each of the first and second steps one or more times and then performing the impurity removal treatment in an atmosphere containing oxygen are regarded as a first cycle, and the first cycle is preferably repeated a plurality of times.

Alternatively, performing each of the first and second steps one or more times and then performing the impurity removal treatment in an atmosphere containing oxygen are regarded as the first cycle, and performing each of the first and second steps one or more times in the order different from that of the first cycle and then performing the impurity removal treatment in an atmosphere containing oxygen are regarded as a second cycle. It is preferable that the first and second cycles be performed alternately a plurality of times.

In each of the first and second cycles, the impurity removal treatment is preferably performed every time the first step or the second step that is less frequent or both of the first and second steps are performed more than or equal to 5 times and less than or equal to 10 times.

Impurities cannot be sufficiently removed only by performing the impurity removal treatment after formation of the metal oxide. When the impurity removal treatment is performed intermittently (with an interval) during deposition, the impurities in the metal oxide can be removed sufficiently.

The first, second, and third compounds can each be referred to as a precursor. The first compound is represented by any one of General Formulae (G1) to (G3), the second compound is represented by another one of General Formulae (G1) to (G3), and the third compound is represented by the other one of General Formulae (G1) to (G3).

That is, there are three possible combinations of the first and second compounds: a compound represented by General Formula (G1) and a compound represented by General Formula (G2), a compound represented by General Formula (G1) and a compound represented by General Formula (G3), and a compound represented by General Formula (G2) and a compound represented by General Formula (G3).

Any one of the first, second, and third compounds is represented by General Formula (G1), another one is represented by General Formula (G2), and the other one is represented by General Formula (G3).

[Chemical Formula 2]

In General Formulae (G1) to (G3), M represents gallium (Ga), aluminum (Al), or tin (Sn); each of $R^1$ to $R^3$ independently represents hydrogen (including deuterium), fluorine, chlorine, bromine, iodine, oxygen, phosphorus, sulfur, a hydroxy group, a thiol group, a boryl group, a substituted or unsubstituted phosphanyl group, a substituted or unsubstituted alkyl group having 1 to 8 carbon atoms, a substituted or unsubstituted alkenyl group having 2 to 8 carbon atoms, a substituted or unsubstituted alkynyl group having 2 to 8 carbon atoms, a substituted or unsubstituted cycloalkyl group having 3 to 10 carbon atoms, a substituted or unsubstituted cycloalkenyl group having 3 to 10 carbon atoms, a substituted or unsubstituted cycloalkynyl group having 3 to 10 carbon atoms, a substituted or unsubstituted alkoxy group having 1 to 6 carbon atoms, a substituted or unsubstituted alkylsulfanyl group having 1 to 6 carbon atoms, a substituted or unsubstituted 1,3-propanedialdehyde group, a substituted or unsubstituted aryl group having 6 to 30 carbon atoms, or a substituted or unsubstituted heteroaryl group having 2 to 30 carbon atoms in which a ring is formed by a plurality of elements selected from carbon, sulfur, oxygen, boron, and phosphorus; m represents an integer of 1 to 3; n represents an integer of 1 to 3 when M is Ga or Al and represents an integer of 1 to 4 when M is Sn; and k represents 1 or 2. In the case where m is 2 or more, a plurality of $R^1$s may be the same or different and may be bonded to each other to form a ring. In the case where n is 2 or more, a plurality of $R^2$s may be the same or different and may be bonded to each other to form a ring. In the case where k is 2, a plurality of $R^3$s may be the same or different and may be bonded to each other to form a ring. A bond between In and $R^1$, a bond between M and $R^2$, a bond between Zn and $R^3$, a bond between the plurality of $R^1$s, a bond between the plurality of $R^2$s, and a bond between the plurality of $R^3$s are each any of a single bond, a double bond, and a triple bond.

In General Formulae (G1) to (G3), at least one of m, n, and k is preferably 2 or more. In the case where m is 2, two $R^1$s are preferably different from each other. In the case where m is 3, at least one of $R^1$s is preferably different from the other $R^1$s. In the case where n is 2, two $R^2$s are preferably different from each other. In the case where n is 3 or more, at least one of $R^2$s is preferably different from the other $R^2$s. In the case where k is 2, two $R^3$s are preferably different from each other.

Two $R^1$s are preferably different from each other or at least one of the plurality of $R^1$s is preferably different from the other $R^1$s, in which case the kind of a gas derived from $R^1$ and generated in the chamber during deposition, specifically a gas of a compound in which a bond between a metal is cleaved and a proton is added thereto, becomes two or more, so that expelling from the chamber can be performed efficiently and the purity of a formed film can be increased. In addition, decomposition of the precursor in the chamber by heating can also be prevented, which is also preferable. The same applies to $R^2$ and $R^3$.

In General Formulae (G1) to (G3), it is preferable that each of $R^1$ to $R^3$ independently represent hydrogen (including deuterium), fluorine, chlorine, bromine, iodine, oxygen, phosphorus, sulfur, a hydroxy group, a thiol group, a boryl group, a substituted or unsubstituted phosphanyl group, a substituted or unsubstituted alkyl group having 1 to 8 carbon atoms, a substituted or unsubstituted cycloalkyl group having 3 to 10 carbon atoms, a substituted or unsubstituted alkoxy group having 1 to 6 carbon atoms, a substituted or unsubstituted acetyl acetone group having 3 to 20 carbon atoms, a substituted or unsubstituted phenyl group, a substituted or unsubstituted furanyl group, or a substituted or unsubstituted thienyl group.

Examples of the alkyl group having 1 to 8 carbon atoms include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a heptyl group, an octyl group, a 3-methylpentyl group, a 2-methylpentyl group, a 2-ethylbutyl group, a 1,2-dimethylbutyl group, and a 2,3-dimethylbutyl group.

Examples of the alkenyl group having 2 to 8 carbon atoms include an ethenyl group, a 1-propenyl group, an allyl group, a 1-butenyl group, a 2-butenyl group, a 3-butenyl group, a sec-butenyl group, an isobutenyl group, a 1-pentenyl group, a 2-pentenyl group, a 3-pentenyl group, a 4-pentenyl group, an isopentenyl group, a 1-hexenyl group, a 2-hexenyl group, a 3-hexenyl group, a 4-hexenyl group, a 5-hexenyl group, a 1-heptenyl group, a 2-heptenyl group, a 3-heptenyl group, a 4-heptenyl group, a 5-heptenyl group, a 6-heptenyl group, a 1-octenyl group, a 2-octenyl group, a 3-octenyl group, a 4-octenyl group, a 5-octenyl group, a 6-octenyl group, and a 7-octenyl group.

Examples of the alkynyl group having 2 to 8 carbon atoms include an ethynyl group, a 1-propynyl group, a 2-propynyl group, a 1-butynyl group, a 2-butynyl group, a 3-butynyl group, a sec-butynyl group, an isobutynyl group, a 1-pentynyl group, a 2-pentynyl group, a 3-pentynyl group, a 4-pentynyl group, an isopentynyl group, a 1-hexynyl group, a 2-hexynyl group, a 3-hexynyl group, a 4-hexynyl group, a 5-hexynyl group, a 1-heptynyl group, a 2-heptynyl group, a 3-heptynyl group, a 4-heptynyl group, a 5-heptynyl group, a 6-heptynyl group, a 1-octynyl group, a 2-octynyl group, a 3-octynyl group, a 4-octynyl group, a 5-octynyl group, a 6-octynyl group, and a 7-octynyl group.

Examples of the cycloalkyl group having 3 to 10 carbon atoms include a cyclopropyl group, a cyclobutyl group, a cyclopentyl group, a cyclohexyl group, a 1-methylcyclohexyl group, a cycloheptyl group, a 1-adamantyl group, and a 2-adamantyl group.

Examples of the cycloalkenyl group having 3 to 10 carbon atoms include a 1-cyclopropenyl group, a 3-cyclopropenyl group, a 1-cyclobutenyl group, a 3-cyclobutenyl group, a 1-cyclopentenyl group, a 3-cyclopentenyl group, a 4-cyclopentenyl group, a 1-cyclohexenyl group, a 3-cyclohexenyl group, a 4-cyclohexenyl group, a 1-methyl-2-cyclohexenyl group, a 1-methyl-3-cyclohexenyl group, a 1-methyl-4-cyclohexenyl group, a 1-methyl-5-cyclohexenyl group, a 1-cycloheptenyl group, a 3-cycloheptenyl group, a 4-cycloheptenyl group, and a 5-cycloheptenyl group.

Examples of the cycloalkynyl group having 3 to 10 carbon atoms include a cyclopropynyl group, a cyclobutynyl group, a 3-cyclopentynyl group, a 4-cyclopentynyl group, a 3-cyclohexynyl group, a 4-cyclohexynyl group, a 3-cycloheptynyl group, a 4-cycloheptynyl group, and a 5-cycloheptynyl group.

Examples of the alkoxy group having 1 to 6 carbon atoms include a methoxy group, an ethoxy group, a propoxy group, an isopropoxy group, a t-butoxy group, a sec-butoxy group, an isobutoxy group, a pentyloxy group, an octyloxy group, an allyloxy group, a cyclohexyloxy group, a phenoxy group, and a benzyloxy group.

Examples of the alkylsulfanyl group having 1 to 6 carbon atoms include a methylsulfanyl group and an ethylsulfanyl group.

Examples of the aryl group having 6 to 30 carbon atoms include a phenyl group, a biphenyl group, a naphthyl group, a fluorenyl group, and a phenanthrenyl group. The aryl group preferably does not remain in a film after deposition. In the case where a bond between the aryl group and a metal is cleaved, a compound where a proton is bonded to the cleaved bond preferably has a low boiling point, in which case the compound is easily expelled from the chamber and is less likely to remain in the film. It is particularly preferable to use a phenyl group, which has a low boiling point and the lowest molecular amount among the specific examples of the aryl group. Specifically, when a bond between a phenyl group and a metal is cleaved and a proton is bonded to the cleaved bond, benzene is obtained. Benzene has a boiling point of 78° C. under an atmospheric pressure and exists as a gas in a chamber, and thus is easily evacuated.

Examples of the heteroaryl group having 2 to 30 carbon atoms in which a ring is formed by a plurality of elements selected from carbon, sulfur, oxygen, boron, and phosphorus include a furanyl group, a benzofuranyl group, a dibenzofuranyl group, a thienyl group, a benzothienyl group, a dibenzothienyl group, and a substituent having a coumarin skeleton. The heteroaryl group preferably does not remain in a film after deposition. In the case where a bond between the heteroaryl group and a metal is cleaved, a compound where a proton is bonded to the cleaved bond preferably has a low boiling point, in which case the compound is easily expelled from the chamber and is less likely to remain in the film. It is particularly preferable to use a furanyl group or a thienyl group, which has a low molecular amount and a low boiling point among the specific examples of the heteroaryl group.

In the case where the alkyl group, the alkenyl group, the alkynyl group, the cycloalkyl group, the cycloalkenyl group, the cycloalkynyl group, the alkoxy group, the alkylsulfanyl group, the 1,3-propanedialdehyde group, the phosphanyl group, the aryl group, and the heteroaryl group each include a substituent, examples of the substituent include tin, aluminum, fluorine, chlorine, bromine, iodine, oxygen, phosphorus, sulfur, a hydroxy group, a thiol group, a boryl group, a substituted or unsubstituted phosphanyl group, an alkyl group having 1 to 4 carbon atoms, an alkenyl group having 2 to 4 carbon atoms, an alkynyl group having 2 to 4 carbon atoms, a cycloalkyl group having 3 to 10 carbon atoms, a cycloalkenyl group having 3 to 6 carbon atoms, a cycloalkynyl group having 3 to 6 carbon atoms, an alkoxy group having 1 to 4 carbon atoms, an alkylsulfanyl group having 1 to 4 carbon atoms, a 1,3-propanedialdehyde group, an aryl group having 6 to 13 carbon atoms, and a heteroaryl group having 2 to 30 carbon atoms in which a ring is formed by a plurality of elements selected from carbon, sulfur, oxygen, boron, and phosphorus. Specific examples of these groups are as described above. A plurality of substituents may be bonded to each other to form a ring. The bond is any of a single bond, a double bond, and a triple bond.

Examples of a compound represented by General Formula (G2) include compounds represented by General Formulae (G4) to (G6).

[Chemical Formula 3]

(G4)

(G5)

(G6)

In General Formulae (G4) to (G6), $R^2$ represents hydrogen (including deuterium), fluorine, chlorine, bromine, iodine, oxygen, phosphorus, sulfur, a hydroxy group, a thiol group, a boryl group, a substituted or unsubstituted phosphanyl group, a substituted or unsubstituted alkyl group having 1 to 8 carbon atoms, a substituted or unsubstituted alkenyl group having 2 to 8 carbon atoms, a substituted or unsubstituted alkynyl group having 2 to 8 carbon atoms, a substituted or unsubstituted cycloalkyl group having 3 to 10 carbon atoms, a substituted or unsubstituted cycloalkenyl group having 3 to 10 carbon atoms, a substituted or unsubstituted cycloalkynyl group having 3 to 10 carbon atoms, a substituted or unsubstituted alkoxy group having 1 to 6 carbon atoms, a substituted or unsubstituted alkylsulfanyl group having 1 to 6 carbon atoms, a substituted or unsubstituted 1,3-propanedialdehyde group, a substituted or unsubstituted aryl group having 6 to 30 carbon atoms, or a substituted or unsubstituted heteroaryl group having 2 to 30 carbon atoms in which a ring is formed by a plurality of elements selected from carbon, sulfur, oxygen, boron, and phosphorus; p represents an integer of 1 to 3; q represents an integer of 1 to 3; and r represents an integer of 1 to 4. In General Formula (G4), in the case where p is 2 or more, a plurality of $R^2$s may be the same or different, and may be bonded to each other to form a ring. In General Formula (G5), in the case where q is 2 or more, a plurality of $R^2$s may be the same or different, and may be bonded to each other to form a ring. In General Formula (G6), in the case where r is 2 or more, a plurality of $R^2$s may be the same or different, and may be bonded to each other to form a ring. A bond between the plurality of $R^2$s, a bond between Ga and $R^2$, a bond between Al and $R^2$, and a bond between Sn and $R^2$ are each any of a single bond, a double bond, and a triple bond.

Compounds represented by General Formulae (G1) to (G3) do not contain nitrogen. Like gallium that is an example of an element constituting a metal oxide, nitrogen has a valence of three and thus unintentionally enters the metal oxide in some cases. Formation of a metal oxide using a compound not containing nitrogen as a precursor can inhibit unintentional entry of nitrogen into the metal oxide. Accordingly, the impurity concentration in the metal oxide can be reduced.

Among compounds represented by General Formulae (G1) to (G3), it is preferable to use a compound that is a liquid at room temperature and normal pressure (at 25° C. and 1 atm, for example). Alternatively, among the compounds represented by General Formulae (G1) to (G3), it is preferable to use a compound that is a solid at room temperature and normal pressure. A compound that is a liquid or a solid at room temperature and normal pressure is preferable because it is handled more easily than a compound that is a gas at room temperature and normal pressure.

In the formation method of a metal oxide which is one embodiment of the present invention, a material with high purity is preferably used. For example, in the compounds represented by General Formulae (G1) to (G3), the purity of a metal element (In, Ga, Zn, Al, or Sn) constituting the compound is preferably higher than or equal to 3N (99.9%), further preferably higher than or equal to 4N (99.99%), still further preferably higher than or equal to 5N (99.999%), yet still further preferably higher than or equal to 6N (99.9999%). With the use of a material with high purity, the amount of impurities in the metal oxide can be reduced.

Specific examples of the compound represented by General Formula (G1) include compounds represented by Structural Formulae (101) to (197). Specific examples of the compound represented by General Formula (G2) include compounds represented by Structural Formulae (201) to (297), Structural Formulae (301) to (411), and Structural Formulae (501) to (771). Specific examples of the compound represented by General Formula (G3) include compounds represented by Structural formulae (801) to (864). Note that the present invention is not limited to these examples.

[Chemical Formula 4]

(101)

(102)

(103)

(104)

(105)

(106)

(107)

-continued
(108) 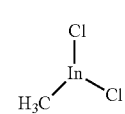
(109) 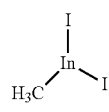
(110) 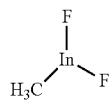
(111) 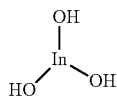
(112) 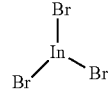
(113) 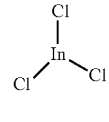
(114) 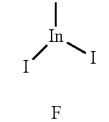
(115) 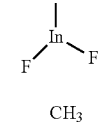
(116) 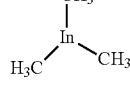
(117) 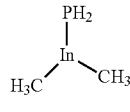
(118) 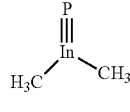
(119) 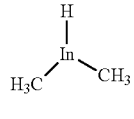
(120) 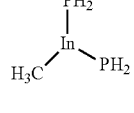
(121) 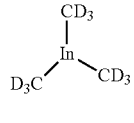
-continued
(122) 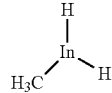
(123) 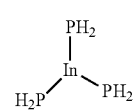
(124) 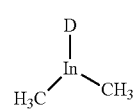
(125) 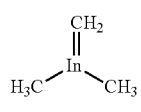
(126) 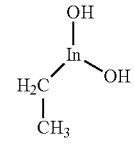
(127) 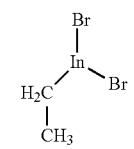
(128) 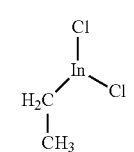
(129) 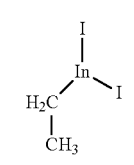
(130) 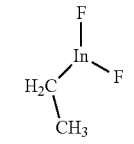
[Chemical Formula 5]
(131) 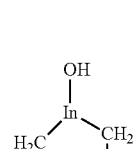
(132) 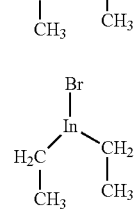

-continued
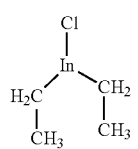 (133)
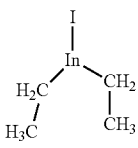 (134)
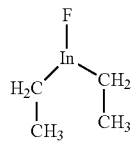 (135)
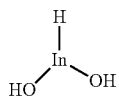 (136)
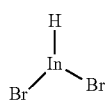 (137)
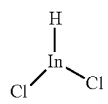 (138)
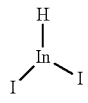 (139)
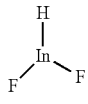 (140)
 (141)
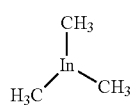 (142)
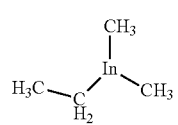 (143)
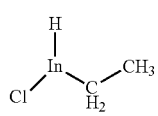 (144)
 (145)
 (146)
-continued
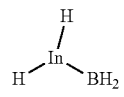 (147)
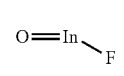 (148)
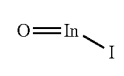 (149)
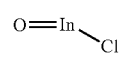 (150)
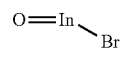 (151)
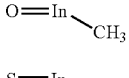 (152)
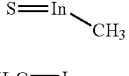 (153)
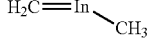 (154)
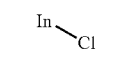 (155)
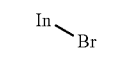 (156)
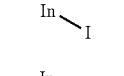 (157)
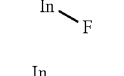 (158)
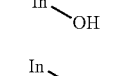 (159)
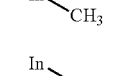 (160)
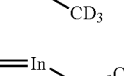 (161)
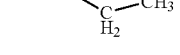 (162)
[Chemical Formula 6]
 (163)
 (164)
 (165)

(166) 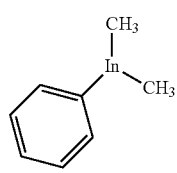
(167) 
(168) 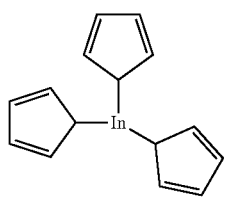
(169) 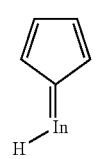
(170) 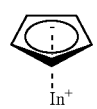
(171) 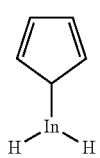
(172) 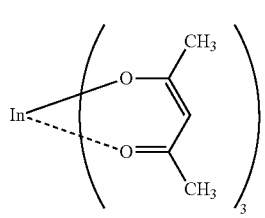
(173) 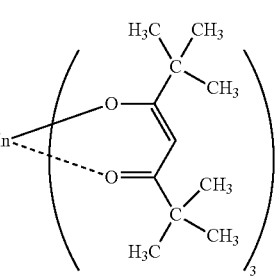
(174) 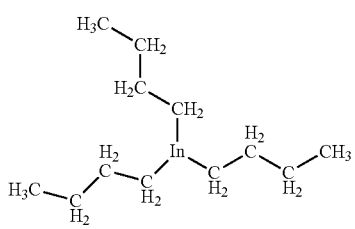
(175) 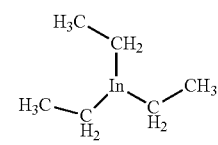
(176) 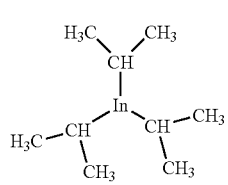
(177) 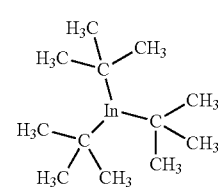
(178) 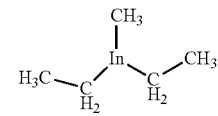
(179) 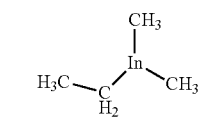
(180) 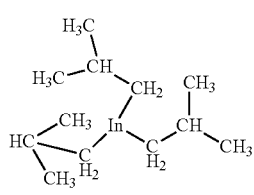
(181) 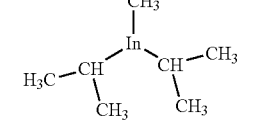
(182) 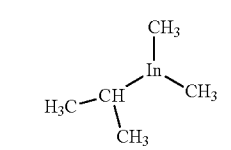

[Chemical Formula 7]
(183) 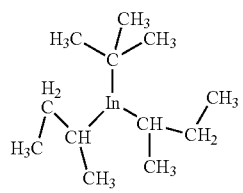
(184) 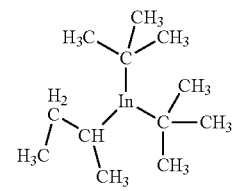
(185) 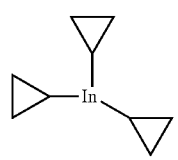
(186) 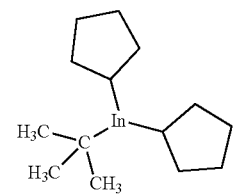
(187) 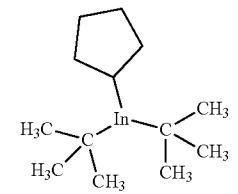
(188) 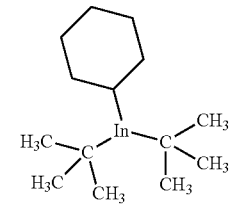
(189) 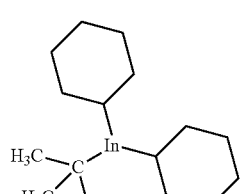
(190) 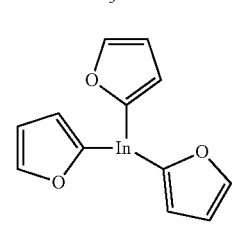
(191) 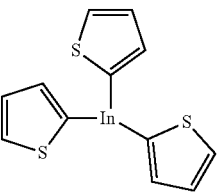
(192) 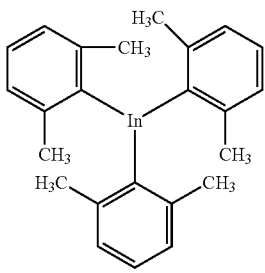
(193) 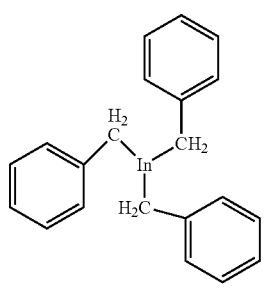
(194) 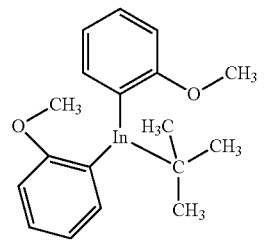
(195) 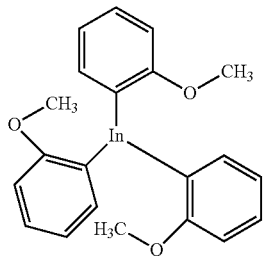
(196) 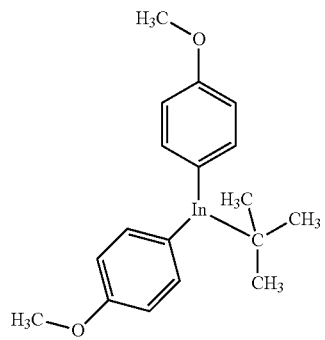

-continued
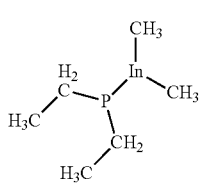 (197)
[Chemical Formula 8]
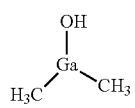 (201)
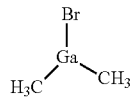 (202)
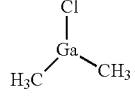 (203)
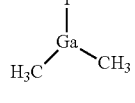 (204)
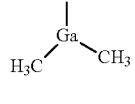 (205)
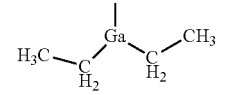 (206)
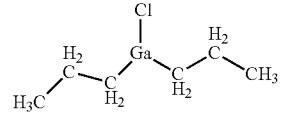 (207)
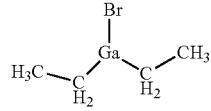 (208)
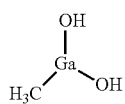 (209)
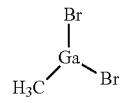 (210)
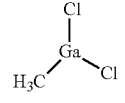 (211)
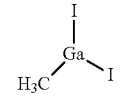 (212)
-continued
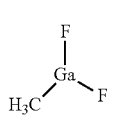 (213)
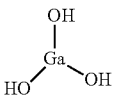 (214)
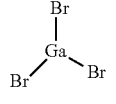 (215)
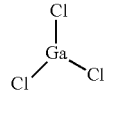 (216)
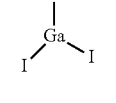 (217)
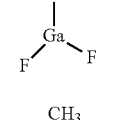 (218)
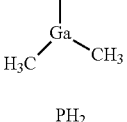 (219)
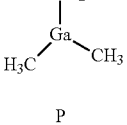 (220)
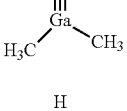 (221)
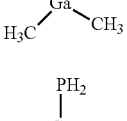 (222)
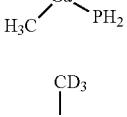 (223)
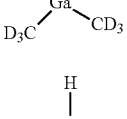 (224)
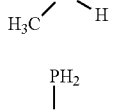 (225)
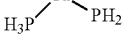 (226)

-continued
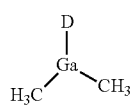 (227)
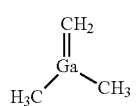 (228)
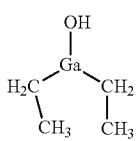 (229)
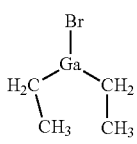 (230)
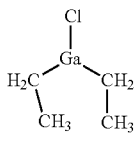 (231)
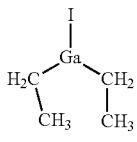 (232)
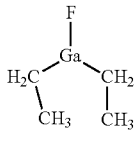 (233)
[Chemical Formula 9]
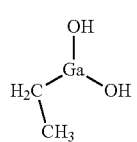 (234)
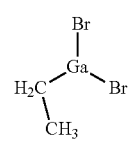 (235)
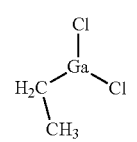 (236)
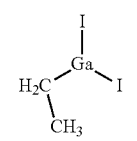 (237)
-continued
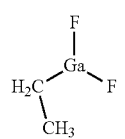 (238)
 (239)
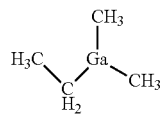 (240)
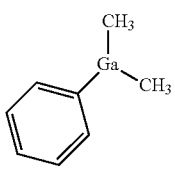 (241)
(242)
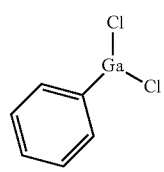 (243)
(244)
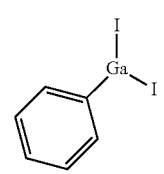 (245)
(246)
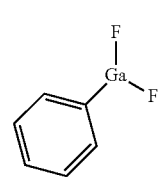 (247)

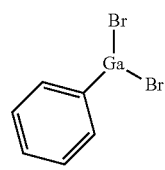 (248)
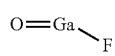 (249)
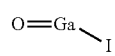 (250)
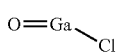 (251)
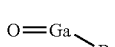 (252)
 (253)
 (254)
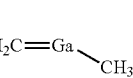 (255)
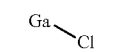 (256)
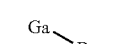 (257)
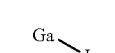 (258)
 (259)
 (260)
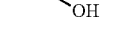 (261)
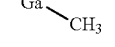 (262)
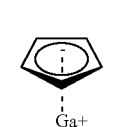 (263)
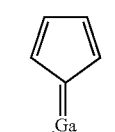 (264)
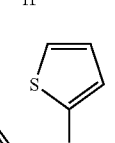 (265)
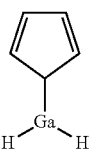 (266)
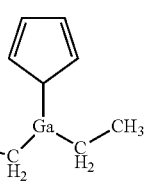 (267)
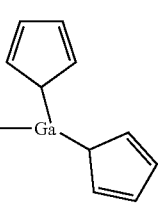 (268)
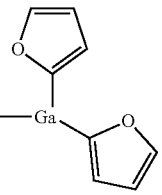 (269)
[Chemical Formula 10]
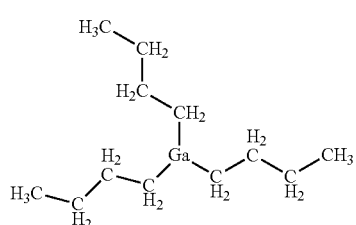 (270)
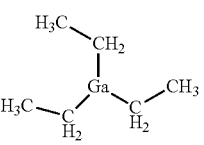 (271)
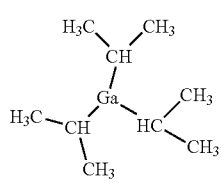 (272)
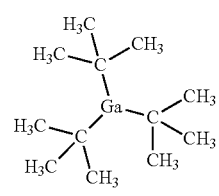 (273)

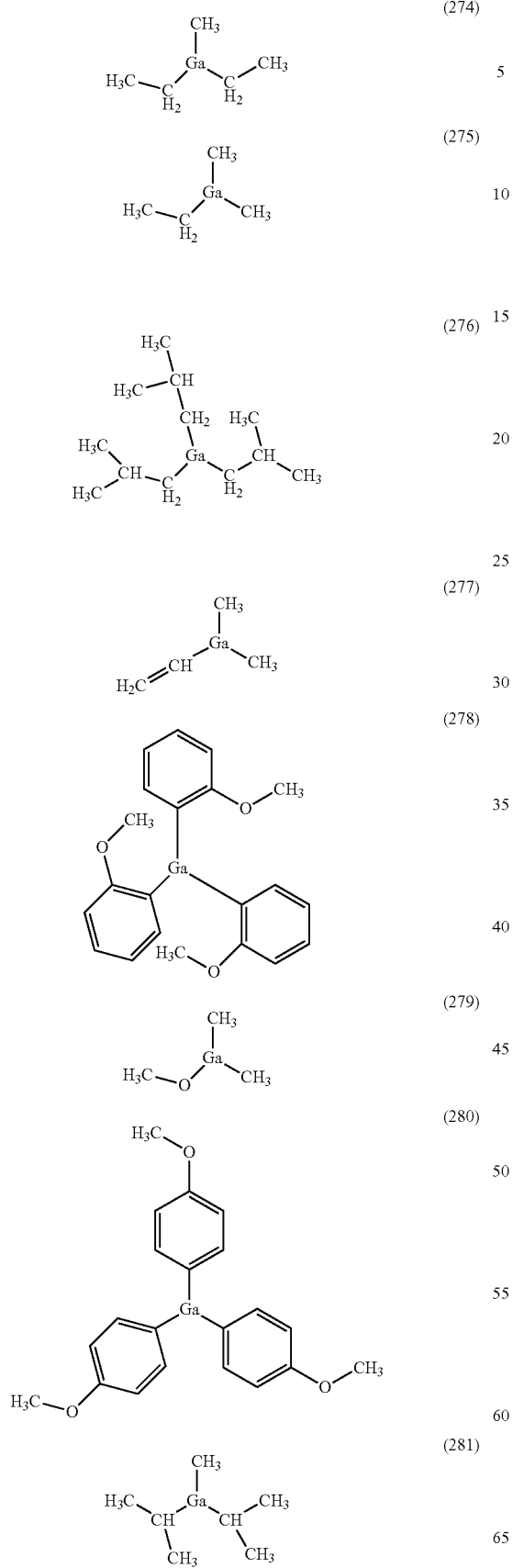
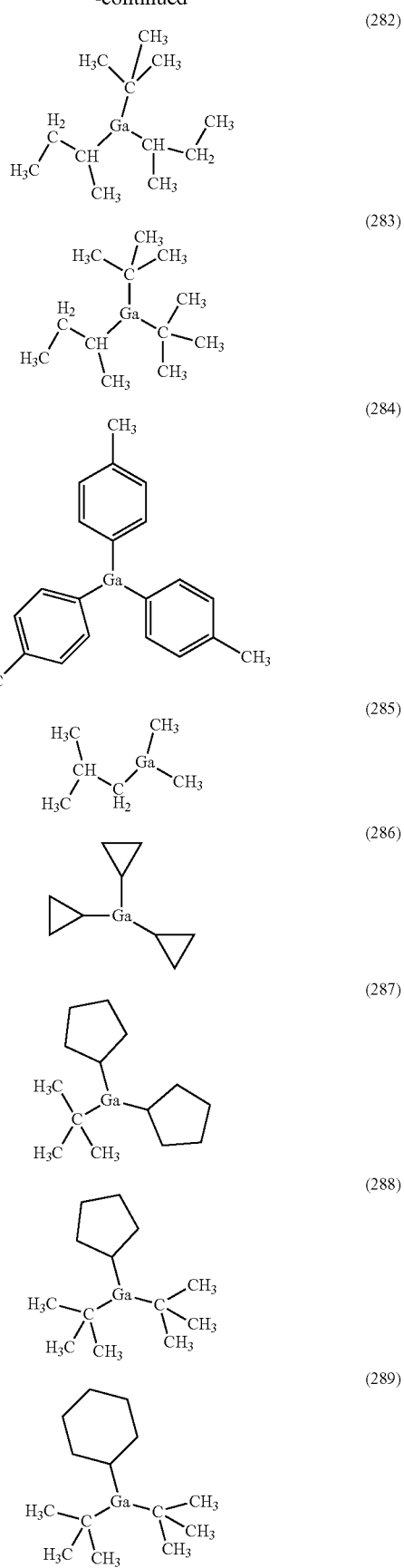

[Chemical Formula 11]
(290) 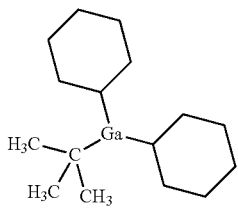
(291) 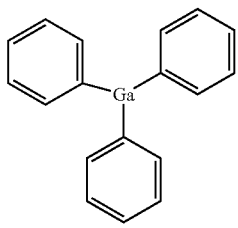
(292) 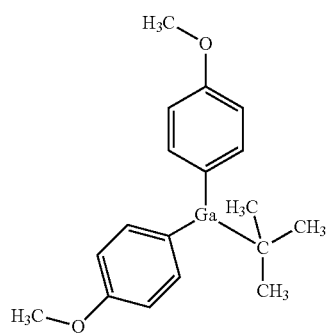
(293) 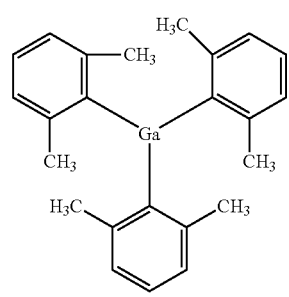
(294) 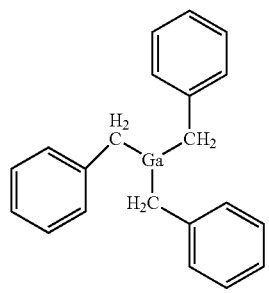
(295) 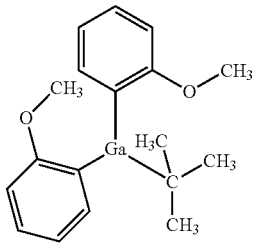
(296) 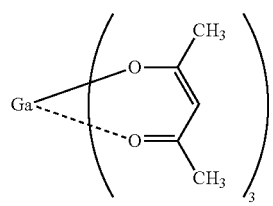
(297) 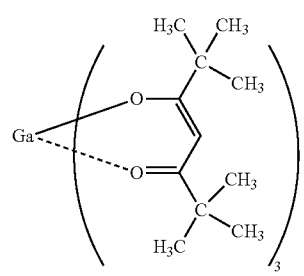
[Chemical Formula 12]
(301) 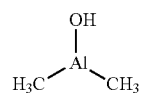
(302) 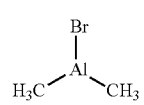
(303) 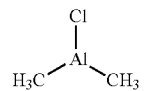
(304) 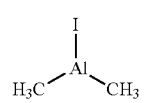
(305) 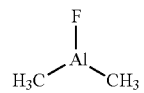
(306) 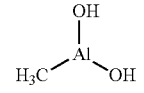

-continued
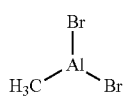 (307)
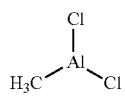 (308)
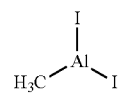 (309)
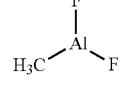 (310)
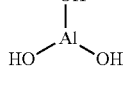 (311)
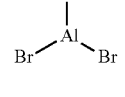 (312)
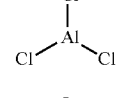 (313)
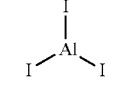 (314)
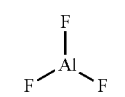 (315)
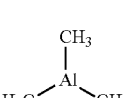 (316)
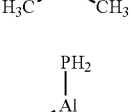 (317)
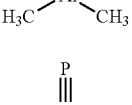 (318)
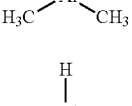 (319)
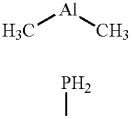 (320)
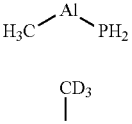 (321)
-continued
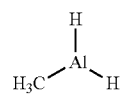 (322)
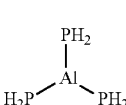 (323)
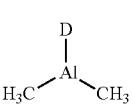 (324)
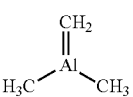 (325)
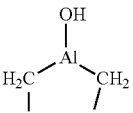 (326)
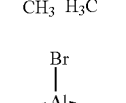 (327)
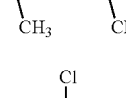 (328)
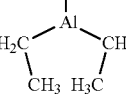 (329)
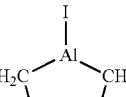 (330)
[Chemical Formula 13]
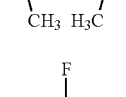 (331)
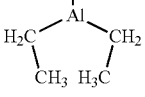 (332)
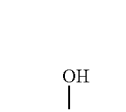 (333)

-continued
(334) 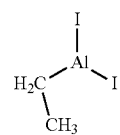
(335) 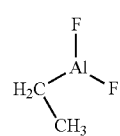
(336) 
(337) 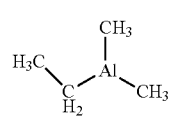
(338) 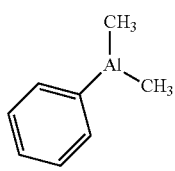
(339) 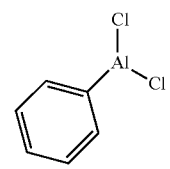
(340) 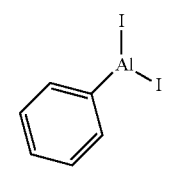
(341) 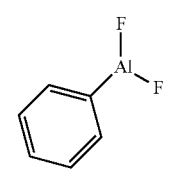
(342) 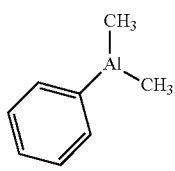
(343) 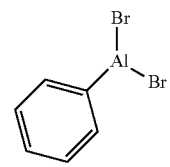
(344) 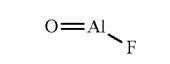
-continued
(345) 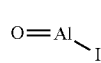
(346) 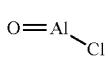
(347) 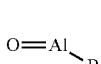
(348) 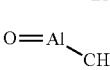
(349) 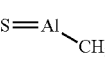
(350) 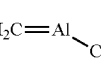
(351) 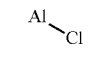
(352) 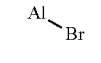
(353) 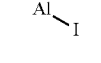
(354) 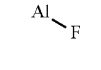
(355) 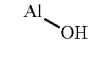
356 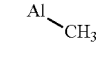
357 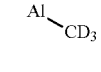
[Chemical Formula 14]
(358) 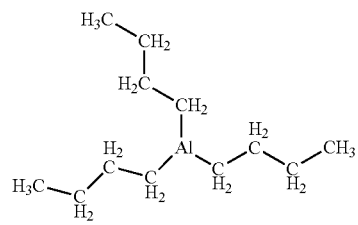
(359) 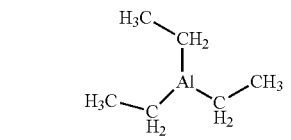
(360) 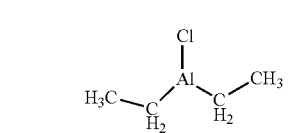
(361) 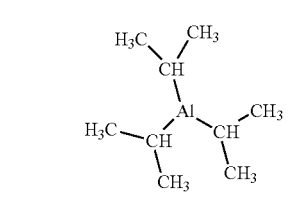

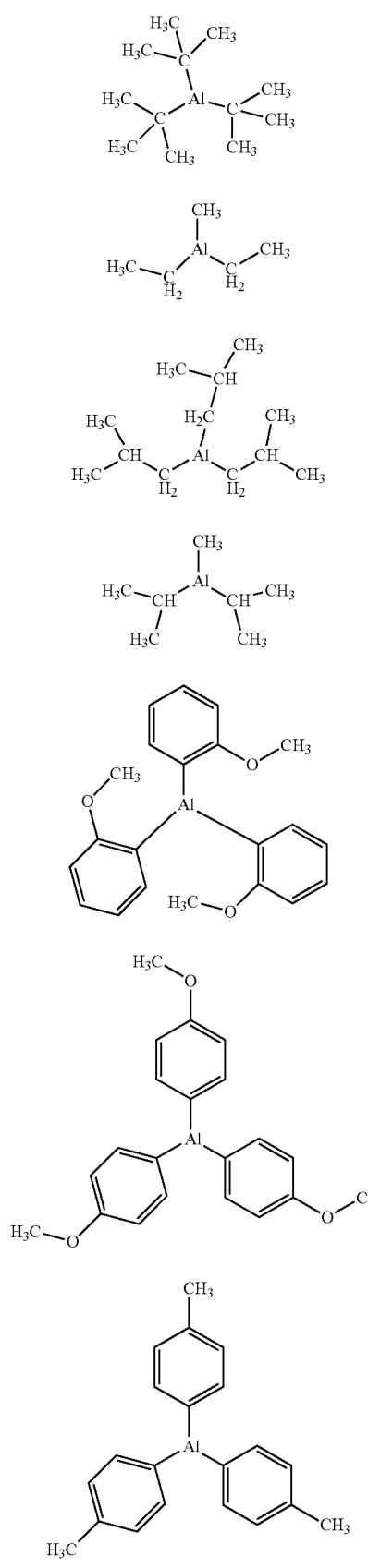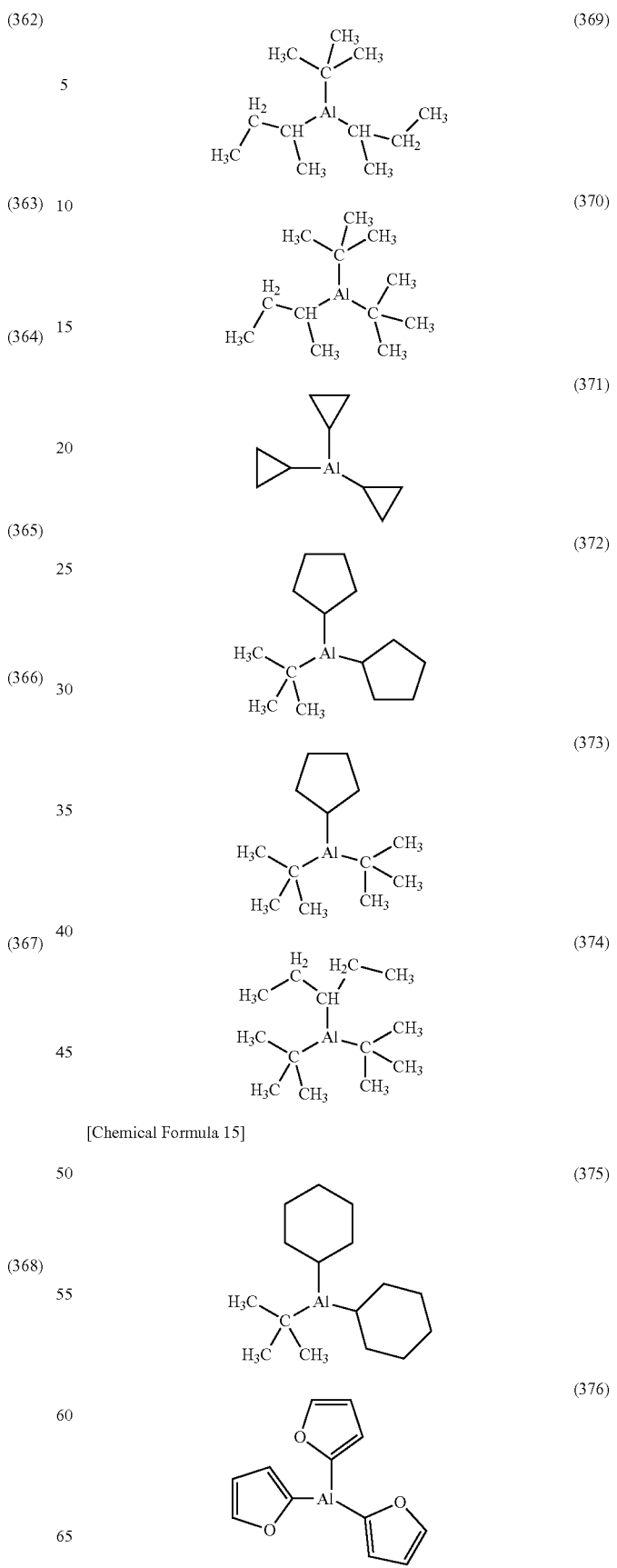
[Chemical Formula 15]

(377) 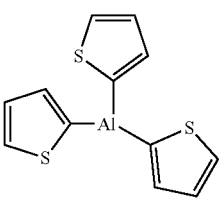
(378) 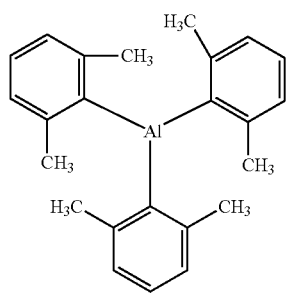
(379) 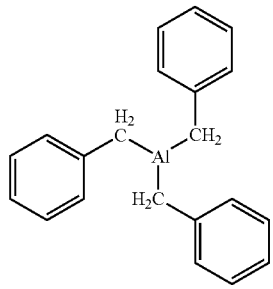
(380) 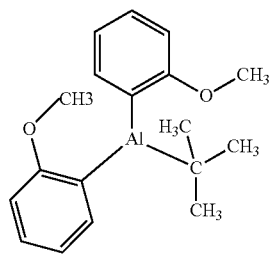
(381) 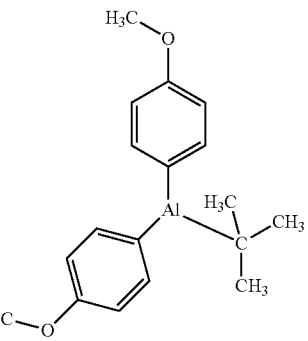
(382) 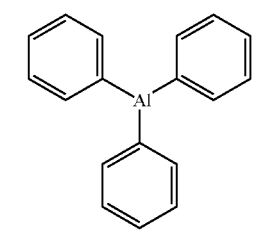
(383) 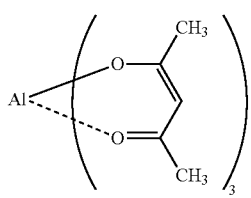
(384) 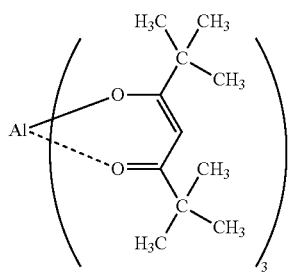
(385) 
(386) 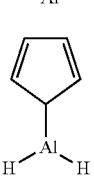
(387) 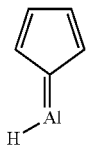
(388) 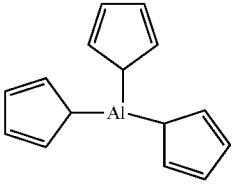
(389) 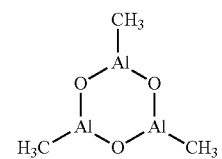
[Chemical Formula 16]
(390) 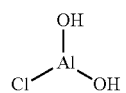
(391)
(392) 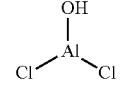

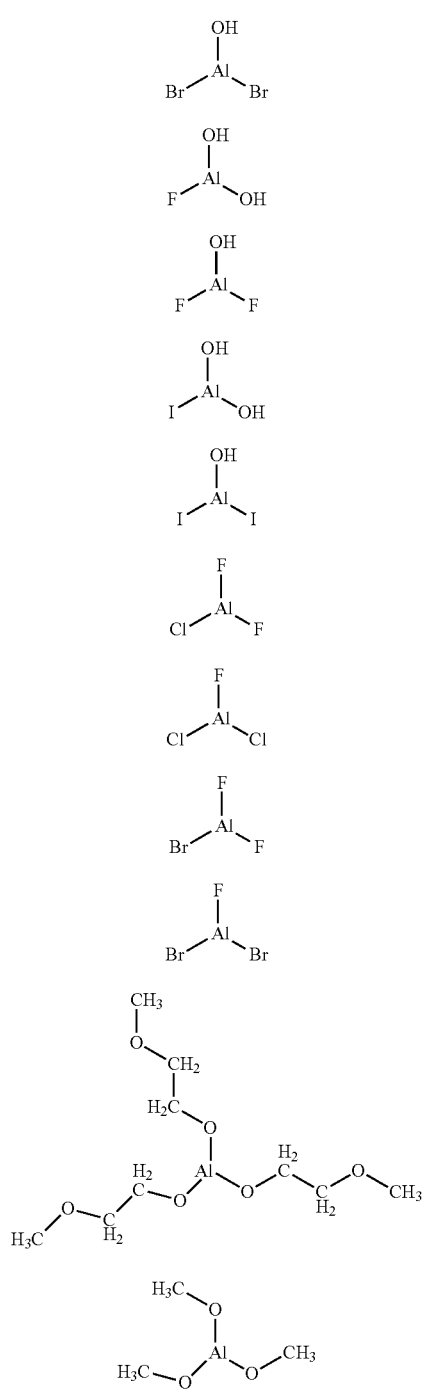
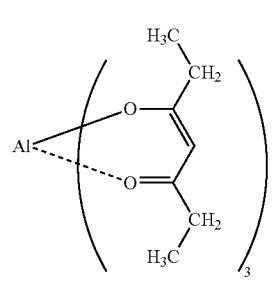
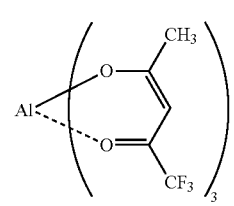
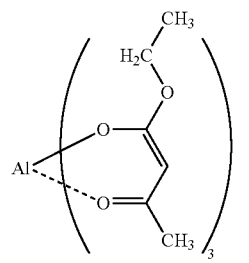
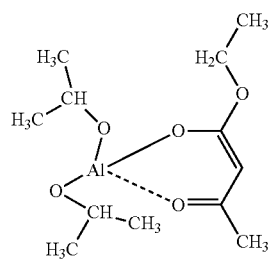
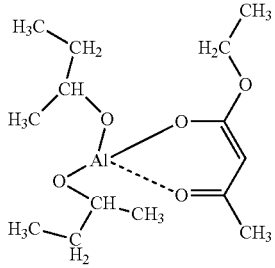
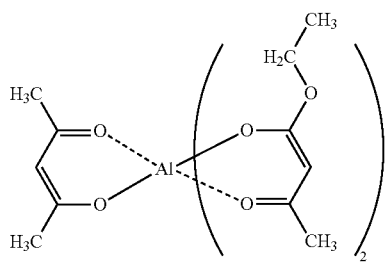

-continued
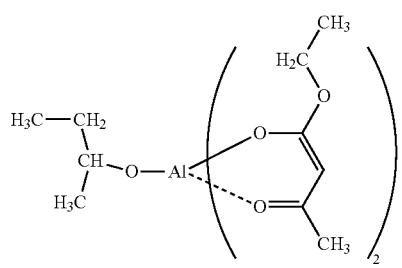 (411)
[Chemical Formula 18]
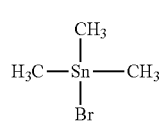 (501)
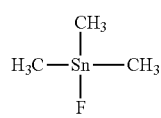 (502)
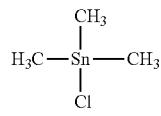 (503)
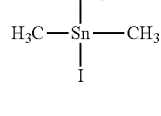 (504)
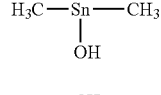 (505)
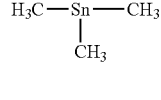 (506)
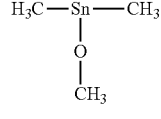 (507)
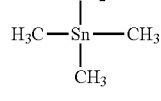 (508)
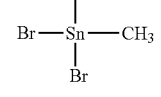 (509)
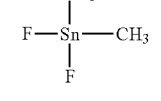 (510)
-continued
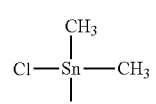 (511)
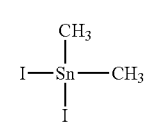 (512)
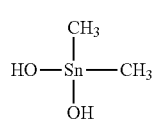 (513)
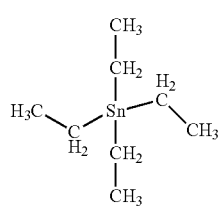 (514)
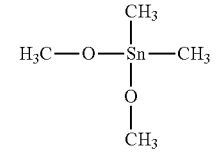 (515)
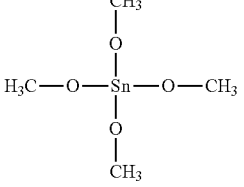 (516)
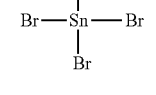 (517)
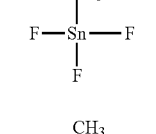 (518)
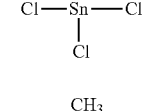 (519)
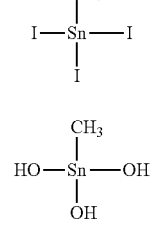 (520)
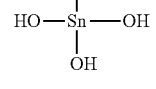 (521)

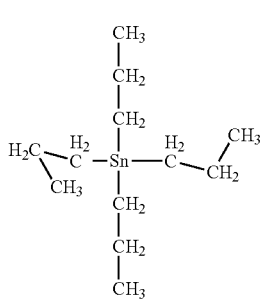 (522)
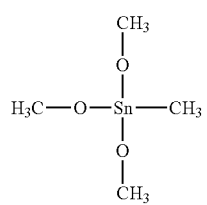 (523)
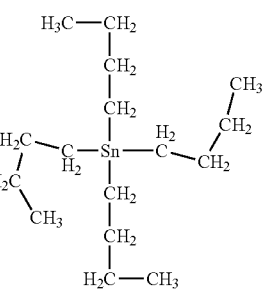 (524)
[Chemical Formula 19]
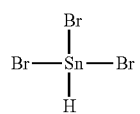 (525)
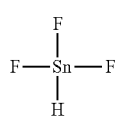 (526)
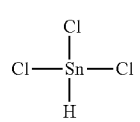 (527)
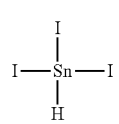 (528)
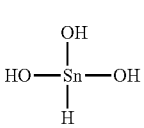 (529)
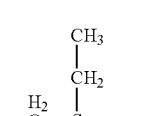 (530)
(531)
(532)
(533)
(534)
(535)
(536)
(537)
(538)
(539)
(540)
(541)
(542)
(543)

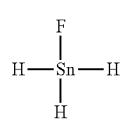 (544)
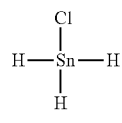 (545)
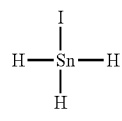 (546)
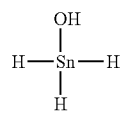 (547)
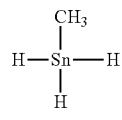 (548)
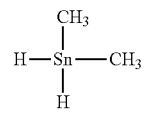 (549)
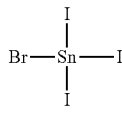 (550)
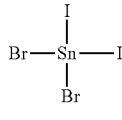 (551)
[Chemical Formula 20]
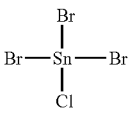 (552)
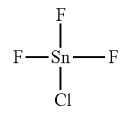 (553)
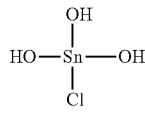 (554)
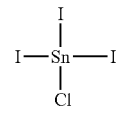 (555)
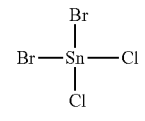 (556)
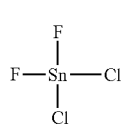 (557)
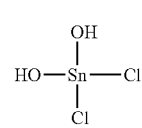 (558)
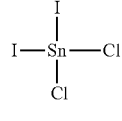 (559)
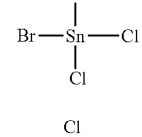 (560)
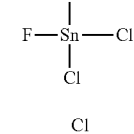 (561)
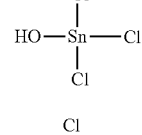 (562)
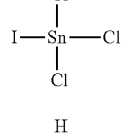 (563)
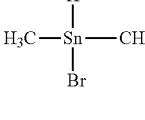 (564)
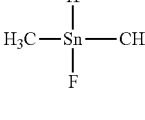 (565)
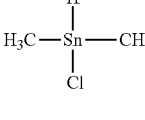 (566)
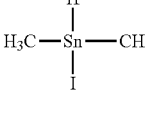 (567)
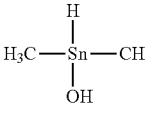 (568)
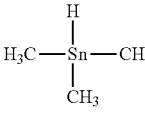 (569)

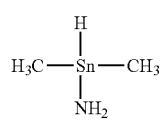 (570)
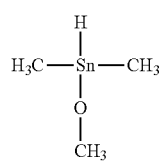 (571)
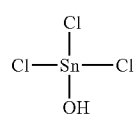 (572)
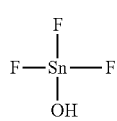 (573)
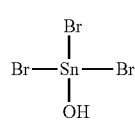 (574)
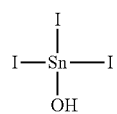 (575)
[Chemical Formula 21]
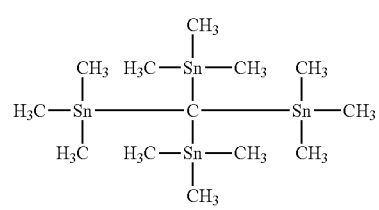 (576)
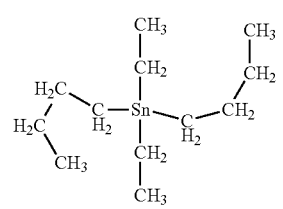 (577)
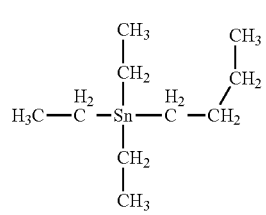 (578)
 (579)
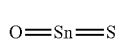 (580)
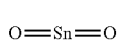 (581)
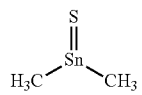 (582)
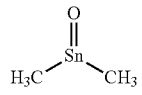 (583)
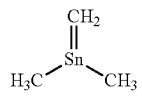 (584)
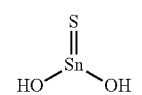 (585)
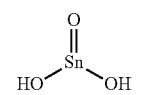 (586)
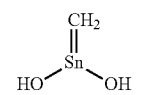 (587)
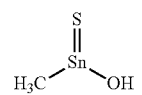 (588)
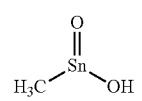 (589)
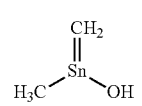 (590)
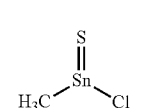 (591)
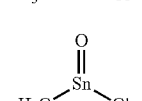 (592)
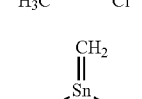 (593)
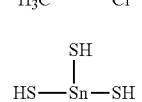 (594)
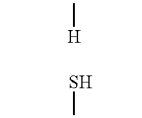 (595)
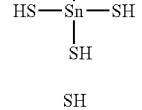 (596)

-continued
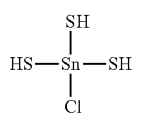 (597)
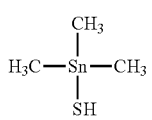 (598)
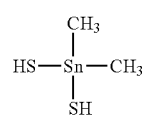 (599)
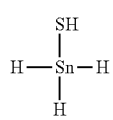 (600)
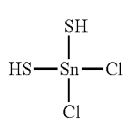 (601)
[Chemical Formula 22]
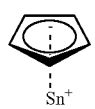 (602)
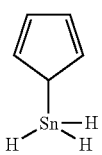 (603)
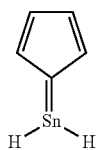 (604)
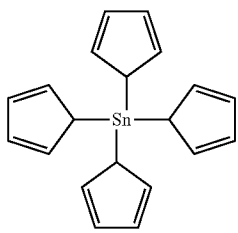 (605)
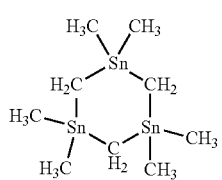 (606)
-continued
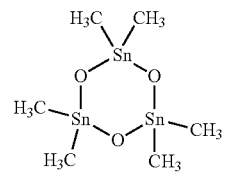 (607)
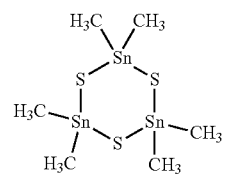 (608)
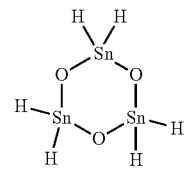 (609)
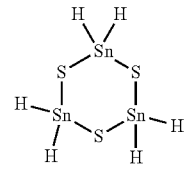 (610)
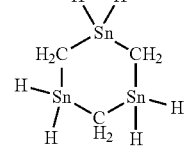 (611)
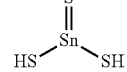 (612)
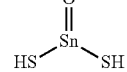 (613)
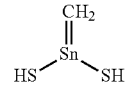 (614)
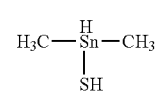 (615)
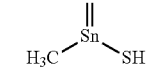 (616)
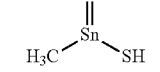 (617)
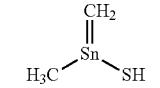 (618)

(619) 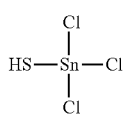
[Chemical Formula 23]
(620) 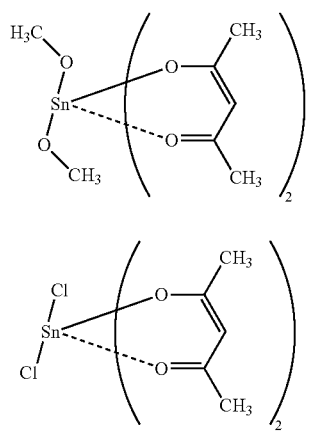
(621)
(622)
(623)
(624)
(625) 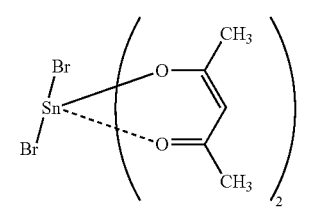
(626) 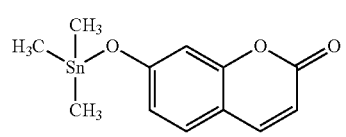
(627) 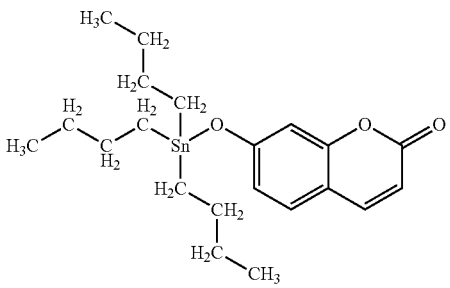
(628) 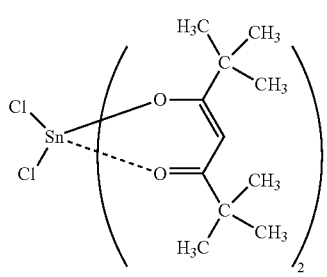
[Chemical Formula 24]
(629) 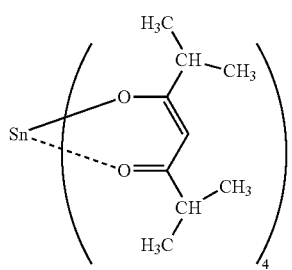
(630) 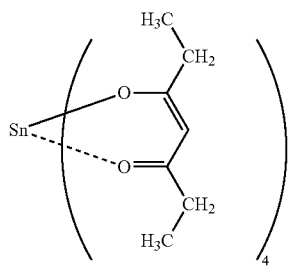
(631) 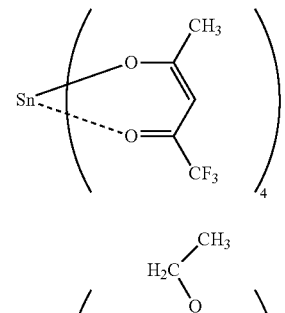
(632) 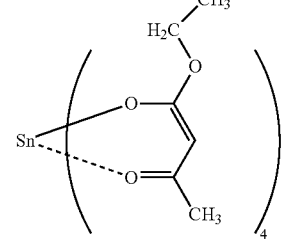

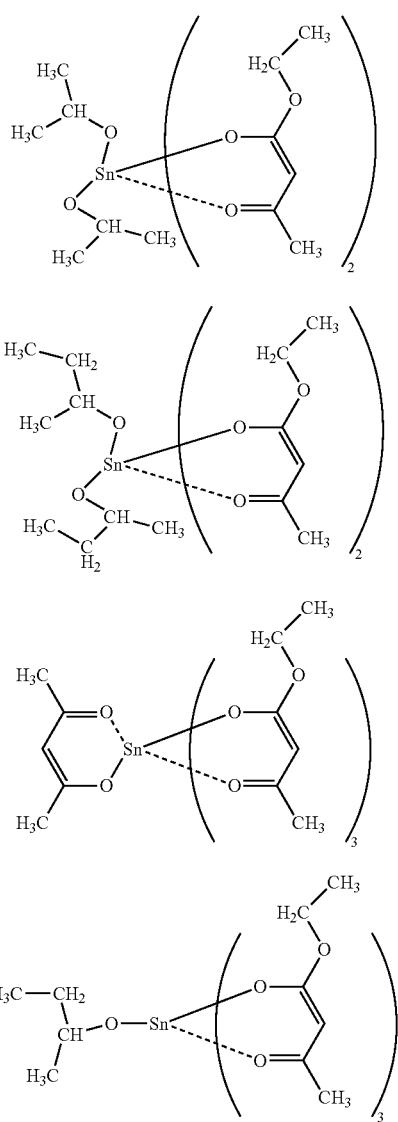
(633)
(634)
(635)
(636)
[Chemical Formula 25]
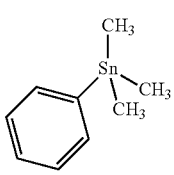
(637)
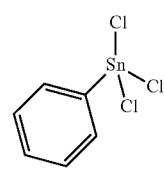
(638)
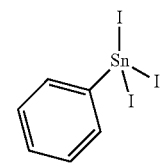
(639)
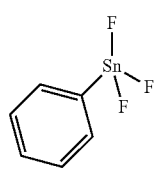
(640)
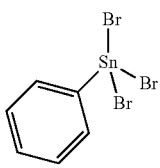
(641)
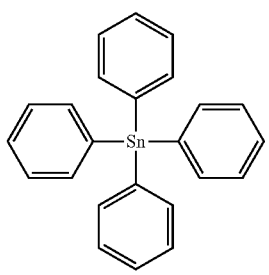
(642)
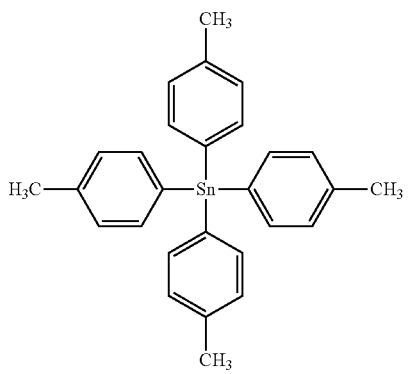
(643)
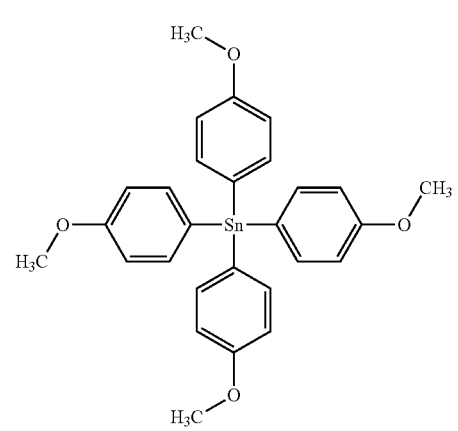
(644)

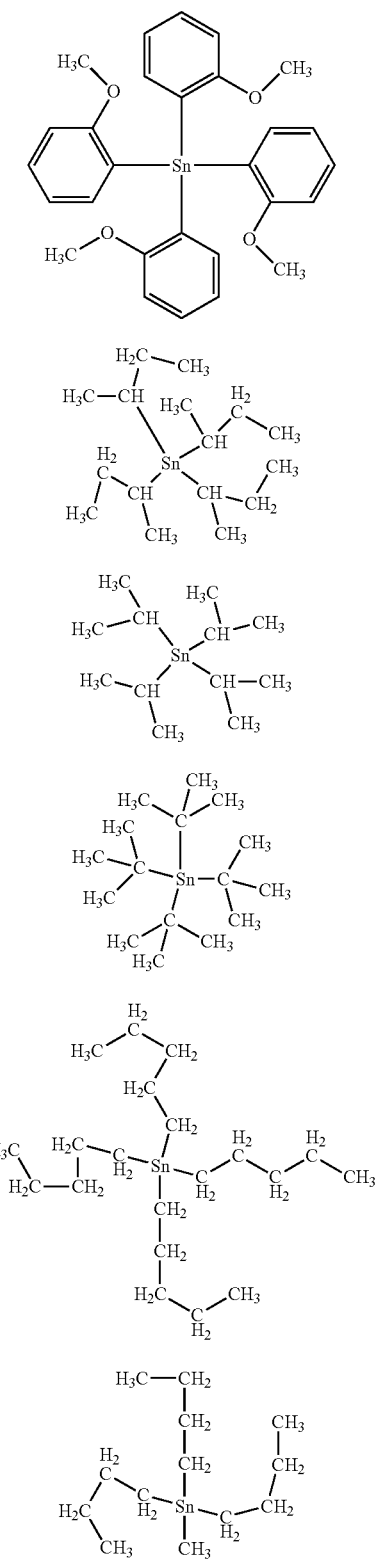
[Chemical Formula 26]
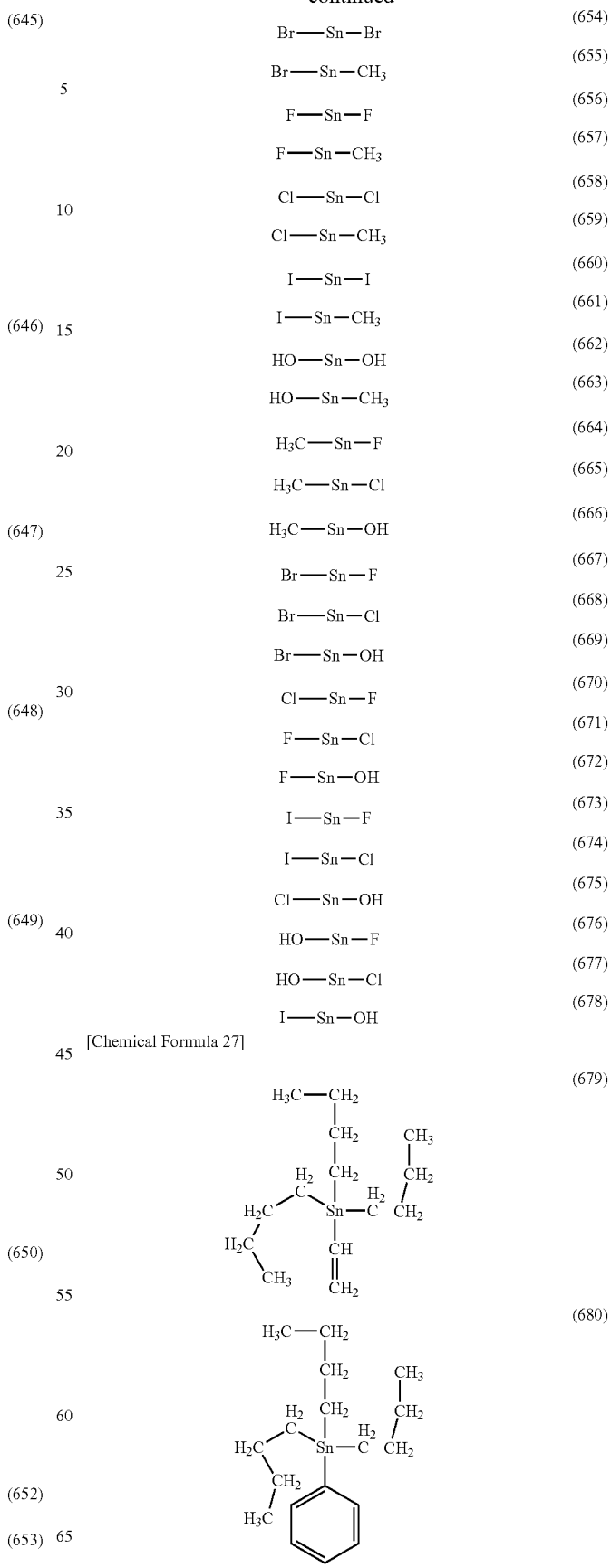
[Chemical Formula 27]

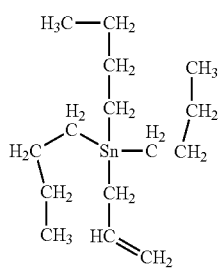
(681)
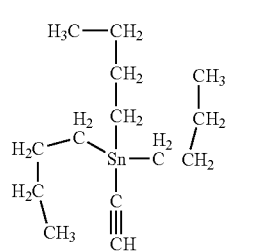
(682)
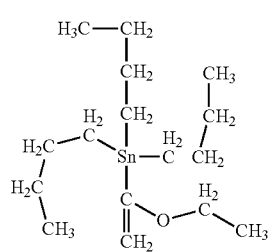
(683)
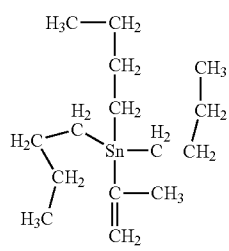
(684)
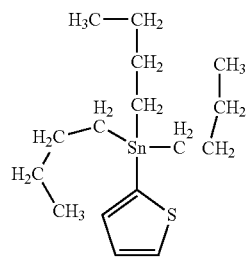
(685)
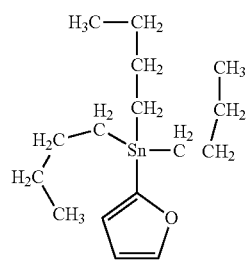
(686)
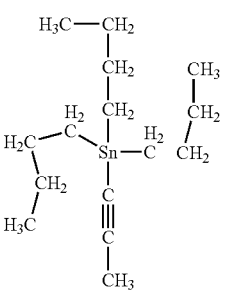
(687)
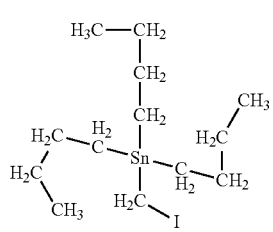
(688)
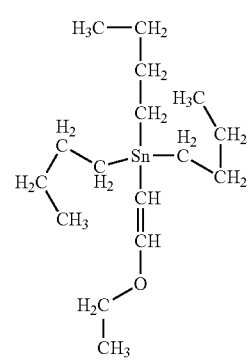
(689)
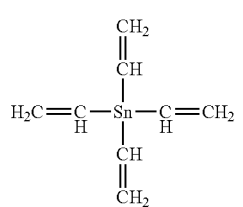
(690)
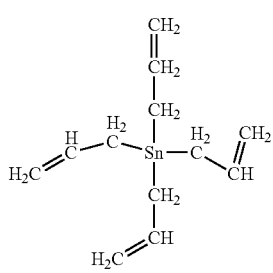
(691)
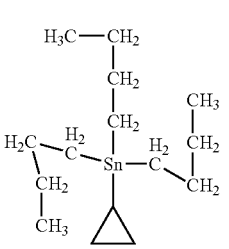
(692)

(693) 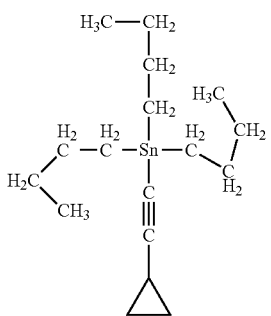
[Chemical Formula 28]
(694) 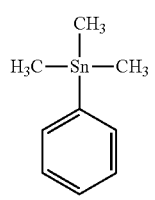
(695) 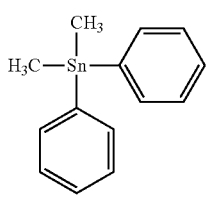
(696) 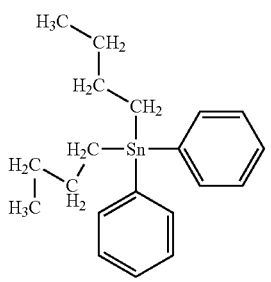
(697) 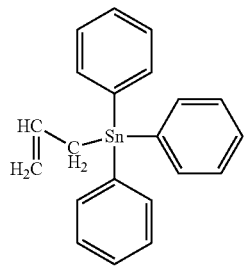
(698) 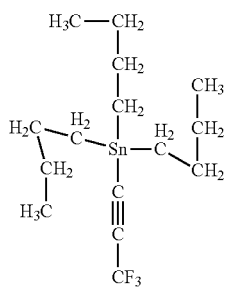
(699) 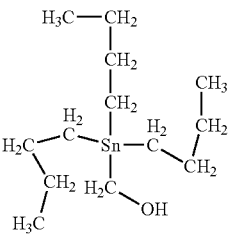
(700) 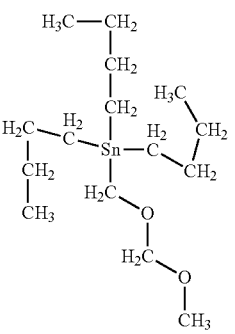
(701) 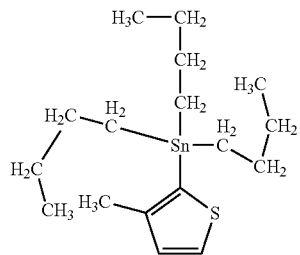
(702) 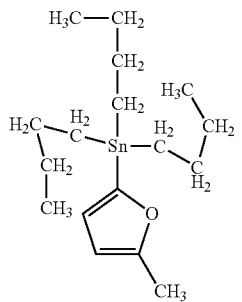
(703) 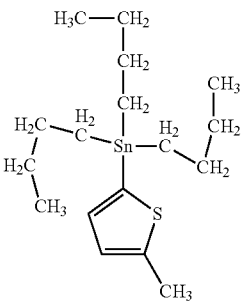

-continued
(704) 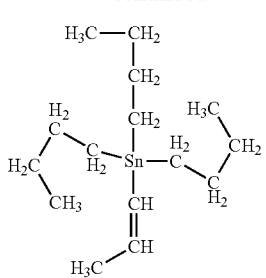
(705) 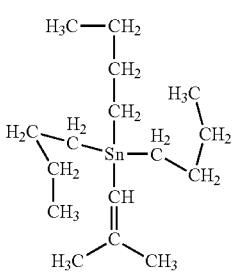
(706) 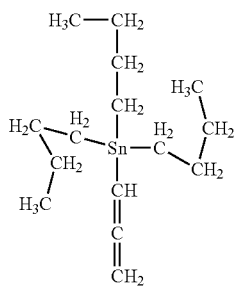
(707) 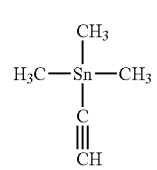
(708) 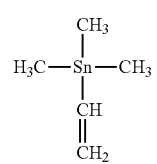
(709) 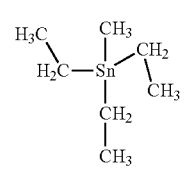
(710) 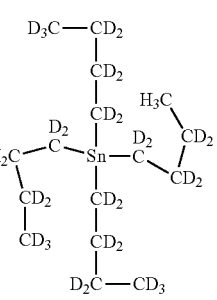
-continued
[Chemical Formula 29]
(711) 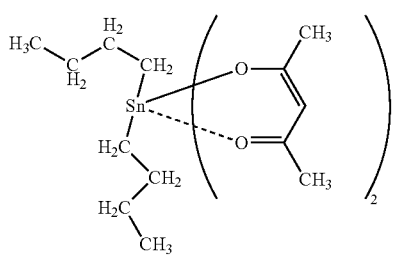
(712) 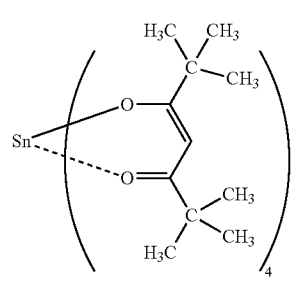
(713) 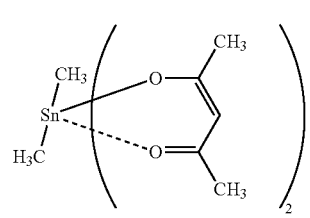
(714) 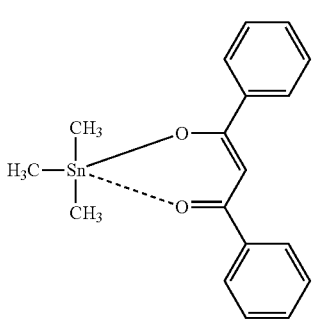
(715) 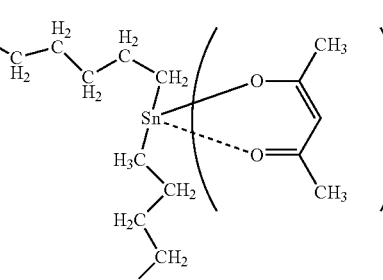

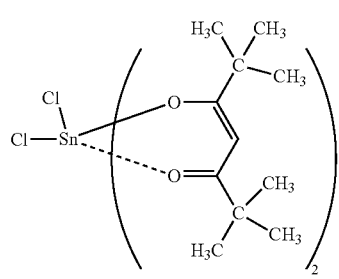
(716)
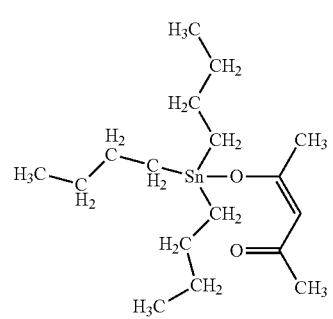
(717)
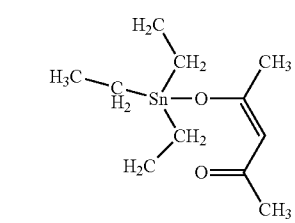
(718)
[Chemical Formula 30]
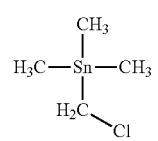
(719)
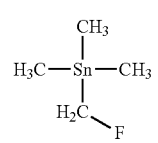
(720)
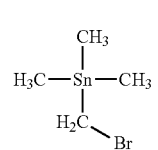
(721)
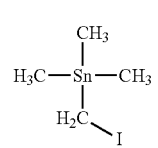
(722)
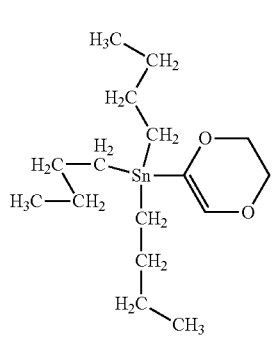
(723)
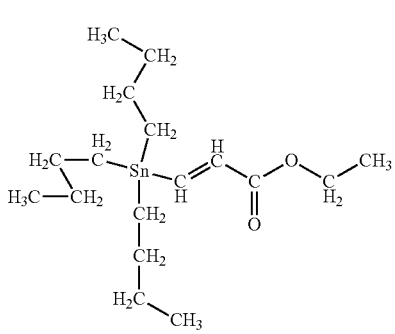
(724)
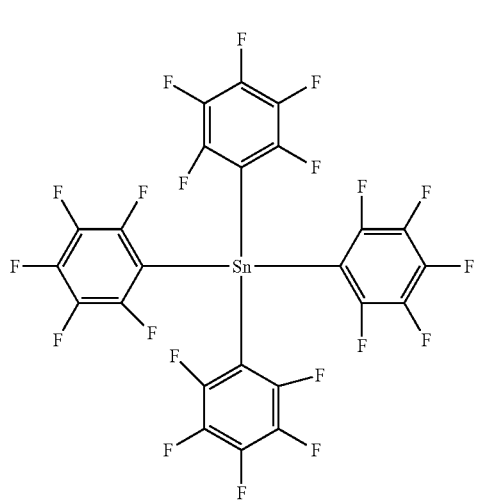
(725)
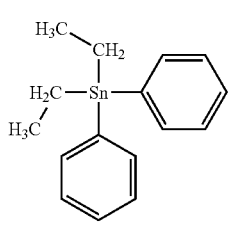
(726)
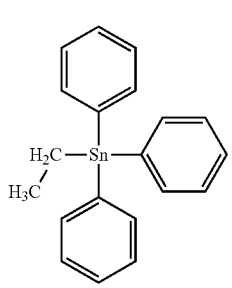
(727)

(728) 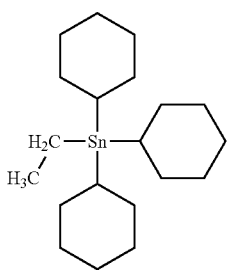
(729) 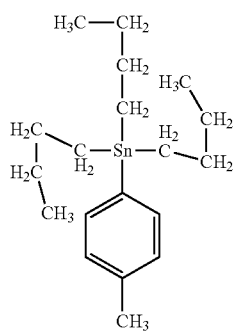
(730) 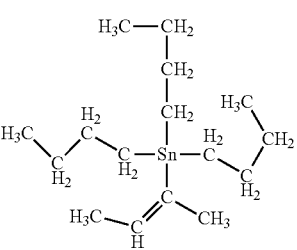
(731) 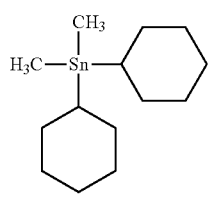
(732) 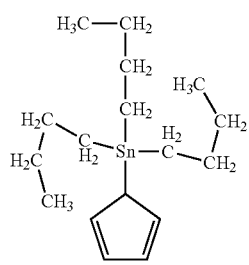
(733) 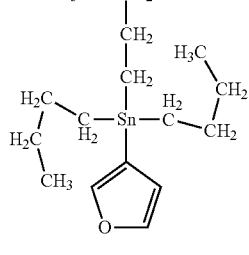
(734) 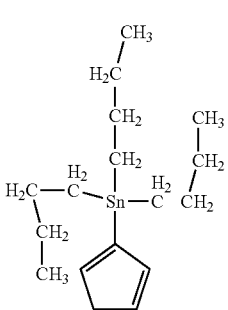
[Chemical Formula 31]
(735) 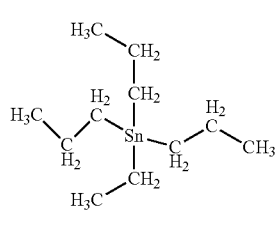
(736) 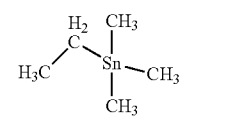
(737) 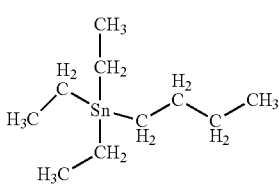
(738) 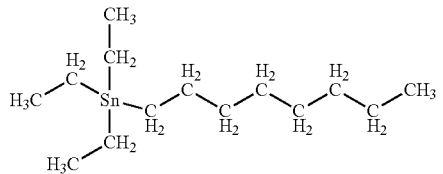
(739) 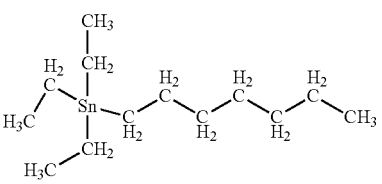
(740) 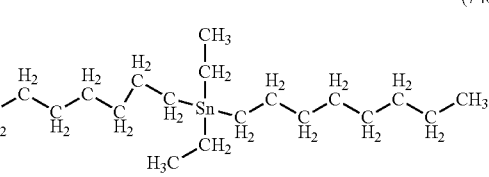
(741)

-continued
(742)
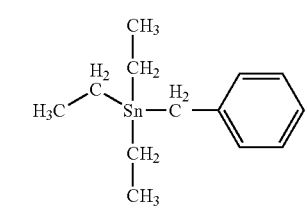
(743)
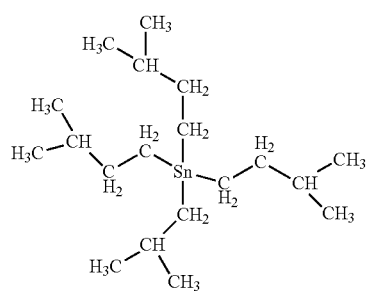
(744)
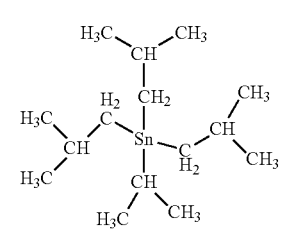
(745)
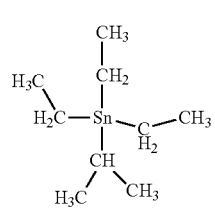
(746)
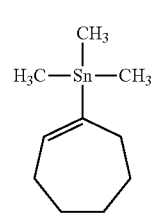
(747)
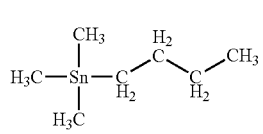
(748)
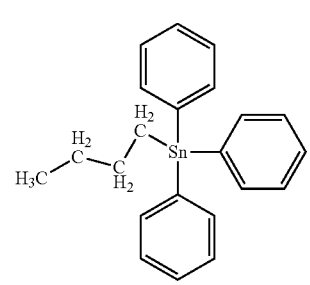
-continued
(749)
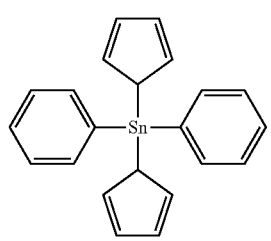
(750)
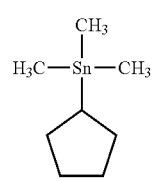
(751)
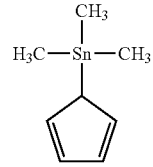
[Chemical Formula 32]
(752)
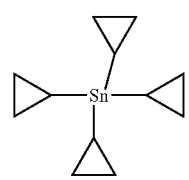
(753)
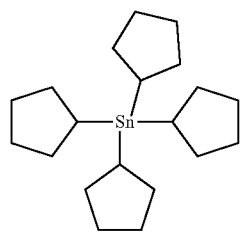
(754)
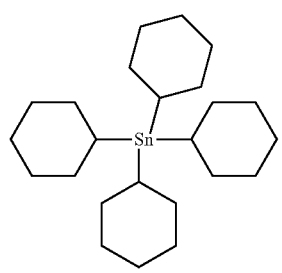
(755)
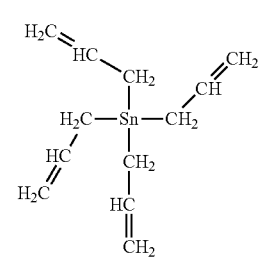

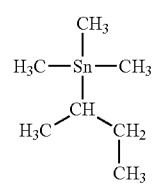(756)
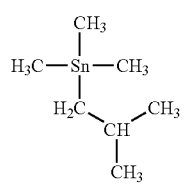(757)
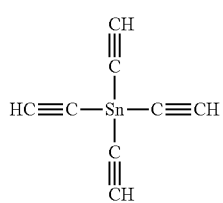(758)
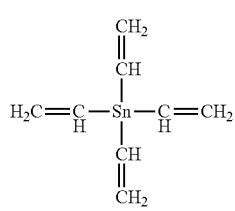(759)
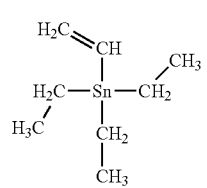(760)
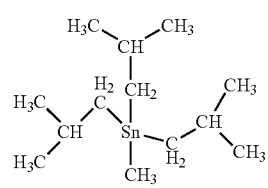(761)
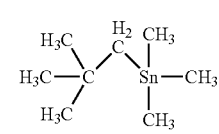(762)
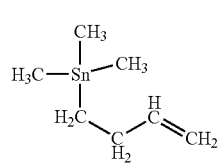(763)
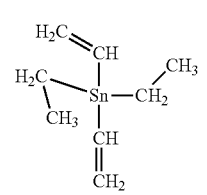(764)
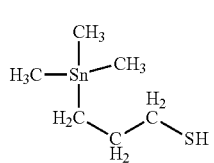(765)
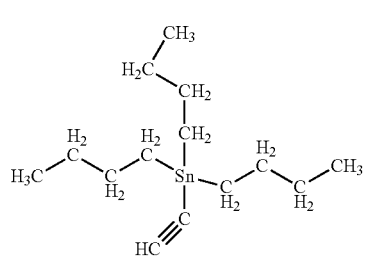(766)
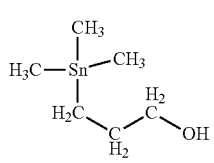(767)
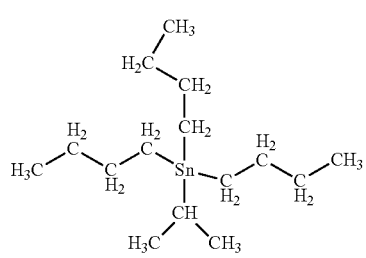(768)
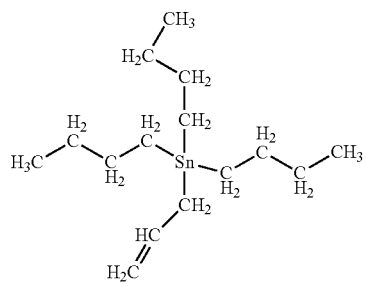(769)
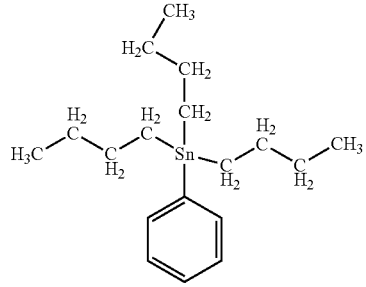(770)

[Chemical Formula 33]
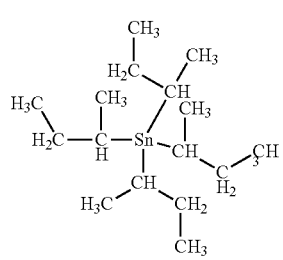 (771)
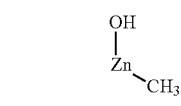 (801)
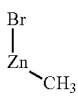 (802)
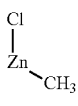 (803)
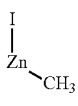 (804)
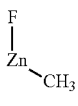 (805)
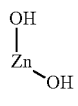 (806)
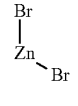 (807)
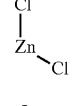 (808)
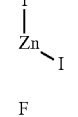 (809)
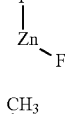 (810)
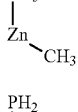 (811)
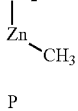 (812)
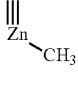 (813)
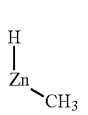 (814)
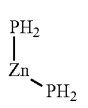 (815)
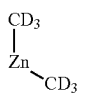 (816)
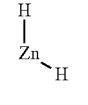 (817)
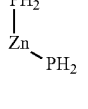 (818)
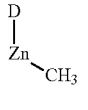 (819)
 (820)
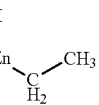 (821)
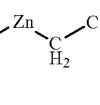 (822)
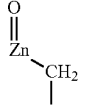 (823)
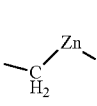 (824)
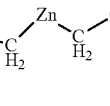 (825)
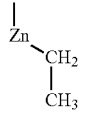 (826)
 (827)

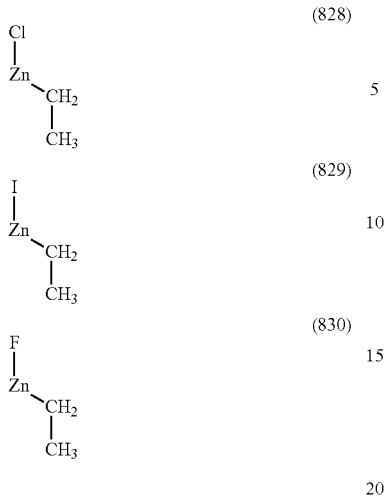
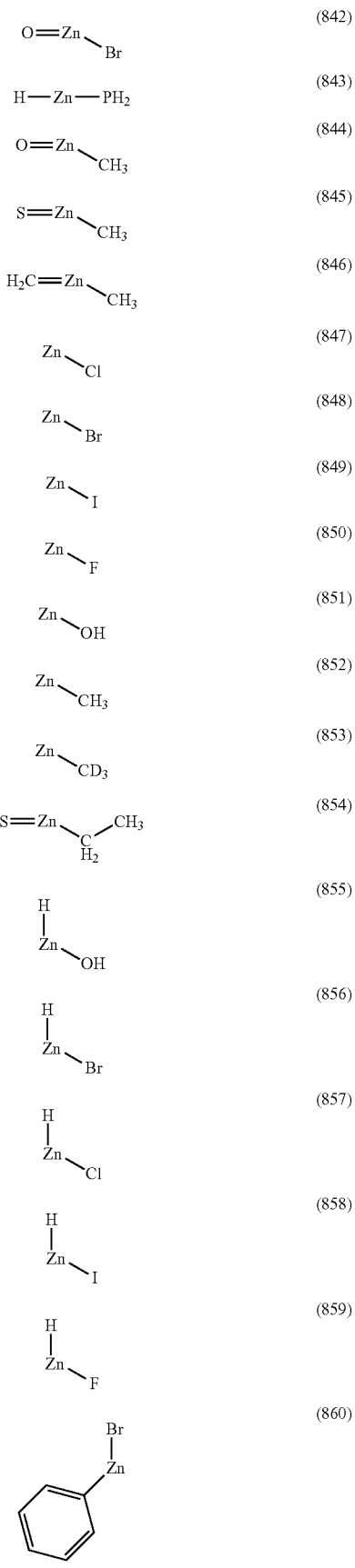

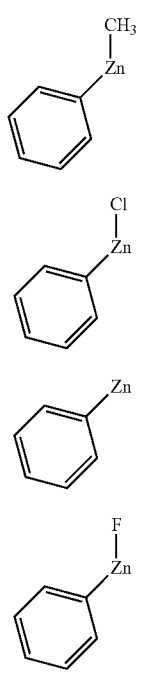

(861)
(862)
(863)
(864)

<Metal Oxide>

A metal oxide has a lattice defect in some cases. Examples of the lattice defect include point defects such as an atomic vacancy and an exotic atom, linear defects such as transition, plane defects such as a grain boundary, and volume defects such as a cavity. Examples of a factor in generating a lattice defect include the deviation of the proportion of the number of atoms in constituent elements (excess or deficiency of constituent atoms) and an impurity.

When a metal oxide is used for a semiconductor layer of a transistor, a lattice defect in the metal oxide might cause generation, capture, or the like of a carrier. Thus, when a metal oxide with a large number of lattice defects is used for a semiconductor layer of a transistor, the electrical characteristics of the transistor might be unstable. Therefore, a metal oxide used for a semiconductor layer of a transistor preferably has a small number of lattice defects.

As for a transistor using a metal oxide, particularly when oxygen vacancies ($V_O$) and impurities are in a channel formation region of the metal oxide, electrical characteristics of the transistor easily vary and the reliability thereof might be degraded. In some cases, hydrogen in the vicinity of an oxygen vacancy forms a defect that is an oxygen vacancy into which hydrogen enters (hereinafter sometimes referred to as VoH), which generates an electron serving as a carrier. Therefore, when the channel formation region in the metal oxide includes oxygen vacancies, the transistor tends to have normally-on characteristics (a channel is generated even when no voltage is applied to a gate electrode and a current flows through the transistor). Therefore, the oxygen vacancies and the impurities are preferably reduced as much as possible in the channel formation region of the metal oxide. In other words, the metal oxide preferably includes an i-type (intrinsic) or substantially i-type channel formation region with a low carrier concentration.

The kind of a lattice defect that is likely to exist in a metal oxide and the number of lattice defects that exist vary depending on the structure of the metal oxide, a method for forming the metal oxide, or the like.

Structures of metal oxides are classified into a single crystal structure and other structures (non-single-crystal structures). Examples of non-single-crystal structures include a CAAC structure, a polycrystalline structure, an nc structure, an amorphous-like (a-like) structure, and an amorphous structure. An a-like structure has a structure between an nc structure and an amorphous structure. Note that the classification of crystal structures will be described later.

A metal oxide having an a-like structure and a metal oxide having an amorphous structure each include a void or a low-density region. That is, a metal oxide having an a-like structure and a metal oxide having an amorphous structure each have lower crystallinity than a metal oxide having an nc structure and a metal oxide having a CAAC structure. Moreover, a metal oxide having an a-like structure has higher hydrogen concentration in the metal oxide than a metal oxide having an nc structure and a metal oxide having a CAAC structure. Thus, a lattice defect is likely to be generated in a metal oxide having an a-like structure and a metal oxide having an amorphous structure.

Therefore, a metal oxide with high crystallinity is preferably used for a semiconductor layer of a transistor. For example, a metal oxide having a CAAC structure or a metal oxide having a single crystal structure is preferably used. The use of the metal oxide for a transistor enables the transistor to have favorable electrical characteristics. In addition, the transistor can have high reliability.

For the channel formation region of a transistor, a metal oxide that increases the on-state current of the transistor is preferably used. To increase the on-state current of the transistor, the mobility of the metal oxide used for the transistor is increased. To increase the mobility of the metal oxide, the transfer of carriers (electrons in the case of an n-channel transistor) needs to be facilitated or scattering factors that affect the carrier transfer need to be reduced. Note that the carriers flow from the source to the drain through the channel formation region. Hence, the on-state current of the transistor can be increased by providing a channel formation region through which carriers can easily flow in the channel length direction.

Here, it is preferable to use a metal oxide with high crystallinity for a metal oxide including a channel formation region. The crystal preferably has a crystal structure where a plurality of layers (for example, a first layer, a second layer, and a third layer) are stacked. That is, the crystal has a layered crystal structure (also referred to as a layered crystal or a layered structure). At this time, the direction of the c-axis of the crystal is the direction in which the plurality of layers are stacked. Examples of a metal oxide including the crystal include a single crystal oxide semiconductor and a c-axis aligned crystalline oxide semiconductor (CAAC-OS).

The c-axis of the above crystal is preferably aligned in the normal direction with respect to the formation surface or film surface of the metal oxide. This enables the plurality of layers to be placed parallel to or substantially parallel to the formation surface or film surface of the metal oxide. In other words, the plurality of layers extend in the channel length direction.

The above layered crystal structure including three layers is as follows, for example. The first layer has a coordination geometry of atoms that has an octahedral structure of oxygen in which a metal included in the first layer is positioned at the center. The second layer has a coordination geometry of atoms that has a trigonal bipyramidal or tetrahedral structure of oxygen in which a metal included in the second layer is positioned at the center. The third layer has a coordination geometry of atoms that has a trigonal bipyramidal or tetrahedral structure of oxygen in which a metal included in the third layer is positioned at the center.

Examples of the crystal structure of the above crystal are a $YbFe_2O_4$ structure, a $Yb_2Fe_3O_7$ structure, their deformed structures, and the like.

Preferably, each of the first to third layers is composed of one metal element or a plurality of metal elements with the same valence and oxygen. The valence of the one or plurality of metal elements contained in the first layer is preferably equal to the valence of the one or plurality of metal elements contained in the second layer. The first layer and the second layer may contain the same metal element. The valence of the one or plurality of metal elements contained in the first layer is preferably different from the valence of the one or plurality of metal elements contained in the third layer.

The above structure can increase the crystallinity of the metal oxide, which leads to an increase in the mobility of the metal oxide. Thus, the use of the metal oxide for the channel formation region of the transistor increases the on-state current of the transistor, leading to an improvement in the electrical characteristics of the transistor.

The metal oxide of one embodiment of the present invention preferably contains at least indium or zinc. In particular, indium and zinc are preferably contained. In addition to them, at least one metal element with the same valence as indium or zinc is preferably contained. Examples of the metal element include gallium, aluminum, and tin. Furthermore, one or more elements selected from yttrium, boron, titanium, iron, nickel, germanium, zirconium, molybdenum, lanthanum, cerium, neodymium, hafnium, tantalum, tungsten, magnesium, calcium, cobalt, and the like may be contained.

Here, the case where the metal oxide is an In-M-Zn oxide containing indium (In), an element M, and zinc (Zn) is considered. Note that the element M is aluminum, gallium, yttrium, or tin. Other examples of the element that can be used as the element M include yttrium, boron, titanium, iron, nickel, germanium, zirconium, molybdenum, lanthanum, cerium, neodymium, hafnium, tantalum, tungsten, magnesium, calcium, and cobalt. Note that two or more of the above elements can be used in combination as the element M in some cases.

Examples of the metal oxide of one embodiment of the present invention include an indium zinc oxide (In—Zn oxide), an indium tin oxide (In—Sn oxide), an indium gallium oxide (In—Ga oxide), an indium gallium aluminum oxide (In—Ga—Al oxide), an indium gallium tin oxide (In—Ga—Sn oxide), a gallium zinc oxide (also referred to as Ga—Zn oxide or GZO), an aluminum zinc oxide (Al—Zn oxide), an indium aluminum zinc oxide (also referred to as In—Al—Zn oxide or IAZO), an indium tin zinc oxide (also referred to as In—Sn—Zn oxide or ITZO (registered trademark)), an indium gallium zinc oxide (also referred to as In—Ga—Zn oxide or IGZO), an indium gallium tin zinc oxide (also referred to as In—Ga—Sn—Zn oxide or IGZTO), and an indium gallium aluminum zinc oxide (also referred to as In—Ga—Al—Zn oxide, IGAZO, IGZAO, or IAGZO).

In this embodiment, In—Ga—Zn oxide is sometimes described as an example of a metal oxide.

For the formation of a metal oxide having the layered crystal structure, one atomic layer is preferably formed at a time. Since an ALD method is employed for the formation method of a metal oxide which is one embodiment of the present invention, a metal oxide having the layered crystal structure is easily formed.

Examples of the ALD method include a thermal ALD method, in which a precursor and a reactant react with each other only by a thermal energy, and a plasma-enhanced ALD (PEALD) method, in which a reactant excited by plasma is used.

An ALD method enables one atomic layer to be formed at a time, and has various advantages such as formation of an extremely thin film, deposition on a component with a high aspect ratio, formation of a film with few defects such as pinholes, deposition with excellent coverage, and low-temperature deposition. A PEALD method utilizing plasma is preferable, because deposition at lower temperature is possible in some cases. Note that some precursors used in the ALD method contain an element such as carbon or chlorine. Thus, a film formed by the ALD method sometimes contains an element such as carbon or chlorine in a larger quantity than a film formed by another deposition method. Note that these elements can be quantified by XPS or SIMS. The formation method of a metal oxide of one embodiment of the present invention, which employs an ALD method and one or both of a deposition condition with a high substrate temperature and impurity removal treatment, might form a film with smaller amounts of carbon and chlorine than a method employing an ALD method and neither the condition nor the treatment.

Unlike in a deposition method in which particles ejected from a target or the like are deposited, in an ALD method, a film is formed by reaction at a surface of an object to be processed. Thus, an ALD method is a deposition method that is less likely to be influenced by the shape of an object to be processed and thus enables favorable step coverage. In particular, an ALD method enables excellent step coverage and excellent thickness uniformity, and thus is suitable for the case of covering a surface of an opening portion with a high aspect ratio, for example. On the other hand, an ALD method has a relatively low deposition rate, and thus is preferably used in combination with another deposition method with a high deposition rate such as a CVD method in some cases.

When an ALD method is used, the composition of a film to be formed can be controlled with the amount of introduced source gases. For example, a film with a certain composition can be formed by adjusting the amount of introduced source gases, the number of times of introduction (also referred to as the number of pulses), and the time required for one pulse (also referred to as the pulse time) in an ALD method. Moreover, for example, when the source gas is changed during the deposition in an ALD method, a film whose composition is continuously changed can be formed. In the case where a film is formed while the source gas is changed, as compared with the case where a film is formed using a plurality of deposition chambers, the time taken for the deposition can be shortened because the time taken for transfer and pressure adjustment is omitted. Hence, the productivity of the semiconductor device can be improved in some cases.

<Transistor Including Metal Oxide>

Next, a transistor including a metal oxide (oxide semiconductor) will be described. Hereinafter, a transistor with a semiconductor layer of an oxide semiconductor is sometimes referred to as an OS transistor, and a transistor with a semiconductor layer of silicon is sometimes referred to as a Si transistor.

When the metal oxide (oxide semiconductor) of one embodiment of the present invention is used for a transistor, the transistor can have high field-effect mobility. In addition, the transistor can have high reliability. Furthermore, a miniaturized or highly integrated transistor can be achieved. For example, a transistor with a channel length of greater than or equal to 2 nm and less than or equal to 30 nm can be manufactured.

An oxide semiconductor having a low carrier concentration is preferably used for a channel formation region of the transistor. For example, the carrier concentration in the channel formation region of an oxide semiconductor is lower than or equal to $1\times10^{18}$ cm$^{-3}$, preferably lower than or equal to $1\times10^{17}$ cm$^{-3}$, more preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. A transistor whose channel formation region is formed in an oxide semiconductor having a high density of trap states has unstable electrical characteristics in some cases.

In order to obtain stable electrical characteristics of the transistor, reducing the impurity concentration in the oxide semiconductor is effective. In order to reduce the impurity concentration in the oxide semiconductor, the impurity concentration in a film that is adjacent to the oxide semiconductor is preferably reduced. Examples of the impurity include hydrogen, carbon, and nitrogen. Note that impurities in an oxide semiconductor refer to, for example, elements other than the main components of the oxide semiconductor. For example, an element with a concentration of lower than 0.1 atomic % can be regarded as an impurity.

The band gap of the oxide semiconductor is preferably larger than that of silicon (typically 1.1 eV), further preferably larger than or equal to 2 eV, still further preferably larger than or equal to 2.5 eV, yet still further preferably larger than or equal to 3.0 eV. With the use of an oxide semiconductor film having a larger band gap than silicon, the off-state current (also referred to as Ioff) of the transistor can be reduced.

As miniaturization of a Si transistor progresses, a short-channel effect (also referred to as SCE) appears. Thus, a Si transistor is difficult to miniaturize. A factor that causes a short-channel effect is a small band gap of silicon. Meanwhile, an OS transistor uses an oxide semiconductor, which is a semiconductor material with a large band gap, and thus is less likely to suffer from a short-channel effect. In other words, a short-channel effect does not appear or hardly appears in an OS transistor.

Note that the short-channel effect refers to degradation of electrical characteristics which becomes obvious along with miniaturization of a transistor (a decrease in channel length). Specific examples of the short-channel effect include a decrease in threshold voltage, an increase in subthreshold swing value (sometime also referred to as S value), an increase in leakage current, and the like. Here, the S value refers to the amount of change in gate voltage in a subthreshold region, which is required for changing drain current by one digit at a constant drain voltage.

The characteristic length is widely used as an indicator of resistance to a short-channel effect. The characteristic length is an indicator of curving of potential in a channel formation region. As the characteristic length is shorter, the potential rises more sharply, which means that the resistance to a short-channel effect is high.

An OS transistor is an accumulation-type transistor, and a Si transistor is an inversion-type transistor. Thus, an OS transistor has a smaller characteristic length between a source region and a channel formation region and a smaller characteristic length between a drain region and the channel formation region than a Si transistor. Accordingly, an OS transistor has higher resistance to a short channel effect than a Si transistor. That is, in the case where a transistor with a short channel length needs to be manufactured, an OS transistor is more suitable than a Si transistor.

Even in the case where the carrier concentration in an oxide semiconductor is reduced until a channel formation region becomes an i-type or substantially i-type region, the conduction band minimum of the channel formation region of the transistor with a short channel length becomes low due to a conduction-band-lowering (CBL) effect; thus, the energy difference between the conduction band minimum of the channel formation region and that of the source region or the drain region might decrease to higher than or equal to 0.1 eV and lower than or equal to 0.2 eV. Thus, the OS transistor can be regarded as having an $n^+/n^-/n^+$ accumulation-type junction-less transistor structure or an $n^+/n^-/n^+$ accumulation-type non-junction transistor structure where the channel formation region is an $n^-$ region and the source and drain regions are $n^+$ regions.

An OS transistor having the above structure enables a semiconductor device to have favorable electrical characteristics even when the semiconductor device is miniaturized or highly integrated. For example, the semiconductor device can have favorable electrical characteristics even when the OS transistor has a gate length of less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. Meanwhile, it is sometimes difficult for a Si transistor to have a gate length less than or equal to 20 nm or less than or equal to 15 nm due to appearance of a short-channel effect. Thus, an OS transistor can be used as a transistor with a short channel length more suitably than a Si transistor. Note that the gate length refers to the length of a gate electrode in a direction in which carriers move inside a channel formation region during operation of the transistor.

Miniaturization of an OS transistor can improve the high frequency characteristics of the transistor. Specifically, the cutoff frequency of the transistor can be improved. In the case where the gate length of the OS transistor is within the above range, the cutoff frequency of the transistor can be higher than or equal to 50 GHz, preferably higher than or equal to 100 GHz, further preferably higher than or equal to 150 GHz at room temperature, for example.

As described above, an OS transistor has advantages over a Si transistor, such as a small off-state current and capability of having a short channel length.

<Impurity in Metal Oxide>

The influence of impurities in the metal oxide (oxide semiconductor) will be described.

When an oxide semiconductor contains silicon or carbon, which is a Group 14 element, defect states are formed in the oxide semiconductor. Thus, the carbon concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, more preferably lower than or equal to $3\times10^{19}$ atoms/cm$^3$, further preferably lower than or equal to $1\times10^{19}$ atoms/cm$^3$, still further preferably lower than or equal to $3\times10^{18}$ atoms/cm$^3$, yet still further preferably lower than or equal to $1\times10^{18}$ atoms/cm$^3$. The silicon concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, more preferably lower than or equal to $3\times10^{19}$ atoms/cm$^3$, further preferably lower than or equal to $1\times10^{19}$ atoms/cm$^3$, still further preferably lower than or equal to $3\times10^{18}$ atoms/cm$^3$, yet still further preferably lower than or equal to $1\times10^{18}$ atoms/cm$^3$.

Furthermore, when the oxide semiconductor contains nitrogen, the oxide semiconductor easily becomes n⁻ type by generation of electrons serving as carriers and an increase in carrier concentration. As a result, a transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the nitrogen concentration in the channel formation region of the oxide semiconductor, which is measured by SIMS, is lower than or equal to $1\times10^{20}$ atoms/cm$^3$, preferably lower than or equal to $5\times10^{19}$ atoms/cm$^3$, more preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom generates an electron serving as a carrier. Thus, a transistor including an oxide semiconductor that contains hydrogen tends to have normally-on characteristics. For this reason, hydrogen in the channel formation region of the oxide semiconductor is preferably reduced as much as possible. Specifically, the hydrogen concentration in the channel formation region of the oxide semiconductor, which is measured by SIMS, is lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the channel formation region of the oxide semiconductor, which is measured by SIMS, is lower than or equal to $1\times10^{18}$ atoms/cm$^3$, preferably lower than or equal to $2\times10^{16}$ atoms/cm$^3$.

When an oxide semiconductor with sufficiently reduced impurities is used for a channel formation region in a transistor, the transistor can have stable electrical characteristics.

<Formation Method>

Next, a formation method of a metal oxide which is one embodiment of the present invention is described. Hereinafter, a method for forming a metal oxide with a deposition apparatus employing an ALD method (hereinafter, also referred to as an ALD apparatus) is described.

A deposition apparatus employing an ALD method performs deposition in the following manner: a first source gas for reaction (sometimes also referred to as a precursor or a metal precursor) and a second source gas for reaction (sometimes also referred to as a reactant, an oxidizer, or a non-metal precursor) are alternately introduced into a chamber, and the introduction of these source gases is repeated. Note that the source gases to be introduced can be switched using the respective switching valves (sometimes also referred to as high-speed valves). When the source gases are introduced, an inert gas such as nitrogen ($N_2$), argon (Ar), or helium (He) may be introduced as a carrier gas with the source gases into the chamber. With the use of a carrier gas, the source gases can be inhibited from being adsorbed onto an inner side of a pipe and an inner side of a valve and can be introduced into the chamber, even in the case where the volatility of the source gases is low or the vapor pressure is low. Moreover, uniformity of the formed film is improved, which is preferable.

An example of a method employing an ALD method for forming a metal oxide having the layered crystal structure including three layers is described with reference to FIGS. 1A to 1E.

As a first step, as illustrated in FIG. 1A, a precursor 11a is introduced into a chamber so that the precursor 11a is adsorbed onto a surface of a substrate 10.

As the precursor 11a, any one of the compounds represented by General Formulae (G1) to (G3) is used.

Here, as illustrated in FIG. 1A, the precursor 11a is adsorbed onto the surface of the substrate 10, whereby a self-limiting mechanism of surface chemical reaction works and no more precursor 11a is adsorbed onto a layer of the precursor 11a over the substrate 10. Note that the proper range of substrate temperatures at which the self-limiting mechanism of surface chemical reaction works is also referred to as an ALD window. The ALD window depends on the temperature characteristics, vapor pressure, decomposition temperature, and the like of a precursor.

Next, as a second step, an inert gas (e.g., argon, helium, or nitrogen) is introduced into the chamber so that the excess precursor 11a, a reaction product, and the like are expelled from the chamber. The second step is also called purge.

In the second step, instead of introduction of an inert gas into the chamber, vacuum evacuation may be performed so that the excess precursor, a reaction product, and the like are expelled from the chamber. In this specification and the like, vacuum evacuation means evacuation under a pressure at least lower than an atmospheric pressure (in a reduced-pressure state).

Figure 1B:
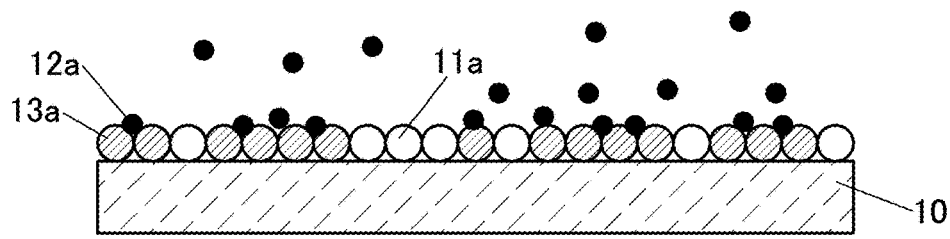

Next, as a third step, as illustrated in FIG. 1B, a reactant 12a (e.g., an oxidizer) is introduced into the chamber to react with the precursor 11a adsorbed onto the surface of the substrate 10 so that some of components contained in the precursor 11a are released while a metal element constituting the precursor 11a is adsorbed onto the substrate 10. Consequently, a layer of an oxide 13a, which is formed by oxidation of part of the precursor 11a, is formed over the surface of the substrate 10.

Examples of an oxidizer include ozone ($O_3$), oxygen ($O_2$), water ($H_2O$), and plasma, a radical, and an ion thereof.

In the case where a plasma ALD method is employed, oxygen may be constantly supplied as an oxidizer and plasma may be generated in the third step. Accordingly, in the third step, oxygen plasma is formed and serves as the reactant 12a. In this case, the precursor 11a that does not react with oxygen that has been heated to the above temperature is used in a step other than the third step.

After that, as a fourth step, introduction of an inert gas or vacuum evacuation is performed so that the excess reactant 12a, a reaction product, and the like are expelled from the chamber.

Figure 1C:
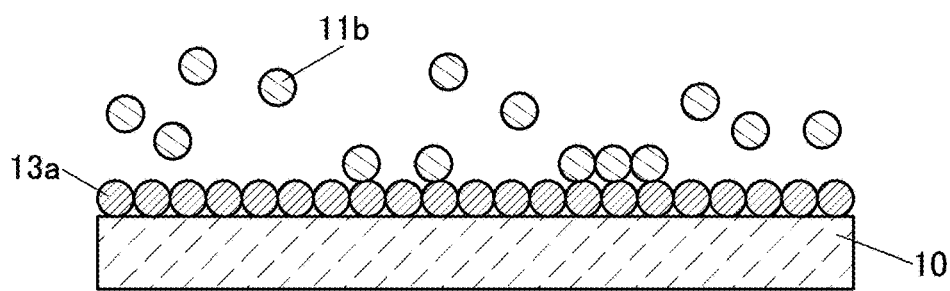

Then, as illustrated in FIG. 1C, a precursor 11b containing a metal element different from that in the precursor 11a is introduced and a step similar to the first step is performed, so that the precursor 11b is adsorbed onto a surface of the layer of the oxide 13a.

As the precursor 11b, any of the compounds represented by General Formulae (G1) to (G3) which contains a metal element different from that of the precursor 11a is used.

Here, as illustrated in FIG. 1C, the precursor 11b is adsorbed onto the layer of the oxide 13a, whereby a self-limiting mechanism of surface chemical reaction works and no more precursor 11b is adsorbed onto a layer of the precursor 11b over the substrate 10.

Next, as in the second step, introduction of an inert gas or vacuum evacuation is performed so that the excess precursor 11b, a reaction product, and the like are expelled from the chamber.

Figure 1D:
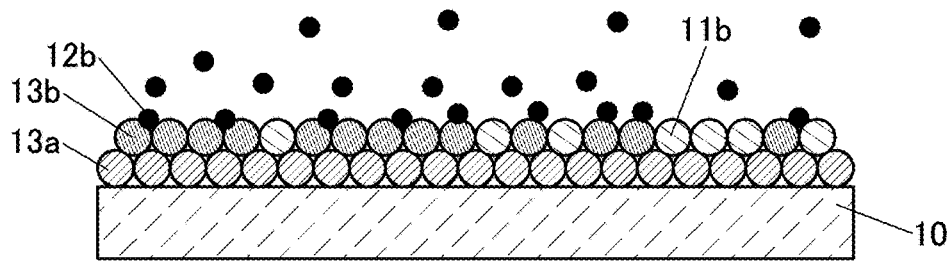

Then, as illustrated in FIG. 1D, a reactant 12b is introduced into the chamber and a step similar to the third step is performed. Thus, a layer of the oxide 13b, which is formed by oxidation of part of the precursor 11b, is formed over the layer of the oxide 13a.

The reactant 12b may be the same as or different from the reactant 12a.

After that, as in the fourth step, introduction of an inert gas or vacuum evacuation is performed so that the excess reactant 12b, a reaction product, and the like are expelled from the chamber.

Furthermore, the first to fourth steps are performed in a similar manner, whereby a layer of an oxide 13c is formed over the layer of the oxide 13b. When the layer of the oxide 13c is formed, any of the compounds represented by General Formulae (G1) to (G3) which contains a metal element different from those of the precursor 11a and the precursor 11b is used as a precursor. The reactant may be the same as one or both of the reactants 12a and 12b, or may be different from both of the reactants 12a and 12b.

Figure 1E:
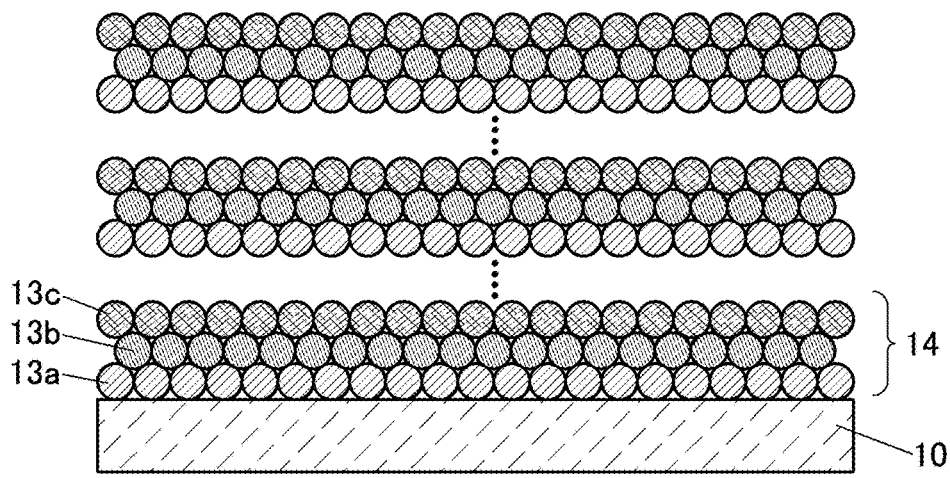

As described above, by performing the steps for forming the oxide 13a to the oxide 13c repeatedly, a metal oxide having a layered crystal structure where a stacked-layer structure 14 including the oxide 13a to the oxide 13c is repeated can be formed (see FIG. 1E). That is, an oxide layer can be formed through the first to fourth steps, which are regarded as one set, and by repeating the set, a layered crystal structure where a plurality of oxide layers are stacked can be formed.

In the formation of a metal oxide having a layered crystal structure, specifically, a metal oxide having the CAAC structure, it is preferable that the steps illustrated in FIGS. 1A to 1E be performed while the substrate is heated. The substrate temperature is preferably higher than or equal to 300° C. and lower than or equal to 500° C., further preferably higher than or equal to 400° C. and lower than or equal to 450° C. In addition, the substrate temperature is preferably lower than the decomposition temperatures of precursors that are used. Accordingly, during deposition by an ALD method, a plurality of kinds of precursors that are used can be adsorbed onto an object (e.g., a substrate) without being decomposed.

By performing the deposition while the substrate is heated within such a temperature range, an impurity such as hydrogen or carbon contained in the precursor, the reactant, or the like can be removed from the metal oxide in each of the first to fourth steps. For example, carbon in the metal oxide can be released as $CO_2$ or CO. In addition, for example, hydrogen in the metal oxide can be released as $H_2O$. Furthermore, metal atoms and oxygen atoms are rearranged concurrently with removal of the impurity, so that layers of oxides can be arranged orderly. Thus, a metal oxide having a layered crystal structure with high crystallinity, specifically, a metal oxide having the CAAC structure can be formed.

Note that FIG. 1A illustrates an example where the precursor 11a is adsorbed onto the substrate 10; however, the present invention is not limited thereto. For example, an insulating film (an insulating film containing one or more of oxygen, nitrogen, silicon, aluminum, hafnium, and the like), a conductive film (a conductive film containing one or more of tungsten, tantalum, molybdenum, zirconium, aluminum, titanium, and the like), or the like may be provided over the substrate 10 and the precursor 11a may be adsorbed thereonto. Alternatively, the precursor 11a may be adsorbed onto a component formed using an insulating film, a conductive film, and the like over the substrate 10.

In order to perform deposition while the substrate is heated within the above temperature range, the decomposition temperature of a precursor used for the deposition is preferably not too low. Meanwhile, too high a decomposition temperature is not preferable because the precursor is difficult to handle and the substrate temperature during deposition needs to be extremely high. For example, the decomposition temperature of the precursor is preferably higher than 300° C. and lower than or equal to 700° C., further preferably higher than or equal to 350° C. and lower than or equal to 650° C., still further preferably higher than or equal to 400° C. and lower than or equal to 600° C.

An inorganic precursor contains few impurities such as hydrogen and carbon, and thus can inhibit an increase in impurity concentration in a formed metal oxide. Meanwhile, an inorganic precursor often has a higher decomposition temperature than an organic precursor.

In view of this, in the formation method of a metal oxide which is one embodiment of the present invention, an organic precursor whose decomposition temperature is within the above range is used, deposition is performed while the substrate is heated, or impurity removal treatment is performed, for example, whereby an increase in impurity concentration in the formed metal oxide can be inhibited.

There is no particular limitation on the frequency of the impurity removal treatment. Higher frequency is preferable in terms of ease of impurity removal, but the productivity might be decreased in this case. Lower frequency is preferable in terms of a short deposition time of the metal oxide, but impurity removal might be insufficient in this case. In repetition of steps for forming the oxides 13a to 13c, for example, the impurity removal treatment is preferably performed every time a plurality of oxide layers are formed. For example, it is also possible to perform the impurity removal treatment every time any one of the oxides 13a to 13c is formed; however, it is preferable to perform the impurity removal treatment every time a plurality of oxide layers are formed or every time a plurality of stacked-layer structures 14 are formed, in which case the process can be simplified.

For example, the impurity removal treatment may be performed every time n oxide layers (n is an integer greater than or equal to 1 and less than or equal to 100, preferably greater than or equal to 2 and less than or equal to 50, further preferably greater than or equal to 5 and less than or equal to 30) are formed. For example, the metal oxide can be formed by repetition of the following steps of: forming the oxides 13a, 13b, 13c, 13a, and 13b in this order; performing the impurity removal treatment; forming the oxides 13c, 13a, 13b, 13c, and 13a in this order; performing the impurity removal treatment; forming the oxides 13b, 13c, 13a, 13b, and 13c in this order; and then performing the impurity removal treatment.

Alternatively, for example, the impurity removal treatment may be performed every time m stacked-layer structures 14 (m is an integer greater than or equal to 1 and less than or equal to 50, preferably greater than or equal to 2 and less than or equal to 30, further preferably greater than or equal to 5 and less than or equal to 10) are formed.

As described above, examples of the impurity removal treatment include plasma treatment, microwave treatment, and heat treatment. The impurity removal treatment may be performed while light irradiation is performed.

A chamber where the impurity removal treatment is performed may be the same as or different from a chamber where the first to fourth steps are performed. That is, a chamber for the deposition may be the same as or different from a chamber for the impurity removal treatment.

In plasma treatment or microwave treatment, the substrate temperature is preferably higher than or equal to room temperature (e.g., 25° C.), higher than or equal to 100° C., higher than or equal to 200° C., higher than or equal to 300° C., or higher than or equal to 400° C., and lower than or equal to 500° C. or lower than or equal to 450° C. The heat treatment temperature is preferably higher than or equal to 100° C., higher than or equal to 200° C., higher than or equal to 300° C., or higher than or equal to 400° C., and lower than or equal to 500° C. or lower than or equal to 450° C. It is particularly preferable that temperature during the impurity removal treatment be lower than or equal to the maximum temperature in a manufacturing process of a transistor or a semiconductor device, in which case the impurity content in the metal oxide can be reduced without decrease in productivity.

In the case where oxygen plasma is used in the third step and the treatment time of the third step is set long, the third step can also serve as plasma treatment as the impurity removal treatment. For example, the third step may be performed longer once every few times so as to serve as the impurity removal treatment.

Here, the microwave treatment refers to, for example, treatment using an apparatus including a power source that generates high-density plasma with the use of a microwave. Note that in this specification and the like, a microwave refers to an electromagnetic wave having a frequency higher than or equal to 300 MHz and lower than or equal to 300 GHz in some cases. The microwave treatment can also be referred to as microwave excitation high-density plasma treatment.

The microwave treatment is preferably performed with a microwave treatment apparatus including a power source for generating high-density plasma using microwaves, for example. Here, the frequency of the microwave treatment apparatus is preferably set to higher than or equal to 300 MHz and lower than or equal to 300 GHz, further preferably higher than or equal to 2.4 GHz and lower than or equal to 2.5 GHz, and can be 2.45 GHz, for example. Oxygen radicals at a high density can be generated with high-density plasma. The electric power of the power source that applies microwaves of the microwave treatment apparatus is preferably set to higher than or equal to 1000 W and lower than or equal to 10000 W, further preferably higher than or equal to 2000 W and lower than or equal to 5000 W. A power source may be provided in the microwave treatment apparatus to apply RF to the substrate side. Furthermore, application of RF to the substrate side allows oxygen ions generated by the high-density plasma to be introduced into a film efficiently.

The microwave treatment is preferably performed under reduced pressure, and the pressure is preferably higher than or equal to 10 Pa and lower than or equal to 1000 Pa, further preferably higher than or equal to 300 Pa and lower than or equal to 700 Pa. The treatment temperature is, for example, preferably higher than or equal to room temperature (25° C.) and lower than or equal to 750° C., further preferably higher than or equal to 300° C. and lower than or equal to 500° C., and can be higher than or equal to 400° C. and lower than or equal to 450° C.

The microwave treatment or the plasma treatment may be followed successively by heat treatment without exposure to the air. The heat treatment temperature is, for example, preferably higher than or equal to 100° C. and lower than or equal to 750° C., further preferably higher than or equal to 300° C. and lower than or equal to 400° C., still further preferably higher than or equal to 400° C. and lower than or equal to 450° C.

The microwave treatment can be performed using an oxygen gas and an argon gas, for example. Here, the oxygen flow rate ratio ($O_2/O_2+Ar$) is higher than 0% and lower than or equal to 100%. The oxygen flow rate ratio ($O_2/O_2+Ar$) is preferably higher than 0% and lower than or equal to 50%. The oxygen flow rate ratio ($O_2/O_2+Ar$) is further preferably higher than or equal to 10% and lower than or equal to 40%. The oxygen flow rate ratio ($O_2/O_2+Ar$) is still further preferably higher than or equal to 10% and lower than or equal to 30%.

The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas is preferably approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen. The heat treatment may be performed under an atmosphere of ultra-dry air (air in which water content is 20 ppm or less, preferably 1 ppm or less, further preferably 10 ppb or less).

The gas used in the heat treatment is preferably highly purified. For example, the amount of moisture contained in the gas used in the heat treatment is preferably 1 ppb or less, further preferably 0.1 ppb or less, and still further preferably 0.05 ppb or less. The heat treatment using a highly purified gas can prevent the entry of moisture or the like into the metal oxide as much as possible.

By performing the heat treatment in such a manner, an impurity such as hydrogen or carbon contained in the metal oxide can be removed. For example, carbon in the metal oxide can be released as $CO_2$ and CO, and hydrogen in the metal oxide can be released as $H_2O$. Furthermore, metal atoms and oxygen atoms are rearranged concurrently with removal of the impurity, which improves crystallinity. Thus, a metal oxide having a layered crystal structure with high crystallinity, specifically, a metal oxide having a CAAC structure can be formed.

Note that heat treatment is preferably performed after formation of the metal oxide (after formation of all the predetermined number of the stacked-layer structures 14 and before formation of another film with a different material or composition). In particular, the heat treatment is preferably performed without exposure to the air successively after the deposition by an ALD method. The heat treatment is performed at preferably higher than or equal to 100° C. and lower than or equal to 500° C., more preferably higher than or equal to 200° C. and lower than or equal to 500° C., further preferably higher than or equal to 250° C. and lower than or equal to 500° C., still further preferably higher than or equal to 300° C. and lower than or equal to 500° C., yet further preferably higher than or equal to 350° C. and lower than or equal to 450° C., yet still further preferably higher than or equal to 400° C. and lower than or equal to 450° C. The heat treatment is performed in a nitrogen gas atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

By performing the heat treatment in such a manner, an impurity such as hydrogen or carbon contained in the metal oxide can be removed. For example, carbon in the metal oxide can be released as $CO_2$ and CO, and hydrogen in the metal oxide can be released as $H_2O$. Furthermore, metal atoms and oxygen atoms are rearranged concurrently with removal of the impurity, which improves crystallinity. Thus, a metal oxide having a layered crystal structure with high crystallinity, specifically, a metal oxide having a CAAC structure can be formed.

Plasma treatment or microwave treatment may be performed after formation of the metal oxide.

Note that FIGS. 1A to 1E illustrate the structure where the stacked-layer structure 14 including the oxides 13a to 13c is repeated; however, the present invention is not limited thereto. For example, a single layer, two layers, or four or more layers of an oxide may be repeatedly formed in a metal oxide. In FIGS. 1A to 1E, the oxides 13a to 13c are repeatedly stacked without changing the order; however, the present invention is not limited thereto. For example, the order of the oxides 13a to 13c may be changed for each stack. Alternatively, the compositions of the oxides 13a to 13c may be changed in the film. In FIGS. 1A to 1E, different oxide layers are provided to be adjacent to each other in the order of the oxide 13a, the oxide 13b, and the oxide 13c; however, the present invention is not limited thereto. A structure may be employed where the same oxide layers are successively provided in the order of, for example, the oxide 13a, the oxide 13a, the oxide 13b, the oxide 13b, the oxide 13c, and the oxide 13c.

In the following description of this specification, in the case of using ozone, oxygen, and water as a reactant or an oxidizer, they include not only those in gas and molecular states but also those in a plasma, radical, and ion states, unless otherwise specified. In the case where a film is formed using an oxidizer in a plasma state, a radical state, or an ion state, a radical ALD apparatus or a plasma ALD apparatus, which will be described later, is used.

In order to remove an impurity such as carbon or hydrogen contained in a precursor, the precursor is preferably made to react with an oxidizer sufficiently. For example, pulse time for introducing an oxidizer is made longer. Alternatively, an oxidizer is introduced a plurality of times. In the case where an oxidizer is introduced a plurality of times, the kinds of the introduced oxidizers may be the same or different. For example, water may be introduced as a first oxidizer into a chamber, vacuum evacuation may be performed, oxygen or ozone not containing hydrogen may be introduced as a second oxidizer into a chamber, and then vacuum evacuation may be performed.

Note that in the above description, an example where the second source gas is introduced into the chamber after the first source gas is introduced into the chamber is shown; however, the present invention is not limited thereto. The first source gas may be introduced into the chamber after the second source gas is introduced into the chamber. In other words, deposition may be performed in the following manner: the third and fourth steps are performed first, the first to fourth steps are performed next, and then the first to fourth steps are repeated. Alternatively, deposition may be performed by repeating the third and fourth steps a plurality of times and then repeating the first to fourth steps.

In this manner, the third and fourth steps are preferably performed one or more times before the first step because the deposition atmosphere in the chamber can be controlled. For example, $O_3$ and $O_2$ are introduced as oxidizers in the third step, so that the chamber can have an oxygen atmosphere. Deposition performed in the chamber having an oxygen atmosphere is preferable because the formed film can have a high oxygen concentration. Furthermore, oxygen can also be supplied to the insulator and the oxide that are to be bases of the film. A semiconductor device formed by such a method can have favorable characteristics and high reliability. Moreover, for example, introduction of water as an oxidizer in the third step can form a hydrophilic group on the formation surface. Accordingly, the precursor can have a much improved adsorption property.

After the first and second steps are performed, the third step of introducing the second source gas and the fourth step of performing vacuum evacuation or introduction of an inert gas may be repeated a plurality of times. That is, after the first and second steps are performed, the third and fourth steps may be repeated a plurality of times, and then the first and second steps may be performed again, for example.

For example, $O_3$ and $O_2$ are introduced as oxidizers in the third step, introduction of an inert gas is performed in the fourth step, and then these steps may be repeated a plurality of times. In the case where the third and fourth steps are repeated, the same source gas is not necessarily used for the repeated introduction. For example, $H_2O$ may be used as an oxidizer in the third step in the first cycle, and $O_3$ may be used as an oxidizer in the third steps in and after the second cycle).

As described above, the introduction of an oxidizer and the introduction of an inert gas (or vacuum evacuation) in the chamber are repeated a plurality of times in a short time, whereby excess hydrogen atoms, carbon atoms, and the like can be more certainly removed from the precursor adsorbed onto the substrate surface and eliminated from the chamber. In the case where two kinds of oxidizers are introduced, more excess hydrogen atoms, carbon atoms, and the like can be removed from the precursor adsorbed onto the substrate surface. In this manner, hydrogen atoms, carbon atoms, and the like are prevented from entering the film during the deposition, so that the amounts of water, hydrogen, and the like in the formed film can be small.

The above-described method enables formation of a film that releases water molecules, the number of which is greater than or equal to $1.0 \times 10^{13}$ molecules/cm$^2$ and less than or equal to $1.0 \times 10^{16}$ molecules/cm$^2$ and preferably greater than or equal to $1.0 \times 10^{13}$ molecules/cm$^2$ and less than or equal to $3.0 \times 10^{15}$ molecules/cm$^2$ in TDS analysis in the range of a surface temperature from 100° C. to 700° C. or from 100° C. to 500° C.

In an ALD method, a film is formed through reaction of a precursor and a reactant using thermal energy. A temperature required for the reaction between the precursor and the reactant is determined by the temperature characteristics, vapor pressure, decomposition temperature, and the like thereof and is set to higher than or equal to 100° C. and lower than or equal to 600° C., preferably higher than or equal to 200° C. and lower than or equal to 600° C., further preferably higher than or equal to 300° C. and lower than or equal to 600° C.

Moreover, an ALD method in which treatment is performed by introducing a plasma-excited reactant into the chamber as a third source gas in addition to the precursor and the reactant which react with each other is referred to as a plasma ALD method in some cases. In this case, a plasma generation apparatus is provided in the introduction portion of the third source gas. Inductively coupled plasma (ICP) can be used for plasma generation. An ALD method in which reaction between the precursor and the reactant is performed using thermal energy is sometimes called a thermal ALD method.

In a plasma ALD method, deposition is performed by introducing a plasma-excited reactant in the third step. Alternatively, deposition is performed in such a manner that the first to fourth steps are repeated while a plasma-excited reactant (a second reactant) is introduced. In this case, the reactant introduced in the third step is referred to as a first reactant. In the plasma ALD method, the same material as the above-described oxidizer can be used for the second reactant used as the third source gas. In other words, plasma-excited ozone, oxygen, and water can be used as the second reactant.

Argon (Ar), helium (He), or nitrogen ($N_2$) may be used as a carrier gas for the second reactant. The use of a carrier gas such as argon, helium, or nitrogen is preferable because plasma is easily discharged and the plasma-excited second reactant is easily generated. Note that in the case where an oxide film such as a metal oxide film is formed by a plasma ALD method and nitrogen is used as a carrier gas, nitrogen enters the film and a desired film quality cannot be obtained in some cases. In this case, argon or helium is preferably used as the carrier gas.

With the ALD method, an extremely thin film with a uniform thickness can be formed. In addition, the coverage of an uneven surface with the film is high.

When the plasma ALD method is employed, the film can be formed at a lower temperature than when the thermal ALD method is employed. With a plasma ALD method, the film can sometimes be formed without decreasing the deposition rate even at 100° C. or lower, for example.

In the case where a plasma ALD method is employed, by generating plasma while a plasma source for inductively coupled plasma (ICP), electron cyclotron resonance plasma (ECR), or the like is apart from a substrate, plasma damage can be reduced.

<Atomic Arrangement in Crystal of Metal Oxide>

Here, atomic arrangement in the crystal when the metal oxide having a layered crystal structure is an In-M-Zn oxide is described with reference to FIGS. 2A to 2D and FIGS. 3A to 3D. In FIGS. 2B, 2D, 3B, and 3D, an atom is represented by a sphere (a circle) and a bond between a metal atom and an oxygen atom is represented by a line. In FIGS. 2B, 2D, 3B, and 3D, the c-axis direction in the crystal structure of the In-M-Zn oxide is indicated by arrows in the drawings. The a-b plane direction in the crystal structure of the In-M-Zn oxide is the direction perpendicular to the c-axis direction indicated by the arrows in FIGS. 2B, 2D, 3B, and 3D.

Figure 2A:
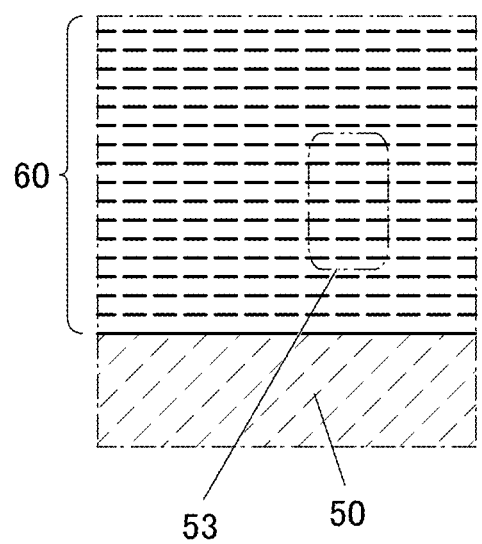
FIGS. 2A to 2D are cross-sectional views illustrating examples of a metal oxide.

FIG. 2A illustrates an oxide 60 including an In-M-Zn oxide formed over a structure body 50. Here, the structure body refers to a component included in a semiconductor device such as a transistor. The structure body 50 includes a substrate, conductors such as a gate electrode, a source electrode, and a drain electrode, an insulator such as a gate insulating film, an interlayer insulating film, and a base insulating film, a semiconductor such as a metal oxide or silicon, and the like. In FIG. 2A, a deposition surface of the structure body 50 is positioned parallel to a substrate (not illustrated).

Figure 2B:
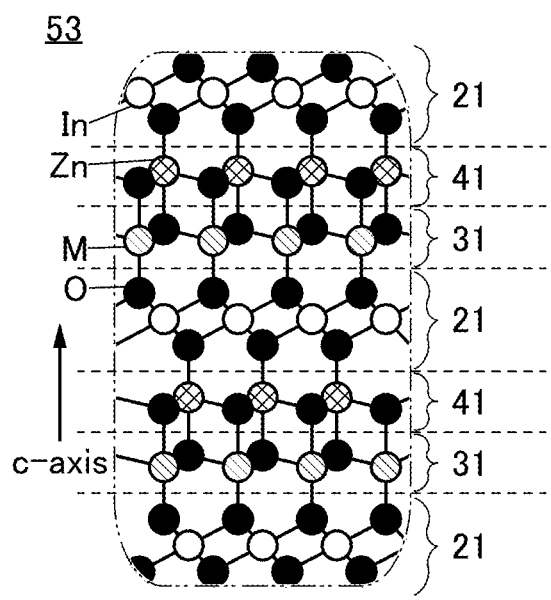

FIG. 2B is an enlarged view illustrating the atomic arrangement in the crystal in a region 53, which is part of the oxide 60 in FIG. 2A. Note that the oxide 60 illustrated in FIGS. 2A and 2B has an atomic ratio of In:M:Zn=1:1:1 and a YbFe$_2$O$_4$ crystal structure. The element M is a metal element having a valence of +3.

As illustrated in FIG. 2B, the crystal included in the oxide 60 has repetitive stacking of a layer 21 containing indium (In) and oxygen, a layer 31 containing the element M and oxygen, and a layer 41 containing zinc (Zn) and oxygen in this order. The layers 21, 31, and 41 are placed parallel or substantially parallel to the deposition surface of the structure body 50. That is, the a-b plane of the oxide 60 is parallel or substantially parallel to the deposition surface of the structure body 50, and the c-axis of the oxide 60 is parallel or substantially parallel to the normal direction of the deposition surface of the structure body 50.

When the layers 21, 31, and 41 included in the above crystal are each composed of one metal element and oxygen as illustrated in FIG. 2B, arrangement with favorable crystallinity is achieved to increase the mobility of the metal oxide.

Note that the In-M-Zn oxide with an atomic ratio of In:M:Zn=1:1:1 is not limited to having the structure illustrated in FIG. 2B. The stacking order of the layers 21, 31, and 41 may be changed. For example, the layers may be stacked repeatedly in the order of the layers 21, 41, and 31. Alternatively, the layers may be stacked repeatedly in the order of the layers 21, 31, 41, 21, 41, and 31. Part of the element M in the layer 31 may be substituted by zinc and part of zinc in the layer 41 may be substituted by the element M.

Although an example of forming the In-M-Zn oxide with an atomic ratio of In:M:Zn=1:1:1 is described above, a crystalline In-M-Zn oxide whose composition formula is represented by $In_{(1+\alpha)}M_{(1-\alpha)}O_3(ZnO)_m$ ($\alpha$ is a real number greater than 0 and less than 1 and m is a positive number) can have a layered crystal structure in a similar manner. As an example, an In-M-Zn oxide with an atomic ratio of In:M:Zn=1:3:4 is described with reference to FIGS. 2C and 2D.

Figure 2C:
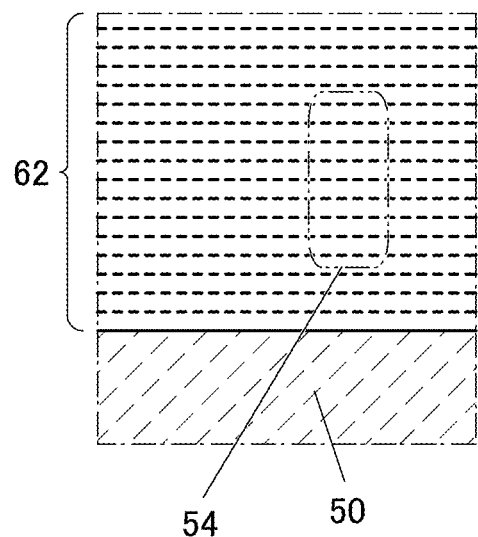
Figure 2D:
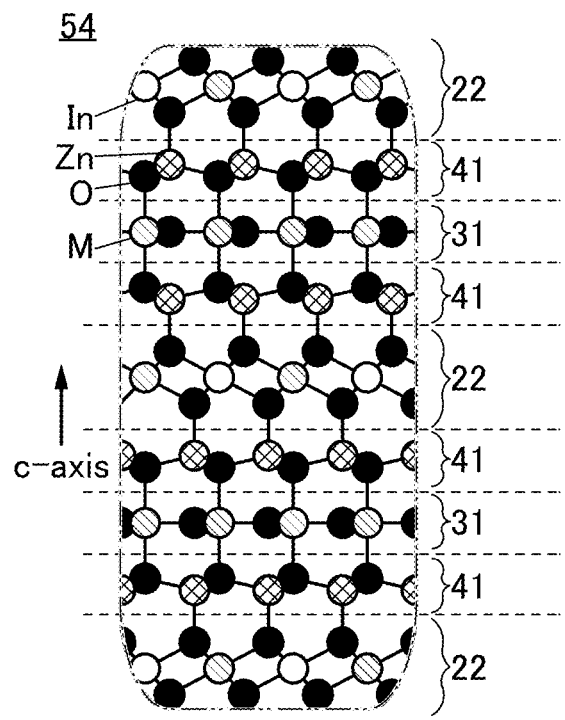

FIG. 2C illustrates an oxide 62 including an In-M-Zn oxide formed over the structure body 50. FIG. 2D is an enlarged view illustrating the atomic arrangement in the crystal in a region 54, which is part of the oxide 62 in FIG. 2C.

As illustrated in FIG. 2D, the crystal included in the oxide 62 includes a layer 22 containing indium (In), the element M, and oxygen, the layer 41 containing zinc (Zn) and oxygen, and the layer 31 containing the element M and oxygen. In the oxide 62, the plurality of layers are stacked repeatedly in the order of the layers 22, 41, 31, and 41. The layers 22, 31, and 41 are placed parallel or substantially parallel to the deposition surface of the structure body 50. That is, the a-b plane of the oxide 62 is parallel or substantially parallel to the deposition surface of the structure body 50, and the c-axis of the oxide 62 is parallel or substantially parallel to the normal direction of the deposition surface of the structure body 50.

Note that the In-M-Zn oxide with an atomic ratio of In:M:Zn=1:3:4 is not limited to having the structure illustrated in FIG. 2D, and the structure may change within a range where the atomic ratio of In:M:Zn=1:3:4 is maintained. For example, the stacking order of the layers 22, 31, and 41 may be changed. Part of the element M in the layer 31 may be substituted by zinc and part of zinc in the layer 41 may be substituted by the element M. The layer 21 or the layer 31 may be formed instead of the layer 22.

Figure 3A:
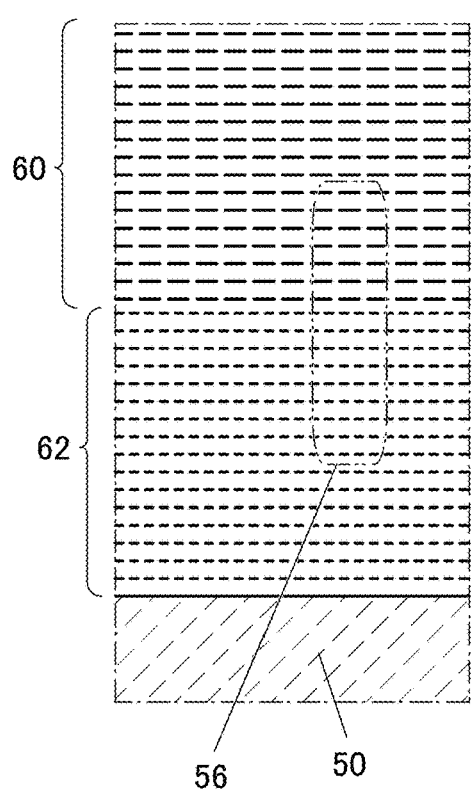
FIGS. 3A to 3D are cross-sectional views illustrating examples of a metal oxide.

Alternatively, as illustrated in FIG. 3A, a stacked-layer structure may be employed in which the oxide 62 is formed over the structure body 50 and the oxide 60 is formed thereover. Here, FIG. 3B is an enlarged view illustrating the atomic arrangement in the crystal in a region 56, which is part of the oxide 62 and the oxide 60 in FIG. 3A.

As described above, the oxide 62 is the In-M-Zn oxide with an atomic ratio of In:M:Zn=1:3:4, and the oxide 60 is the In-M-Zn oxide with an atomic ratio of In:M:Zn=1:1:1. That is, the oxide illustrated in FIG. 3A is an oxide film in which the atomic ratio changes in the film. Furthermore, when the oxide 62 has a layered crystal structure as illustrated in FIG. 3B, the crystallinity of the oxide 60 over the oxide 62 can be favorable.

Figure 3B:
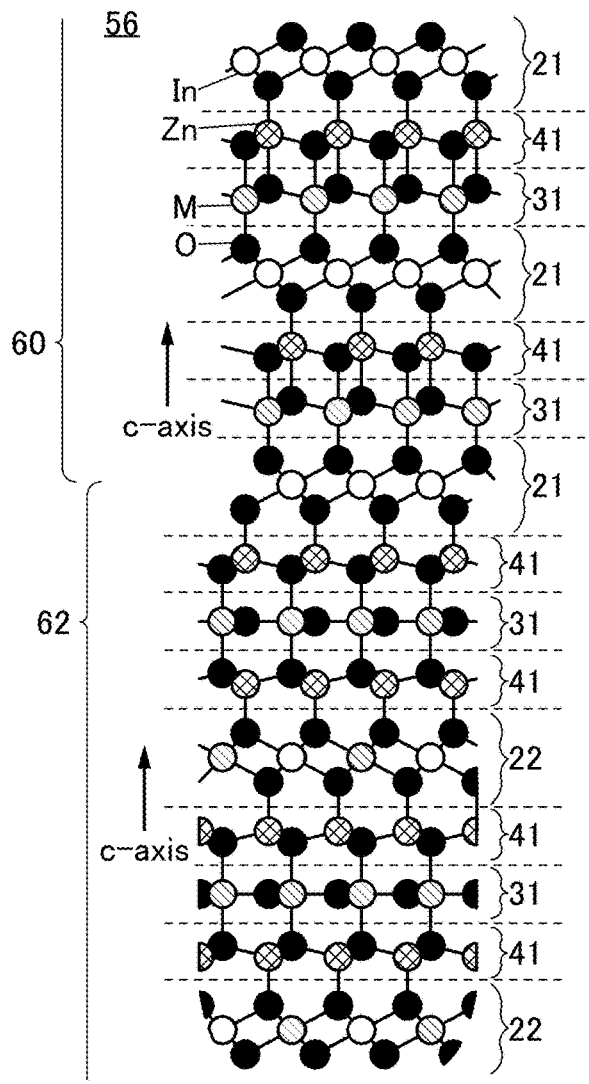

Note that the oxides 62 and 60 are not limited to having the structure illustrated in FIG. 3B, and the structures of the oxides 62 and 60 may be changed as described above. The layer 21 is placed at the boundary between the oxides 62 and 60 in FIG. 3B; however, the present invention is not limited thereto. For example, the layer 22 may be formed at the boundary between the oxides 62 and 60.

As described above, an ALD method enables formation of a film on a component with a high aspect ratio and also enables formation of a film with excellent coverage on a side surface of a structure body. By an ALD method, a metal oxide having crystallinity such as a CAAC structure can be easily formed regardless of the orientation of the deposition surface. For example, a metal oxide with favorable coverage can be formed on a top surface, a bottom surface, a side surface, and a surface with a slope of a structure body even when the structure body has a projected shape or a recessed shape. In other words, a metal oxide that has a substantially uniform thickness in the normal direction can be formed on each deposition surface. As for the metal oxide that is formed on each of the top surface, the bottom surface, the side surface, and the surface with the slope of the structure body, the ratio of the minimum thickness to the maximum thickness can be greater than or equal to 0.5 and less than or equal to 1, preferably greater than or equal to 0.7 and less than or equal to 1, further preferably greater than or equal to 0.9 and less than or equal to 1. At this time, in the case where the metal oxide has a crystal structure, the c-axis thereof is aligned in a direction substantially parallel to the normal direction of each of the deposition surfaces. In other words, the c-axis is aligned perpendicularly to each of the deposition surfaces.

Figure 3C:
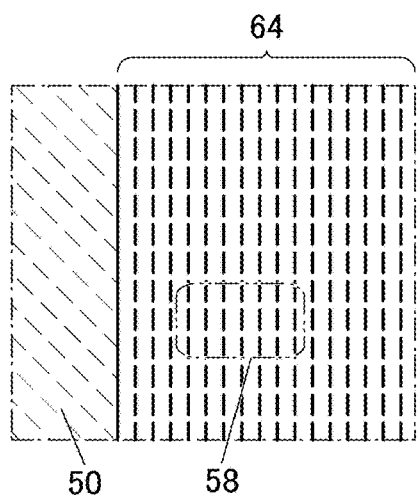
Figure 3D:
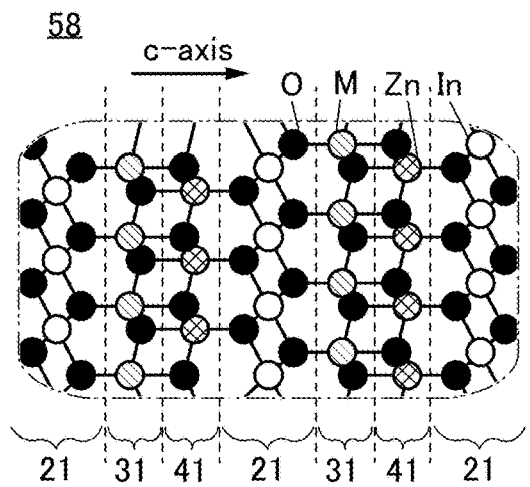

Here, FIG. 3C illustrates a case where a deposition surface of the structure body 50 is placed perpendicular to a substrate (not illustrated) and an oxide 64 is formed on the surface of the structure body 50. FIG. 3D is an enlarged view of a region 58, which is part of the oxide 64 in FIG. 3C. FIG. 3D illustrates a state where, on the side surface of the structure body 50, the layer 21 containing indium (In), the layer 31 containing the element M, and the layer 41 containing zinc (Zn) are stacked with respect to the deposition surface. The layer 21 containing indium is placed parallel or substantially parallel to the deposition surface of the structure body 50, the layer 31 containing the element M is placed thereover to be parallel or substantially parallel to the deposition surface of the structure body 50, and further the layer 41 containing zinc is placed thereover to be parallel or substantially parallel to the deposition surface of the structure body 50. That is, the a-b plane of the oxide 60 is parallel or substantially parallel to the deposition surface of the structure body 50, and the c-axis of the oxide 60 is parallel or substantially parallel to the normal direction of the deposition surface of the structure body 50. Note that FIGS. 3C and 3D show the example of the In-M-Zn oxide with an atomic ratio of In:M:Zn=1:1:1, but an oxide with a different atomic ratio can also be formed on the surface of the structure body 50 whose deposition surface is perpendicular to the substrate.

The examples of the metal oxide with an atomic ratio of In:M:Zn=1:1:1 and the metal oxide with an atomic ratio of In:M:Zn=1:3:4 are shown in the above; however, the present invention is not limited thereto.

Preferred ranges of the atomic ratio of indium, the element M, and zinc contained in a metal oxide that can be used as an oxide of one embodiment of the present invention will be described below with reference to FIGS. 4A to 4C. Note that the proportion of oxygen atoms is not shown in FIGS. 4A to 4C. The terms of the atomic ratio of indium, the element M, and zinc contained in the metal oxide are denoted by [In], [M], and [Zn], respectively.

Figure 4A:
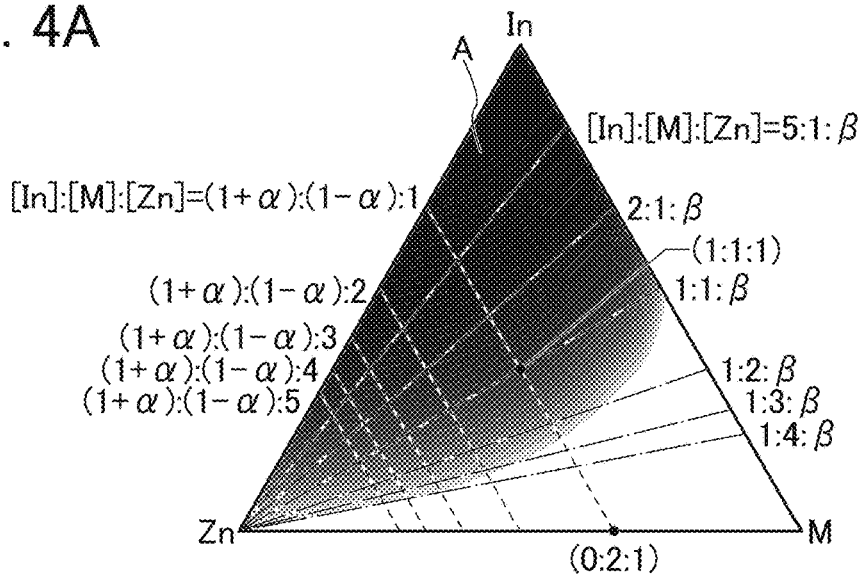
FIGS. 4A to 4C show examples of an atomic ratio range of a metal oxide.
Figure 4B:
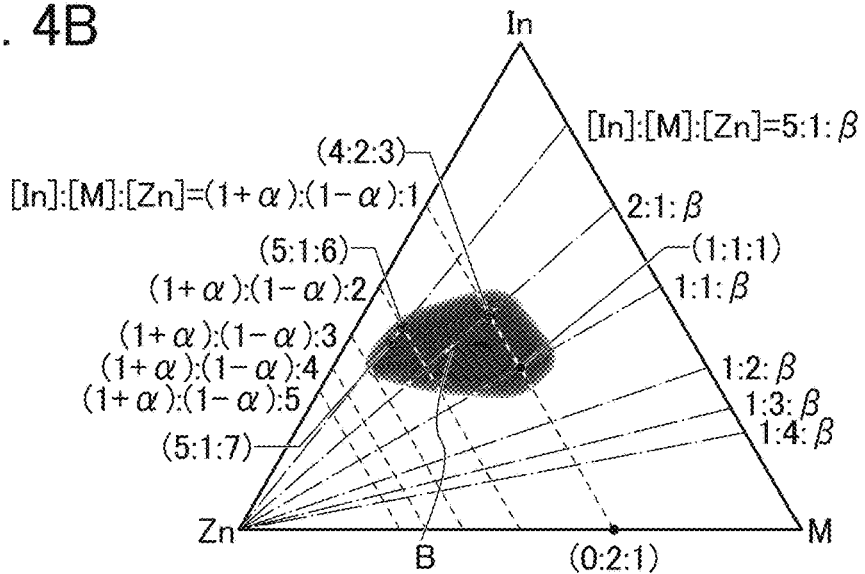
Figure 4C:
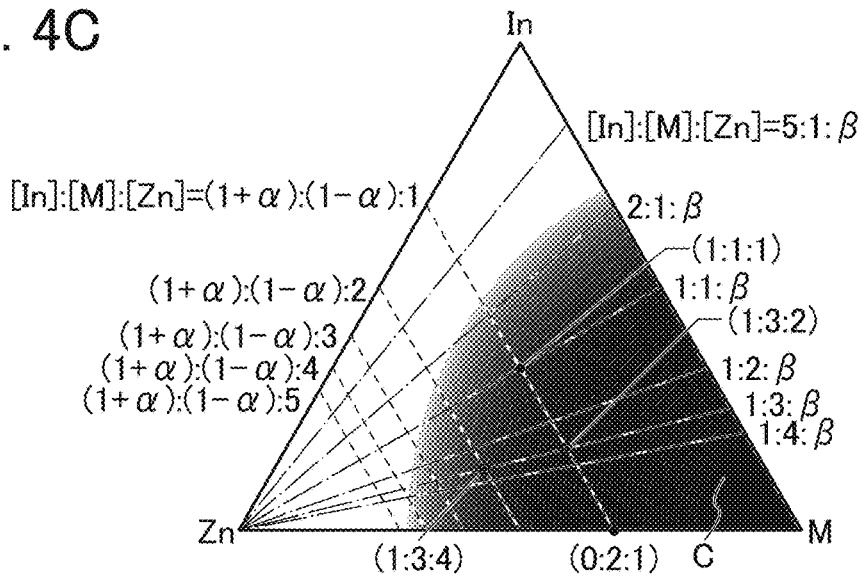

In FIGS. 4A to 4C, broken lines indicate a line representing an atomic ratio of $[In]:[M]:[Zn]=(1+\alpha):(1-\alpha):1$ ($-1\leq\alpha\leq1$), a line representing an atomic ratio of $[In]:[M]:[Zn]=(1+\alpha):(1-\alpha):2$, a line representing an atomic ratio of $[In]:[M]:[Zn]=(1+\alpha):(1-\alpha):3$, a line representing an atomic ratio of $[In]:[M]:[Zn]=(1+\alpha):(1-\alpha):4$, and a line representing an atomic ratio of $[In]:[M]:[Zn]=(1+\alpha):(1-\alpha):5$.

Furthermore, dashed-dotted lines indicate a line representing an atomic ratio of $[In]:[M]:[Zn]=5:1:\beta$ ($\beta\geq0$), a line representing an atomic ratio of $[In]:[M]:[Zn]=2:1:\beta$, a line representing an atomic ratio of $[In]:[M]:[Zn]=1:1:\beta$, a line representing an atomic ratio of $[In]:[M]:[Zn]=1:2:\beta$, a line representing an atomic ratio of $[In]:[M]:[Zn]=1:3:\beta$, and a line representing an atomic ratio of $[In]:[M]:[Zn]=1:4:\beta$.

A metal oxide with an atomic ratio of [In]:[M]:[Zn]=0:2:1 and the neighborhood thereof in FIGS. 4A to 4C tends to have a spinel crystal structure.

A plurality of phases (e.g., two phases or three phases) exist in the metal oxide in some cases. For example, with an atomic ratio of [In]:[M]:[Zn] that is close to 0:2:1, two phases of a spinel crystal structure and a layered crystal structure are likely to exist. In addition, with an atomic ratio of [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 4A shows an example of the preferred ranges of the atomic ratio of indium, the element M, and zinc contained in a metal oxide.

A metal oxide with a higher content of indium can have higher carrier mobility (electron mobility). Therefore, a metal oxide with a high indium content has higher carrier mobility than a metal oxide with a low indium content.

By contrast, when the content of indium and zinc in a metal oxide becomes lower, carrier mobility becomes lower. Thus, with an atomic ratio of [In]:[M]:[Zn]=0:1:0 and the neighborhood thereof (e.g., a region C in FIG. 4C), the insulating property becomes better. Note that since the region C includes a region that is likely to have the above spinel crystal structure, it is preferable to employ a composition with which the region that is likely to have the spinel crystal structure is avoided.

For example, the metal oxide used for a channel formation region and a low-resistance region preferably has an atomic ratio represented by the region A in FIG. 4A. The metal oxide used for the channel formation region and the low-resistance region may have an atomic ratio of In:Ga:Zn=4:2:3 to 4.1 and approximately a value in the neighborhood thereof, for example. Alternatively, the metal oxide may have an atomic ratio of In:Ga:Zn=1:1:1 and approximately a value in the neighborhood thereof, for example. On the other hand, in the case where the metal oxide is provided to surround the channel formation region and the low-resistance region, the metal oxide preferably has an atomic ratio represented by the region C in FIG. 4C, with which a relatively high insulating property is obtained. The metal oxide provided to surround the channel formation region and the low-resistance region may have an atomic ratio of In:Ga:Zn=1:3:4 and approximately a value in the neighborhood thereof, or an atomic ratio of In:Ga:Zn=1:3:2 and approximately a value in the neighborhood thereof. Alternatively, the metal oxide provided to surround the channel formation region and the low-resistance region may be formed using a metal oxide that is equivalent to a metal oxide used as the channel formation region and the low-resistance region.

A metal oxide with an atomic ratio in the region A, particularly in a region B in FIG. 4B, has high carrier mobility and high reliability and is excellent.

Note that the region B includes [In]:[M]:[Zn]=4:2:3 to 4.1 and the neighborhood thereof. The neighborhood includes an atomic ratio [In]:[M]:[Zn] of 5:3:4, for example. In addition, the region B includes [In]:[M]:[Zn]=5:1:6 and the neighborhood thereof and [In]:[M]:[Zn]=5:1:7 and the neighborhood thereof. Note that the region B includes an atomic ratio of [In]:[M]:[Zn]=1:1:1 and the neighborhood thereof.

As described above, the electrical conductivity of the metal oxide largely varies depending on the atomic ratio. By forming a metal oxide by an ALD method as described above, a metal oxide having a layered crystal structure corresponding to the atomic ratio can be formed. Thus, by employing an ALD method, a metal oxide corresponding to required characteristics can be formed.

Next, details of a method for forming the oxide 60 including the In-M-Zn oxide illustrated in FIGS. 2A and 2B are described with reference to FIG. 5D and FIGS. 6A to 6C.

Figure 5A:
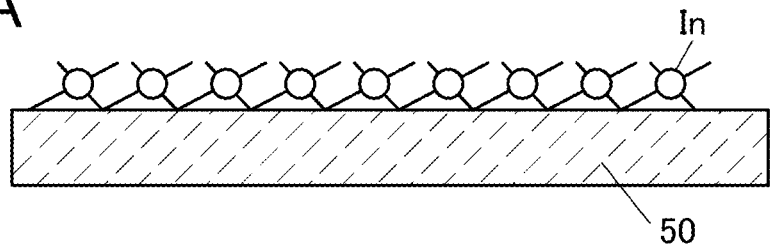
FIGS. 5A to 5D are cross-sectional views illustrating an example of a method for forming a metal oxide.

First, as illustrated in FIG. 5A, a source gas containing a precursor containing indium is introduced into a chamber so that the precursor is adsorbed onto the surface of the structure body 50.

Here, the source gas containing the precursor contains a carrier gas such as argon, helium, or nitrogen in addition to the precursor.

An example of a precursor containing indium is a compound represented by General Formula (G1). Examples include trimethylindium, triethylindium, ethyldimethylindium, tris(1-methylethyl)indium, tris(2,2,6,6-tetramethyl-3,5-heptanedione acid)indium, cyclopentadienylindium, indium(III)acetylacetonate, (diethylphosphino)dimethylindium, chlorodimethylindium, bromodimethylindium, dimethyl(2-propanolato)indium, indium trichloride, indium tribromide, and indium triiodide.

Next, introduction of the source gas is stopped and the chamber is purged so that an excess precursor, a reaction product, and the like are expelled from the chamber.

Figure 5B:
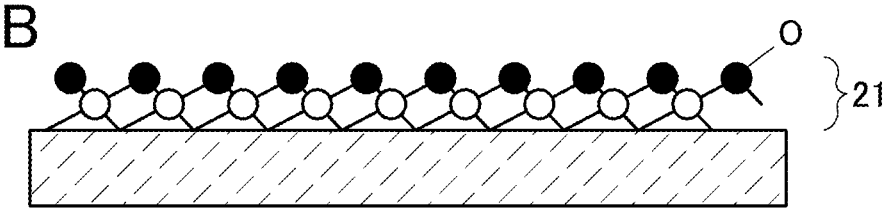

Then, as illustrated in FIG. 5B, an oxidizer is introduced as a reactant into the chamber to react with the adsorbed precursor, and components other than indium are released while indium is adsorbed onto the substrate, whereby the layer 21 in which indium and oxygen are bonded to each other is formed.

Ozone, oxygen, water, or the like can be used as the oxidizer.

After that, introduction of the oxidizer is stopped and the chamber is purged so that an excess reactant, a reaction product, and the like are expelled from the chamber.

Figure 5C:
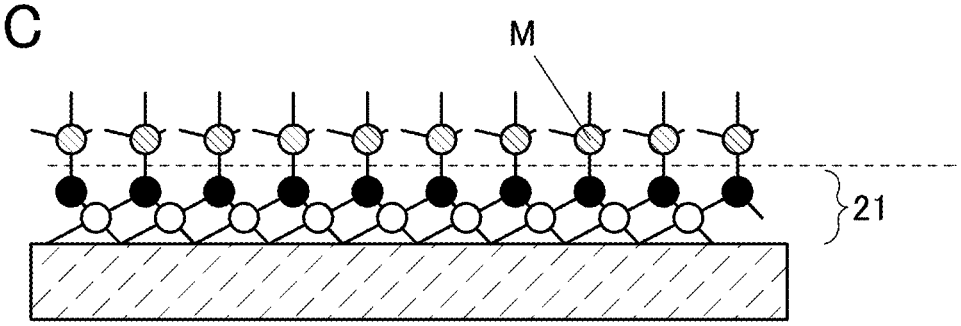

Subsequently, as illustrated in FIG. 5C, a source gas containing a precursor containing the element M is introduced into the chamber so that the precursor is adsorbed onto the layer 21.

An example of a precursor containing the element M is a compound represented by General Formula (G2). Here, gallium, aluminum, or tin is used as the element M.

Examples of a precursor containing gallium include trimethylgallium, triethylgallium, triphenylgallium, diethyl(3-methyl-2,4-cyclopropanedien-1-yl)gallium, [4-(1,1-dimethyl)phenyl]dimethylgallium, dimethyl(4-methylphenyl) gallium, dimethylphenylgallium, methyldiphenylgallium, ethyldimethylgallium, dimethylmethylenegallium, gallium (III)acetylacetonate, tris(2,2,6,6-tetramethyl-3,5-heptanedione acid)gallium, dimethyl(2-methyl-2-propanolato)gallium, methoxydimethylgallium, hydroxydimethylgallium, (methanethiolato)dimethylgallium, chlorodimethylgallium, chlorodiethylgallium, chlorodipropylgallium, bromodimethylgallium, bromodiethylgallium, dimethyliodogallium, chlorobis(2,2-dimethylpropyl)gallium, gallium trichloride, gallium tribromide, and gallium triiodide.

Examples of a precursor containing aluminum include trimethylaluminum, triethylaluminum, chlorodimethylaluminum, dichloromethylaluminum, bromodimethylaluminum, iododimethylaluminum, aluminumacetylacetonate, tris(2,2,6,6-tetramethyl-3,5-heptanedione acid)aluminum, dimethylchloroaluminum, diethylchloroaluminum, aluminum trichloride, aluminum tribromide, and aluminum triiodide.

Examples of a precursor containing tin include tetramethyltin, tetraethyltin, tetraethenyltin, tetraallyltin, tributylvinyltin, allyltributyltin, tributylstanylacetylene, tributylphenyltin, chlorotrimethyltin, chlorotriethyltin, tin tetrachloride, tin tetrabromide, and tin tetraiodide.

Next, introduction of the source gas is stopped and the chamber is purged so that an excess precursor, a reaction product, and the like are expelled from the chamber.

Figure 5D:
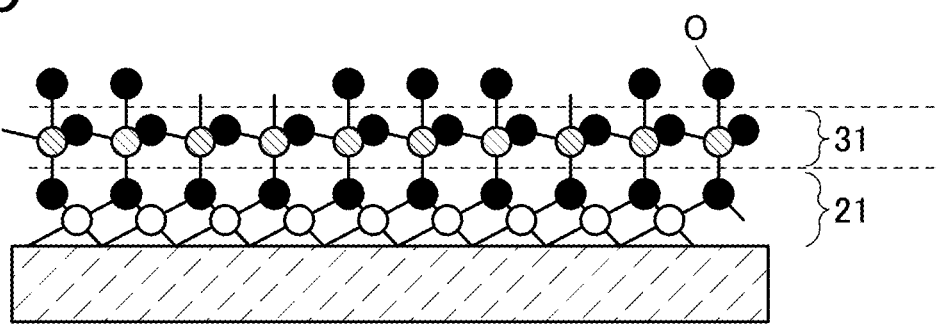

Then, as illustrated in FIG. 5D, an oxidizer is introduced as a reactant into the chamber to react with the adsorbed precursor, and components other than the element M are released while the element M is adsorbed onto the substrate, whereby the layer 31 in which the element M and oxygen are bonded to each other is formed. At this time, part of oxygen adsorbed onto the layer 31 may be contained in the layer 41 described later.

After that, introduction of the oxidizer is stopped and the chamber is purged so that an excess reactant, a reaction product, and the like are expelled from the chamber.

Figure 6A:
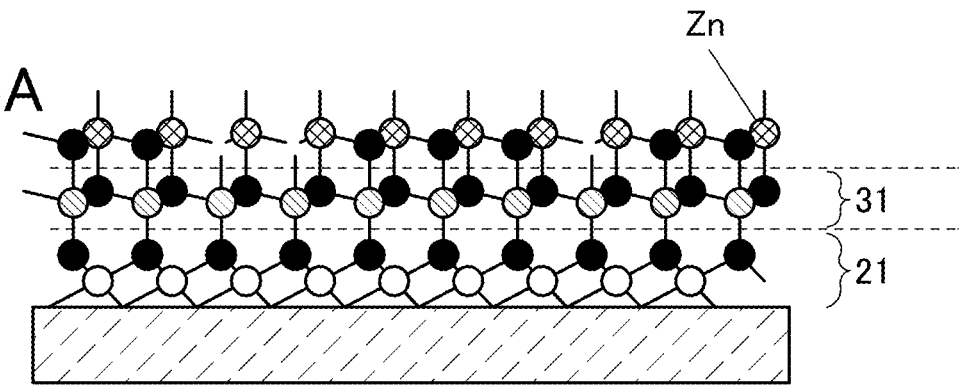
FIGS. 6A to 6C are cross-sectional views illustrating the example of a method for forming a metal oxide.

Subsequently, as illustrated in FIG. 6A, a source gas containing a precursor containing zinc is introduced into the chamber so that the precursor is adsorbed onto the layer 31. At this time, part of the layer 41 in which zinc is bonded to oxygen is formed in some cases.

An example of a precursor containing zinc is a compound represented by General Formula (G3). For example, dimethylzinc, diethylzinc, bis(1-methylethyl)zinc, bis(1,1-dimethylethyl)zinc, dibutylzinc, diethenylzinc, dicyclohexylzinc, bis(2,2,6,6-tetramethyl-3,5-heptanedione acid)zinc, zinc chloride, chloromethylzinc, zinc bromide, bromomethylzinc, and zinc iodide are given.

Next, introduction of the source gas is stopped and the chamber is purged so that an excess precursor, a reaction product, and the like are expelled from the chamber.

Figure 6B:
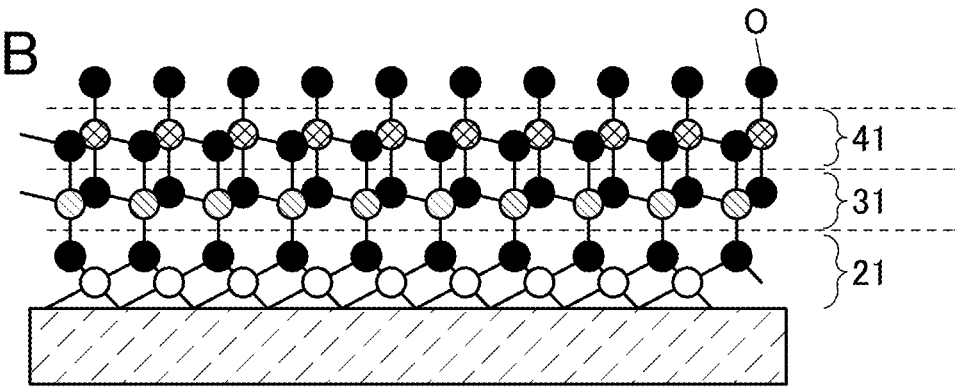

Then, as illustrated in FIG. 6B, an oxidizer is introduced as a reactant into the chamber to react with the adsorbed precursor, and components other than zinc are released while zinc is adsorbed onto the substrate, whereby the layer 41 in which zinc and oxygen are bonded to each other is formed.

After that, introduction of the oxidizer is stopped and the chamber is purged so that an excess reactant, a reaction product, and the like are expelled from the chamber.

Figure 6C:
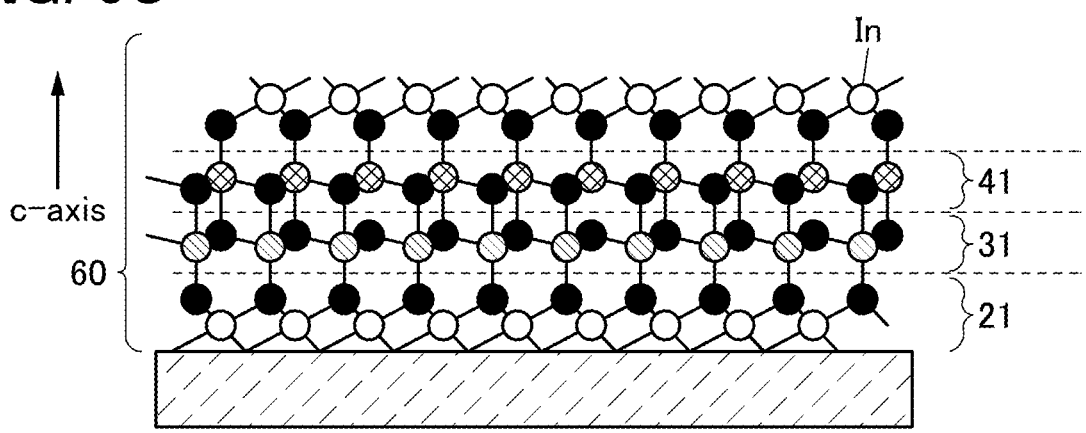

Next, as illustrated in FIG. 6C, the layer 21 is formed again over the layer 41 by the above-described method. By repeating the above-described method, the oxide 60 can be formed over the substrate or the structure body.

Other than above-described precursors containing the metal elements, there is a precursor containing one or both of carbon and chlorine. A film formed using a precursor containing carbon may contain carbon. A film formed using a precursor containing halogen such as chlorine may contain halogen such as chlorine.

The steps illustrated in FIGS. 5A to 5D and FIGS. 6A to 6C are preferably performed while the substrate is heated. For example, the substrate temperature may be set higher than or equal to 200° C. and lower than or equal to 600° C., preferably higher than or equal to 300° C. and lower than or equal to the decomposition temperature of the precursor. By performing the deposition while the substrate is heated within such a temperature range, an impurity such as hydrogen or carbon contained in the precursor, the reactant, or the like can be removed from the metal oxide in each of the steps in FIGS. 5A to 5D and FIGS. 6A to 6C. For example, carbon in the metal oxide can be released as $CO_2$ and CO, and hydrogen in the metal oxide can be released as $H_2O$. Furthermore, metal atoms and oxygen atoms are rearranged concurrently with removal of the impurity, so that oxide layers can be arranged orderly. Thus, a metal oxide having a layered crystal structure with high crystallinity, for example, a metal oxide having a CAAC structure can be formed.

Note that the impurity removal treatment is preferably performed intermittently during formation of the oxide 60. For example, the impurity removal treatment is preferably performed every time a three-layer stack of the layers 21, 31, and 41 is formed n times (n is an integer greater than or equal to 1 and less than or equal to 50, preferably greater than or equal to 2 and less than or equal to 30, further preferably greater than or equal to 5 and less than or equal to 10). The impurity removal treatment is preferably performed also after the formation of the oxide 60.

By performing the impurity removal treatment, an impurity such as hydrogen or carbon contained in the metal oxide can be removed. For example, carbon in the metal oxide can be released as $CO_2$ and CO, and hydrogen in the metal oxide can be released as $H_2O$. Furthermore, metal atoms and oxygen atoms are rearranged concurrently with removal of the impurity, which improves crystallinity. Thus, a metal oxide having a layered crystal structure with high crystallinity, specifically, a metal oxide having a CAAC structure can be formed.

As described above, the oxide 60 is formed by an ALD method, whereby the metal oxide having a CAAC structure, in which the c-axis is aligned substantially parallel to the normal direction of the deposition surface, can be obtained.

Note that FIGS. 5A to 5D and FIGS. 6A to 6C illustrate an example where the layer 21 is formed as a layer containing indium, the layer 31 is formed thereover as a layer containing the element M, and further the layer 41 is formed thereover as a layer containing zinc; however, this embodiment is not limited thereto. One of the layers 31 and 41 may be formed, the layer 21 may be formed thereover, and further the other of the layers 31 and 41 may be formed thereover. Alternatively, one of the layers 31 and 41 may be formed, the other of the layers 31 and 41 may be formed thereover, and further the layer 21 may be formed thereover.

In the case of forming a metal oxide with an atomic ratio that is different from In:M:Zn=1:1:1, the layers 21, 31, and 41 are formed as appropriate in accordance with the atomic ratio. For example, the formation of the layer 41 is repeated a plurality of times before and after the formation of the layer 31 illustrated in FIG. 6A so that a stack including the layer 31 and the layers 41 and having the desired number of atoms and layers and a desired thickness is formed between two layers 21.

<Deposition Apparatus>

Figure 7:
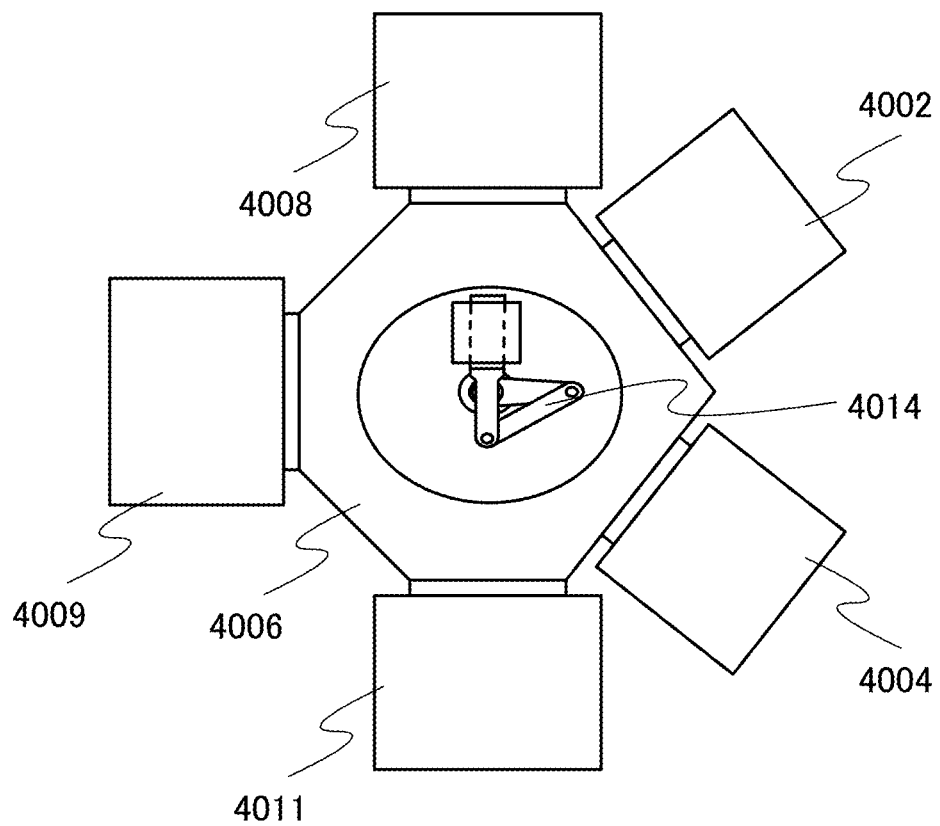
FIG. 7 is a top view illustrating an example of a deposition apparatus.
Figure 8A:
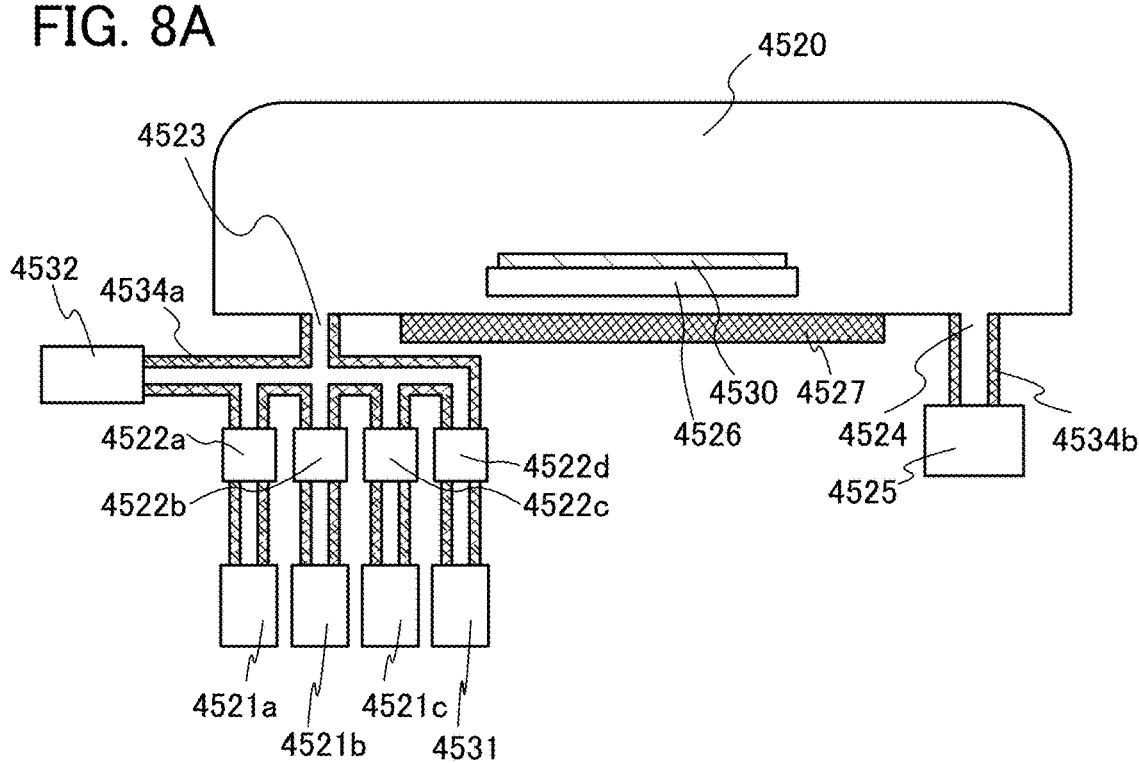
FIGS. 8A and 8B are cross-sectional views illustrating examples of a deposition apparatus.
Figure 8B:
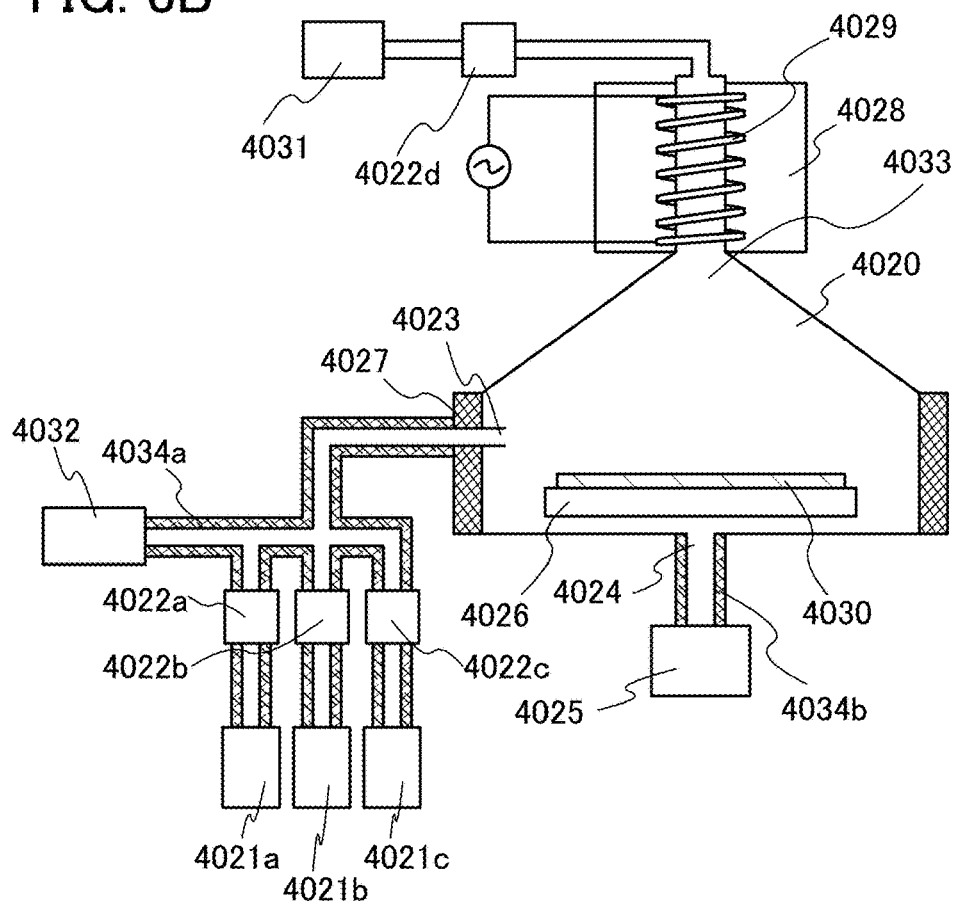

A structure of a deposition apparatus 4000 is described with reference to FIG. 7 and FIGS. 8A and 8B as an example of an apparatus with which a film can be formed by an ALD method. FIG. 7 is a schematic diagram of the deposition apparatus 4000 that is of a multi-chamber type, and FIGS. 8A and 8B are each a cross-sectional view of an ALD apparatus that can be used for the deposition apparatus 4000.

The deposition apparatus 4000 illustrated in FIG. 7 includes a carrying-in/out chamber 4002, a carrying-in/out chamber 4004, a transfer chamber 4006, a deposition chamber 4008, a deposition chamber 4009, a treatment chamber 4011, and a transfer arm 4014. Here, the carrying-in/out chamber 4002, the carrying-in/out chamber 4004, the deposition chamber 4008, the deposition chamber 4009, and the treatment chamber 4011 are each independently connected to the transfer chamber 4006 through a gate valve. Thus, successive treatment can be performed in the deposition chamber 4008, the deposition chamber 4009, and the treatment chamber 4011 without exposure to the air, whereby entry of impurities into a film can be prevented. Moreover, contamination of an interface between a substrate and a film and interfaces between films can be reduced, so that clean interfaces can be obtained.

Note that in order to prevent attachment of moisture, for example, the carrying-in/out chamber 4002, the carrying-in/out chamber 4004, the transfer chamber 4006, the deposition chamber 4008, the deposition chamber 4009, and the treatment chamber 4011 are preferably filled with an inert gas (such as a nitrogen gas) whose dew point is controlled, more preferably maintain reduced pressure.

An ALD apparatus can be used in the deposition chamber 4008 and the deposition chamber 4009. A deposition apparatus other than an ALD apparatus may be used for either the deposition chamber 4008 or the deposition chamber 4009. Examples of the deposition apparatus that can be used in the deposition chamber 4008 and the deposition chamber 4009 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus.

In the treatment chamber 4011, it is preferable to use an apparatus having a function other than that of a deposition apparatus, such as a heating apparatus (typically, a vacuum heating apparatus) or a plasma generation apparatus (typically, a μ-wave plasma generation apparatus).

For example, in the case where an ALD apparatus is used in the deposition chamber 4008, a sputtering apparatus is used in the deposition chamber 4009, and a heating apparatus is used in the treatment chamber 4011, a base insulating film can be formed in the deposition chamber 4009, an oxide semiconductor film functioning as an active layer can be formed in the deposition chamber 4008, and heat treatment after the formation of the oxide semiconductor film can be performed in the treatment chamber 4011. In this case, the formation of the base insulating film, the formation of the oxide semiconductor film, and the heat treatment can be performed successively without exposure to the air.

Although the deposition apparatus 4000 includes the carrying-in/out chamber 4002, the carrying-in/out chamber 4004, the deposition chamber 4008, the deposition chamber 4009, and the treatment chamber 4011, the present invention is not limited to this structure. The number of the deposition chambers in the deposition apparatus 4000 may be one or three or more. The number of the treatment chambers in the deposition apparatus 4000 may be two or more. The deposition apparatus 4000 may be of a single-wafer type or may be of a batch type.

<ALD Apparatus>

Next, a structure of a thermal ALD apparatus that can be used for the deposition apparatus 4000 is described with reference to FIG. 8A. The thermal ALD apparatus includes a deposition chamber (a chamber 4520), a source material supply portion 4521 (a source material supply portion 4521a to a source material supply portion 4521c), a source material supply portion 4531, a high-speed valve 4522a to a high-speed valve 4522d that are introduction amount controllers, a gas supply portion 4532, a source material introduction port 4523, a source material exhaust port 4524, and an evacuation unit 4525. The source material introduction port 4523 provided in the chamber 4520 is connected to the source material supply portion 4521a, the source material supply portion 4521b, the source material supply portion 4521c, the source material supply portion 4531, and the gas supply portion 4532 through supply tubes and valves, and the source material exhaust port 4524 is connected to the evacuation unit 4525 through an exhaust tube, a valve, and a pressure controller, for example.

A substrate holder 4526 is provided in the chamber 4520, and a substrate 4530 is placed on the substrate holder 4526. The substrate holder 4526 may include a rotation mechanism. A heater 4527, which is provided on an outside wall of the chamber 4520, can control the temperature inside the chamber 4520 and the temperatures of the substrate holder 4526, the surface of the substrate 4530, and the like. The heater 4527 is preferably capable of controlling the surface temperature of the substrate 4530 to higher than or equal to 300° C. and lower than or equal to 500° C., preferably higher than or equal to 400° C. and lower than or equal to 450° C. The temperature of the heater 4527 itself is preferably controlled to higher than or equal to 100° C. and lower than or equal to 600° C., for example. By performing the deposition while the substrate is heated within such a temperature range, an impurity such as hydrogen or carbon contained in the precursor, the reactant, or the like can be inhibited from remaining in the metal oxide. Furthermore, metal atoms and oxygen atoms are rearranged concurrently with removal of the impurities, so that oxide layers can be arranged orderly. Thus, a metal oxide having a layered crystal structure with high crystallinity can be formed. In addition, the heat treatment after the deposition of the metal oxide may be performed with the use of the heater 4527.

In the source material supply portion 4521a, the source material supply portion 4521b, the source material supply portion 4521c, and the source material supply portion 4531, a source gas is formed from a solid source material or a liquid source material using a vaporizer, a heating unit, or the like. Alternatively, the source material supply portion 4521a, the source material supply portion 4521b, the source material supply portion 4521c, and the source material supply portion 4531 may supply a source gas.

In the deposition apparatus illustrated in FIG. 8A, a metal oxide can be formed by appropriate selection of source materials (e.g., a volatile organic metal compound) used in the source material supply portion 4521 and the source material supply portion 4531 and introduction of the materials into the chamber 4520. In the case where an In—Ga—Zn oxide, which contains indium, gallium, and zinc, is formed as the metal oxide as described above, it is preferable to use a deposition apparatus provided with at least three source material supply portions 4521a to 4521c and at least one source material supply portion 4531, as illustrated in FIG. 8A.

For example, a precursor containing indium is supplied from the source material supply portion 4521a, a precursor containing gallium is supplied from the source material supply portion 4521b, and a precursor containing zinc is supplied from the source material supply portion 4521c. Any of the above-described precursors can be used as the precursor containing indium, the precursor containing gallium, and the precursor containing zinc.

A reactant is supplied from the source material supply portion 4531. An oxidizer containing at least one of ozone, oxygen, and water can be used as the reactant.

A carrier gas is supplied from the gas supply portion 4532. As the carrier gas, an inert gas such as argon (Ar), helium (He), or nitrogen ($N_2$) can be used. The precursor from the source material supply portion 4521 and the reactant from the source material supply portion 4531 are mixed with the carrier gas and introduced into the chamber 4520.

A pipe heater 4534a is provided to cover the pipe, the valve, and the like between the source material supply portion 4521a, the source material supply portion 4521b, the source material supply portion 4521c, the source material supply portion 4531, and the gas supply portion 4532 and the chamber 4520. A pipe heater 4534b is provided to cover the pipe, the valve, and the like between the evacuation unit 4525 and the chamber 4520. The temperatures of the pipe heater 4534a and the pipe heater 4534b are set as appropriate in a range from room temperature to 300° C., for example. Provision of such pipe heaters can prevent a precursor or the like supplied from the source material supply portion 4521 from being solidified on inner walls of pipes or the like of the gas introduction system and the gas evacuation system. The temperatures of the pipe heater 4534a, the pipe heater 4534b, and the heater 4527 are preferably controlled independently. Alternatively, the temperatures of the pipe heater 4534a, the pipe heater 4534b, and the heater 4527 may be controlled collectively.

The high-speed valve 4522a to the high-speed valve 4522d can be precisely controlled based on time. Thus, source gases supplied from the source material supply portion 4521a, the source material supply portion 4521b, the source material supply portion 4521c, and the source material supply portion 4531 can be controlled to be introduced into the chamber 4520.

For example, in the case of supplying a precursor included in any of the source material supply portion 4521a, the source material supply portion 4521b, and the source material supply portion 4521c, a corresponding high-speed valve among the high-speed valve 4522a to the high-speed valve 4522c is opened. In the case of supplying a reactant included in the source material supply portion 4531, the high-speed valve 4522d is opened. In the case of purging the chamber 4520, the high-speed valve 4522a to the high-speed valve 4522d are closed and only a carrier gas included in the gas supply portion 4532 is introduced into the chamber 4520.

Although FIG. 8A illustrates the example where three source material supply portions 4521 and one source material supply portion 4531 are provided, this embodiment is not limited thereto. One, two, or four or more source material supply portions 4521 may be provided. In addition, two or more source material supply portions 4531 may be provided.

In FIG. 8A, the heater 4527, the source material introduction port 4523, and the source material exhaust port 4524 are provided on the lower portion of the chamber 4520; however, without limitation to this, their arrangement can be set as appropriate. In FIG. 8A, inlets of the source material supply portion 4521a, the source material supply portion 4521b, the source material supply portion 4521c, the source material supply portion 4531, and the gas supply portion 4532 are combined into the source material introduction port 4523; however, without limitation to this, inlets different from each other may be provided.

Next, a structure of a plasma ALD apparatus that can be used for the deposition apparatus 4000 is described with reference to FIG. 8B. The plasma ALD apparatus includes a deposition chamber (a chamber 4020), a source material supply portion 4021 (a source material supply portion 4021a to a source material supply portion 4021c), a source material supply portion 4031, a high-speed valve 4022a to a high-speed valve 4022d that are introduction amount controllers, a gas supply portion 4032, a source material introduction port 4023, a source material introduction port 4033, a source material exhaust port 4024, and an evacuation unit 4025. The source material introduction port 4023 and the source material introduction port 4033 provided in the chamber 4020 are connected to the source material supply portion 4021a, the source material supply portion 4021b, the source material supply portion 4021c, the source material supply portion 4031, and the gas supply portion 4032 through supply tubes and valves, and the source material exhaust port 4024 is connected to the evacuation unit 4025 through an exhaust tube, a valve, and a pressure controller. A substrate holder 4026 is positioned in the chamber 4020, and a substrate 4030 is placed on the substrate holder 4026. A heater 4027 is provided on an outside wall of the chamber, and a pipe heater 4034a and a pipe heater 4034b are provided to cover pipes and the like connected to the chamber.

Here, the chamber 4020, the source material supply portion 4021, the source material supply portion 4031, the high-speed valve 4022a to the high-speed valve 4022d, the gas supply portion 4032, the source material introduction port 4023, the source material exhaust port 4024, the evacuation unit 4025, the substrate holder 4026, the substrate 4030, the heater 4027, the pipe heater 4034a, and the pipe heater 4034b correspond to the chamber 4520, the source material supply portion 4521, the source material supply portion 4531, the high-speed valve 4522a to the high-speed valve 4522d, the gas supply portion 4532, the source material introduction port 4523, the source material exhaust port 4524, the evacuation unit 4525, the substrate holder 4526, the substrate 4530, the heater 4527, the pipe heater 4534a, and the pipe heater 4534b, respectively; and the above description can be referred to for specific structures.

In the plasma ALD apparatus, the plasma generation apparatus 4028 is connected to the chamber 4020 as illustrated in FIG. 8B, whereby film formation can be performed by a plasma ALD method instead of a thermal ALD method. It is preferable that the plasma generation apparatus 4028 be an ICP-type plasma generation apparatus using a coil 4029 connected to a high frequency power source. The high-frequency power source is capable of outputting power with a frequency higher than or equal to 10 kHz and lower than or equal to 100 MHz, preferably higher than or equal to 1 MHz and lower than or equal to 60 MHz, further preferably higher than or equal to 2 MHz and lower than or equal to 60 MHz. For example, power with a frequency of 13.56 MHz can be output. By a plasma ALD method, a film can be formed without decreasing the deposition rate even at low temperatures; thus, a plasma ALD method is preferably used for a single-wafer type deposition apparatus with low deposition efficiency.

A reactant released from the source material supply portion 4031 passes through the plasma generation apparatus 4028 and turns into a plasma state. The reactant in the plasma state is introduced from the source material introduction port 4033 into the chamber 4020. Although not illustrated in FIG. 8B, a reactant released from the source material supply portion 4031 may be mixed with a carrier gas.

The substrate holder 4526 may be provided with a mechanism to which a constant potential or a high-frequency wave is applied. Alternatively, the substrate holder 4526 may be floating or grounded.

In FIG. 8B, the source material introduction port 4033 is provided on the upper portion of the chamber 4520, the heater 4027 and the source material introduction port 4023 are provided on a side surface of the chamber 4520, and the source material exhaust port 4524 is provided on the lower portion of the chamber 4520; however, without limitation to this, their arrangement can be set as appropriate.

Another structure of an ALD apparatus that can be used for the deposition apparatus 4000 is described with reference to FIGS. 9A to 9C. Note that detailed description on structures and functions similar to those of the ALD apparatus illustrated in FIG. 8B are omitted in some cases.

Figure 9A:
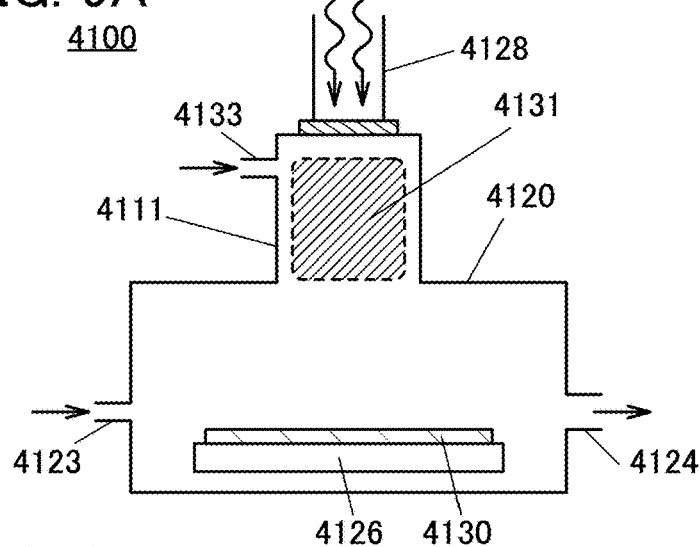
FIGS. 9A to 9C are cross-sectional views illustrating examples of a deposition apparatus.

FIG. 9A is a schematic view illustrating one embodiment of a plasma ALD apparatus. A plasma ALD apparatus 4100 is provided with a reaction chamber 4120 and a plasma generation chamber 4111 above the reaction chamber 4120. The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, a plasma generation apparatus 4128 enables a high-frequency wave such as RF or a microwave to be applied to a gas introduced to the plasma generation chamber 4111, thereby generating plasma 4131 in the plasma generation chamber 4111. In the case where the plasma 4131 is generated using a microwave, a microwave with a frequency of 2.45 GHz is typically used. Such plasma generated by application of the microwave and an electric field is referred to as electron cyclotron resonance (ECR) plasma in some cases.

A substrate holder 4126 is provided in the reaction chamber 4120, and a substrate 4130 is placed thereover. A source gas introduced from the source material introduction port 4123 is decomposed by heat from a heater provided in the reaction chamber 4120 and is deposited over the substrate 4130. A source gas introduced from the source material introduction port 4133 turns into a plasma state by the plasma generation apparatus 4128. The source gas in the plasma state is recombined with electrons or other molecules to be in a radical state before it reaches the surface of the substrate 4130, and reaches the substrate 4130. An ALD apparatus that performs deposition using a radical in such a manner is also referred to as a radical ALD (radical-enhanced ALD) apparatus in some cases. Although the plasma ALD apparatus 4100 has a structure where the plasma generation chamber 4111 is provided above the reaction chamber 4120, this embodiment is not limited to this structure. The plasma generation chamber 4111 may be provided adjacent to a side surface of the reaction chamber 4120.

Figure 9B:
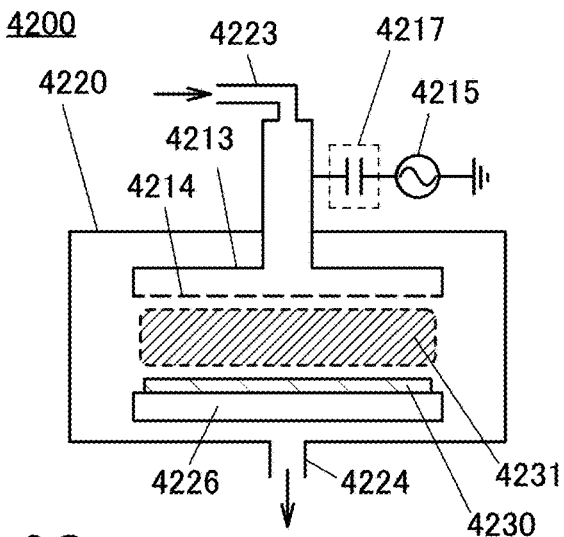

FIG. 9B is a schematic view illustrating one embodiment of a plasma ALD apparatus. A plasma ALD apparatus 4200 includes a chamber 4220. The chamber 4220 includes an electrode 4213, a source material exhaust port 4224, and a substrate holder 4226, and a substrate 4230 is placed over the substrate holder 4226. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213 The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode, respectively, for generating plasma 4231. A source gas introduced from the source material introduction port 4223 is decomposed by heat from a heater provided in the chamber 4220 and is deposited over the substrate 4230. Alternatively, the source gas introduced from the source material introduction port 4223 turns into a plasma state between the electrode 4213 and the substrate holder 4226. The source gas in the plasma state enters the substrate 4230 owing to a potential difference (also referred to as an ion sheath) generated between the plasma 4231 and the substrate 4230.

Figure 9C:
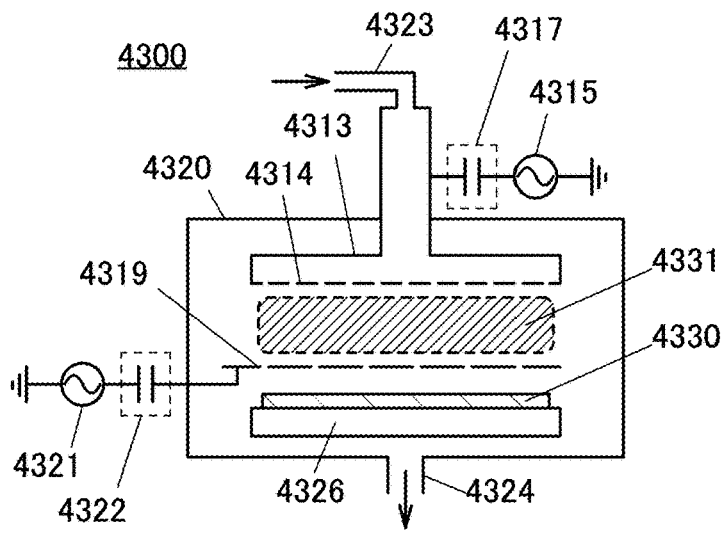

FIG. 9C is a schematic view illustrating one embodiment of a plasma ALD apparatus different from that in FIG. 9B. A plasma ALD apparatus 4300 includes a chamber 4320. The chamber 4320 includes an electrode 4313, a source material exhaust port 4324, and a substrate holder 4326, and a substrate 4330 is placed over the substrate holder 4326. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied. Alternatively, the substrate holder 4326 may be floating or grounded. The electrode 4313 and the substrate holder 4326 function as an upper electrode and a lower electrode, respectively, for generating plasma 4331. The plasma ALD apparatus 4300 is different from the plasma ALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 turns into a plasma state between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with suppressed damage due to plasma and the entry of ions.

For example, with the use of any of plasma ALD apparatuses illustrated in FIG. 8B and FIGS. 9A to 9C, plasma treatment or microwave treatment may be performed as the impurity removal treatment. This is preferable because transfer from the deposition chamber to another chamber for the impurity removal treatment is unnecessary.

Note that the plasma treatment or the microwave treatment after the formation of the metal oxide may be performed with the use of the plasma ALD apparatus illustrated in FIG. 8B and FIGS. 9A to 9C.

<Deposition Sequence>

Next, a deposition sequence of a metal oxide using the ALD apparatus illustrated in FIG. 8A is described with reference to FIGS. 10A and 10B, FIGS. 11A and 11B, and FIG. 12. In FIGS. 10A and 10B, FIGS. 11A and 11B, and FIG. 12, introductions of a first source gas to a fourth source gas are each indicated by ON, and periods during which the source gases are not introduced are each indicated by OFF.

Figure 10A:
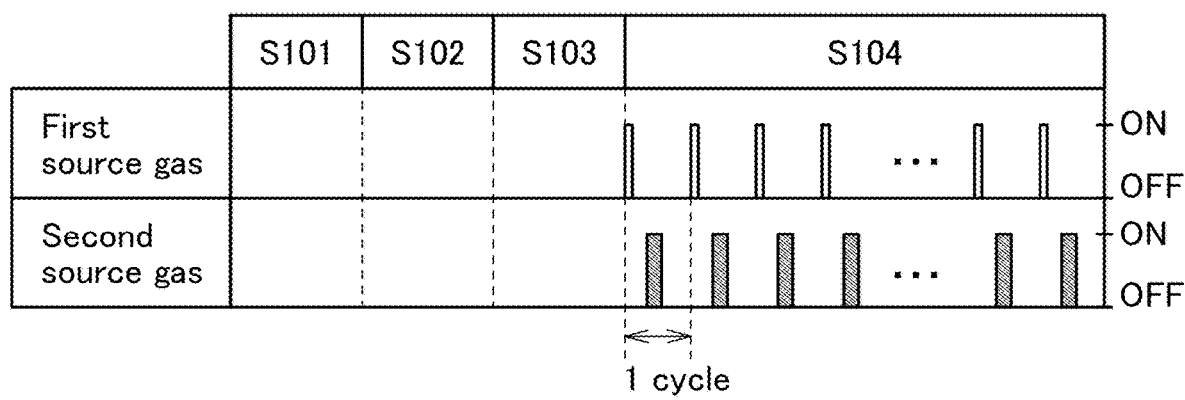
FIGS. 10A and 10B show examples of a method for forming a metal oxide.

FIG. 10A shows a deposition sequence using the ALD apparatus illustrated in FIG. 8A. First, the substrate 4530 is set on the substrate holder 4526 in the chamber 4520 (Step S101). Next, the temperature of the heater 4527 is adjusted (Step S102). At this time, the temperatures of the pipe heater 4534$a$ and the pipe heater 4534$b$ are preferably also adjusted. Then, the substrate 4530 is held on the substrate holder 4526 so that the temperature of the substrate 4530 becomes uniform in the substrate surface (Step S103). Next, a metal oxide is formed in accordance with the above first step to fourth step (Step S104). Note that after setting the substrate 4530 (Step S101), Step S102 may be omitted if the temperature of the heater 4527 does not need to be adjusted.

In Step S104, the first source gas (a source gas containing a precursor) and the second source gas (a source gas containing a reactant) are alternately introduced into the chamber 4520, whereby a film is formed over the substrate 4530. The first source gas and the second source gas are introduced in a pulsed form. In periods during which neither the first source gas nor the second source gas is introduced, the chamber 4520 is purged. In the deposition by an ALD method, introduction of the first source gas (the first step), purge of the first source gas (the second step), introduction of the second source gas (the third step), and purge of the second source gas (the fourth step) are regarded as one cycle, and a film having a desired thickness is formed by repetition of this cycle. Although intermittent impurity removal treatment is not mentioned here, the impurity removal treatment is preferably performed in the chamber 4520 or another chamber every time the cycle is repeated a plurality of times.

Furthermore, the second source gas containing a reactant may be introduced into the chamber 4020 between Step S103 and Step S104. It is preferable that one or more selected from ozone ($O_3$), oxygen ($O_2$), and water ($H_2O$), which function as oxidizers, be introduced as the second source gas. Introduction of water as the second source gas can form a hydrophilic group on the substrate 4530, so that the precursor can have a much improved adsorption property. Introduction of ozone and oxygen as the second source gas can provide an oxygen atmosphere in the chamber and supply oxygen to the base insulating film or the like formed on the substrate 4530. Accordingly, oxygen can be supplied to the metal oxide film formed over the base insulating film, so that the oxygen concentration in the film can be increased. In this case, the second source gas is preferably introduced in a pulsed form in a manner similar to that in Step S104; however, the present invention is not limited thereto. The second source gas may be successively introduced. In the period during which the second source gas is not introduced, the chamber 4520 is evacuated.

A first oxide layer is formed in one cycle using the above first source gas, a second oxide layer is formed in one cycle using the third source gas different from the first source gas, and a third oxide layer is formed in one cycle using the fourth source gas different from the first source gas, whereby a layered crystalline oxide including different oxide layers can be formed. Hereinafter, a deposition sequence corresponding to a deposition process of the In—Ga—Zn oxide illustrated in FIGS. 5A to 5D and FIGS. 6A to 6C is described as an example with reference to FIG. 10B.

FIG. 10 shows an example where deposition in Step S104 in the deposition sequence is performed using the first to third source gases that contain different precursors. Note that Steps S101 to S103 are as described above. Here, the first source gas contains a precursor containing indium, the third source gas contains a precursor containing gallium, and the fourth source gas contains a precursor containing zinc.

Figure 10B:
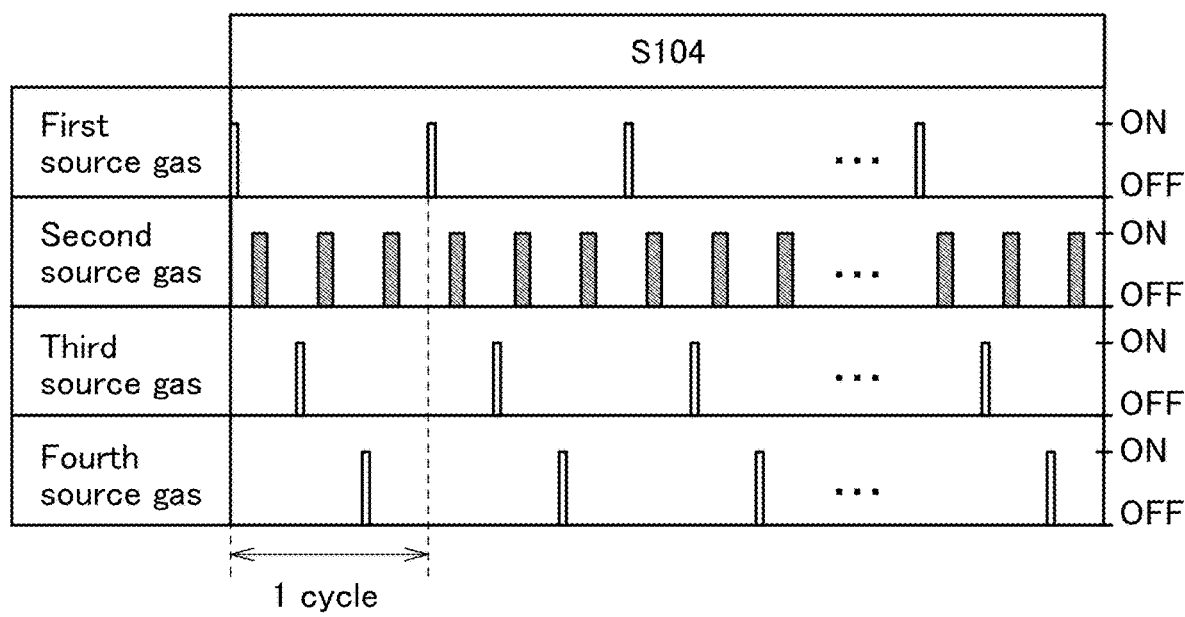

As shown in FIG. 10B, first, the first source gas is introduced, whereby the precursor containing indium is adsorbed onto the substrate 4530 (corresponding to FIG. 5A). Then, introduction of the first source gas is stopped and an excess first source gas in the chamber is purged.

Next, the second source gas is introduced, whereby the adsorbed precursor containing indium reacts with an oxidizer and a layer of indium oxide is formed (corresponding to FIG. 5B). Then, introduction of the second source gas is stopped and an excess second source gas in the chamber is purged.

Next, the third source gas is introduced, whereby the precursor containing gallium is adsorbed onto the layer of indium oxide (corresponding to FIG. 5C). Then, introduction of the third source gas is stopped and an excess third source gas in the chamber is purged.

Next, the second source gas is introduced, whereby the adsorbed precursor containing gallium reacts with an oxidizer and a layer of gallium oxide is formed (corresponding to FIG. 5D). Then, introduction of the second source gas is stopped and an excess second source gas in the chamber is purged.

Next, the fourth source gas is introduced, whereby the precursor containing zinc is adsorbed onto the layer of gallium oxide (corresponding to FIG. 6A). Then, introduction of the fourth source gas is stopped and an excess fourth source gas in the chamber is purged.

Next, the second source gas is introduced, whereby the adsorbed precursor containing zinc reacts with an oxidizer and a layer of zinc oxide is formed (corresponding to FIG. 6B). Then, introduction of the second source gas is stopped and an excess second source gas in the chamber is purged. Furthermore, the precursor containing indium is adsorbed onto the zinc oxide by the above method (corresponding to FIG. 6C).

The above steps of forming indium oxide, gallium oxide, and zinc oxide are regarded as one cycle and the cycle is repeated, whereby an In—Ga—Zn oxide with an atomic ratio of In:Ga:Zn=1:1:1 and a desired thickness can be formed.

Note that the first to fourth source gases are introduced in a pulsed form. The pulse time of introducing the first third, and fourth source gases into the chamber 4520 is preferably longer than or equal to 0.05 seconds and shorter than or equal to 1 second, further preferably longer than or equal to 0.1 seconds and shorter than or equal to 0.5 seconds. The time for evacuating the first, third, and fourth source gases from the chamber 4520 is longer than or equal to 0.1 seconds and shorter than or equal to 15 seconds, preferably longer than or equal to 0.5 seconds and shorter than or equal to 10 seconds. The pulse time of introducing the second source gas into the chamber 4520 is preferably longer than or equal to 0.05 seconds and shorter than or equal to 30 seconds, further preferably longer than or equal to 0.1 seconds and shorter than or equal to 15 seconds. The time for evacuating the second source gas from the chamber 4520 is longer than or equal to 0.1 seconds and shorter than or equal to 15 seconds, preferably longer than or equal to 0.1 seconds and shorter than or equal to 5 seconds.

Note that in the sequence shown in FIG. 10B, the order of introduction of the first, third, and fourth source gases is not limited thereto. For example, the fourth gas containing the precursor containing zinc may be introduced first. Since zinc oxide is more likely to form a crystal structure than indium oxide and gallium oxide, a stable crystal of zinc oxide can be formed in a bottom layer. Accordingly, layers of indium oxide and gallium oxide can be comparatively easily formed over the zinc oxide.

Formation of an In—Ga—Zn oxide with an atomic ratio of In:Ga:Zn=1:1:1 is described above; however, the present invention is not limited thereto. An In—Ga—Zn oxide with a different atomic ratio can be formed by a similar method. The number of pulses or the pulse time of a source gas containing a precursor in one cycle is preferably set in accordance with the atomic ratio of a desired In—Ga—Zn oxide.

For example, in the sequence shown in FIG. 10B, in order to form an In—Ga—Zn oxide with an atomic ratio of In:Ga:Zn=1:1:1, the numbers of pulses of the first source gas containing indium, the third source gas containing gallium, and the fourth source gas containing zinc are each one in one cycle. Here, the pulse times of the precursors are the same.

Figure 11A:
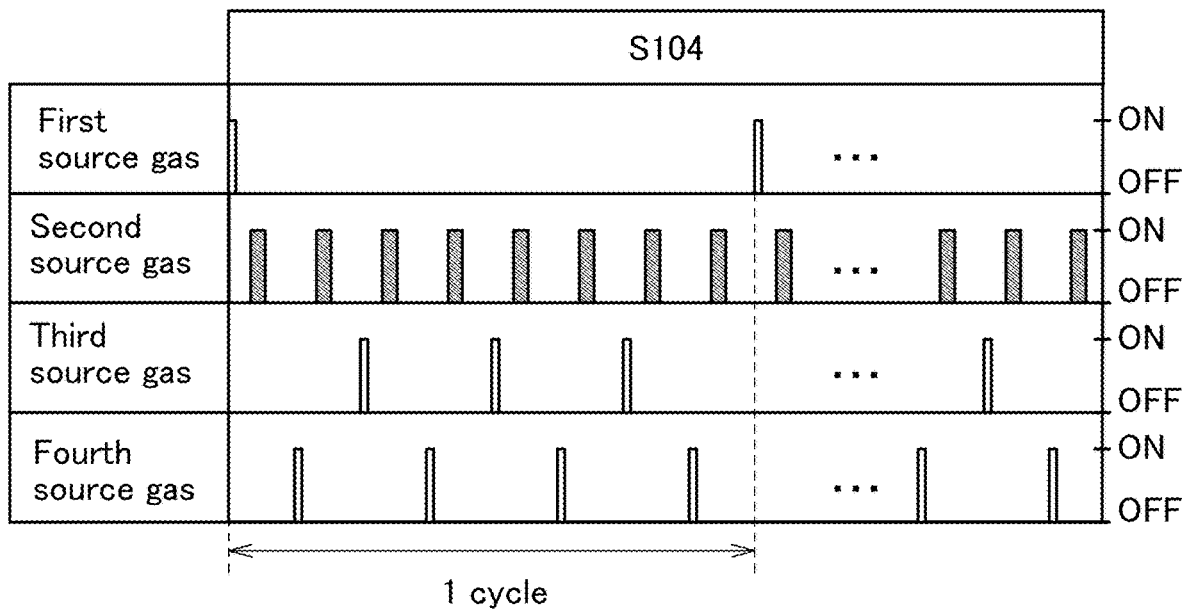
FIGS. 11A and 11B show examples of a method for forming a metal oxide.

FIG. 11A shows an example of a deposition sequence of an In—Ga—Zn oxide with an atomic ratio of In:Ga:Zn=1:3:4. In FIG. 11A, in one cycle, the number of pulses of the first source gas containing indium is one, the number of pulses of the third source gas containing gallium is three, and the number of pulses of the fourth source gas containing zinc is four. That is, the numbers of pulses of the source gases containing precursors correspond to the atomic ratio of In:Ga:Zn=1:3:4. By performing deposition in such a manner, a metal oxide having a layered crystal structure according to FIG. 2D can be formed.

Furthermore, by performing deposition by an ALD method while a substrate is heated as described above, rearrangement of oxide layers can be promoted. Accordingly, even when deposition is performed in accordance with the sequence shown in FIG. 11A, a layer in which one oxide layer contains two kinds of metal elements (indium and gallium), like the layer 22 illustrated in FIG. 2D, can be formed.

Note that in the above, introductions of different kinds of precursors are performed with the source gas containing a reactant introduced therebetween; however, the present invention is not limited thereto. For example, introductions of source gases containing the same kind of precursor may be successively performed with the source gas containing a reactant introduced therebetween. At this time, the numbers of pulses of the source gases containing the precursors in one cycle is preferably the same as the atomic ratio of a desired In—Ga—Zn oxide.

Moreover, in the above, the structure where only the source gas containing one kind of precursor is introduced in the interval between the oxidations using the second source gas is shown; however, the present invention is not limited thereto. Two or more kinds of source gases containing precursors may be introduced in the interval between the oxidations using the second source gas. At this time, two or more kinds of source gases containing precursors may be introduced at the same time. Alternatively, the same kind of precursor may be successively introduced twice in the interval between the oxidations using the second source gas.

Figure 11B:
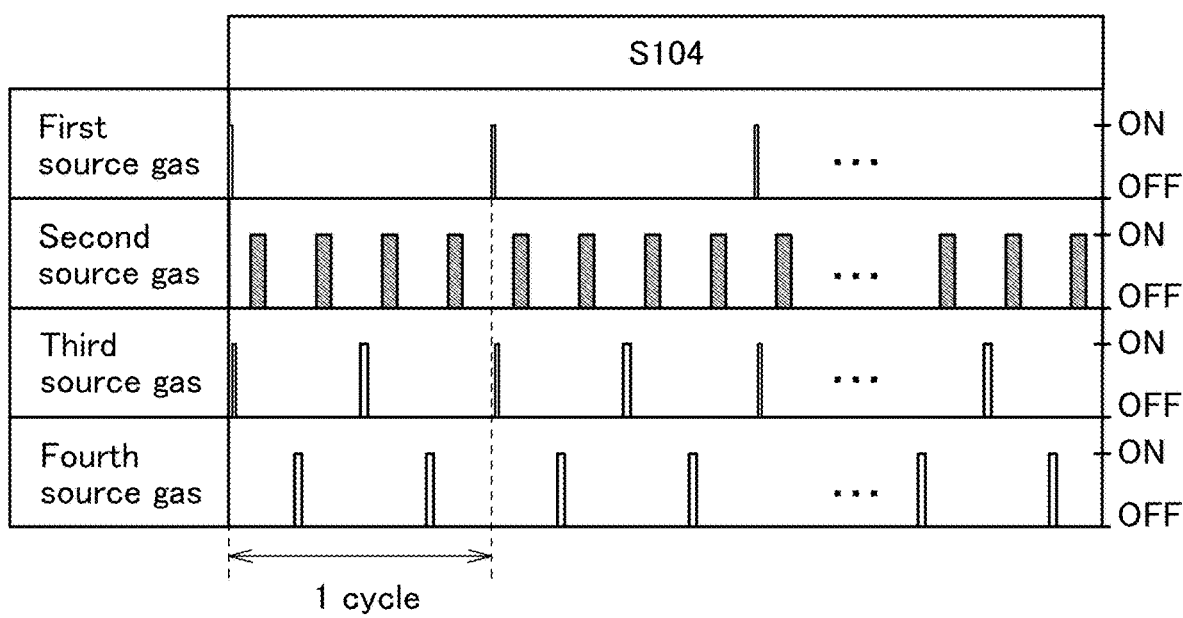

For example, when an In—Ga—Zn oxide with an atomic ratio of In:Ga:Zn=1:3:4 is formed, the deposition may be performed in a sequence shown in FIG. 11B. In FIG. 11B, in accordance with the crystal structure illustrated in FIG. 2D in which the layer 22, the layer 41, the layer 31, and the layer 41 are stacked in this order, the first source gas, the third source gas, the fourth source gas, the third source gas, and the fourth source gas are introduced in this order. Note that first introductions of the first source gas and the third source gas are performed without introducing the second source gas therebetween. In other words, an oxidizer is introduced after the precursor containing indium contained in the first source gas and the precursor containing gallium contained in the third source gas are adsorbed. Accordingly, like the layer 22 illustrated in FIG. 2D, a layer in which one oxide layer contains two kinds of metal elements (indium and gallium) can be formed. At this time, the pulse time of each of the first and third source gases is preferably approximately half of the pulse time of the fourth source gas. Accordingly, as shown in FIG. 11B, the ratio of the pulse time of the first source gas containing indium to the pulse time of the third source gas containing gallium and the pulse time of the fourth source gas containing zinc in one cycle can be 1:3:4, which is the same as the atomic ratio.

The formation of the oxide with a constant atomic ratio is described above; however, the present invention is not limited thereto. Two or more kinds of oxides with different atomic ratios can be successively formed by a similar method. In this case, for stacked oxides with different atomic ratios, the number of pulses or the pulse time of a source gas containing a precursor in one cycle is preferably set in accordance with the atomic ratios of the oxides. When deposition is performed in such a manner, the stacked oxides with different atomic ratios can be formed in one chamber. Thus, entry of an impurity such as hydrogen or carbon can be prevented in the interval in which the oxide is formed.

Figure 12:
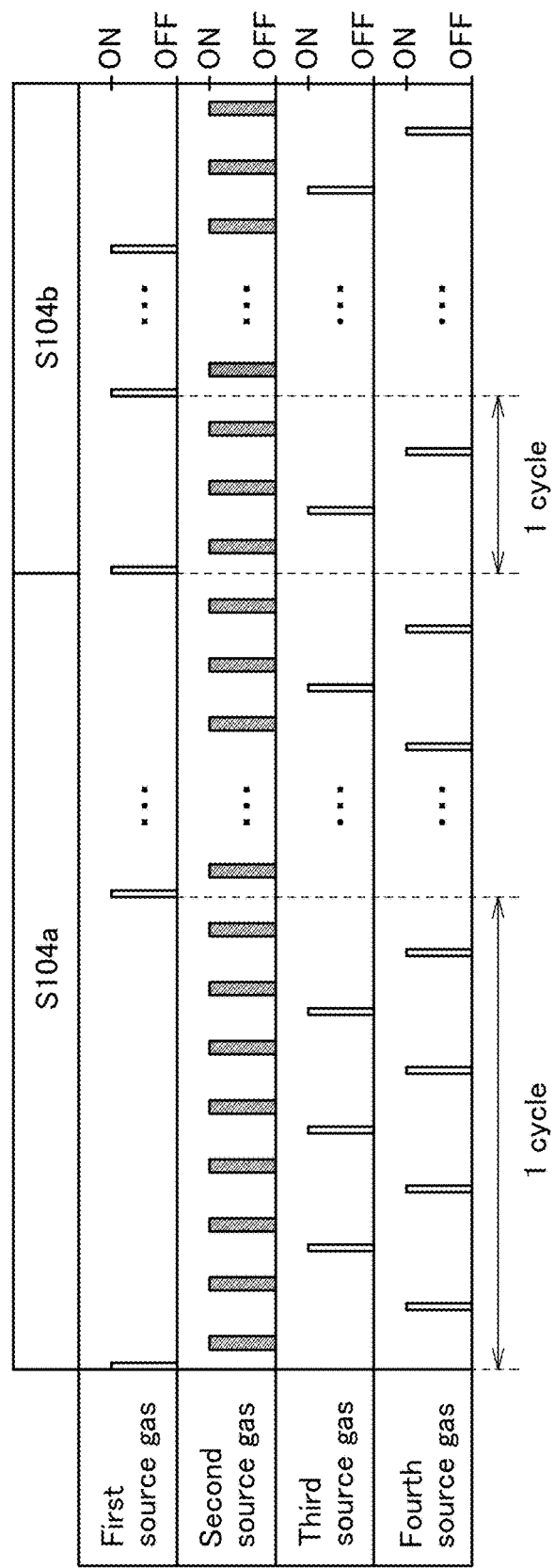
FIG. 12 shows an example of a method for forming a metal oxide.

FIG. 12 shows an example of a deposition sequence in the case where an oxide with an atomic ratio of In:Ga:Zn=1:1:1 is stacked over an oxide with an atomic ratio of In:Ga:Zn=1:3:4. Step 104a corresponds to the sequence of the oxide with an atomic ratio of In:Ga:Zn=1:3:4 and is similar to the sequence shown in FIG. 11A. Step 104b corresponds to the sequence of the oxide with an atomic ratio of In:Ga:Zn=1:1:1 and is similar to the sequence shown in FIG. 10B. As described above, the number of pulses in one cycle in the former period is the first source gas:the third source gas:the fourth source gas=1:3:4 and the number of pulses in one cycle in the latter period is the first source gas:the third source gas:the fourth source gas=1:1:1, so that a metal oxide having a stacked-layer structure including the oxide 62 and the oxide 60 illustrated in FIG. 3B can be formed. In other words, deposition is performed in the former period with the number of pulses corresponding to the atomic ratio of In:Ga:Zn=1:3:4 and deposition is performed in the latter period with the number of pulses corresponding to the atomic ratio of In:Ga:Zn=1:1:1.

In the above, the deposition method is described using an In—Ga—Zn oxide as an example; however, the present invention is not limited thereto. A precursor is set as appropriate in accordance with a metal element contained in a desired metal oxide. In the above, one or three kinds of precursors are used; however, without limitation to this, two kinds or four or more kinds may be used.

In the above, the example where deposition is performed using a precursor containing one kind of metal element is described; however, the present invention is not limited thereto. A precursor containing two or more kinds of metal elements may be used. For example, a precursor containing indium and gallium or a precursor containing gallium and zinc may be used. In this case, the number of source material supply portions 4521 illustrated in FIG. 8A and the like can be reduced.

<Classification of Crystal Structures>

Hereinafter, the classification of the crystal structures of the above metal oxide (oxide semiconductor) is described.

First, the classification of the crystal structures of an oxide semiconductor will be described with FIG. 13A. FIG. 13A is a diagram showing the classification of crystal structures of an oxide semiconductor, typically IGZO (a metal oxide containing In, Ga, and Zn).

The oxide semiconductor is classified into "amorphous", "crystalline", and "crystal", as shown in FIG. 13A. The term "Amorphous" includes a completely amorphous structure. The term "Crystalline" includes c-axis-aligned crystalline (CAAC), nanocrystalline (nc), and cloud-aligned composite (CAC) structures, excluding single crystal and poly crystal. Note that the term "Crystalline" excludes single crystal, poly crystal, and completely amorphous. The term "Crystal" includes single crystal and poly crystal structures.

The structure shown in the thick frame in FIG. 13A is a new crystalline phase, which is an intermediate state between "amorphous" and "crystal". That is, these structures are completely different from "Amorphous," which is energetically unstable, and "Crystal."

A crystal structure of a film or a substrate can be analyzed with an X-ray diffraction (XRD) spectrum. FIG. 13B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 13B and obtained by GIXD measurement is hereinafter simply referred to as an XRD spectrum. The CAAC-IGZO film in FIG. 13B has an atomic ratio of In:Ga:Zn=4:2:3 or the neighborhood thereof. The CAAC-IGZO film in FIG. 13B has a thickness of 500 nm.

As shown in FIG. 13B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 13B, the peak at 2θ of around 31° is asymmetric with the angle at which the peak intensity is observed as the axis.

The crystal structure of a film or a substrate can be analyzed with a diffraction pattern obtained by nanobeam electron diffraction (NBED) (also referred to as a nanobeam electron diffraction pattern). FIG. 13C shows a diffraction pattern of the CAAC-IGZO film. FIG. 13C shows a diffraction pattern obtained by the NBED method in which an electron beam is incident in the direction parallel to the substrate. The CAAC-IGZO film in FIG. 13C has an atomic ratio of In:Ga:Zn=4:2:3 or the neighborhood thereof. In the nanobeam electron diffraction method, electron diffraction is performed with a probe diameter of 1 nm.

As shown in FIG. 13C, a plurality of spots indicating c-axis alignment are observed in the diffraction pattern of the CAAC-IGZO film.

<Metal Oxide Having CAAC Structure>

The details of a metal oxide having a CAAC structure are described below.

The CAAC structure has a plurality of crystal regions each of which has c-axis alignment in a particular direction. Note that the particular direction refers to the thickness direction of a metal oxide having the CAAC structure, the normal direction of the surface where the metal oxide having the CAAC structure is formed, or the normal direction of the surface of the metal oxide having the CAAC structure. In the case where a crystal region is denoted, the crystal region refers to a crystal itself included in the CAAC structure, or a crystal included in the CAAC structure and a region in the vicinity thereof. Thus, a crystal included in the CAAC structure is sometimes referred to as a crystal region included in the CAAC structure.

The crystal region refers to a region having a periodic atomic arrangement. When an atomic arrangement is regarded as a lattice arrangement, the crystal region also refers to a region with a uniform lattice arrangement. The CAAC structure has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the metal oxide having the CAAC structure has c-axis alignment and no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region is approximately several tens of nanometers in some cases.

In the case of an In-M-Zn oxide (the element M is one or more kinds selected from aluminum, gallium, yttrium, tin, titanium, and the like), the CAAC structure tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that the layer containing indium and oxygen sometimes contains the element M or zinc. The layer containing the element M, zinc, and oxygen sometimes contains indium. Such a layered structure is observed as a lattice image in a high-resolution TEM image, for example.

When the metal oxide having the CAAC-structure is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) sometimes changes depending on the kind, composition, or the like of the metal element contained in the metal oxide.

For example, a plurality of bright spots are observed in the electron diffraction pattern of the metal oxide having the CAAC-OS structure. Note that one spot and another spot are symmetric with respect to a spot of the incident electron beam which passes through a sample (also referred to as a direct spot) (see FIG. 13C). Note that fast fourier transform (FFT) analysis on a TEM image yields an FFT image having a pattern reflecting reciprocal lattice space information like an electron diffraction pattern. That is, a crystal structure (e.g., CAAC structure) can be observed and evaluated by FFT analysis.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the metal oxide having the CAAC structure. That is, formation of a grain boundary is inhibited by the distortion of a lattice arrangement. This is probably because the metal oxide having the CAAC structure can tolerate distortion owing to a low density of arrangement of oxygen atoms in the a-b plane direction, an interatomic bond distance changed by substitution of a metal atom, and the like.

A metal oxide having the CAAC structure is a metal oxide with high crystallinity in which no clear grain boundary is observed. That is, in the metal oxide having the CAAC structure, a reduction in electron mobility due to the grain boundary is less likely to occur. Thus, the metal oxide having the CAAC structure is physically stable. Accordingly, the metal oxide having the CAAC structure is resistant to heat and has high reliability. Thus, a metal oxide having the CAAC structure is one of crystalline oxides having a crystal structure suitable for a semiconductor layer of a transistor.

A formation method of a metal oxide of one embodiment of the present invention, which performs deposition using a precursor with a high decomposition temperature while a substrate is heated at high temperature, enables formation of a film with few impurities. In addition, in the formation method of a metal oxide of one embodiment of the present invention, impurity removal treatment is performed intermittently during deposition in an atmosphere containing oxygen. This can inhibit hydrogen contained in a raw material such as a precursor from remaining in the metal oxide. In addition, carbon, nitrogen, and the like contained in a raw material such as a precursor can be inhibited from remaining in the metal oxide. Accordingly, the impurity concentration in the metal oxide can be reduced. Furthermore, the crystallinity of the metal oxide can be improved.

This embodiment can be combined with any of the other embodiments as appropriate. In this specification, in the case where a plurality of structure examples are shown in one embodiment, the structure examples can be combined as appropriate.

Embodiment 2

In this embodiment, a semiconductor device of one embodiment of the present invention will be described with reference to FIGS. 14A to 14D, FIGS. 15A to 15F, FIGS. 16A and 16B, FIGS. 17A to 17D, FIGS. 18A to 18C, FIGS. 19A to 19D, FIGS. 20A and 20B, and FIGS. 21A and 21B.

The semiconductor device of one embodiment of the present invention includes a transistor. A transistor of this embodiment includes the metal oxide described in Embodiment 1 in its channel formation region. That is, the transistor of this embodiment can be referred to as an OS transistor.

An OS transistor has a low off-state current and thus can achieve a semiconductor device with low power consumption. In addition, an OS transistor has excellent frequency characteristics and thus can achieve a semiconductor device that operates at high speed. The use of an OS transistor can achieve a semiconductor device having favorable electrical characteristics, a semiconductor device with a small variation in electrical characteristics of transistors, a semiconductor device with a high on-state current, or a semiconductor device with high reliability.

Note that a metal oxide exhibits an insulating property or a conductive property depending on the constituent elements or the composition. Thus, the metal oxide described in Embodiment 1 can sometimes be used as an insulator or a conductor included in a transistor or a semiconductor device by adjustment of the constituent elements, the composition, or the like.

Structure examples of a transistor including the metal oxide described in Embodiment 1 in its channel formation region are mainly described below. Note that <Constituent material of semiconductor device> described later can be referred to for constituent elements that can be used for a transistor or a semiconductor device.

[Transistor 600]

Figure 14A:
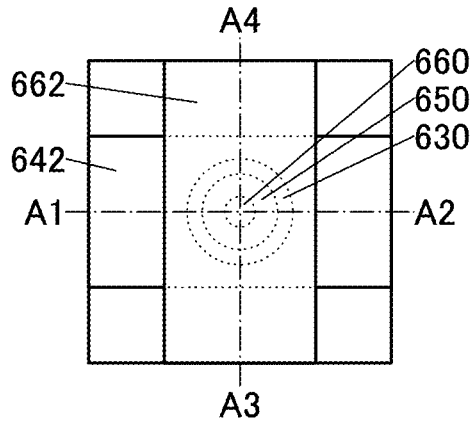
FIGS. 14A and 14D are plan views illustrating a structure example of a transistor.
Figure 14B:
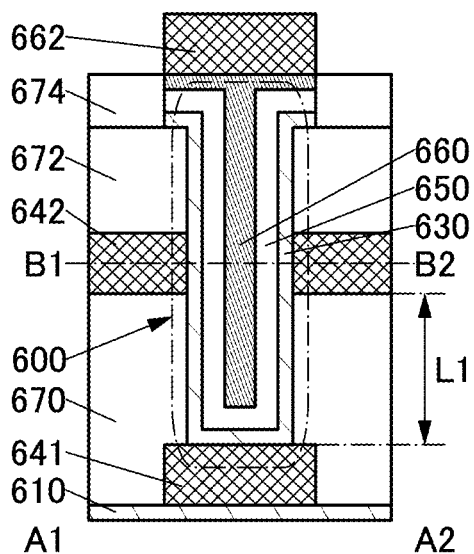
FIGS. 14B and 14C are cross-sectional views illustrating the structure example of the transistor.
Figure 14C:
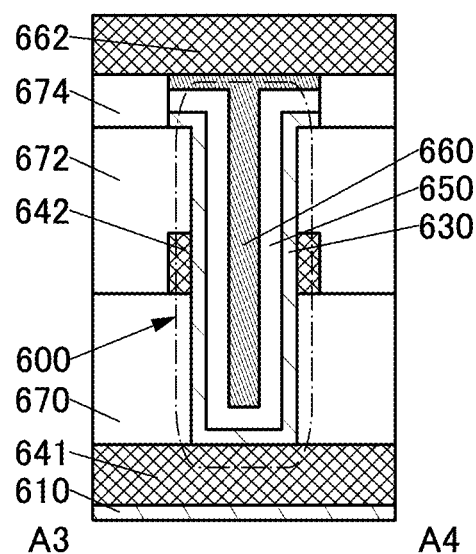
Figure 14D:
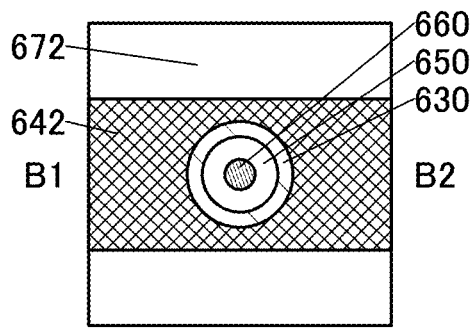

A structure of a transistor 600 is described with reference to FIGS. 14A to 14D. FIG. 14A is a plan view of the transistor 600. FIG. 14B is a cross-sectional view taken along dashed-dotted line A1-A2 in FIG. 14A, and FIG. 14C is a cross-sectional view taken along dashed-dotted line A3-A4 in FIG. 14A. FIG. 14D is a plan view taken along dashed-dotted line B1-B2 in FIG. 14B. Note that for simplification, some components are not illustrated in the plan views in FIGS. 14A and 14D.

The transistor 600 is provided over an insulator 610. An insulator 670 is provided over the insulator 610, an insulator 672 is provided over the insulator 670, and an insulator 674 is provided over the insulator 672. The top surfaces of the insulator 670 and the insulator 672 may each be planarized.

The transistor 600 includes a conductor 641, a metal oxide 630 over the conductor 641, an insulator 650 over the metal oxide 630, a conductor 660 over the insulator 650, and a conductor 642 over the insulator 670.

The conductor 660 includes a region functioning as a gate electrode. The insulator 650 includes a region functioning as a gate insulator. The conductor 641 includes a region functioning as one of a source electrode and a drain electrode, and the conductor 642 includes a region functioning as the other of the source electrode and the drain electrode. At least part of a region of the metal oxide 630 opposite to the conductor 660 with the insulator 650 therebetween functions as a channel formation region.

The metal oxide 630 includes a region functioning as the channel formation region, and thus can be referred to as a semiconductor layer of the transistor 600 in this specification and the like. In addition, the semiconductor layer can be referred to as the metal oxide 630.

In the transistor 600, the source electrode and the drain electrode are positioned at different heights, so that a current flows downward or upward in the semiconductor layer. In other words, the channel length direction includes a height (vertical) component, so that the transistor 600 can also be referred to as a vertical transistor, a vertical channel transistor, or the like.

In the vertical transistor, the source electrode, the semiconductor layer, and the drain electrode can be provided to overlap with each other; thus, the area occupied by the vertical transistor can be significantly smaller than that of what is called a planar transistor in which a semiconductor layer is provided in a planar shape.

An opening portion reaching the conductor 641 is formed in the insulator 672, the conductor 642, and the insulator 670. That is, the opening portion is formed by an opening portion of the insulator 672, an opening portion of the conductor 642, and an opening portion of the insulator 670. In addition, the opening portion includes a region overlapping with the conductor 641 in a plan view. In the opening portion, at least part of the metal oxide 630, part of the insulator 650, and part of the conductor 660 are placed in the opening portion.

FIGS. 14B and 14C illustrate a structure where a sidewall of the opening portion is perpendicular to a substrate surface (not illustrated). Note that the present invention is not limited to this structure. The sidewall of the opening portion may be tapered with respect to the substrate surface.

In this specification and the like, a sidewall of an opening portion refers to a side surface of an opening portion in a structure where the opening portion is provided. Thus, "sidewall of opening portion" described in this specification and the like can be referred to as a side surface of a structure where the opening portion is provided.

That is, the side surfaces of the insulator 672, the conductor 642, and the insulator 670 in the opening portion are perpendicular to the substrate surface in FIGS. 14B and 14C; however, without limitation thereto, the side surfaces may be tapered with respect to the substrate surface.

The metal oxide 630 is in contact with the side surfaces of the insulator 672, the conductor 642, and the insulator 670 in the opening portion provided in the insulator 672, the conductor 642, and the insulator 670. In addition, the metal oxide 630 is in contact with part of the top surface of the conductor 641 and part of the top surface of the insulator 672. The metal oxide 630 includes a depressed portion.

At least part of the insulator 650 is placed in the depressed portion of the metal oxide 630. In this case, the insulator 650 is in contact with the top surface of the metal oxide 630. The insulator 650 includes a depressed portion. The depressed portion is positioned in the depressed portion of the metal oxide 630.

The conductor 660 is placed to fill the depressed portion of the insulator 650. In this case, the conductor 660 is in contact with the top surface of the insulator 650. In a cross-sectional view, the conductor 660 includes a region opposite to the metal oxide 630 with the insulator 650 therebetween.

In the structure illustrated in FIGS. 14A to 14D, the channel length of the transistor 600 corresponds to the minimum distance (a distance L1 shown in FIG. 14B) from the top surface of the conductor 641 to the bottom surface of the conductor 642. Note that the distance L1 is also a thickness of the insulator 670 in a region overlapping with the top surface of the conductor 641. That is, the channel length of the transistor 600 can be adjusted by changing the thickness of the insulator 670. For example, when the thickness of the insulator 670 is made small, the transistor 600 can have a short channel length.

In the structure illustrated in FIGS. 14A to 14D, the channel width of the transistor 600 corresponds to the length of a region where the insulator 670 and the metal oxide 630 are in contact with each other in a plan view, and corresponds to the length of the outline (outer periphery) of the metal oxide 630 in a plan view. That is, the channel width of the transistor 600 can be adjusted by changing the diameter of an opening portion provided in the insulator 670. For example, when the diameter of the opening portion is made large, the transistor 600 can have a large channel width.

The transistor 600 has a structure where the channel formation region surrounds the gate electrode, and thus can be regarded as a transistor having a channel-all-around (CAA) structure.

Although FIG. 14D illustrates a structure where the top surface of the opening portion of the conductor 642 has a circular shape, the present invention is not limited thereto. For example, the top surface of the opening portion may have an oval shape, a polygonal shape, or a polygonal shape with rounded corners. The polygonal shape here means a triangle, a quadrangle, a pentagon, a hexagon, and the like.

The metal oxide 630 needs to be provided in the opening portion formed in the insulator 672, the conductor 642, and the insulator 670. In view of this, the metal oxide described in Embodiment 1 is preferably used as the metal oxide 630. The metal oxide 630 is preferably formed by an ALD method described in Embodiment 1. An ALD method enables excellent step coverage and excellent thickness uniformity, and thus is particularly suitable for covering a surface of the opening portion.

In addition, an oxide semiconductor having crystallinity is preferably used for the metal oxide 630. Examples of an oxide semiconductor having crystallinity include a c-axis aligned crystalline oxide semiconductor (CAAC-OS), a nanocrystalline oxide semiconductor (nc-OS), a polycrystalline oxide semiconductor, and a single-crystal oxide semiconductor. In particular, a CAAC-OS is preferably used as the metal oxide 630.

By contrast, in the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

When an oxide having crystallinity, such as CAAC-OS, is used as the metal oxide 630, extraction of oxygen from the metal oxide 630 by the conductors 641 and 642 can be inhibited. In this case, extraction of oxygen from the metal oxide 630 can be inhibited even when heat treatment is performed; hence, the transistor 600 is stable against high temperatures in the manufacturing process (i.e., thermal budget). Moreover, a decrease in conductivity of the conductor 641 and the conductor 642 can be inhibited.

A metal oxide formed by an ALD method described in Embodiment 1 includes a CAAC-OS, and thus can be suitably used as the metal oxide 630.

Note that an oxide semiconductor can have any of various structures that show different properties. The metal oxide 630 may include two or more of a CAAC-OS, an nc-OS, an amorphous-like oxide semiconductor (a-like OS), an amorphous oxide semiconductor, a polycrystalline oxide semiconductor, and a cloud-aligned composite oxide semiconductor (CAC-OS).

To obtain stable electrical characteristics of the transistor, reducing the impurity concentration in the oxide semiconductor is effective. A metal oxide formed by an ALD method described in Embodiment 1 has a reduced impurity concentration, and thus can be suitably used as the metal oxide 630.

When impurities and oxygen vacancies are in a channel formation region of an OS transistor, electrical characteristics of the OS transistor easily vary and the reliability thereof might worsen. In some cases, an oxide semiconductor has a defect that is an oxygen vacancy into which hydrogen enters (VoH), which generates an electron serving as a carrier. Formation of VoH in the channel formation region increases the donor concentration in the channel formation region in some cases. The increased donor concentration in the channel formation region causes variation in threshold voltage in some cases. Thus, if the channel formation region of the oxide semiconductor includes oxygen vacancies, the transistor tends to have normally-on characteristics. Therefore, the impurities, oxygen vacancies, and VoH are preferably reduced as much as possible in the channel formation region of the oxide semiconductor.

As the insulator 650, an insulator containing a material with a low dielectric constant is preferably used. For example, the insulator 650 is preferably formed using silicon oxide or silicon oxynitride, which is thermally stable.

The impurity concentration in the insulator 650 is preferably reduced. When the impurity concentration in the insulator 650 in contact with the metal oxide 630 is reduced, the metal oxide 630 can be inhibited from having a high impurity concentration.

The insulator 650 may have a single-layer structure or a stacked-layer structure.

A conductor 662 is provided over the insulator 674 and the conductor 660. The conductor 662 includes a region functioning as a wiring. The conductor 662 is preferably formed using a conductive material with high conductivity.

Alternatively, the conductor 660 is preferably formed using a conductive material having a function of inhibiting oxygen diffusion. When the conductor 660 has a function of inhibiting oxygen diffusion, the conductivity of the conductor 662 can be inhibited from being lowered due to oxidization by oxygen contained in the insulator 650, for example.

The conductor 660 is preferably formed using a conductive material that is not easily oxidized. Alternatively, the conductor 660 is preferably formed using a conductive material having a function of inhibiting impurity diffusion.

The conductor 660 may have a single-layer structure or a stacked-layer structure. For example, in the case where the conductor 660 has a stacked-layer structure of a first conductor and a second conductor over the first conductor, the first conductor is preferably placed to surround the bottom and side surfaces of the second conductor.

The conductor 641 and the conductor 642 are each preferably formed using a conductive material that is not easily oxidized or a conductive material having a function of inhibiting oxygen diffusion. The use of such a conductive material can inhibit a decrease in conductivity of the conductor 641 and the conductor 642. As the conductor 641 and the conductor 642, it is particularly preferable to use a nitride containing tantalum.

In FIG. 14B, the conductor 641 and the conductor 642 each have a single-layer structure. Note that one or both of the conductors 641 and 642 may have a stacked-layer structure.

For example, in the case where the conductor 641 and the conductor 642 each have a two-layer structure of a first conductor and a second conductor, it is preferable to use, for the first conductor in contact with the insulator 670, a conductive material that is not easily oxidized or a conductive material having a function of inhibiting oxygen diffusion. In this case, a decrease in conductivity of the conductor 641 and the conductor 642 can be inhibited.

The second conductors of the conductor 641 and the conductor 642 each preferably have higher conductivity than the first conductors of the conductor 641 and the conductor 642. In addition, the second conductors of the conductor 641 and the conductor 642 each preferably have a larger thickness than the first conductors of the conductor 641 and the conductor 642.

For example, tantalum nitride or titanium nitride can be used for the first conductors of the conductor 641 and the conductor 642, and tungsten can be used for the second conductors of the conductor 641 and the conductor 642.

As the insulator 670, an insulator containing a material with a low dielectric constant is preferably used. It is particularly preferable to use an insulator in which a region containing oxygen that is released by heating (hereinafter, sometimes referred to as excess oxygen) is easily formed. The metal oxide 630 is provided to be in contact with the insulator 670 containing excess oxygen and heat treatment is performed, so that oxygen can be supplied from the insulator 670 to the metal oxide 630 and the amount of oxygen vacancies and $V_O H$ in the metal oxide 630 can be reduced. In particular, a region of the metal oxide 630 which is in contact with the insulator 670 functions as the channel formation region; thus, the amount of oxygen vacancies and $V_O H$ in the channel formation region can be reduced with such a structure.

The impurity concentration in the insulator 670 is preferably reduced. When the impurity concentration in the insulator 670 in contact with the metal oxide 630 is reduced, the metal oxide 630 can be inhibited from having a high impurity concentration.

As the insulator 672, an insulator containing a material with a low dielectric constant is preferably used.

As illustrated in FIGS. 14B and 14C, an end portion of the conductor 660 is aligned with an end portion of the metal oxide 630 and an end portion of the insulator 650 in a region above the insulator 672. Note that the end portion of the conductor 660 is not necessarily aligned with the end portions of the metal oxide 630 and the insulator 650.

Figure 15A:
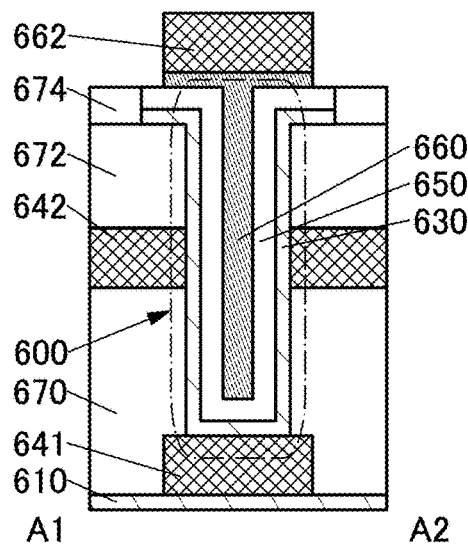
FIGS. 15A to 15F are cross-sectional views illustrating structure examples of a transistor.
Figure 15B:
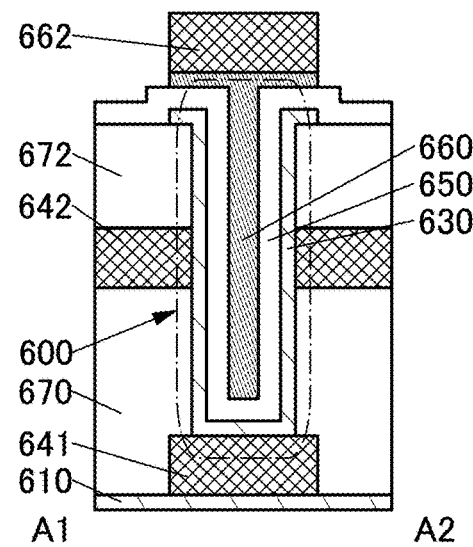

For example, as illustrated in FIG. 15A, the end portion of the conductor 660 may be positioned on the inner side of the end portion of the insulator 650. As another example, as illustrated in FIG. 15B, the insulator 650 may be provided to cover the top and side surfaces of the metal oxide 630. With the structure illustrated in FIG. 15A or 15B, the conductor 660 and the metal oxide 630 can be sufficiently apart from each other by the insulator 650.

Note that in the case where the conductor 660 has a function of a wiring in the structure illustrated in FIG. 15A or 15B, the conductor 662 is not necessarily provided.

Figure 15C:
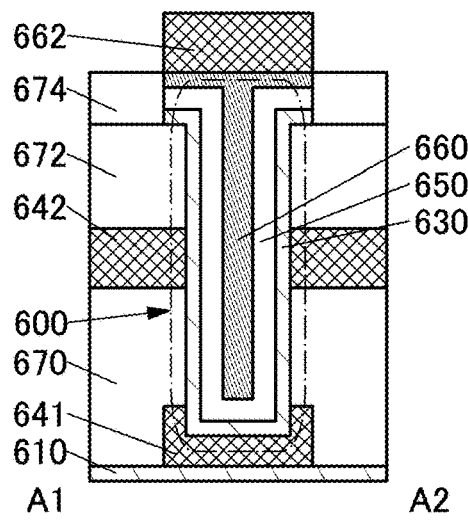

FIG. 14B illustrates a structure where the conductor 641 does not include a depressed portion in a region overlapping with the opening portion of the insulator 670. Note that the present invention is not limited to this structure. For example, as illustrated in FIG. 15C, the conductor 641 may include a depressed portion in the region overlapping with the opening portion. In other words, the top surface of the conductor 641 in the region overlapping with the opening portion may be partly removed. When the conductor 641 includes a depressed portion, a lower end portion of a region where the metal oxide 630 and the conductor 660 are opposite to each other with the insulator 650 therebetween can be closer to the conductor 641. Alternatively, the conductor 660 can include a region opposite to the conductor 641 with the metal oxide 630 and the insulator 650 therebetween. Such a structure allows a region where the metal oxide 630 and the conductor 660 are not opposite to each other with the insulator 650 therebetween, what is called an Loff region, to be narrow or omitted. Consequently, the frequency characteristics of the transistor 600 can be improved.

Figure 15D:
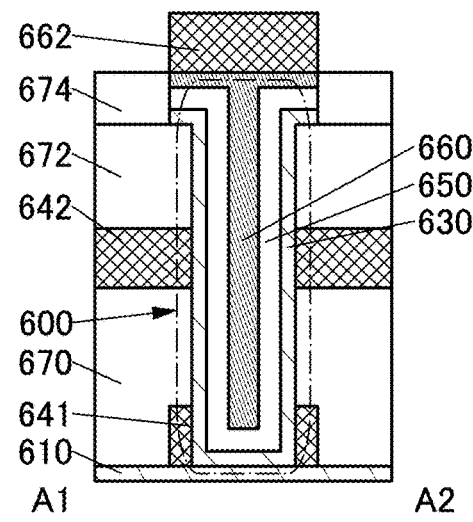

As another example, as illustrated in FIG. 15D, the conductor 641 may include an opening portion reaching the insulator 610 in a region overlapping with the opening portion of the insulator 670. In other words, a region of the conductor 641 overlapping with the opening portion of the insulator 670 may be removed. When the conductor 641 includes an opening portion reaching the insulator 610, the lower end portion of a region where the metal oxide 630 and the conductor 660 are opposite to each other with the insulator 650 therebetween can be closer to the conductor 641. Alternatively, the conductor 660 can include a region opposite to the conductor 641 with the metal oxide 630 and the insulator 650 therebetween. Accordingly, the frequency characteristics of the transistor 600 can be improved.

Figure 15E:
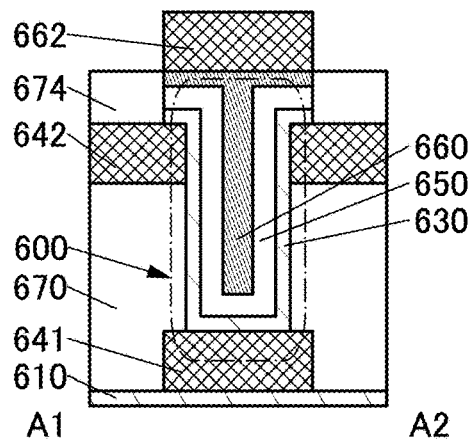
Figure 15F:
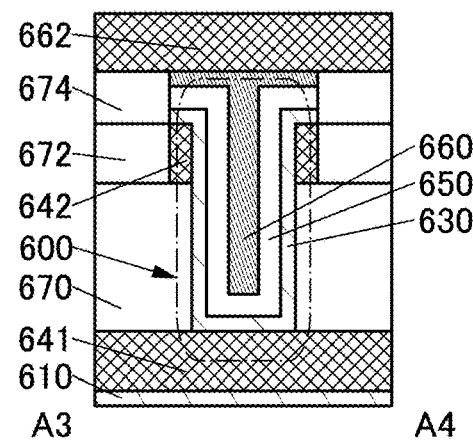

FIG. 14B illustrates a structure where the metal oxide 630 includes a region in contact with the sidewall of the opening portion of the conductor 642 and a region in contact with the top surface of the insulator 672. Note that the present invention is not limited to this structure. For example, as illustrated in FIGS. 15E and 15F, the metal oxide 630 may include a region in contact with part of the top surface of the conductor 642, in addition to the region in contact with the sidewall of the opening portion of the conductor 642. Such a structure can increase a contact area between the metal oxide 630 and the conductor 642, thereby increasing the on-state current of the transistor 600.

Figure 16A:
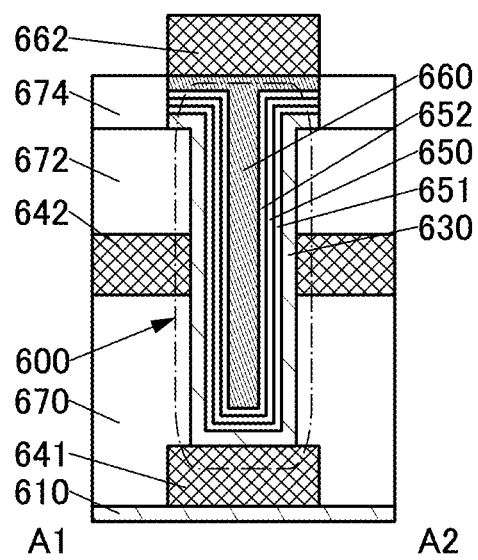
FIGS. 16A and 16B are cross-sectional views illustrating structure examples of a transistor.

Furthermore, as illustrated in FIG. 16A, a layer 651 may be provided between the insulator 650 and the metal oxide 630. In this case, the layer 651 is provided to be in contact with the bottom surface of the insulator 650 and the depressed portion of the metal oxide 630. The layer 651 preferably has a barrier property against oxygen. Such a structure can inhibit oxygen contained in the insulator 650 from being supplied excessively to the channel formation region. In addition, in heat treatment or the like, release of oxygen from the metal oxide 630 can be inhibited and accordingly formation of an oxygen vacancy in the metal oxide 630 can be inhibited. Thus, the electrical characteristics and reliability of the transistor 600 can be improved.

It is further preferable that aluminum oxide be used for the layer 651, for example. As the layer 651, either an insulator containing an insulating material or a semiconductor layer containing a semiconductor material may be used.

As illustrated in FIG. 16A, a layer 652 may be provided between the conductor 660 and the insulator 650. In this case, the layer 652 is provided to be in contact with the bottom surface of the conductor 660 and the depressed portion of the insulator 650. The layer 652 preferably has a barrier property against hydrogen. Such a structure can inhibit diffusion of impurities such as hydrogen contained in the conductor 660 into the metal oxide 630.

Silicon nitride is preferably used for the layer 652, for example. As the layer 652, either an insulator containing an insulating material or a conductor containing a conductive material may be used.

The layer 652 may have a barrier property against oxygen. When the layer 652 has a barrier property against oxygen, oxygen contained in the insulator 650 can be inhibited from diffusing into the conductor 660. That is, a reduction in the amount of oxygen supplied to the metal oxide 630 can be inhibited. Moreover, oxidation of the conductor 660 due to oxygen contained in the insulator 650 can be inhibited. Hafnium oxide is preferably used for the layer 652. Note that hafnium oxide has a function of capturing or fixing hydrogen, and thus is suitably used for the layer 652.

Figure 16B:
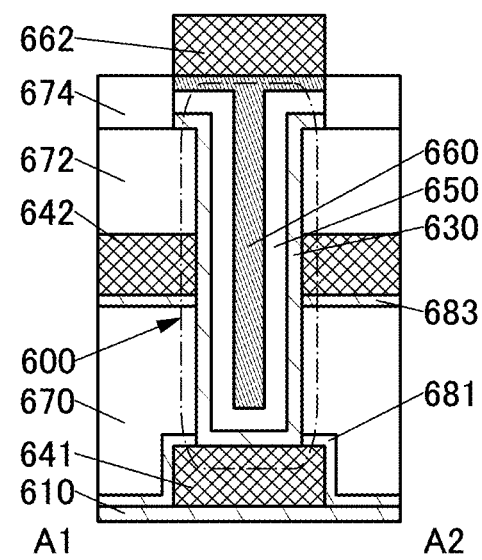

As illustrated in FIG. 16B, an insulator 681 may be provided between the conductor 641 and the insulator 670. The insulator 681 preferably has a barrier property against oxygen. Such a structure can inhibit diffusion of oxygen contained in the insulator 670 into the conductor 641 and oxidation of the conductor 641.

As illustrated in FIG. 16B, an insulator 683 may be provided between the conductor 642 and the insulator 670. The insulator 683 preferably has a barrier property against oxygen. Such a structure can inhibit diffusion of oxygen contained in the insulator 670 into the conductor 642 and oxidation of the conductor 642.

As the insulator 681 and the insulator 683, it is preferable to use an insulator that can be used for the layer 651 or the layer 652.

[Transistor 600A]

Figure 17A:
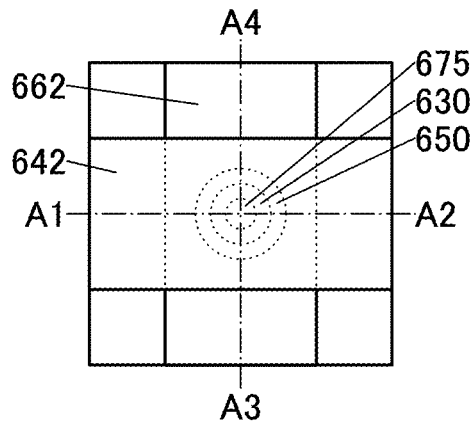
FIGS. 17A and 17D are plan views illustrating a structure example of a transistor.
Figure 17B:
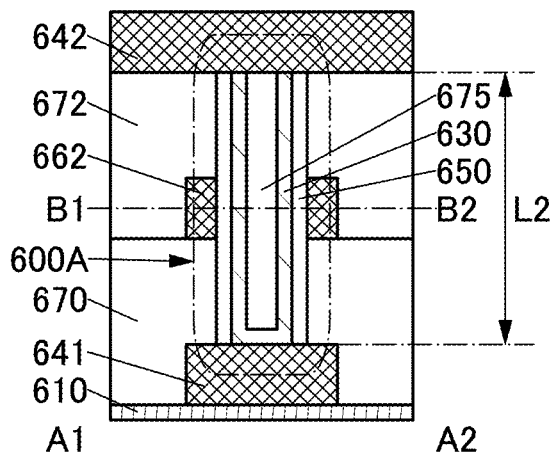
FIGS. 17B and 17C are cross-sectional views illustrating the structure example of the transistor.
Figure 17C:
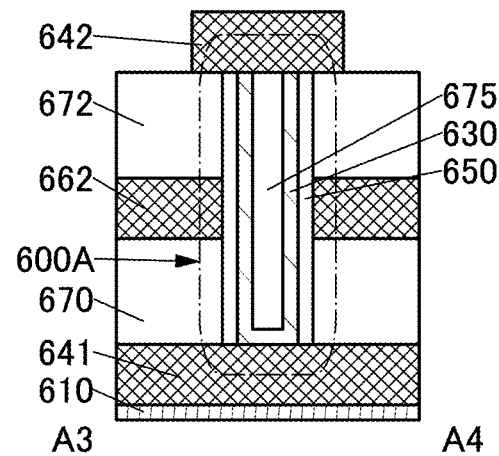
Figure 17D:
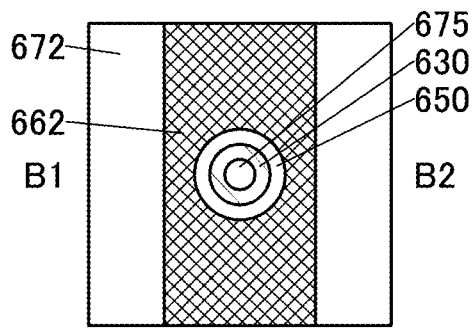

A structure of the transistor 600A will be described with reference to FIGS. 17A to 17D. FIG. 17A is a plan view of the transistor 600A. FIG. 17B is a cross-sectional view taken along dashed-dotted line A1-A2 in FIG. 17A, and FIG. 17C is a cross-sectional view taken along dashed-dotted line A3-A4 in FIG. 17A. FIG. 17D is a plan view taken along dashed-dotted line B1-B2 in FIG. 17B. Note that for simplification, some components are not illustrated in the plan views in FIGS. 17A and 17D. Note that in the following description, components common to the description in [Transistor 600] are not described and denoted by the same reference numerals as those in the description in [Transistor 600].

The transistor 600A is provided over the insulator 610. The insulator 670 is provided over the insulator 610, and the insulator 672 is provided over the insulator 670. The top surfaces of the insulator 670 and the insulator 672 may each be planarized.

The transistor 600A includes the conductor 641, the insulator 650 and the metal oxide 630 over the conductor 641, an insulator 675 over the metal oxide 630, the conductor 662 over the insulator 670, and the conductor 642 over the insulator 672, the insulator 650, the metal oxide 630, and the insulator 675.

The conductor 662 includes a region functioning as a gate electrode. The insulator 650 includes a region functioning as a gate insulator. The conductor 641 includes a region functioning as one of a source electrode and a drain electrode, and the conductor 642 includes a region functioning as the other of the source electrode and the drain electrode. At least part of a region of the metal oxide 630 opposite to the conductor 662 functions as a channel formation region.

The transistor 600A can be referred to as a vertical transistor.

An opening portion reaching the conductor 641 is formed in the insulator 672, the conductor 662, and the insulator 670. That is, the opening portion is formed by an opening portion of the insulator 672, an opening portion of the conductor 662, and an opening portion of the insulator 670. In addition, the opening portion includes a region overlapping with the conductor 641 in a plan view. At least part of the insulator 650, part of the metal oxide 630, and part of the insulator 275 are placed in the opening portion.

Although FIGS. 17B and 17C each illustrate a structure where a sidewall of the opening portion is perpendicular to a substrate surface (not illustrated), the present invention is not limited to this structure. The sidewall of the opening portion may be tapered with respect to the substrate surface.

The insulator 650 is in contact with the side surfaces of the insulator 672, the conductor 662, and the insulator 670 in the opening portion provided in the insulator 672, the conductor 662, and the insulator 670. In addition, the insulator 650 is in contact with part of the top surface of the conductor 641 and part of the bottom surface of the conductor 642. The insulator 650 has a cylindrical shape including a hollow portion.

The metal oxide 630 is placed in the hollow portion of the insulator 650. The metal oxide 630 includes a region in contact with the side surface of the insulator 650, a region in contact with the conductor 641, and a region in contact with the conductor 642. In addition, the metal oxide 630 includes a region opposite to the conductor 662 with the insulator 650 therebetween. The metal oxide 630 includes a depressed portion. In the case where the diameter of the opening portion provided in the insulator 672, the conductor 662, and the insulator 670 is small, the metal oxide 630 does not include a depressed portion in some cases. Alternatively, the metal oxide 630 includes a depressed portion with a small diameter.

The insulator 675 is placed to fill the depressed portion of the metal oxide 630. In the case where the metal oxide 630 does not include a depressed portion, the insulator 675 is not necessarily provided. In the case where the metal oxide 630 includes a depressed portion with a small diameter, a cavity may be provided instead of the insulator 675. In this case, the cavity is provided between the metal oxide 630 and the conductor 642. The cavity contains one or more selected from air, nitrogen, oxygen, carbon dioxide, and a Group 18 element, for example.

In the structure illustrated in FIGS. 17A to 17D, the channel length of the transistor 600A corresponds to the minimum distance (a distance L2 shown in FIG. 17B) from the top surface of the conductor 641 to the bottom surface of the conductor 642 in a cross-sectional view. Note that the distance L2 is also a height (depth) of the opening portion provided in the insulator 672, the conductor 662, and the insulator 670. That is, the channel length of the transistor 600A can be adjusted by changing the height (depth) of the opening portion. For example, when the thicknesses of the insulators 670 and 672 are made small, the transistor 600A can have a short channel length.

In the structure illustrated in FIGS. 17A to 17D, the channel width of the transistor 600A corresponds to the length of a region where the insulator 650 and the metal oxide 630 are in contact with each other in a plan view, and corresponds to the length of the outline (outer periphery) of the metal oxide 630 in a plan view. That is, the width of the transistor 600A can be adjusted by changing the diameter of an opening portion provided in the conductor 662. For example, when the diameter of the opening portion is made large, the transistor 600A with a large channel width can be manufactured.

The transistor 600A has a structure where the gate electrode surrounds the channel formation region, and thus can be regarded as a transistor having a gate-all-around (GAA) structure.

Although FIG. 17D illustrates a structure where the top surface of the opening portion of the conductor 662 has a circular shape, the present invention is not limited thereto. For example, the top surface of the opening portion may have an oval shape, a polygonal shape, or a polygonal shape with rounded corners.

The conductor 662 may have a single-layer structure or a stacked-layer structure. As the conductor 662, it is possible to use a conductor that can be used as the conductor 660.

Figure 18A:
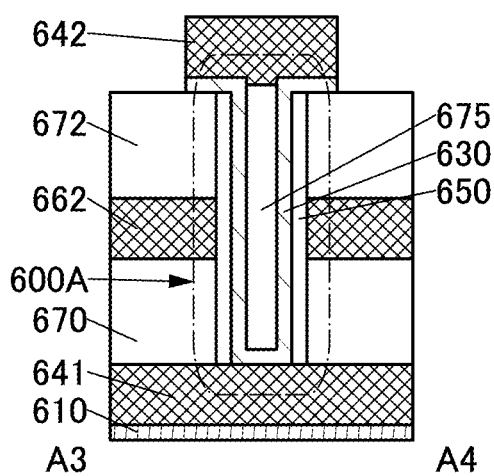
FIGS. 18A to 18C are cross-sectional views illustrating structure examples of a transistor.

In FIGS. 17B and 17C, the top surface of the metal oxide 630 is level with the top surfaces of the insulator 672, the insulator 650, and the insulator 675. Note that the present invention is not limited to this structure. For example, as illustrated in FIG. 18A, the top surface of the metal oxide 630 may be positioned at a higher level than the top surfaces of the insulator 672 and the insulator 650. FIG. 18A illustrates a structure where the metal oxide 630 is in contact with part of the top surface of the insulator 672. Such a structure can increase a contact area between the metal oxide 630 and the conductor 642, thereby increasing the on-state current of the transistor 600A.

In FIGS. 17B and 17C, the conductor 642 includes a region in contact with the uppermost portion of the metal oxide 630. Note that the present invention is not limited to this structure. For example, as illustrated in FIG. 18A, part of the conductor 642 may be provided in the depressed portion of the metal oxide 630. In other words, the conductor 642 may include a region in contact with part of the depressed portion of the metal oxide 630. Such a structure can increase a contact area between the metal oxide 630 and the conductor 642, thereby increasing the on-state current of the transistor 600A.

Figure 18B:
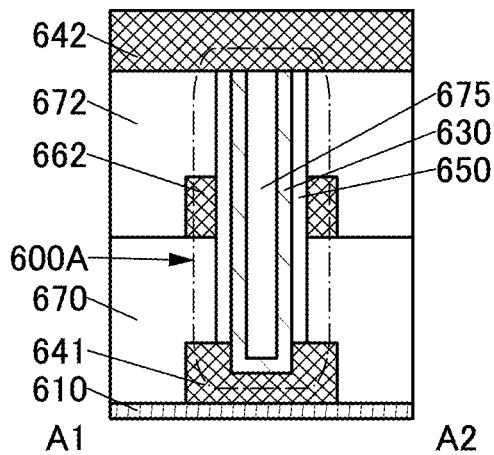
Figure 18C:
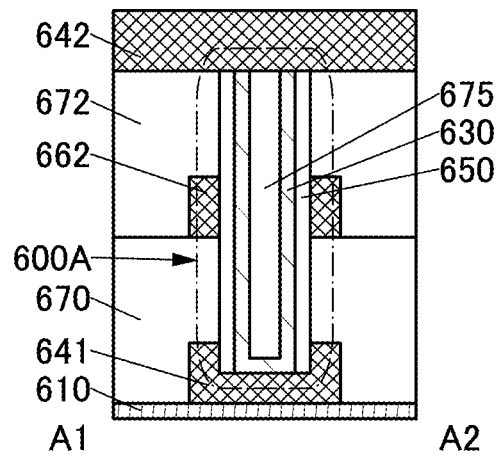

FIGS. 17B and 17C illustrate a structure where the conductor 641 does not include a depressed portion in a region overlapping with the opening portion of the conductor 662. Note that there is no particular limitation on the shape of the conductor 641 as long as there is a region where the conductor 641 and the metal oxide 630 are in contact with each other. For example, as illustrated in FIGS. 18B and 18C, the conductor 641 may include a depressed portion in a region overlapping with at least part of the opening portion. In other words, the top surface of the conductor 641 in the region overlapping with at least part of the opening portion may be partly removed.

In FIG. 18B, at least part of the metal oxide 630 is provided in the depressed portion of the conductor 641. Such a structure can increase a contact area between the metal oxide 630 and the conductor 641, thereby increasing the on-state current of the transistor 600A. Alternatively, as illustrated in FIG. 18C, part of the insulator 650 and part of the metal oxide 630 may be provided in the depressed portion of the conductor 641.

A transistor that can include the metal oxide described in Embodiment 1 is not limited to a vertical-channel transistor. For example, the metal oxide can also be used for a planar transistor, a staggered transistor, or an inverted staggered transistor. The metal oxide may be used for either a top-gate transistor or a bottom-gate transistor. Alternatively, gates may be provided above and below a semiconductor layer where a channel is formed.

[Transistor 200]

Figure 19A:
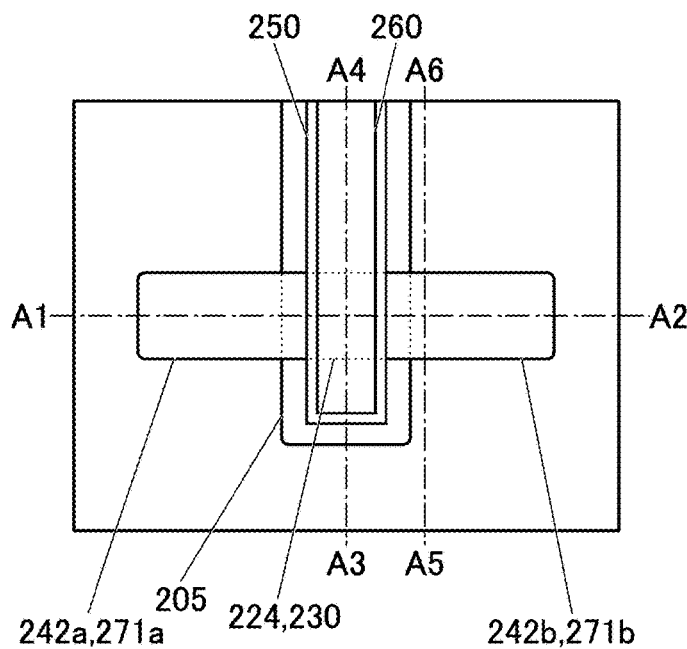
FIG. 19A is a plan view illustrating a structure example of a transistor.
Figure 19C:
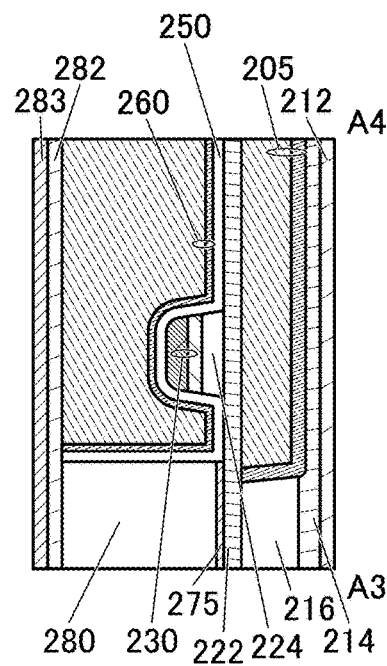
FIGS. 19B to 19D are cross-sectional views illustrating the structure example of the transistor.
Figure 19B:
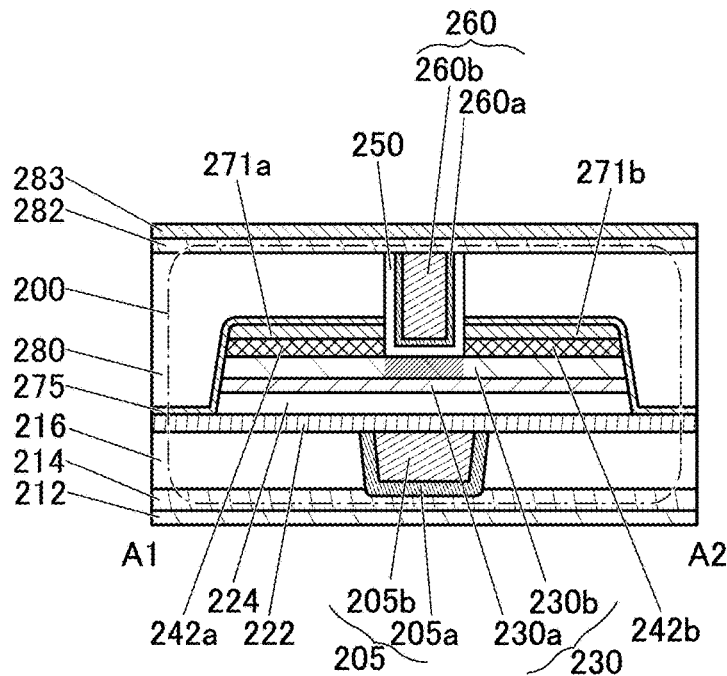
Figure 19D:
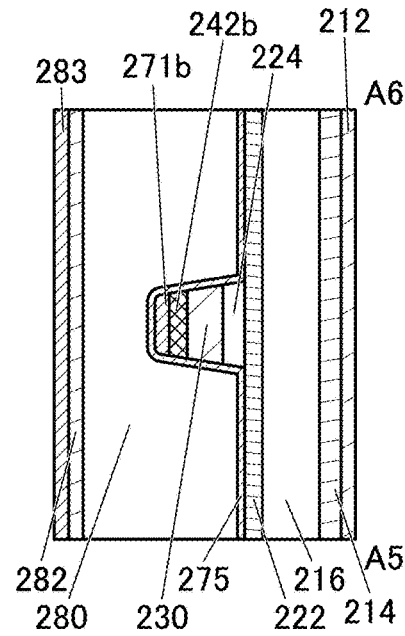

A structure of a transistor 200 is described with reference to FIGS. 19A to 19D. FIG. 19A is a plan view of the transistor 200. FIG. 19B is a cross-sectional view taken along dashed-dotted line A1-A2 in FIG. 19A, illustrating a cross section of the transistor 200 in the channel length direction. FIG. 19C is a cross-sectional view taken along dashed-dotted line A3-A4 in FIG. 19A, illustrating a cross-section of the transistor 200 in the channel width direction. FIG. 19D is a cross-sectional view taken along dashed-dotted line A5-A6 in FIG. 19A. Note that for simplification, some components are not illustrated in the plan view in FIG. 19A.

The transistor 200 includes a conductor 205, an insulator 222 over the conductor 205, an insulator 224 over the insulator 222, a metal oxide 230 over the insulator 224, a conductor 242a and a conductor 242b over the metal oxide 230, an insulator 271a over the conductor 242a, an insulator 271b over the conductor 242b, an insulator 250 over the metal oxide 230, and a conductor 260 over the insulator 250. The transistor 200 illustrated in FIGS. 19A to 19D is a top-gate transistor.

Hereinafter, the conductor 242a and the conductor 242b are collectively referred to as a conductor 242 in some cases. The insulator 271a and the insulator 271b are collectively referred to as an insulator 271 in some cases.

The insulator 275 is provided over the insulator 271, and an insulator 280 is provided over the insulator 275. The top surface of the insulator 280 may be planarized. An opening portion reaching the metal oxide 230 is provided in the insulators 280 and 275. The insulator 250 and the conductor 260 are provided in the opening portion.

The conductor 260 includes a region functioning as a first gate (also referred to as a top gate) electrode and the conductor 205 includes a region functioning as a second gate (also referred to as a back gate) electrode. The insulator 250 includes a region functioning as a first gate insulator, and the insulator 222 and the insulator 224 include a region functioning as a second gate insulator. The conductor 242a includes a region functioning as one of a source electrode and a drain electrode, and the conductor 242b includes a region functioning as the other of the source electrode and the drain electrode. A region of the metal oxide 230 overlapping with the conductor 260 at least partly functions as a channel formation region.

In the transistor 200, the metal oxide described in Embodiment 1 is preferably used as the metal oxide 230 including a channel formation region. The metal oxide described in Embodiment 1 includes a CAAC-OS, and thus can be suitably used as the metal oxide 230.

The metal oxide 230 preferably includes a metal oxide 230a over the insulator 224 and a metal oxide 230b over the metal oxide 230a. Although FIGS. 19B and 19C illustrate a structure where the metal oxide 230 has a two-layer structure of the metal oxide 230a and the metal oxide 230b, the present invention is not limited thereto. For example, the metal oxide 230 may have a single-layer structure or a stacked-layer structure of three or more layers.

The metal oxide 230 preferably has a stacked-layer structure of oxide layers with different chemical compositions. Specifically, the atomic ratio of the element M to a metal element that is the main component is preferably higher in the metal oxide used as the metal oxide 230a than in the metal oxide used as the metal oxide 230b. The atomic ratio of the element M to In is preferably higher in the metal oxide used as the metal oxide 230a than in the metal oxide used as the metal oxide 230b. With such a structure, impurities and oxygen can be inhibited from diffusing into the metal oxide 230b from the components formed below the metal oxide 230a.

The atomic ratio of In to the element M is preferably higher in the metal oxide used as the metal oxide 230b than in the metal oxide used as the metal oxide 230a. With such a structure, the transistor 200 can have a high on-state current and excellent frequency characteristics.

Furthermore, when the metal oxide 230a and the metal oxide 230b contain a common element (as the main component) besides oxygen, the density of defect states at the interface between the metal oxide 230a and the metal oxide 230b can be low. This reduces the influence of interface scattering on carrier conduction, and the transistor 200A can have a high on-state current and excellent frequency characteristics.

Specifically, as the metal oxide 230a, the metal oxide with an atomic ratio of In:M:Zn=1:3:4 or the neighborhood thereof, In:M:Zn=1:3:2 or the neighborhood thereof, or In:M:Zn=1:1:0.5 or the neighborhood thereof is preferably used. It is particularly preferable to use the metal oxide described in Embodiment 1 as the metal oxide 230b. As the element M, gallium, aluminum, or tin is preferably used, and gallium is further preferably used. In the case where the metal oxide 230 is provided to have a single-layer structure, a metal oxide that can be used as the metal oxide 230a or the metal oxide 230b is preferably used as the metal oxide 230.

Figure 20A:
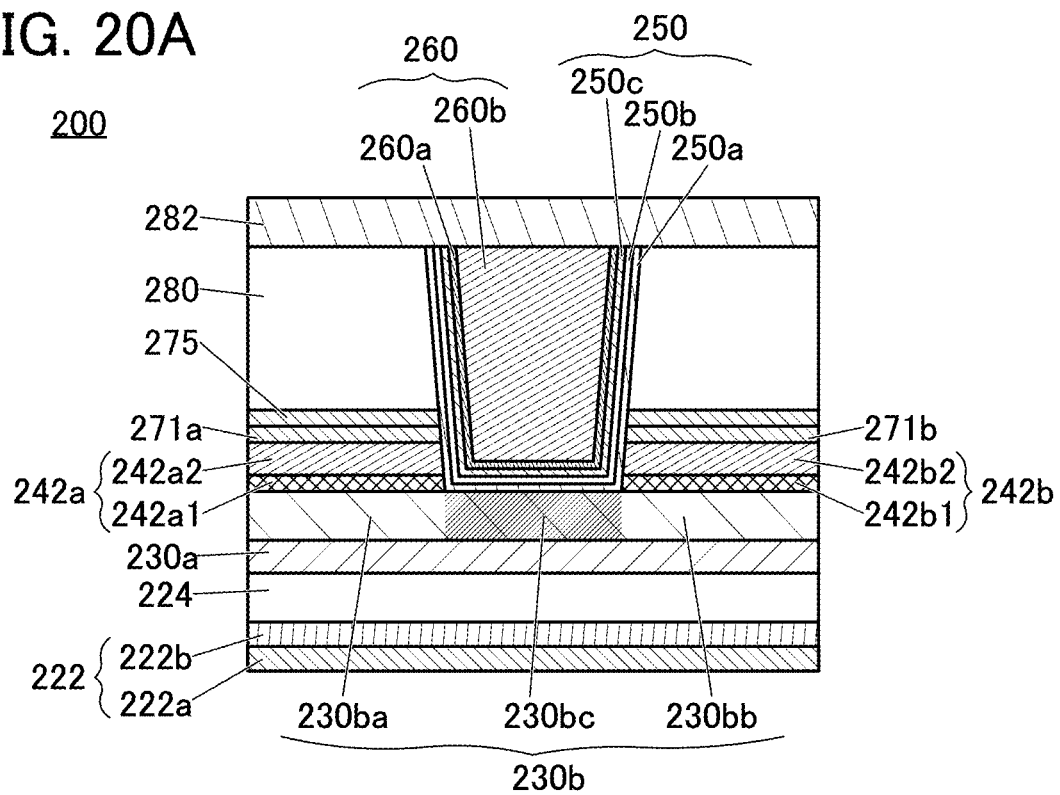
FIGS. 20A and 20B are cross-sectional views illustrating structure examples of a transistor.

FIG. 20A is an enlarged view of the vicinity of the channel formation region in FIG. 19B. As illustrated in FIG. 20A, the metal oxide 230b includes a region 230bc functioning as the channel formation region and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

As described above, the amount of impurities, oxygen vacancies, and $V_OH$ are preferably reduced as much as possible in the channel formation region of the oxide semiconductor. By contrast, when an insulator containing oxygen that is released by heating (hereinafter, also referred to as excess oxygen) is provided in the vicinity of the oxide semiconductor and heat treatment is performed, oxygen can be supplied from the insulator to the oxide semiconductor so as to reduce the amount of oxygen vacancies and $V_OH$. Note that too much oxygen supplied to the source region or the drain region might cause a decrease in the on-state current or the field-effect mobility of the transistor 200. Furthermore, a variation in the amount of oxygen supplied to the source region or the drain region in the substrate plane leads to variation in characteristics of the semiconductor device including the transistor.

Hence, the region 230bc functioning as the channel formation region in the oxide semiconductor is preferably an i-type or substantially i-type region with a low carrier concentration, whereas the regions 230ba and 230bb functioning as the source and drain regions are preferably n⁻ type regions with a high carrier concentration. That is, it is preferable to reduce the amount of oxygen vacancies and $V_OH$ in the region 230bc so that reduction in the amount of oxygen vacancies and $V_OH$ in the region 230ba and the region 230bb is inhibited.

The carrier concentration in the region 230bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^3$. Note that the lower limit of the carrier concentration in the region 230bc is not particularly limited and can be, for example, $1 \times 10^{-9}$ cm$^3$.

Note that FIG. 20A illustrates an example where the region 230ba, the region 230bb, and the region 230bc are formed in the metal oxide 230b; however, the present invention is not limited to this. For example, the above regions may be formed not only in the metal oxide 230b but also in the metal oxide 230a.

The conductor 242a and the conductor 242b are each preferably formed using a conductive material that is not easily oxidized or a material that maintains its conductivity even after absorbing oxygen. For example, a nitride containing tantalum is preferable. When a nitride containing tantalum is used for the conductor 242a and the conductor 242b, hydrogen contained in the metal oxide 230b or the like is absorbed by the conductor 242a or the conductor 242b in some cases.

The conductor 242a and the conductor 242b may each have a single-layer structure or a stacked-layer structure. For example, as illustrated in FIG. 20A, the conductor 242a and the conductor 242b may each have a two-layer structure. In this case, the conductor 242a is a stacked body of a conductor 242a1 and a conductor 242a2 over the conductor 242a1, and the conductor 242b is a stacked body of a conductor 242b1 and a conductor 242b2 over the conductor 242b1. In this case, for the layers (the conductor 242a1 and the conductor 242b1) in contact with the metal oxide 230b, it is preferable to use a conductive material that is not easily oxidized or a conductive material having a function of inhibiting oxygen diffusion. This can inhibit the conductor 242a and the conductor 242b from being excessively oxidized by oxygen contained in the metal oxide 230b. In addition, a decrease in conductivity of the conductor 242a and the conductor 242b can be inhibited.

The conductor 242a2 and the conductor 242b2 preferably have higher conductivity than the conductor 242a1 and the conductor 242b1. For example, the thicknesses of the conductor 242a2 and the conductor 242b2 are preferably larger than those of the conductor 242a1 and the conductor 242b1. As the conductor 242a2 and the conductor 242b2, it is possible to use a conductor that can be used as the conductor 205b. The above structure can reduce the resistances of the conductor 242a2 and the conductor 242b2. Accordingly, the conductor 242a and the conductor 242b can each function as a wiring or an electrode with high conductivity. Furthermore, the operation speed of the transistor 200 can be increased.

For example, tantalum nitride or titanium nitride can be used for the conductor 242a1 and the conductor 242b1, and tungsten can be used for the conductor 242a2 and the conductor 242b2.

As illustrated in FIG. 20A, the insulator 250 preferably has a stacked-layer structure of an insulator 250a in contact with the metal oxide 230, an insulator 250b over the insulator 250a, and an insulator 250c over the insulator 250b.

As the insulator 250b, an insulator that easily transmits oxygen is preferably used. With such a structure, oxygen contained in the insulator 280 can be supplied to the region 230bc through the insulator 250b. As the insulator 250b, an insulator containing a material with a low dielectric constant is preferably used. In particular, silicon oxide or silicon oxynitride is preferable because of being thermally stable.

The insulator 250a preferably has a barrier property against oxygen. The insulator 250a includes a region in contact with the side surface of the conductor 242a and a region in contact with the side surface of the conductor 242a. When the insulator 250a has a barrier property against oxygen, oxidation of the side surfaces of the conductors 242a and 242b, which forms oxide films on the side surfaces, can be inhibited. It is thus possible to inhibit a reduction in the on-state current or field-effect mobility of the transistor 200.

The insulator 250a is provided to be in contact with the top and side surfaces of the metal oxide 230b and the side surface of the metal oxide 230a. That is, in the cross-sectional view in the channel width direction, the region 230bc is surrounded by the insulator 250a and the metal oxide 230a. When the insulator 250a and the metal oxide 230a have a barrier property against oxygen, release of oxygen from the region 230bc at the time of heat treatment or the like can be inhibited. Thus, formation of an oxygen vacancy in the region 230bc can be inhibited. Accordingly, the electrical characteristics and reliability of the transistor 200 can be improved.

Furthermore, even when excess oxygen is contained in the insulator 280, provision of the insulator 250a can inhibit supply of the excess oxygen to the region 230bc, whereby an appropriate amount of oxygen can be supplied to the region 230bc. Thus, the regions 230ba and 230bb are inhibited from being excessively oxidized, so that a reduction in the on-state current or field-effect mobility of the transistor 200 can be inhibited.

For the insulator 250a, an oxide containing one or both of aluminum and hafnium is preferably used, and aluminum oxide is further preferably used.

The insulator 250c preferably has a barrier property against hydrogen. In this case, hydrogen contained in the conductor 260 can be inhibited from diffusing into the region 230bc. It is particularly preferable to use silicon nitride for the insulator 250c.

Furthermore, the insulator 250c may have a barrier property against oxygen. The insulator 250c is provided between the insulator 250b and the conductor 260. Thus, diffusion of oxygen contained in the insulator 250b into the conductor 260 can be prevented, so that oxidation of the conductor 260 can be inhibited. In addition, a reduction in the amount of oxygen supplied to the region 230bc can be inhibited. Note that silicon nitride has a barrier property against oxygen, and thus can be suitably used for the insulator 250c.

Figure 20B:
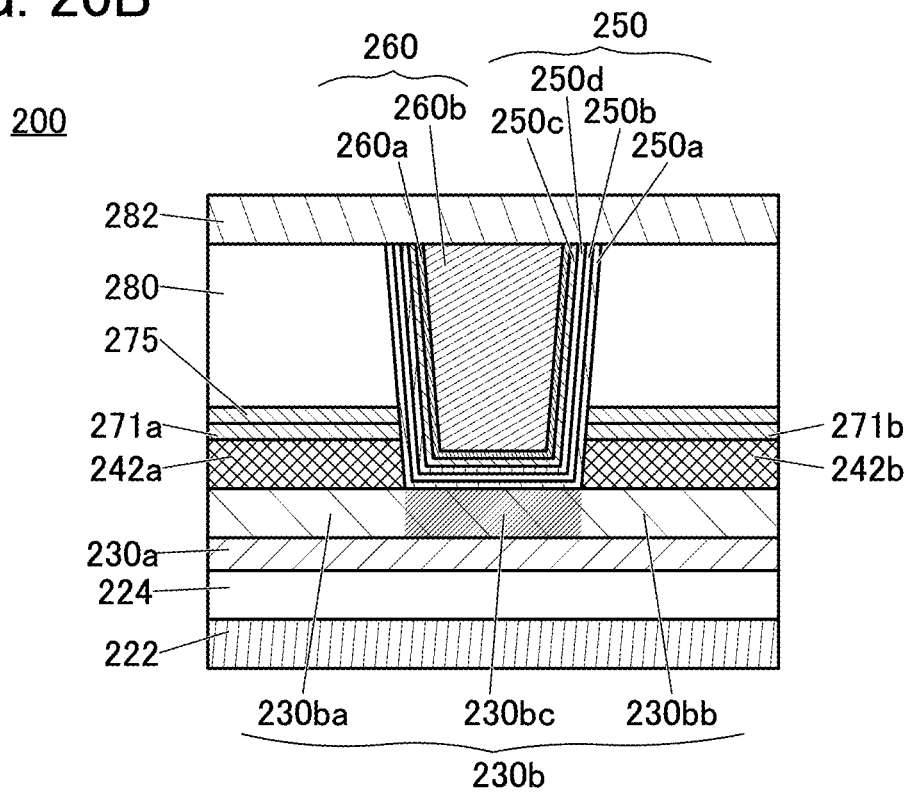

As illustrated in FIG. 20B, an insulator 250d may be provided between the insulator 250b and the insulator 250c. The insulator 250d preferably has a function of capturing or fixing hydrogen. By provision of an insulator having a function of capturing or fixing hydrogen inside a region surrounded by the insulator 250c and the insulator 222, hydrogen inside the region can be captured or fixed effectively. That is, hydrogen contained in the insulator 250b, the region 230bc of the metal oxide 230b, or the insulator 224 can be captured or fixed effectively. Thus, the hydrogen concentration in the region 230bc can be reduced. Accordingly, $V_OH$ in the region 230bc can be reduced.

For the insulator 250d, hafnium oxide is preferably used, for example. The insulator 250d may have an amorphous structure.

Since the insulator 250 includes a region functioning as a first gate insulator, an insulator containing a high-k material may be used as one or more of the insulators 250a to 250d.

The insulator 250a to the insulator 250d are provided together with the conductor 260 in an opening portion formed in the insulator 280 and the like. The thicknesses of the insulator 250a to the insulator 250d are preferably small for miniaturization of the transistor 200. The thicknesses of the insulator 250a to the insulator 250d are each greater than or equal to 0.1 nm and less than or equal to 10 nm, preferably greater than or equal to 0.1 nm and less than or equal to 5.0 nm, further preferably greater than or equal to 0.5 nm and less than or equal to 5.0 nm, still further preferably greater than or equal to 1.0 nm and less than or equal to 5.0 nm, yet still further preferably greater than or equal to 1.0 nm and less than or equal to 3.0 nm. In this case, each of the insulators 250a to 250d at least partly includes a region with the above thickness.

Although the insulator 250 has a three-layer structure of the insulator 250a to the insulator 250c or a four-layer structure of the insulator 250a to the insulator 250d in the structures described above, the present invention is not limited thereto. The insulator 250 can have a structure including at least one of the insulators 250a to 250d. When the insulator 250 is formed of one, two, or three layer(s) of the insulators 250a to 250d, the manufacturing process of a semiconductor device can be simplified and the productivity can be improved.

The conductor 260 preferably includes a conductor 260a and a conductor 260b over the conductor 260a. For example, the conductor 260a is preferably placed to cover the bottom and side surfaces of the conductor 260b. In FIGS. 19B and 19C, the top surface of the conductor 260 is level with the top surface of the insulator 250. Although the conductor 260 has a two-layer structure of the conductor 260a and the conductor 260b in FIGS. 19B and 19C, the conductor 260 may have a single-layer structure or a stacked-layer structure of three or more layers.

The conductor 260a is preferably formed using a conductive material having a function of inhibiting diffusion of impurities. Alternatively, the conductor 260a is preferably formed using a conductive material having a function of inhibiting diffusion of oxygen. When the conductor 260a has a function of inhibiting diffusion of oxygen, the conductivity of the conductor 260b can be inhibited from being lowered due to oxidation by oxygen contained in the insulator 250. A single layer or a stacked layer of the above conductive material can be used for the conductor 260a. For example, titanium nitride may be used for the conductor 260a.

The conductor 260 also functions as a wiring. Thus, the conductor 260b is preferably formed using a conductor having high conductivity.

In the transistor 200, the conductor 260 is formed in a self-aligned manner so as to fill an opening portion formed in the insulator 280 and the like. In this manner, the conductor 260 can surely be provided in a region between the conductor 242a and the conductor 242b without alignment.

As illustrated in FIG. 19C, in the channel width direction of the transistor 200, the bottom surface of the conductor 260 in a region that does not overlap with the metal oxide 230b is preferably positioned closer to the insulator 222 than the bottom surface of the metal oxide 230b. When the conductor 260 functioning as the gate electrode covers the side and top surfaces of the channel formation region of the metal oxide 230b, the electric field of the conductor 260 is likely to affect the entire channel formation region of the metal oxide 230b. Hence, the transistor 200 can have a higher on-state current and improved frequency characteristics.

An insulator 216 is provided below the insulator 222, an insulator 214 is provided below the insulator 216, and an insulator 212 is provided below the insulator 214.

The conductor 205 is placed to overlap with the metal oxide 230 and the conductor 260. Here, the conductor 205 is preferably provided to fill an opening portion formed in the insulator 216. Part of the conductor 205 is embedded in the insulator 214 in some cases.

The conductor 205 includes the conductor 205a and the conductor 205b. The conductor 205a is provided to be in contact with the sidewall of the opening portion formed in the insulator 216 and the top surface of the insulator 214. The conductor 205b is provided to be embedded in a recessed portion formed by the conductor 205a. Here, the top surface of the conductor 205b is level with the top surfaces of the conductor 205a and the insulator 216.

Here, the conductor 205a is preferably formed using a conductive material having a function of inhibiting diffusion of impurities. When the conductor 205a is formed using a conductive material having a function of inhibiting diffusion impurities, impurities contained in the conductor 205b can be inhibited from diffusing into the metal oxide 230 through the insulator 216 and the like.

Alternatively, the conductor 205a is preferably formed using a conductive material having a function of inhibiting diffusion of oxygen. When the conductor 205a is formed using a conductive material having a function of inhibiting oxygen, a decrease in conductivity of the conductor 205b due to oxidation of the conductor 205b can be inhibited.

As the conductor 205a, it is possible to use a conductor that can be used as the conductor 260a.

The conductor 205 also functions as a wiring. Thus, a conductor with high conductivity is preferably used as the conductor 205b. As the conductor 205b, it is possible to use a conductor that can be used as the conductor 260b.

Although the conductors 205a and 205b are stacked in the example illustrated in FIGS. 19B and 19C, the present invention is not limited to this. For example, the conductor 205 may have a single-layer structure or a stacked-layer structure of three or more layers.

The conductor 205 functions as a second gate electrode in some cases. In that case, by changing a potential applied to the conductor 205 independently of a potential applied to the conductor 260, the threshold voltage ($V_{th}$) of the transistor 200 can be controlled. In particular, by applying a negative potential to the conductor 205, $V_{th}$ of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

As illustrated in FIG. 19A, the size of the conductor 205 is preferably larger than the size of a region of the metal oxide 230 that does not overlap with the conductor 242a or 242b. As illustrated in FIG. 19C, it is particularly preferable that the conductor 205 extend beyond the end portion of the metal oxide 230 in the channel width direction. In other words, the conductor 205 and the conductor 260 preferably overlap with each other with the insulator therebetween, in a region on the outer side of the side surface of the metal oxide 230 in the channel width direction. With such a structure, the channel formation region in the metal oxide 230 can be electrically surrounded by electric fields of the conductor 260 functioning as a first gate electrode and electric fields of the conductor 205 functioning as a second gate electrode. In this specification and the like, a transistor structure where a channel formation region is electrically surrounded by at least the electric field of a first gate electrode is referred to as a surrounded channel (S-channel) structure.

In this specification and the like, the S-channel structure refers to a transistor structure where a channel formation region is electrically surrounded by the electric fields of a pair of gate electrodes. The S-channel structure disclosed in this specification and the like is different from a Fin structure or a planar structure. The S-channel structure disclosed in this specification and the like can also be regarded as a kind of the Fin structure. In this specification and the like, the Fin structure refers to a structure where at least two surfaces (specifically, two surfaces, three surfaces, four surfaces, or the like) of a channel are covered with a gate electrode. With the use of the Fin structure and the S-channel structure, a transistor with high resistance to a short-channel effect, i.e., a transistor in which a short-channel effect is unlikely to occur, can be obtained.

When the transistor 200 has the above-described S-channel structure, the channel formation region can be electrically surrounded. Since the S-channel structure is a structure with the electrically surrounded channel formation region, the S-channel structure is, in a sense, equivalent to a gate all around (GAA) structure or a lateral gate all around (LGAA) structure. When the transistor 200 has any of the S-channel structure, the GAA structure, and the LGAA structure, the channel formation region formed at the interface between the metal oxide 230 and the gate insulator or in the vicinity thereof can correspond to the whole of bulk in the metal oxide 230. Consequently, the density of current flowing through the transistor can be improved, so that the on-state current or the field-effect mobility of the transistor can be increased.

As illustrated in FIG. 19C, the conductor 205 is extended to function also as a wiring. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

The insulator 222 preferably has a function of inhibiting hydrogen diffusion. When the insulator 222 has a function of inhibiting hydrogen diffusion, hydrogen diffusion from the peripheral portion of the transistor 200 into the metal oxide 230 can be inhibited.

Thus, the insulator 222 preferably has a function of inhibiting oxygen diffusion. With the insulator 222 having a function of inhibiting oxygen diffusion, release of oxygen from the metal oxide 230 to the substrate side can be inhibited. Thus, generation of an oxygen vacancy in the metal oxide 230 can be inhibited. Moreover, the conductor 205 can be inhibited from reacting with oxygen contained in the insulator 224 and the metal oxide 230.

As the insulator 222, it is preferable to use an insulator having a barrier property against one or both of oxygen and hydrogen. Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the above insulator to which one or more of the materials are added may be subjected to nitriding treatment.

Since the insulator 222 includes a region functioning as a second gate insulator, a single layer or stacked layers of an insulator containing a high-k material may be used.

The insulator 222 may have a single-layer structure or a stacked-layer structure. For example, as illustrated in FIG. 20A, the insulator 222 may have a stacked-layer structure of an insulator 222a and an insulator 222b over the insulator 222a.

As the insulator 222b, it is possible to use an insulator that can be used as the insulator 222.

The insulator 222a is provided between the insulator 222b and each of the insulator 216 and the conductor 205. The insulator 222a preferably has a function of inhibiting hydrogen diffusion. With the insulator 222a having a function of inhibiting hydrogen diffusion, hydrogen diffusion from below the insulator 222a into the transistor 200 can be inhibited.

For the insulator 222a, silicon nitride deposited by an ALD method (especially a PEALD method) is preferably used, for example. When formed by an ALD method, the insulator 222a can have favorable coverage even when unevenness is formed by the insulator 216 and the conductor 205. This can inhibit formation of a pinhole, disconnection, or the like in the insulator 222b formed over the insulator 222a.

As the insulator 224, it is preferable to use an insulator containing a material with a low dielectric constant. Alternatively, an insulator including a region containing excess oxygen may be used as the insulator 224. For example, silicon oxide or silicon oxynitride can be used as appropriate for the insulator 224.

Note that the insulator 224 may have a stacked-layer structure of two or more layers. In that cases, without limitation to a stacked-layer structure formed of the same material, a stacked-layer structure formed of different materials may be employed. The insulator 224 may be formed into an island shape overlapping with the metal oxide 230a. In this case, the insulator 275 is in contact with the side surface of the insulator 224 and the top surface of the insulator 222. Note that in this specification and the like, the term "island shape" refers to a state where two or more layers formed using the same material in the same step are physically separated from each other.

The insulator 271 is provided in contact with the top surface of the conductor 242. The insulator 271 preferably functions as at least a barrier insulating film against oxygen.

The insulator 271 is in contact with the conductor 242, and thus is preferably an inorganic insulator that does not easily oxidize the conductor 242. For example, an insulator that can be used as the insulator 250c is preferably used as the insulator 271. For example, silicon nitride can be used for the insulator 271.

Since an insulating layer to be the insulator 271 functions as a mask for a conductive layer to be the conductor 242, the conductor 242 does not have a curved surface between its side surface and top surface. Thus, an end portion at the intersection of the side surface and the top surface of the conductor 242 is angular. The cross-sectional area of the conductor 242 is larger in the case where an end portion at the intersection of the side surface and the top surface of the conductor 242 is angular than in the case where the end portion is rounded. Furthermore, when an insulator that does not easily oxidize a metal is used as the insulator 271, the conductor 242 can be inhibited from being oxidized excessively. As described above, the resistance of the conductor 242 is reduced, so that the on-state current of the transistor 200 can be increased.

The insulator 271 may have a single-layer structure or a stacked-layer structure.

The insulator 275 is provided to cover the insulator 224, the metal oxide 230, the conductor 242, and the insulator 271. The insulator 275 preferably has a function of capturing or fixing hydrogen. The insulator 275 preferably has a barrier property against hydrogen. The insulator 275 is preferably formed using aluminum oxide, magnesium oxide, silicon nitride, or the like. Alternatively, for example, a stacked-layer film of aluminum oxide and silicon nitride over the aluminum oxide may be used as the insulator 275. Note that silicon nitride also serves as a barrier insulating film against oxygen, and thus is suitable for the insulator 275.

When the above insulators 271 and 275 are provided, the conductor 242 can be surrounded by the barrier insulating films against oxygen. With such a structure, oxidation of the conductor 242 directly by oxygen contained in the insulator 280 can be inhibited, so that an increase in resistance and a reduction in on-state current can be inhibited.

An insulator 282 and an insulator 283 are provided in this order over the insulator 280, the conductor 260, and the insulator 250.

At least one of the insulators 212, 214, 282, and 283 preferably functions as a barrier insulating film that inhibits diffusion of impurities from the substrate side or from above the transistor 200 into the transistor 200. Thus, at least one of the insulators 212, 214, 282, and 283 is preferably formed using an insulating material having a function of inhibiting impurity diffusion. An example of the impurity is hydrogen.

For example, silicon nitride, which has a high barrier property against hydrogen, is preferably used for the insulators 212 and 283.

For example, aluminum oxide, which has a function of capturing or fixing hydrogen, is preferably used for the insulators 214 and 282. When such an insulator having a function of capturing or fixing hydrogen is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed.

With the above structure, hydrogen diffusion from the substrate side into the transistor 200 through the insulator 212 and the insulator 214 can be inhibited. Furthermore, hydrogen can be inhibited from diffusing to the transistor 200 side from an interlayer insulating film and the like placed outside the insulator 283. Accordingly, the transistor 200 and the semiconductor device with favorable characteristics and high reliability can be manufactured.

Each of the insulators 216 and 280 is preferably formed using a material that has a lower dielectric constant than the material used for the insulator 214. When a material with a low dielectric constant is used for the insulators 216 and 280 functioning as interlayer films, parasitic capacitance generated between wirings can be reduced. As the insulator 280, it is preferable to use an insulator in which a region containing excess oxygen is likely to be formed.

FIGS. 19B and 19C illustrate a structure where the insulators 212, 214, 282, and 283 each have a single-layer structure; however, the present invention is not limited thereto, and one or more of the insulators 212, 214, 282, and 283 may have a stacked-layer structure of two or more layers.

[Transistor 200A]

Figure 21A:
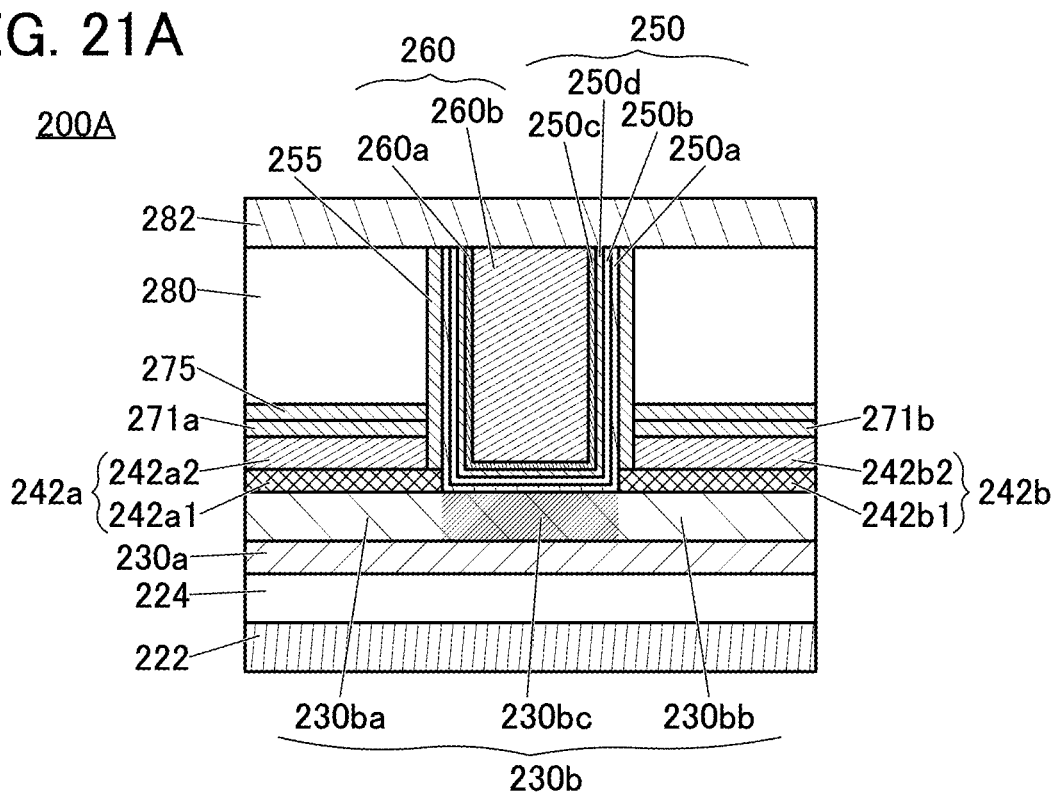
FIGS. 21A and 21B are cross-sectional views illustrating structure examples of a transistor.

FIG. 21A is an enlarged cross-sectional view of the transistor 200A in the channel length direction. The transistor 200A illustrated in FIG. 21A is a variation example of the transistor 200 illustrated in FIG. 20B. Specifically, the transistor 200A illustrated in FIG. 21A is different from the transistor 200 illustrated in FIG. 20B in including an insulator 255 between the insulator 250a and the conductor 242a2 and between the insulator 250a and the conductor 242b2. Hereinafter, differences from [Transistor 200] described above are mainly described and common portions are not described.

As illustrated in FIG. 21A, in the cross-sectional view of the transistor 200A in the channel length direction, a distance between the conductor 242a1 and the conductor 242b1 is smaller than that between the conductor 242a2 and the conductor 242b2. Such a structure allows a shorter distance between a source and a drain and a shorter channel length. As a result, the frequency characteristics of the transistor 200A can be improved. Thus, by miniaturization of a semiconductor device, the semiconductor device can operate at a higher speed.

The insulator 255 is preferably an insulator that is not easily oxidized, such as a nitride. The insulator 255 is formed to be in contact with a side surface of the conductor 242a2 and a side surface of the conductor 242b2, and thus has a function of protecting the conductor 242a2 and the conductor 242b2. The insulator 255 is exposed to an oxidized atmosphere, and thus is preferably an inorganic insulator that is not easily oxidized. In addition, the insulator 255 is in contact with the conductor 242a2 and the conductor 242b2, and thus is preferably an inorganic insulator that does not easily oxidize the conductor 242a2 and the conductor 242b2. Thus, the insulator 255 is preferably formed using an insulating material having a barrier property against oxygen. For example, silicon nitride can be used for the insulator 255.

In the transistor 200A illustrated in FIG. 21A, a side surface of the insulator 255 is aligned with the side surface of the conductor 242a1 and a side surface of the insulator 255 is aligned with the side surface of the conductor 242b1 in an opening portion formed in the insulator 280 and the insulator 275. With such a structure, the insulator 255 can be provided without an increase in the number of masks used in manufacturing the transistor 200.

Although FIG. 21A illustrates a structure where the side surface of the insulator 255 is aligned with the side surface of the conductor 242a1 and the side surface of the insulator 255 is aligned with the side surface of the conductor 242b1 in the opening portion formed in the insulator 280 and the insulator 275, the present invention is not limited thereto. For example, as illustrated in FIG. 21B, the insulator 250 may include regions overlapping with the conductor 242a1 and the conductor 242b1 with the insulator 255 therebetween.

Figure 21B:
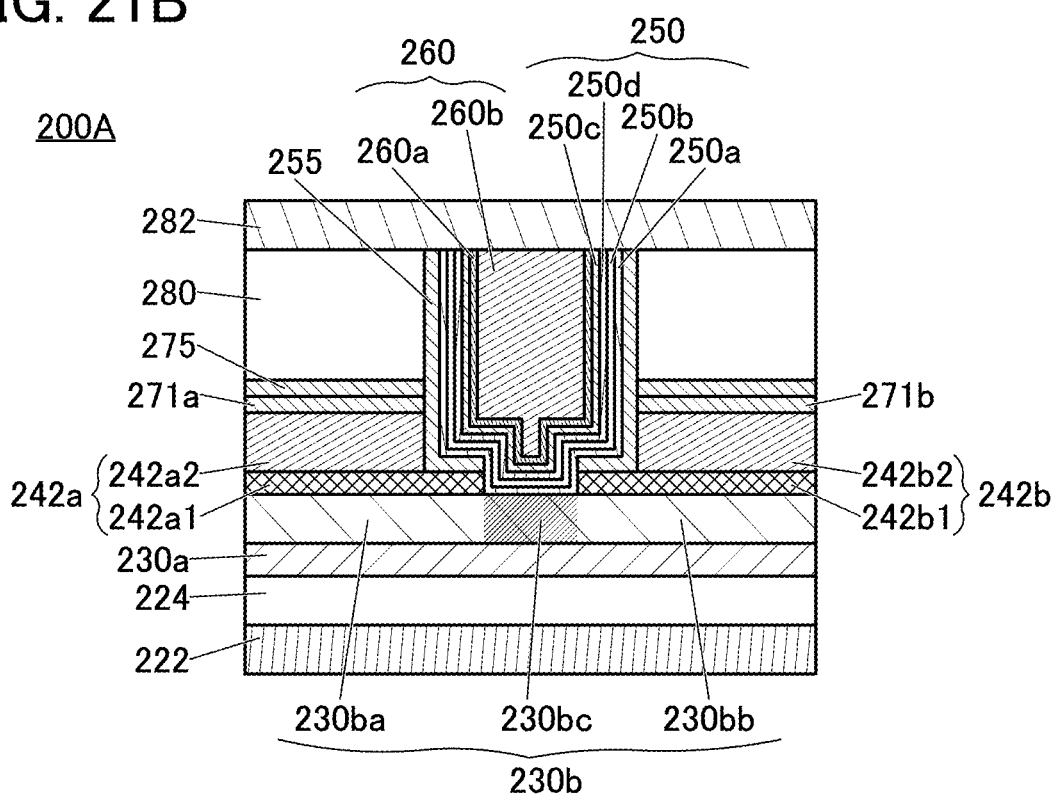

The transistor 200A illustrated in FIG. 21B is formed in the following manner: an opening portion is formed in the insulator 280 and the insulator 275, the insulator 255 is formed to be in contact with the sidewall of the opening portion, and then the conductor 242a1 and the conductor 242b1 are separated with the use of a mask. Here, the opening portion overlaps with a region between the conductor 242a2 and the conductor 242b2. Part of the conductor 242a1 and part of the conductor 242b1 are each formed to extend to the opening portion. Thus, in the opening portion, the insulator 255 is in contact with the top surface of the conductor 242a1, the top surface of the conductor 242b1, the side surface of the conductor 242a2, and the side surface of the conductor 242b2. In addition, the insulator 250a is in contact with the top surface of the metal oxide 230 in the region between the conductor 242a1 and the conductor 242b1.

In the structures illustrated in FIGS. 21A and 21B, the thicknesses of the insulator 250a to the insulator 250d are preferably small and preferably within the above range for miniaturization of the transistor 200A. Typically, the thicknesses of the insulator 250a, the insulator 250b, the insulator 250d, and the insulator 250c are 1 nm, 2 nm, 2 nm, and 1 nm, respectively. Such a structure enables a semiconductor device to have favorable electrical characteristics even when the semiconductor device is miniaturized or highly integrated.

Note that microwave treatment may be performed in an atmosphere containing oxygen after any one of insulating films to be the insulator 250a to the insulator 250d is formed.

The microwave treatment in an atmosphere containing oxygen converts an oxygen gas into plasma using a high-frequency wave such as a microwave or RF, and applies the oxygen plasma to a region of the metal oxide 230b that is between the conductor 242a and the conductor 242b. Specifically, oxygen can be supplied to the metal oxide 230b. By the effects of plasma, microwave, and the like, $V_O H$ in the region can be divided into oxygen vacancies and hydrogen, and the hydrogen can be removed from the region.

The microwave treatment improves the film quality of the insulating film, thereby inhibiting diffusion of hydrogen, water, impurities, and the like.

The microwave treatment in an atmosphere containing oxygen may be performed a plurality of times (two or more times). For example, it is preferable that first microwave treatment be performed after silicon oxide is formed as an insulating film to be the insulator 250b, and then second microwave treatment be performed at a higher temperature after hafnium oxide is formed as an insulating film to be the insulator 250d. The first microwave treatment performed at a substrate temperature of 250° C., for example, can supply oxygen to the metal oxide 230b, and second microwave treatment performed at a substrate temperature of 400° C., for example, can remove hydrogen in the metal oxide 230b and the silicon oxide.

<Material for Semiconductor Device>

Materials that can be used for a semiconductor device are described below.

<<Substrate>>

As a substrate where a transistor is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example is any of the above semiconductor substrates provided with an insulator region, such as a silicon on insulator (SOI) substrate. Examples of the conductor substrate include a graphite substrate, a metal substrate, an alloy substrate, and a conductive resin substrate. Other examples include a substrate containing a nitride of a metal, a substrate containing an oxide of a metal, an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided over the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of transistors, for example, a problem such as generation of leakage current or the like may arise because of a thinner gate insulator. When a high-k material is used for the insulator functioning as a gate insulator, the voltage at the time of operation of the transistor can be reduced while the physical thickness is maintained. In addition, the equivalent oxide thickness (EOT) of the insulator functioning as the gate insulator can be reduced. By contrast, when a material with a low dielectric constant is used for the insulator functioning as an interlayer film, parasitic capacitance generated between wirings can be reduced. Thus, a material is preferably selected depending on the function of an insulator. Note that a material with a low dielectric constant is a material with high dielectric strength.

Examples of a material with a high dielectric constant (a high-k material) include gallium oxide, hafnium oxide, tantalum oxide, zirconium oxide, hafnium zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. Other examples include lead zirconate titanate (PZT), strontium titanate ($SrTiO_3$), and $(Ba,Sr)TiO_3$(BST).

Examples of a material with a low dielectric constant include inorganic insulating materials such as silicon oxide, silicon oxynitride, and silicon nitride oxide, and resins such as polyester, polyolefin, polyamide (e.g., nylon and aramid), polyimide, polycarbonate, and acrylic. Other examples of an inorganic insulating material with a low dielectric constant include silicon oxide to which fluoride is added, silicon oxide to which carbon is added, and silicon oxide to which carbon and nitrogen are added. Another example is porous silicon oxide. Note that the above-listed silicon oxide may contain nitrogen.

A transistor including a metal oxide can have stable electrical characteristics when surrounded by an insulator having a function of inhibiting transmission of impurities and oxygen. The insulator having a function of inhibiting transmission of impurities and oxygen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of impurities and oxygen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

An insulator that is in contact with a semiconductor or provided in the vicinity of the semiconductor, such as a gate insulator, preferably includes a region containing excess oxygen. For example, when an insulator including a region containing excess oxygen is in contact with a semiconductor layer or provided in the vicinity of the semiconductor layer, the number of oxygen vacancies in the semiconductor layer can be reduced. Examples of an insulator in which a region containing excess oxygen is easily formed include silicon oxide, silicon oxynitride, and porous silicon oxide.

Examples of an insulator having a barrier property against oxygen include an oxide containing one or both of aluminum and hafnium, an oxide containing hafnium and silicon (hafnium silicate), magnesium oxide, gallium oxide, gallium zinc oxide, silicon nitride, and silicon nitride oxide. Examples of an oxide containing one or both of aluminum and hafnium include aluminum oxide, hafnium oxide, and an oxide containing aluminum and hafnium (hafnium aluminate).

Examples of an insulator having a barrier property against hydrogen include aluminum oxide, magnesium oxide, hafnium oxide, gallium oxide, indium gallium zinc oxide, silicon nitride, and silicon nitride oxide.

An insulator having a barrier property against oxygen and an insulator having a barrier property against hydrogen can each be regarded as an insulator having a barrier property against one or both of oxygen and hydrogen.

Examples of an insulator having a function of capturing or fixing hydrogen include an oxide containing magnesium and an oxide containing one or both of aluminum and hafnium. These oxides preferably have an amorphous structure. In such an oxide having an amorphous structure, an oxygen atom has a dangling bond, and the oxide has a property of capturing or fixing hydrogen with the dangling bond in some cases. Although these metal oxides preferably have an amorphous structure, a crystal region may be partly formed.

Note that in this specification and the like, a barrier insulating film refers to an insulating film having a barrier property. In addition, the barrier property refers to a property that does not easily allow diffusion of a target substance (also referred to as a property that does not easily allow passage of a target substance, a property with low permeability of a target substance, or a function of inhibiting diffusion of a target substance). Note that a function of capturing or fixing (also referred to as gettering) a target substance can be rephrased as a barrier property. Note that hydrogen described as a target substance refers to at least one of a hydrogen atom, a hydrogen molecule, a water molecule, and a substance bonded to hydrogen, such as $OH^-$. Unless otherwise specified, an impurity described as a target substance refers to an impurity in a channel formation region or a semiconductor layer, and for example, refers to at least one of a hydrogen atom, a hydrogen molecule, a water molecule, a nitrogen atom, a nitrogen molecule, a nitrogen oxide molecule (e.g., $N_2O$, NO, or $NO_2$), and a copper atom. Oxygen described as a target substance refers to, for example, at least one of an oxygen atom, an oxygen molecule, and the like. Specifically, a barrier property against oxygen refers to a property that does not easily allow diffusion of at least one of an oxygen atom, an oxygen molecule, and the like.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. As an alloy containing any of the above metal elements, a nitride of the alloy or an oxide of the alloy may be used. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Alternatively, a semiconductor having high electric conductivity, typified by polycrystalline silicon containing an impurity element such as phosphorus, or silicide such as nickel silicide may be used.

A conductive material containing nitrogen, such as a nitride containing tantalum, a nitride containing titanium, a nitride containing molybdenum, a nitride containing tungsten, a nitride containing ruthenium, a nitride containing tantalum and aluminum, or a nitride containing titanium and aluminum; a conductive material containing oxygen, such as ruthenium oxide, an oxide containing strontium and ruthenium, or an oxide containing lanthanum and nickel; or a material containing a metal element such as titanium, tantalum, or ruthenium is preferable because it is a conductive material that is not easily oxidized, a conductive material having a function of inhibiting oxygen diffusion, or a material maintaining its conductivity even after absorbing oxygen.

In addition, a conductive material containing tungsten, copper, or aluminum as its main component is preferable because it has high conductivity.

Conductive layers formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Further alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. One or more of indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon is added may be used. Indium gallium zinc oxide containing nitrogen may be used. With the use of such a material, hydrogen contained in the metal oxide where the channel is formed can be captured in some cases. Hydrogen entered from a surrounding insulator or the like can also be captured in some cases.

This embodiment can be combined with any of the other embodiments as appropriate.

Embodiment 3

In this embodiment, a memory device of one embodiment of the present invention including an OS transistor and a capacitor (hereinafter, such a memory device is also referred to as an OS memory device in some cases) is described with reference to FIGS. 22A and 22B, FIGS. 23A to 23I, and FIG. 24. The OS memory device includes at least a capacitor and an OS transistor that controls charging and discharging of the capacitor. Since the OS transistor has an extremely low off-state current, the OS memory device has excellent retention characteristics and can function as a nonvolatile memory. Note that the transistor (the transistor 600, the transistor 600A, the transistor 200, or the transistor 200A) described in Embodiment 2 can be used as the OS transistor.

<Structure Example of Memory Device>

Figure 22A:
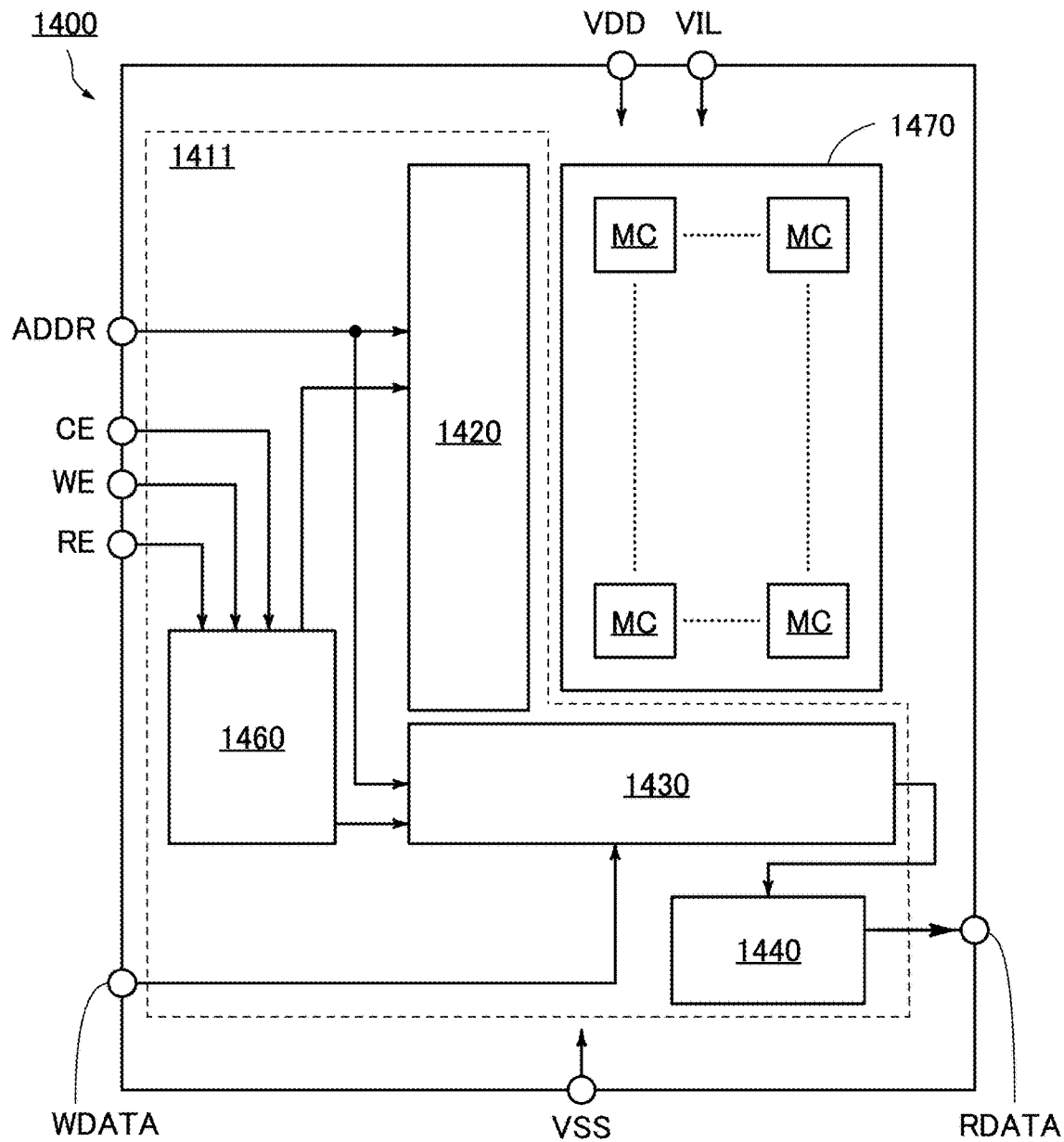
FIG. 22A is a block diagram illustrating a structure example of a memory device.

FIG. 22A illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. The wirings mentioned above are connected to memory cells included in the memory cell array 1470, which will be described later in detail. The amplified data signal is output as a data signal RDATA to the outside of the memory device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto and other control signals may be input as necessary.

The memory cell array 1470 includes a plurality of memory cells MC arranged in a matrix and a plurality of wirings. The number of wirings that connect the memory cell array 1470 and the row circuit 1420 depends on the structure of the memory cell MC, the number of memory cells MC in one column, and the like. The number of wirings that connect the memory cell array 1470 and the column circuit 1430 depends on the structure of the memory cell MC, the number of memory cells MC in one row, and the like.

Figure 22B:
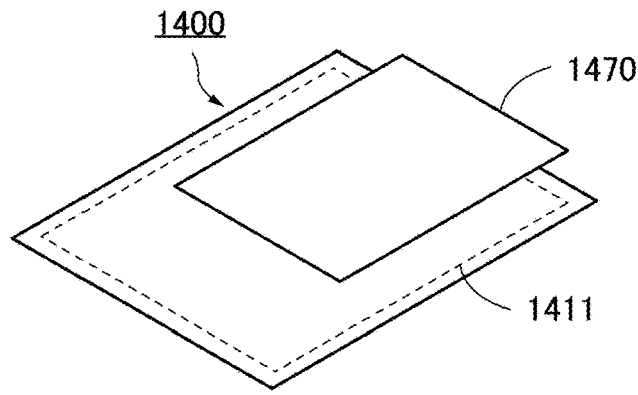
FIG. 22B is a perspective view illustrating the structure example of the memory device.

FIG. 22A shows an example where the peripheral circuit 1411 and the memory cell array 1470 are formed on the same plane; however, this embodiment is not limited thereto. For example, as illustrated in FIG. 22B, the memory cell array 1470 may be provided to partly overlap with the peripheral circuit 1411. For example, the sense amplifier may be provided below the memory cell array 1470 so that they overlap with each other. The OS transistor can be formed in a back end of line (BEOL) process for forming a wiring of a memory device. Thus, in the case where an OS transistor is used for the memory cell array 1470 and a Si transistor is used for the peripheral circuit 1411, a technique with which the OS transistor is directly formed above the Si transistor (referred to as a BEOL-Tr technique) can be employed.

Furthermore, a plurality of memory cell arrays 1470 may be stacked. By stacking a plurality of memory cell arrays 1470, memory cells can be integrated without an increase in the area occupied by the memory cell arrays 1470. That is, a 3D cell array can be formed. A high integration of memory cells is thus possible and a semiconductor device with large storage capacity can be provided. Note that a layer including an OS transistor is preferable because it can be stacked monolithically.

Note that the structures of the peripheral circuit 1411, the memory cell array 1470, and the like shown in this embodiment are not limited to those described above. The arrangement and functions of these circuits and the wirings, circuit components, and the like connected to the circuits can be changed, removed, or added as needed. The memory device of one embodiment of the present invention operates fast and can retain data for a long time.

Structure examples of a memory cell that can be used as the memory cell MC are described with reference to FIGS. 23A to 23I.

[DOSRAM]

Figure 23A:
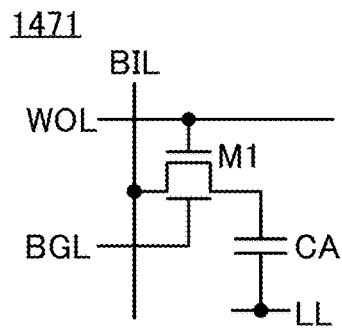
FIGS. 23A to 23I are circuit diagrams illustrating structure examples of a memory device.
Figure 23B:
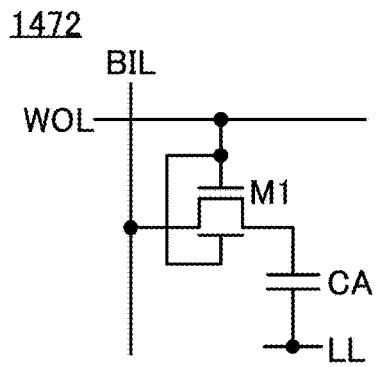
Figure 23C:
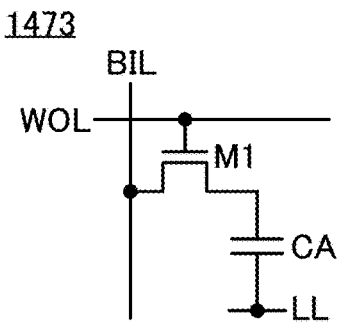
Figure 23D:
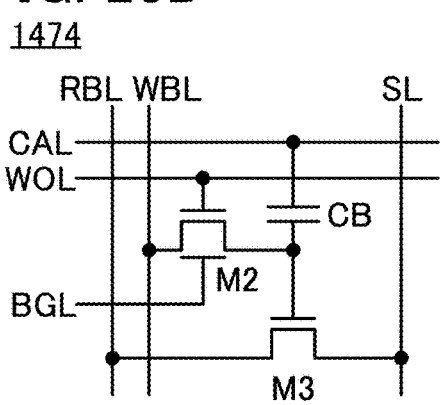
Figure 23E:
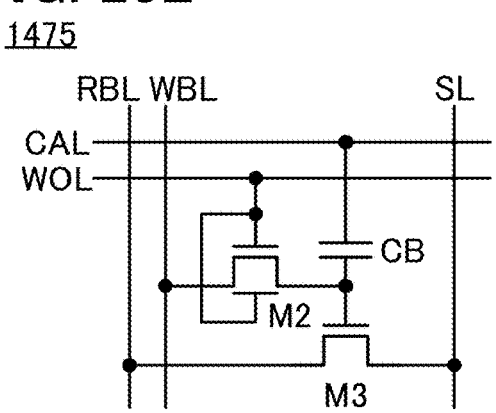
Figure 23F:
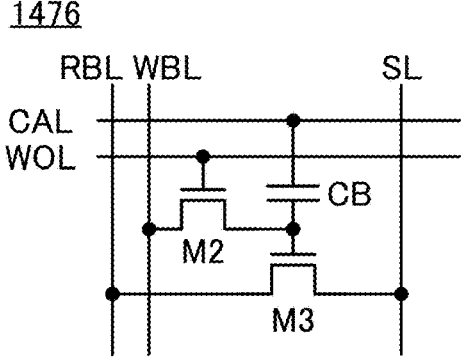
Figure 23G:
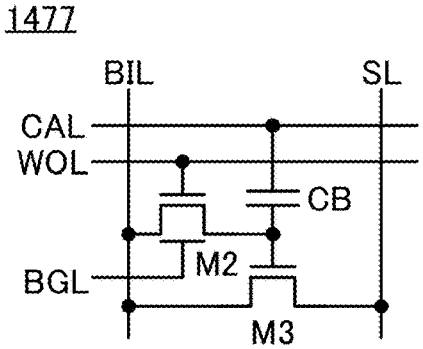

FIGS. 23A to 23C illustrate a circuit structure example of a memory cell of a DRAM. In this specification and the like, a DRAM using a memory cell including one OS transistor and one capacitor is sometimes referred to as a dynamic oxide semiconductor random access memory (DOSRAM). A memory cell 1471 illustrated in FIG. 23A includes a transistor M1 and a capacitor CA. The transistor M1 includes a gate (sometimes also referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. In data writing and data reading, the wiring LL may be set to a ground potential or a low-level potential. The wiring BGL functions as a wiring for applying a potential to the back gate of the transistor M1. The threshold voltage of the transistor M1 can be increased or decreased by supplying a given potential to the wiring BGL.

The memory cell MC is not limited to the memory cell 1471 and can have a different circuit structure. For example, in the memory cell MC, the back gate of the transistor M1 may be connected to the wiring WOL instead of the wiring BGL as in a memory cell 1472 illustrated in FIG. 23B. As another example, in the memory cell MC, the transistor M1 may be a single-gate transistor, that is, a transistor without a back gate as in a memory cell 1473 illustrated in FIG. 23C.

Figure 24:
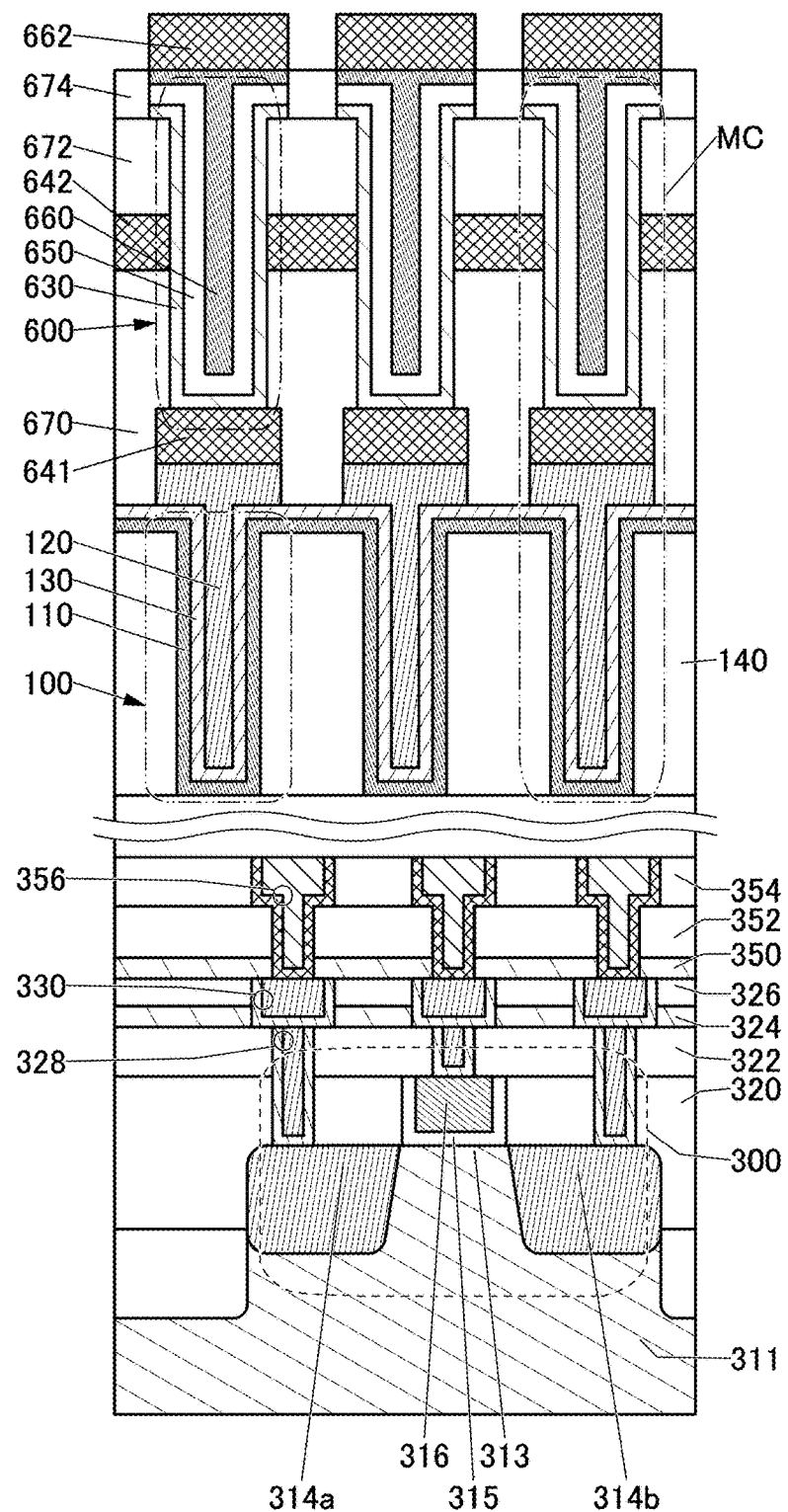
FIG. 24 is a cross-sectional view illustrating an example of a memory device.

Here, FIG. 24 illustrates an example of a memory device including a DOSRAM. In the memory device illustrated in FIG. 24, a capacitor 100 is provided above a transistor 300, and the transistor 600 is provided above the transistor 300 and the capacitor 100.

The transistor 600 illustrated in FIG. 24 has the same structure as the transistor 600 described in Embodiment 2. Thus, the description in Embodiment 2 is referred to for the structure of the transistor 600 illustrated in FIG. 24. The memory device illustrated in FIG. 24 can be regarded as including the transistor 600 described in Embodiment 2 above the capacitor 100.

When the memory device illustrated in FIG. 24 is used in the memory cell 1473, the transistor 600 can be used as the transistor M1 and the capacitor 100 can be used as the capacitor CA. When an OS transistor is used as the transistor M1, the off-state current of the transistor M1 can be extremely low. That is, with the use of the transistor M1, written data can be retained for a long time, and thus the frequency of refresh operation for the memory cell can be decreased. Alternatively, refresh operation for the memory cell can be omitted. Owing to an extremely low off-state current, the memory cell 1473 can retain multilevel data or analog data. The same applies to the memory cells 1471 and 1472.

In the DOSRAM, when the sense amplifier is provided to overlap with part of the memory cell array 1470 as described above, the bit line can be shortened. This reduces bit line capacitance, which reduces the storage capacitance of the memory cell.

When the transistor 600 is provided above the capacitor 100, the transistor 600 is not affected by thermal budget in fabricating the capacitor 100. Thus, in the transistor 600, degradation of the electrical characteristics such as variation in threshold voltage or an increase in parasitic resistance, and an increase in variation in electrical characteristics due to the degradation of the electrical characteristics can be inhibited.

The transistor 300 is provided on a substrate 311 and includes a conductor 316 functioning as a gate, an insulator 315 functioning as a gate insulator, a semiconductor region 313 that is a part of the substrate 311, and a low-resistance region 314$a$ and a low-resistance region 314$b$ functioning as a source region and a drain region. The transistor 300 can be a p-channel transistor or an $n^-$ channel transistor.

In the transistor 300 illustrated in FIG. 24, the semiconductor region 313 (part of the substrate 311) where a channel is formed has a projecting portion. Furthermore, the conductor 316 is provided to cover the side and top surfaces of the semiconductor region 313 with the insulator 315 therebetween. Note that the conductor 316 may be formed using a material for adjusting the work function. The transistor 300 having such a structure is also referred to as a FIN transistor because the projecting portion of the semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 24 is just an example and is not limited to having the structure illustrated therein; an appropriate transistor can be used in accordance with a circuit structure or a driving method.

Wiring layers including an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, in some cases, part of a conductor functions as a wiring or part of a conductor functions as a plug.

For example, an insulator 320, an insulator 322, an insulator 324, and an insulator 326 are stacked over the transistor 300 in this order as interlayer films. A conductor 328 is embedded in the insulator 320 and the insulator 322, and a conductor 330 is embedded in the insulator 324 and the insulator 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a CMP method or the like to improve the planarity.

A wiring layer may be provided over the insulator 326 and the conductor 330. For example, in FIG. 24, an insulator 350, an insulator 352, and an insulator 354 are stacked in this order. Furthermore, a conductor 356 is formed in the insulators 350, 352, and 354. The conductor 356 functions as a plug or a wiring.

As the insulator 352, the insulator 354, and the like functioning as interlayer films, it is possible to use an insulator that can be used as the insulator 216.

When an OS transistor is surrounded by an insulator having a function of inhibiting passage of impurities and oxygen, the transistor can have stable electrical characteristics. Thus, as the insulator 214, the insulator 212, the insulator 350, and the like, it is possible to use an insulator having a function of inhibiting passage of impurities and oxygen, which is described above in <<Insulator>>.

As the conductor functioning as a plug or a wiring, such as the conductor 328, the conductor 330, and the conductor 356, a conductor described above in <<Conductor>> can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

The capacitor 100 is provided above the transistor 300. The capacitor 100 illustrated in FIG. 24 has a cylindrical shape.

An insulator 140 is provided over the transistor 300.

The capacitor 100 includes a conductor 110, an insulator 130 over the conductor 110, and a conductor 120 over the insulator 130. Here, at least part of the conductor 110, the insulator 130, and the conductor 120 is provided in the opening portion formed in the insulator 140.

The top surface shape of the opening portion provided in the insulator 140 may be a circular shape including an elliptical shape, a quadrangular shape, a polygonal shape other than a quadrangular shape, or a polygonal shape with rounded corners. Here, the area where the opening portion and the transistor 600 overlap with each other is preferably larger in a plan view. Such a structure can reduce the area occupied by the semiconductor device including the capacitor 100 and the transistor 600.

The conductor 110 functions as a lower electrode, the conductor 120 functions as an upper electrode, and the insulator 130 functions as a dielectric. The upper electrode and the lower electrode of the capacitor 100 face each other with the dielectric therebetween, along the side surface as well as the bottom surface of the opening portion provided in the insulator 140; thus, the capacitance per unit area can be increased. Accordingly, the deeper the opening portion is, the larger the capacitance of the capacitor 100 can be. Increasing the capacitance per unit area of the capacitor 100 in this manner advances miniaturization and integration of the semiconductor device.

At least part of the conductor 110 is placed in the opening portion formed in the insulator 140. As illustrated in FIG. 24, the conductor 110 may be provided to be shared by adjacent capacitors 100. Note that the conductor 110 may be provided for each capacitor 100. That is, the conductor 110 may be isolated between adjacent capacitors 100.

The insulator 130 is placed to cover the conductor 110. The insulator 130 is preferably formed using a material with high dielectric strength or a high dielectric (high-k) material described above in <<Insulator>>. The insulator 130 may have a stacked-layer structure including a material with high dielectric strength and a high-k material. The use of such an insulator with high dielectric strength can inhibit electrostatic breakdown of the capacitor 100. Moreover, the use of such a high-k material enables sufficient capacitance of the capacitor 100 to be ensured even if the insulator 130 has a large thickness. The insulator 130 having a large thickness can inhibit a leakage current generated between the conductor 110 and the conductor 120.

An Insulating film in which silicon nitride, silicon oxide, and silicon nitride are stacked in this order can be used as the insulator 130, for example. Alternatively, an insulating film in which zirconium oxide, silicon oxide, and zirconium oxide are stacked in this order can be used.

As the insulator 130, an insulating film in which zirconium oxide, aluminum oxide, and zirconium oxide are stacked in order can be used, for instance.

The conductor 120 is placed to fill the opening portion provided in the insulator 140. The conductor 120 is electrically connected to the conductor 641 included in the transistor 600. As the conductor 120, it is possible to use a conductor that can be used as the conductor 110 described above.

[NOSRAM]

FIGS. 23D to 23G each illustrate a circuit structure example of a gain-cell memory cell including two transistors and one capacitor. A memory cell 1474 illustrated in FIG. 23D includes a transistor M2, a transistor M3, and a capacitor CB. The transistor M2 includes a top gate (simply referred to as a gate in some cases) and a back gate. In this specification and the like, a memory device including a gain-cell memory cell using an OS transistor as the transistor M2 is referred to as a nonvolatile oxide semiconductor RAM (NOSRAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to a wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In data writing and data reading, a high-level potential is preferably applied to the wiring CAL. In the data retention, a low-level potential is preferably applied to the wiring CAL. The wiring BGL functions as a wiring for applying a predetermined potential to the back gate of the transistor M2. The threshold voltage of the transistor M2 can be increased or decreased by applying a given potential to the wiring BGL.

The circuit structure of the memory cell MC is not limited to that of the memory cell 1474, and can be changed as appropriate. For example, as in a memory cell 1475 illustrated in FIG. 23E, the back gate of the transistor M2 may be connected to the wiring WOL instead of the wiring BGL in the memory cell MC. As another example, in the memory cell MC, the transistor M2 may be a single-gate transistor, that is, a transistor without a back gate as in a memory cell 1476 illustrated in FIG. 23F. As another example, in the memory cell MC, the wirings WBL and RBL may be combined into one wiring BIL as in a memory cell 1477 illustrated in FIG. 23G.

The transistor described in Embodiment 2 can be used as the transistor M2, the transistor 300 can be used as the transistor M3, and the capacitor 100 can be used as the capacitor CB. When an OS transistor is used as the transistor M2, the off-state current of the transistor M2 can be extremely low. That is, with the use of the transistor M2, written data can be retained for a long time, and thus the frequency of the refresh operation for the memory cell can be decreased. Alternatively, refresh operation for the memory cell can be omitted. In addition, since the transistor M2 has an extremely low off-state current, multi-level data or analog data can be retained in the memory cell 1474. The same applies to the memory cells 1475 to 1477.

Note that the transistor M3 may be a Si transistor. The Si transistor may be either an n⁻ channel transistor or a p-channel transistor. The Si transistor has higher field-effect mobility than the OS transistor in some cases. Therefore, a Si transistor may be used as the transistor M3 functioning as a reading transistor. Furthermore, the transistor M2 can be provided over the transistor M3 when a Si transistor is used as the transistor M3, in which case the area occupied by the memory cell can be reduced, leading to high integration of the memory device.

Alternatively, the transistor M3 may be an OS transistor. When an OS transistor is used as each of the transistors M2 and M3, the memory cell array 1470 can be formed using only n⁻ channel transistors.

Figure 23H:
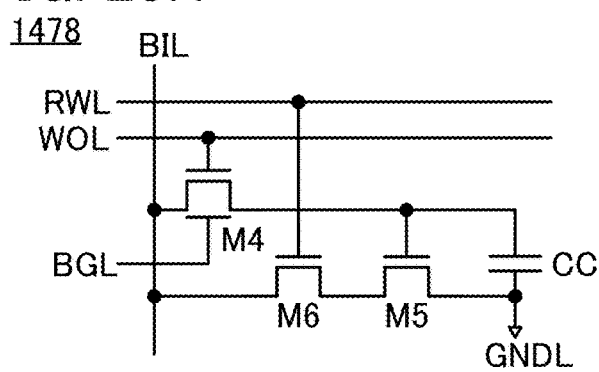

FIG. 23H illustrates an example of a gain-cell memory cell including three transistors and one capacitor. A memory cell 1478 illustrated in FIG. 23H includes transistors M4 to M6 and a capacitor CC. The capacitor CC is provided as appropriate. The memory cell 1478 is electrically connected to the wiring BIL, a wiring RWL, the wiring WOL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 does not necessarily include the back gate.

Note that each of the transistors M5 and M6 may be an n⁻ channel Si transistor or a p-channel Si transistor. Alternatively, the transistors M4 to M6 may be OS transistors. In this case, the circuit of the memory cell array 1470 can be formed using only n⁻ channel transistors.

The transistor described in Embodiment 2 can be used as the transistor M4, the transistor 300 can be used as the transistor M5 and the transistor M6, and the capacitor 100 can be used as the capacitor CC. When an OS transistor is used as the transistor M4, the off-state current of the transistor M4 can be extremely low.

Figure 23I:
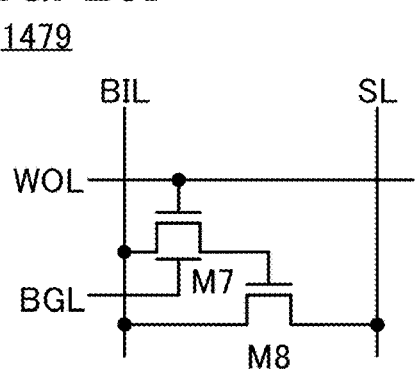

FIG. 23I illustrates an example of a gain-cell memory cell including two transistors. A memory cell 1479 illustrated in FIG. 23I includes a transistor M7 and a transistor M8. The memory cell 1479 is electrically connected to the wiring BIL, the wiring WOL, the wiring BGL, and the wiring SL.

The transistor M7 is an OS transistor with a back gate that is electrically connected to the wiring BGL. Note that the back gate and the gate of the transistor M7 may be electrically connected to each other. Alternatively, the transistor M7 does not necessarily include the back gate.

In the memory cell 1479 illustrated in FIG. 23I, gate capacitance of the transistor M8 is used as storage capacitance. That is, the memory cell 1479 can also be referred to as a capacitorless memory cell. It can be said that the memory cell 1479 has a structure where the capacitor CB is omitted in the memory cell 1477 illustrated in FIG. 23G, and is a gain-cell memory cell with two transistors and zero capacitor.

When an OS transistor is used as the transistor M7 and the transistor M7 is brought into an off state, electric charge at a node where one of a source electrode and a drain electrode of the transistor M7 and a gate electrode of the transistor M8 are electrically connected can be retained for a long time. Accordingly, a nonvolatile memory cell can be obtained.

The transistor M8 may be an n⁻ channel Si transistor or a p-channel Si transistor.

The transistor described in Embodiment 2 can be used as the transistor M7, and the transistor 300 can be used as the transistor M8. When an OS transistor is used as the transistor M7, the off-state current of the transistor M7 can be extremely low.

Alternatively, the transistor M8 may be an OS transistor. In this case, the circuit of the memory cell array 1470 can be formed using only n⁻ channel transistors.

As the transistors M7 and M8, the transistor described in Embodiment 2 can be used. This structure enables the transistors M7 and M8 to be formed in the same layer. Accordingly, the manufacturing process of stacking layers each including the memory cells 1479 can be simplified and the productivity can be improved as compared with the case where the transistors M7 and M8 are formed in different layers.

In the case where the transistor described in Embodiment 2 is used as the transistors M7 and M8, the constituent elements (including the channel length, the channel width, and the cross-sectional shape) are designed as appropriate depending on the characteristics required for the transistors M7 and M8.

Note that there is no particular limitation on the structure of the transistor M8 regardless of the semiconductor material used for the transistor M8. For example, a planar transistor, a staggered transistor, or an inverted staggered transistor can be used. Either a top-gate transistor or a bottom-gate transistor can be used. Gates may be provided above and below a semiconductor layer where a channel is formed.

This embodiment can be combined with any of the other embodiments as appropriate.

Embodiment 4

In this embodiment, application examples of the semiconductor device of one embodiment of the present invention are described with reference to FIGS. 25A and 25B, FIGS. 26A to 26E, FIG. 27, and FIG. 28. The semiconductor device of one embodiment of the present invention can be used for an electronic component, an electronic device, a large computer, a device for space, and a data center (also referred to as DC), for example. An electronic component, an electronic device, a large computer, a device for space, and a data center each employing the semiconductor device of one embodiment of the present invention are effective in improving performance, for example, reducing power consumption.

[Electronic Component]

Figure 25A:
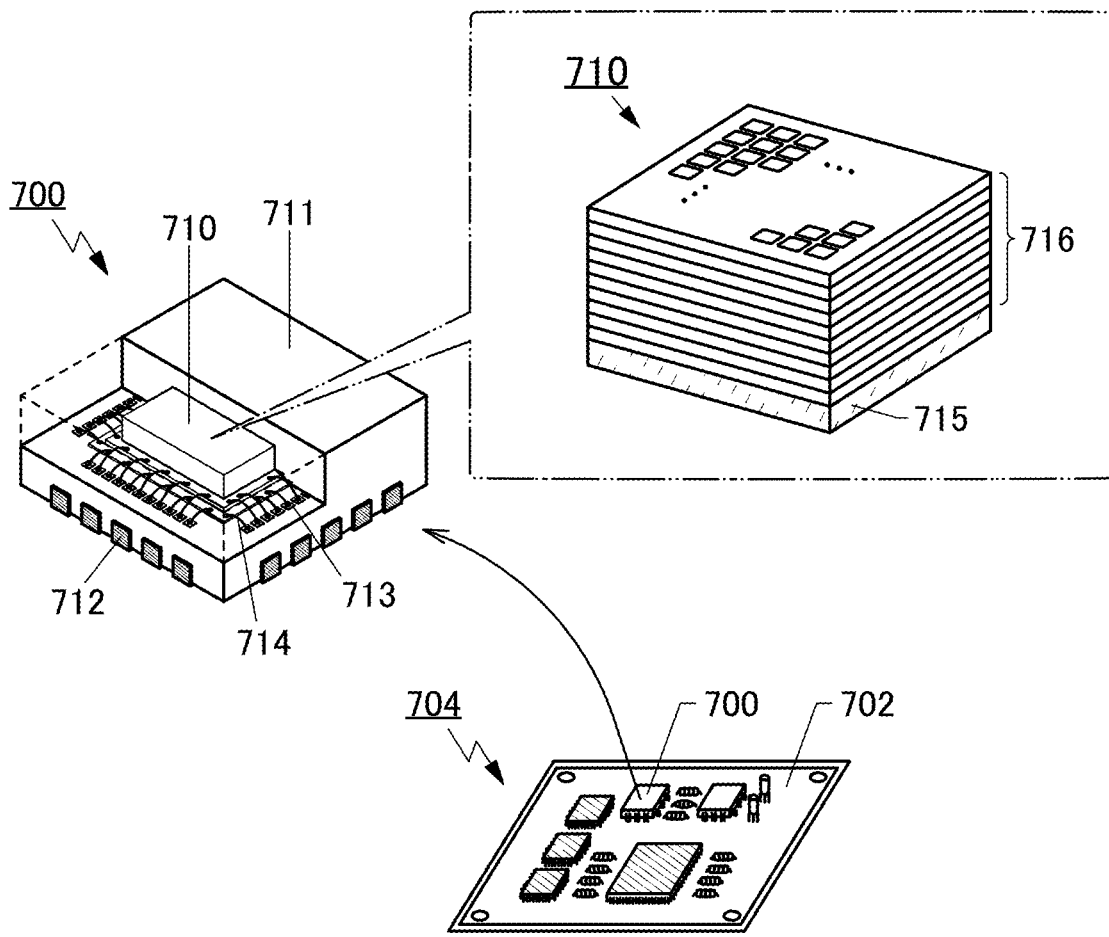
FIGS. 25A and 25B illustrate examples of an electronic component.

FIG. 25A is a perspective view of a substrate (a circuit board 704) provided with an electronic component 700. The electronic component 700 illustrated in FIG. 25A includes a semiconductor device 710 in a mold 711. Some components are omitted in FIG. 25A to show the inside of the electronic component 700. The electronic component 700 includes a land 712 outside the mold 711. The land 712 is electrically connected to an electrode pad 713, and the electrode pad 713 is electrically connected to the semiconductor device 710 through a wire 714. The electronic component 700 is mounted on a printed circuit board 702, for example. A plurality of such electronic components are combined and electrically connected to each other on the printed circuit board 702, which forms the circuit substrate 704.

The semiconductor device 710 includes a driver circuit layer 715 and a memory layer 716. The memory layer 716 has a structure where a plurality of memory cell arrays are stacked. A stacked-layer structure of the driver circuit layer 715 and the memory layer 716 can be stacked monolithically. In the monolithically stacked structure, layers can be connected without using through electrode technique such as through-silicon via (TSV) technique and bonding technique such as Cu—Cu direct bonding. Monolithically stacking the driver circuit layer 715 and the memory layer 716 enables, for example, what is called an on-chip memory structure in which a memory is directly formed on a processor. The on-chip memory structure allows an interface portion between the processor and the memory to operate at high speed.

With the on-chip memory structure, the sizes of a connection wiring and the like can be smaller than those in the case where the through electrode technique such as TSV is used, which means that the number of connection pins can be increased. The increase in the number of connection pins enables parallel operations, which can improve the bandwidth of the memory (also referred to as a memory bandwidth).

It is preferable that the plurality of memory cell arrays included in the memory layer 716 be formed with OS transistors and be monolithically stacked. Monolithically stacking memory cell arrays can improve the bandwidth of the memory and/or the access latency of the memory. Note that the bandwidth refers to the data transfer volume per unit time, and the access latency refers to a period of time from data access to the start of data transmission. Note that the memory layer 716 formed with Si transistors is more difficult to monolithically stack than the memory layer 716 formed with OS transistors. Therefore, an OS transistor is superior to a Si transistor in the monolithically stacked structure.

The semiconductor device 710 may be called a die. Note that in this specification and the like, a die refers to a chip obtained by, for example, forming a circuit pattern on a disc-like substrate (also referred to as a wafer) or the like and cutting the substrate with the pattern into dices in a process of manufacturing a semiconductor chip. Examples of semiconductor materials that can be used for the die include silicon (Si), silicon carbide (SiC), and gallium nitride (GaN). For example, a die obtained from a silicon substrate (also referred to as a silicon wafer) is referred to as a silicon die in some cases.

Figure 25B:
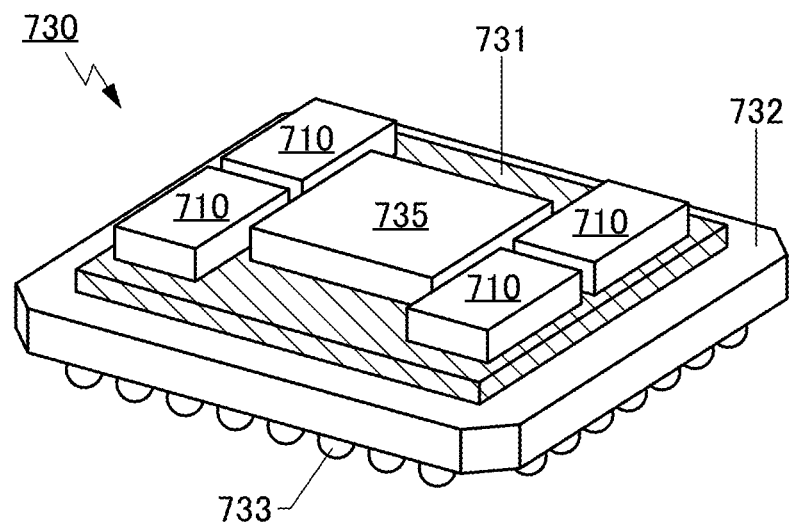

Next, FIG. 25B is a perspective view of an electronic component 730. The electronic component 730 is an example of a system in package (SiP) or a multi-chip module (MCM). In the electronic component 730, an interposer 731 is provided over a package substrate 732 (printed circuit board), and a semiconductor device 735 and a plurality of semiconductor devices 710 are provided over the interposer 731.

The electronic component 730 using the semiconductor device 710 as a high bandwidth memory (HBM) is illustrated as an example. The semiconductor device 735 can be used for an integrated circuit such as a central processing unit (CPU), a graphics processing unit (GPU), or an field programmable gate array (FPGA).

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings are provided in a single layer or multiple layers. In addition, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. Furthermore, a through electrode is provided in the interposer 731 and the through electrode is used to electrically connect an integrated circuit and the package substrate 732 in some cases. Moreover, in the case of using a silicon interposer, a TSV can also be used as the through electrode.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in the expansion coefficient between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In the case where a plurality of integrated circuits with different terminal pitches are electrically connected with use of a silicon interposer, TSV, and the like, a space for a width of the terminal pitch and the like is needed. Accordingly, in the case where the size of the electronic component 730 is reduced, the width of the terminal pitch becomes an issue, which sometimes makes it difficult to provide a large number of wirings for obtaining a wide memory bandwidth. For this reason, the above-described monolithically stacked structure with use of OS transistors is suitable. A composite structure obtained by combining a stacked layer of memory cell arrays formed by TSV and a monolithically stacked layer of memory cell arrays may be employed.

In addition, a heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 710 and the semiconductor device 735 are preferably equal to each other.

To mount the electronic component 730 on another substrate, an electrode 733 may be provided on a bottom portion of the package substrate 732. FIG. 25B illustrates an example where the electrode 733 is formed of a solder ball. Solder balls are provided in a matrix on the bottom portion of the package substrate 732, so that ball grid array (BGA) mounting can be achieved. Alternatively, the electrode 733 may be formed of a conductive pin. When conductive pins are provided in a matrix on the bottom portion of the package substrate 732, pin grid array (PGA) mounting can be achieved.

The electronic component 730 can be mounted on another substrate by various mounting methods other than BGA and PGA. Examples of a mounting method include staggered pin grid array (SPGA), land grid array (LGA), quad flat package (QFP), quad flat J-leaded package (QFJ), and quad flat non-leaded package (QFN).

[Electronic Device]

Figure 26A:
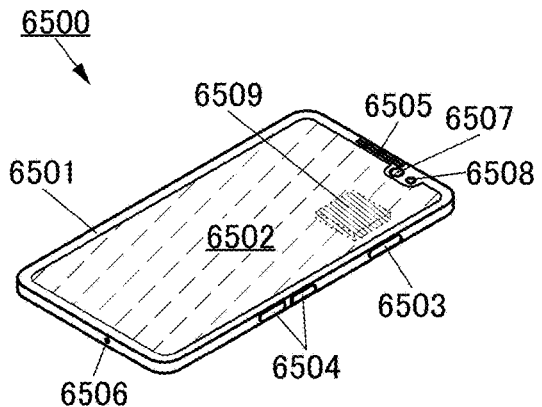
FIGS. 26A and 26B illustrate examples of an electronic device.

Next, FIG. 26A is a perspective view of an electronic device 6500. The electronic device 6500 in FIG. 26A is a portable information terminal that can be used as a smartphone. The electronic device 6500 includes a housing 6501, a display portion 6502, a power button 6503, buttons 6504, a speaker 6505, a microphone 6506, a camera 6507, a light source 6508, a control device 6509, and the like. Note that as the control device 6509, for example, one or more selected from a CPU, a GPU, and a memory device are included. The semiconductor device of one embodiment of the present invention can be used for the display portion 6502, the control device 6509, and the like.

Figure 26B:
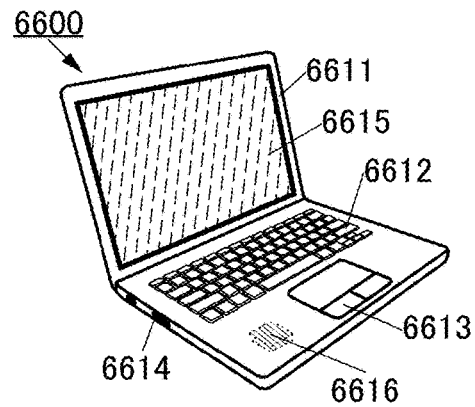

An electronic device 6600 illustrated in FIG. 26B is an information terminal that can be used as a laptop personal computer. The electronic device 6600 includes a housing 6611, a keyboard 6612, a pointing device 6613, an external connection port 6614, a display portion 6615, a control device 6616, and the like. Note that as the control device 6616, for example, one or more selected from a CPU, a GPU, and a memory device are included. The semiconductor device of one embodiment of the present invention can be used for the display portion 6615, the control device 6616, and the like. Note that the semiconductor device of one embodiment of the present invention is preferably used for the control device 6509 and the control device 6616, in which case power consumption can be reduced.

[Large Computer]

Figure 26C:
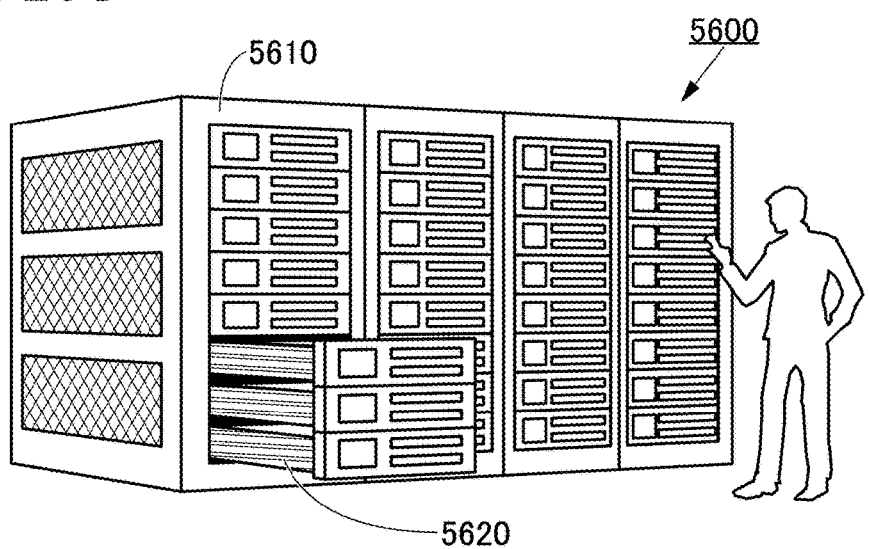
FIGS. 26C to 26E illustrate an example of a large computer.

Next, FIG. 26C is a perspective view of a large computer 5600. In the large computer 5600 illustrated in FIG. 26C, a plurality of rack mount computers 5620 are stored in a rack 5610. Note that the large computer 5600 may be referred to as a supercomputer.

Figure 26D:
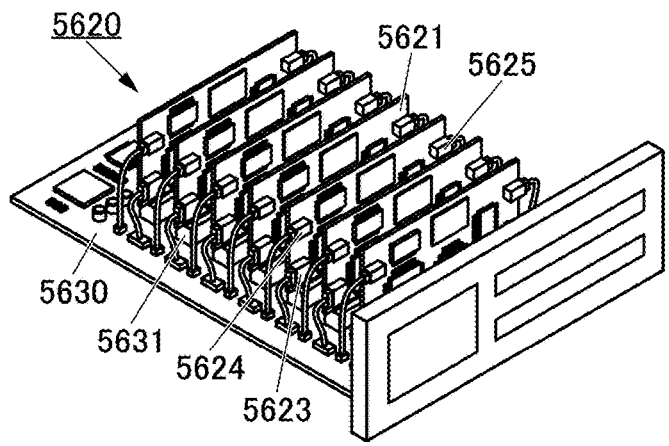

The computer 5620 can have a structure in a perspective view illustrated in FIG. 26D, for example. In FIG. 26D, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 26E:
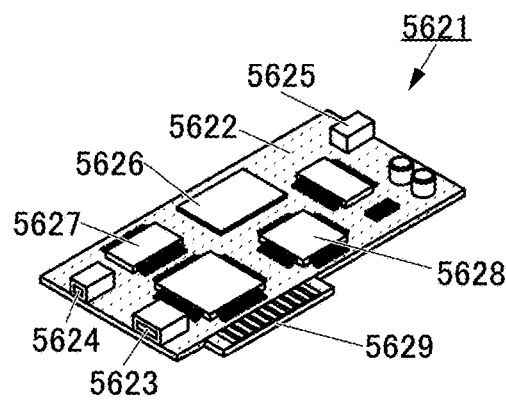

The PC card 5621 illustrated in FIG. 26E is an example of a processing board provided with a CPU, a GPU, a storage device, and the like. The PC card 5621 includes a board 5622. The board 5622 includes a connection terminal 5623, a connection terminal 5624, a connection terminal 5625, a semiconductor device 5626, a semiconductor device 5627, a semiconductor device 5628, and a connection terminal 5629. Note that FIG. 26E also illustrates semiconductor devices other than the semiconductor device 5626, the semiconductor device 5627, and the semiconductor device 5628, the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include universal serial bus (USB), serial ATA (SATA), and small computer system interface (SCSI). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA, a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a storage device or the like. As the semiconductor device 5628, the electronic component 700 can be used, for example.

The large computer 5600 can also function as a parallel computer. When the large computer 5600 is used as a parallel computer, large-scale computation necessary for artificial intelligence learning and inference can be performed, for example.

[Device for Space]

The semiconductor device of one embodiment of the present invention can be suitably used as a device for space.

The semiconductor device of one embodiment of the present invention includes an OS transistor. A change in electrical characteristics of the OS transistor due to radiation irradiation is small. That is, the OS transistor is highly resistant to radiation, and thus can be suitably used even in an environment where radiation can enter. For example, the OS transistor can be suitably used in outer space. Specifically, the OS transistor can be used as a transistor in a semiconductor device provided in a space shuttle, an artificial satellite, or a space probe. Examples of radiation include X-rays and a neutron beam. Note that outer space refers to, for example, space at an altitude greater than or equal to 100 km, and outer space described in this specification may include one or more of thermosphere, mesosphere, and stratosphere.

Figure 27:
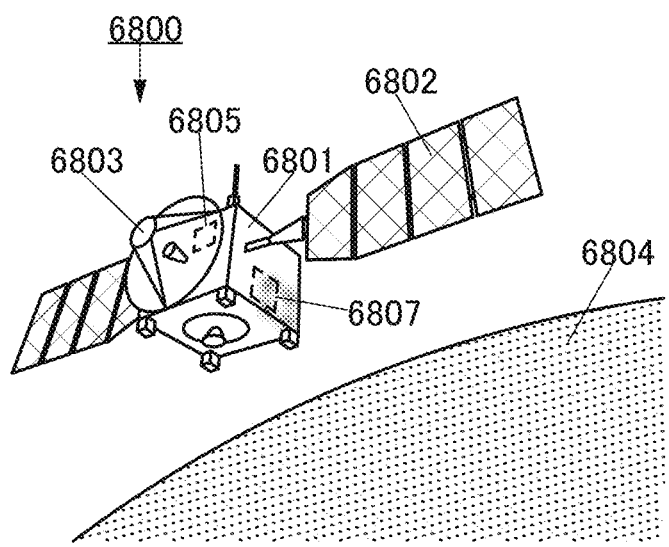
FIG. 27 illustrates an example of a device for space.

FIG. 27 illustrates an artificial satellite 6800 as an example of a device for space. The artificial satellite 6800 includes a body 6801, a solar panel 6802, an antenna 6803, a secondary battery 6805, and a control device 6807. In FIG. 27, a planet 6804 in outer space is illustrated.

Although not illustrated in FIG. 27, a battery management system (also referred to as BMS) or a battery control circuit may be provided in the secondary battery 6805. The battery management system or the battery control circuit preferably uses the OS transistor, in which case low power consumption and high reliability are achieved even in outer space.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beam, proton beam, heavy-ion beams, and meson beams.

When the solar panel 6802 is irradiated with sunlight, electric power required for operation of the artificial satellite 6800 is generated. However, for example, in the situation where the solar panel is not irradiated with sunlight or the situation where the amount of sunlight with which the solar panel is irradiated is small, the amount of generated electric power is small. Accordingly, a sufficient amount of electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a memory device, for example. Note that the semiconductor device including the OS transistor of one embodiment of the present invention is suitably used for the control device 6807. A change in electrical characteristics of the OS transistor due to radiation irradiation is smaller than a change in electrical characteristics of a Si transistor. Accordingly, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can function as an earth observing satellite, for example.

Although the artificial satellite is described as an example of a device for space in this embodiment, one embodiment of the present invention is not limited to this example. The semiconductor device of one embodiment of the present invention can be suitably used for a device for space such as a spacecraft, a space capsule, or a space probe, for example.

As described above, an OS transistor has excellent effects of achieving a wide memory bandwidth and being highly resistant to radiation as compared with a Si transistor.

[Data Center]

The semiconductor device of one embodiment of the present invention can be suitably used for, for example, a storage system in a data center or the like. Long-term management of data, such as guarantee of data immutability, is required for the data center. The long-term management of data needs setting a storage and a server for retaining a huge amount of data, stable power supply for retaining data, cooling equipment for retaining data, an increase in building size, and the like.

With use of the semiconductor device of one embodiment of the present invention for a storage system in a data center, electric power used for retaining data can be reduced and a semiconductor device for retaining data can be reduced in size. Accordingly, reductions in sizes of the storage system and the power supply for retaining data, downscaling of the cooling equipment, and the like can be achieved. Therefore, a space of the data center can be reduced.

Since the semiconductor device of one embodiment of the present invention has low power consumption, heat generation from a circuit can be reduced. Accordingly, adverse effects of the heat generation on the circuit itself, the peripheral circuit, and the module can be reduced. Furthermore, the use of the semiconductor device of one embodiment of the present invention can achieve a data center that operates stably even in a high temperature environment. Thus, the reliability of the data center can be increased.

Figure 28:
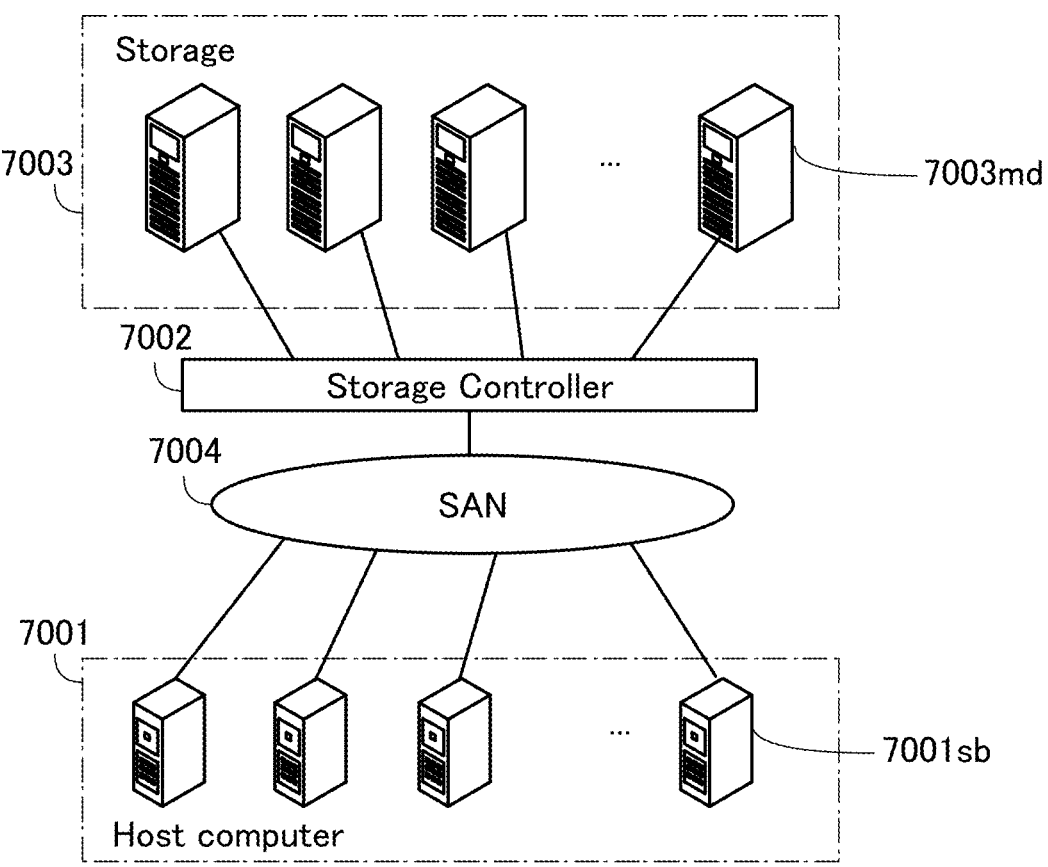
FIG. 28 illustrates an example of a storage system that can be used for a data center.

FIG. 28 illustrates a storage system that can be used in a data center. A storage system 7000 illustrated in FIG. 28 includes a plurality of servers 7001$sb$ as host 7001 (indicated as "Host Computer" in the diagram). The storage system 7000 includes a plurality of storage devices 7003$md$ as a storage 7003 (indicated as "Storage" in the diagram). In the illustrated example, the host 7001 and the storage 7003 are connected to each other through a storage area network 7004 (indicated as "SAN" in the diagram) and a storage control circuit 7002 (indicated as "Storage Controller" in the diagram).

The host 7001 corresponds to a computer which accesses data stored in the storage 7003. The host 7001 may be connected to another host 7001 through a network.

The data access speed, i.e., the time taken for storing and outputting data, of the storage 7003 is shortened by using a flash memory, but is still considerably longer than the data access speed of a DRAM that can be used as a cache memory in the storage. In the storage system, in order to solve the problem of low access speed of the storage 7003, a cache memory is normally provided in the storage to shorten the time taken for data storage and output.

The above-described cache memory is used in the storage control circuit 7002 and the storage 7003. The data transmitted between the host 7001 and the storage 7003 is stored in the cache memories in the storage control circuit 7002 and the storage 7003 and then output to the host 7001 or the storage 7003.

With a configuration in which an OS transistor is used as a transistor for storing data in the cache memory to retain a potential based on data, the frequency of refreshing can be decreased, so that power consumption can be reduced. Furthermore, downscaling is possible by stacking memory cell arrays.

A reduction in power consumption of an electronic device, a large computer, a device for space, or a data center is expected with use of the semiconductor device of one embodiment of the present invention for their electronic components. While the demand for energy is expected to increase with higher performance or higher integration of semiconductor devices, the emission amount of greenhouse effect gases typified by carbon dioxide ($CO_2$) can be reduced with use of the semiconductor device of one embodiment of the present invention. Furthermore, the semiconductor device of one embodiment of the present invention has low power consumption and thus is effective as a global warming countermeasure.

This embodiment can be combined with any of the other embodiments as appropriate.

This application is based on Japanese Patent Application Serial No. 2022-114230 filed with Japan Patent Office on Jul. 15, 2022, the entire contents of which are hereby incorporated by reference.

What is claimed is:

1. A method for forming a metal oxide, comprising:
a first step of supplying a first compound to a chamber and then supplying an oxidizer to the chamber; and
a second step of supplying a second compound to the chamber and then supplying the oxidizer to the chamber,
wherein the first compound is represented by any one of General Formulae (G1) to (G3),
wherein the second compound is represented by any one of General Formulae (G1) to (G3),
wherein the first compound and the second compound are different from each other,
wherein in each of the first and second steps, a substrate in the chamber is heated to higher than or equal to 300° C. and lower than or equal to 500° C.,

wherein M represents Ga, Al, or Sn,
wherein each of $R^1$ to $R^3$ independently represents hydrogen, fluorine, chlorine, bromine, iodine, oxygen, phosphorus, sulfur, a hydroxy group, a thiol group, a boryl group, a substituted or unsubstituted phosphanyl group, a substituted or unsubstituted alkyl group comprising 1 to 8 carbon atoms, a substituted or unsubstituted alkenyl group comprising 2 to 8 carbon atoms, a substituted or unsubstituted alkynyl group comprising 2 to 8 carbon atoms, a substituted or unsubstituted cycloalkyl group comprising 3 to 10 carbon atoms, a substituted or unsubstituted cycloalkenyl group comprising 3 to 10 carbon atoms, a substituted or unsubstituted cycloalkynyl group comprising 3 to 10 carbon atoms, a substituted or unsubstituted alkoxy group comprising 1 to 6 carbon atoms, a substituted or unsubstituted alkylsulfanyl group comprising 1 to 6 carbon atoms, a substituted or unsubstituted 1,3-propanedialdehyde group, a substituted or unsubstituted aryl group comprising 6 to 30 carbon atoms, or a substituted or unsubstituted heteroaryl group comprising 2 to 30 carbon atoms in which a ring is formed by a plurality of elements selected from carbon, sulfur, oxygen, boron, and phosphorus,
wherein m represents an integer of 1 to 3,
wherein n represents an integer of 1 to 3 when M is Ga or Al, and represents an integer of 1 to 4 when M is Sn,
wherein k represents 1 or 2,
wherein when m is 2 or more, a plurality of $R^1$s represent the same substance or different substances which are bonded to each other to form a ring,
wherein when n is 2 or more, a plurality of $R^2$s represent the same substance or different substances which are bonded to each other to form a ring,
wherein when k is 2, a plurality of $R^3$s represent the same substance or different substances which are bonded to each other to form a ring, and
wherein a bond between In and $R^1$, a bond between M and $R^2$, a bond between Zn and $R^3$, a bond between the plurality of $R^1$s, a bond between the plurality of $R^2$s, and a bond between the plurality of $R^3$s are each any of a single bond, a double bond, and a triple bond.

2. A method for forming a metal oxide, comprising:
a first step of supplying a first compound to a chamber and then supplying an oxidizer to the chamber; and
a second step of supplying a second compound to the chamber and then supplying the oxidizer to the chamber,
wherein the first compound is represented by any one of General Formulae (G1) to (G3),
wherein the second compound is represented by any one of General Formulae (G1) to (G3),
wherein the first compound and the second compound are different from each other,
wherein in each of the first and second steps, a substrate in the chamber is heated to higher than or equal to 300° C. and lower than or equal to 500° C.,

wherein M represents Ga, Al, or Sn,
wherein each of $R^1$ to $R^3$ independently represents hydrogen, fluorine, chlorine, bromine, iodine, oxygen, phosphorus, sulfur, a hydroxy group, a thiol group, a boryl group, a substituted or unsubstituted phosphanyl group, a substituted or unsubstituted alkyl group comprising 1 to 8 carbon atoms, a substituted or unsubstituted alkenyl group comprising 2 to 8 carbon atoms, a substituted or unsubstituted alkynyl group comprising 2 to 8 carbon atoms, a substituted or unsubstituted cycloalkyl group comprising 3 to 10 carbon atoms, a substituted or unsubstituted cycloalkenyl group comprising 3 to 10 carbon atoms, a substituted or unsubstituted cycloalkynyl group comprising 3 to 10 carbon atoms, a substituted or unsubstituted alkoxy group comprising 1 to 6 carbon atoms, a substituted or unsubstituted alkylsulfanyl group comprising 1 to 6 carbon atoms, a substituted or unsubstituted 1,3-propanedialdehyde group, a substituted or unsubstituted aryl group comprising 6 to 30 carbon atoms, or a substituted or unsubstituted heteroaryl group comprising 2 to 30 carbon atoms in which a ring is formed by a plurality of elements selected from carbon, sulfur, oxygen, boron, and phosphorus,
wherein m represents an integer of 1 to 3,
wherein n represents an integer of 1 to 3 when M is Ga or Al, and represents an integer of 1 to 4 when M is Sn,
wherein k represents 1 or 2,
wherein when m is 2 or more, a plurality of $R^1$s represent the same substance or different substances,
wherein when n is 2 or more, a plurality of $R^2$s represent the same substance or different substances, and
wherein when k is 2, a plurality of $R^3$s represent the same substance or different substances.

3. The method for forming a metal oxide, according to claim 1,
wherein in General Formulae (G1) to (G3), at least one of m, n, and k is 2 or more,
wherein when m is 2, the plurality of $R^1$s are different from each other,
wherein when m is 3, at least one of the plurality of $R^1$s is different from the other $R^1$s of the plurality of $R^1$s,
wherein when n is 2, the plurality of $R^2$s are different from each other,
wherein when n is 3 or more, at least one of the plurality of $R^2$s is different from the other $R^2$s of the plurality of $R^2$s, and
wherein when k is 2, the plurality of $R^3$s are different from each other.

4. The method for forming a metal oxide, according to claim 1,
wherein the first compound and the second compound are each a liquid at 25° C. and 1 atm.

5. The method for forming a metal oxide, according to claim 1,
wherein performing each of the first and second steps one or more times and performing impurity removal treatment in an atmosphere containing oxygen are regarded as a first cycle, and
wherein the first cycle is repeated a plurality of times.

6. The method for forming a metal oxide, according to claim 1, further comprising a third step of supplying a third compound to the chamber and then supplying the oxidizer to the chamber,
wherein the third compound is represented by any one of General Formulae (G1) to (G3),
wherein the third compound is different from the first compound and the second compound, and
wherein in the third step, the substrate is heated to higher than or equal to 300° C. and lower than or equal to 500° C.

7. The method for forming a metal oxide, according to claim 5,
wherein plasma treatment is performed as the impurity removal treatment.

8. The method for forming a metal oxide, according to claim 5,
wherein the impurity removal treatment is performed while irradiation with ultraviolet light is performed.

9. The method for forming a metal oxide, according to claim 5,
wherein microwave treatment is performed as the impurity removal treatment.

10. The method for forming a metal oxide, according to claim 5,
wherein heat treatment at higher than or equal to 300° C. and lower than or equal to 500° C. is performed as the impurity removal treatment.

11. A method for forming a metal oxide, comprising:
a first step of supplying a first compound to a chamber and then supplying an oxidizer to the chamber; and
a second step of supplying a second compound to the chamber and then supplying the oxidizer to the chamber,
wherein the first compound is represented by any one of General Formulae (G1) to (G3),
wherein the second compound is represented by any one of General Formulae (G1) to (G3),
wherein the first compound and the second compound are different from each other,
wherein performing each of the first and second steps one or more times and then performing impurity removal treatment in an atmosphere containing oxygen are regarded as a first cycle,
wherein the first cycle is repeated a plurality of times,

(G1)

(G2)

(G3)

wherein M represents Ga, Al, or Sn,
wherein each of $R^1$ to $R^3$ independently represents hydrogen, fluorine, chlorine, bromine, iodine, oxygen, phosphorus, sulfur, a hydroxy group, a thiol group, a boryl group, a substituted or unsubstituted phosphanyl group, a substituted or unsubstituted alkyl group comprising 1 to 8 carbon atoms, a substituted or unsubstituted alkenyl group comprising 2 to 8 carbon atoms, a substituted or unsubstituted alkynyl group comprising 2 to 8 carbon atoms, a substituted or unsubstituted cycloalkyl group comprising 3 to 10 carbon atoms, a substituted or unsubstituted cycloalkenyl group comprising 3 to 10 carbon atoms, a substituted or unsubstituted cycloalkynyl group comprising 3 to 10 carbon atoms, a substituted or unsubstituted alkoxy group comprising 1 to 6 carbon atoms, a substituted or unsubstituted alkylsulfanyl group comprising 1 to 6 carbon atoms, a substituted or unsubstituted 1,3-propanedialdehyde group, a substituted or unsubstituted aryl group comprising 6 to 30 carbon atoms, or a substituted or unsubstituted heteroaryl group comprising 2 to 30 carbon atoms in which a ring is formed by a plurality of elements selected from carbon, sulfur, oxygen, boron, and phosphorus, wherein m represents an integer of 1 to 3, wherein n represents an integer of 1 to 3 when M is Ga or Al, and represents an integer of 1 to 4 when M is Sn, wherein k represents 1 or 2, wherein when m is 2 or more, a plurality of $R^1$s represent the same substance or different substances which are bonded to each other to form a ring, wherein when n is 2 or more, a plurality of $R^2$s represent the same substance or different substances which are bonded to each other to form a ring, wherein when k is 2, a plurality of $R^3$s represent the same substance or different substances which are bonded to each other to form a ring, and wherein a bond between In and $R^1$, a bond between M and $R^2$, a bond between Zn and $R^3$, a bond between the plurality of $R^1$s, a bond between the plurality of $R^2$s, and a bond between the plurality of $R^3$s are each any of a single bond, a double bond, and a triple bond.

12. The method for forming a metal oxide, according to claim 11,
wherein in the first cycle, the first step or the second step that is less frequent or both of the first and second steps are performed more than or equal to 5 times and less than or equal to 10 times.

13. The method for forming a metal oxide, according to claim 11, further comprising a third step of supplying a third compound to the chamber and then supplying the oxidizer to the chamber,
wherein the third compound is represented by any one of General Formulae (G1) to (G3),
wherein the third compound is different from the first compound and the second compound, and
wherein in the first cycle, the third step is performed one or more times before the impurity removal treatment.

14. A method for forming a metal oxide, comprising:
a first step of supplying a first compound to a chamber and then supplying an oxidizer to the chamber; and
a second step of supplying a second compound to the chamber and then supplying the oxidizer to the chamber,
wherein the first compound is represented by any one of General Formulae (G1) to (G3),
wherein the second compound is represented by any one of General Formulae (G1) to (G3),
wherein the first compound and the second compound are different from each other,
wherein performing each of the first and second steps one or more times and then performing impurity removal treatment in an atmosphere containing oxygen are regarded as a first cycle,
wherein performing each of the first and second steps one or more times in an order different from that of the first cycle and then performing the impurity removal treatment in an atmosphere containing oxygen are regarded as a second cycle,
wherein the first cycle and the second cycle are alternately performed a plurality of times,

wherein M represents Ga, Al, or Sn, wherein each of $R^1$ to $R^3$ independently represents hydrogen, fluorine, chlorine, bromine, iodine, oxygen, phosphorus, sulfur, a hydroxy group, a thiol group, a boryl group, a substituted or unsubstituted phosphanyl group, a substituted or unsubstituted alkyl group comprising 1 to 8 carbon atoms, a substituted or unsubstituted alkenyl group comprising 2 to 8 carbon atoms, a substituted or unsubstituted alkynyl group comprising 2 to 8 carbon atoms, a substituted or unsubstituted cycloalkyl group comprising 3 to 10 carbon atoms, a substituted or unsubstituted cycloalkenyl group comprising 3 to 10 carbon atoms, a substituted or unsubstituted cycloalkynyl group comprising 3 to 10 carbon atoms, a substituted or unsubstituted alkoxy group comprising 1 to 6 carbon atoms, a substituted or unsubstituted alkylsulfanyl group comprising 1 to 6 carbon atoms, a substituted or unsubstituted 1,3-propanedialdehyde group, a substituted or unsubstituted aryl group comprising 6 to 30 carbon atoms, or a substituted or unsubstituted heteroaryl group comprising 2 to 30 carbon atoms in which a ring is formed by a plurality of elements selected from carbon, sulfur, oxygen, boron, and phosphorus, wherein m represents an integer of 1 to 3, wherein n represents an integer of 1 to 3 when M is Ga or Al, and represents an integer of 1 to 4 when M is Sn, wherein k represents 1 or 2, wherein when m is 2 or more, a plurality of $R^1$s represent the same substance or different substances which are bonded to each other to form a ring, wherein when n is 2 or more, a plurality of $R^2$s represent the same substance or different substances which are bonded to each other to form a ring, wherein when k is 2, a plurality of $R^3$s represent the same substance or different substances which are bonded to each other to form a ring, and wherein a bond between In and $R^1$, a bond between M and $R^2$, a bond between Zn and $R^3$, a bond between the plurality of $R^1$s, a bond between the plurality of $R^2$s, and a bond between the plurality of $R^3$s are each any of a single bond, a double bond, and a triple bond.

15. The method for forming a metal oxide, according to claim 14,
wherein in the first cycle, the first step or the second step that is less frequent or both of the first and second steps are performed more than or equal to 5 times and less than or equal to 10 times, and
wherein in the second cycle, the first step or the second step that is less frequent or both of the first and second steps are performed more than or equal to 5 times and less than or equal to 10 times.

16. The method for forming a metal oxide, according to claim 14, further comprising a third step of supplying a third compound to the chamber and then supplying the oxidizer to the chamber, wherein the third compound is represented by any one of General Formulae (G1) to (G3), wherein the third compound is different from the first compound and the second compound, and wherein in each of the first and second cycles, the third step is performed one or more times before the impurity removal treatment.

17. The method for forming a metal oxide, according to claim 14, wherein plasma treatment is performed as the impurity removal treatment.

18. The method for forming a metal oxide, according to claim 14, wherein the impurity removal treatment is performed while irradiation with ultraviolet light is performed.

19. The method for forming a metal oxide, according to claim 14, wherein microwave treatment is performed as the impurity removal treatment.

20. The method for forming a metal oxide, according to claim 14, wherein heat treatment at higher than or equal to 300° C. and lower than or equal to 500° C. is performed as the impurity removal treatment.

* * * * *